US009553343B2

(12) United States Patent
Malcolm et al.

(10) Patent No.: US 9,553,343 B2
(45) Date of Patent: Jan. 24, 2017

(54) PRINTED CIRCUIT BOARD INTERCONNECT FOR CELLS IN A BATTERY SYSTEM

(71) Applicant: Johnson Controls Technology Company, Holland, MI (US)

(72) Inventors: Robert G. Malcolm, Waterford, MI (US); Perry M. Wyatt, Fox Point, WI (US); Thanh T. Nguyen, Mequon, WI (US); James Pinon, Troy, MI (US); Ajinkya S. Joshi, Birmingham, MI (US)

(73) Assignee: Johnson Controls Technology Company, Holland, MI (US)

( * ) Notice: Subject to any disclaimer, the term of this patent is extended or adjusted under 35 U.S.C. 154(b) by 712 days.

(21) Appl. No.: 13/954,765

(22) Filed: Jul. 30, 2013

(65) Prior Publication Data

US 2015/0037634 A1    Feb. 5, 2015

(51) Int. Cl.
*H01M 10/48* (2006.01)
*H01M 2/20* (2006.01)
*H05K 1/18* (2006.01)

(52) U.S. Cl.
CPC .......... *H01M 10/482* (2013.01); *H01M 2/206* (2013.01); *H05K 1/18* (2013.01); *H05K 2201/10037* (2013.01); *H05K 2201/10151* (2013.01)

(58) Field of Classification Search
CPC  H01M 10/425; H01M 10/482; H01M 2/1077; H01M 2/206; H01M 10/647; H01M 10/6568; H01M 10/6557; H01M 10/613; H05K 3/328; H05K 2201/10037; H05K 2201/10189; H05K 2201/10295; H05K 2201/10962; Y10T 29/53135

USPC .......................................................... 429/90
See application file for complete search history.

(56) References Cited

U.S. PATENT DOCUMENTS

| 4,910,415 A | 3/1990 | Yoshimura |
| 5,749,754 A | 5/1998 | Patterson et al. |
| 6,242,128 B1 | 6/2001 | Tura et al. |
| 6,319,631 B1 | 11/2001 | Bay et al. |
| 6,724,170 B1 | 4/2004 | Maggert |

(Continued)

FOREIGN PATENT DOCUMENTS

| EP | 2523234 A1 | 11/2012 |
| WO | 2010076767 A1 | 7/2010 |
| WO | 2012082691 A2 | 6/2012 |

OTHER PUBLICATIONS

Partial International Search Report for PCT Application No. PCT/US2014/024715 dated Jun. 24, 2014; 6 pgs.

*Primary Examiner* — Gary Harris
(74) *Attorney, Agent, or Firm* — Fletcher Yoder P.C.

(57) ABSTRACT

A system includes a cell interconnect board including a printed circuit board (PCB) disposed proximate a power assembly having a plurality of pouch battery cells, including at least a first battery cell and a second battery cell in a stacked orientation relative to each other. The cell interconnect board includes an interconnect spanning a slot in the cell interconnect board and configured to receive a first tab electrode extending from the first battery cell and a second tab electrode extending from the second battery cell, such that the first and second tab electrodes are in contact with each other. The system also includes a sensor configured to measure a parameter associated with the power assembly.

29 Claims, 65 Drawing Sheets

(56) References Cited

U.S. PATENT DOCUMENTS

| | | | |
|---|---|---|---|
| 6,972,544 B2 | 12/2005 | Seman, Jr. et al. | |
| 8,057,931 B2 | 11/2011 | Bjork | |
| 2002/0137391 A1* | 9/2002 | Berberich | H01R 13/65802 439/620.22 |
| 2008/0124617 A1 | 5/2008 | Bjork | |
| 2009/0111015 A1* | 4/2009 | Wood | H01M 2/1077 429/164 |
| 2009/0323293 A1* | 12/2009 | Koetting | H01M 10/425 361/736 |
| 2009/0325042 A1 | 12/2009 | Koetting et al. | |
| 2011/0229745 A1 | 9/2011 | Barter et al. | |
| 2012/0034496 A1 | 2/2012 | Langhoff et al. | |
| 2013/0034750 A1 | 2/2013 | Choi et al. | |
| 2013/0078485 A1 | 3/2013 | Muis | |
| 2013/0108902 A1 | 5/2013 | Kristofek et al. | |
| 2013/0120910 A1 | 5/2013 | Watanabe | |
| 2013/0122339 A1 | 5/2013 | Chae et al. | |

* cited by examiner

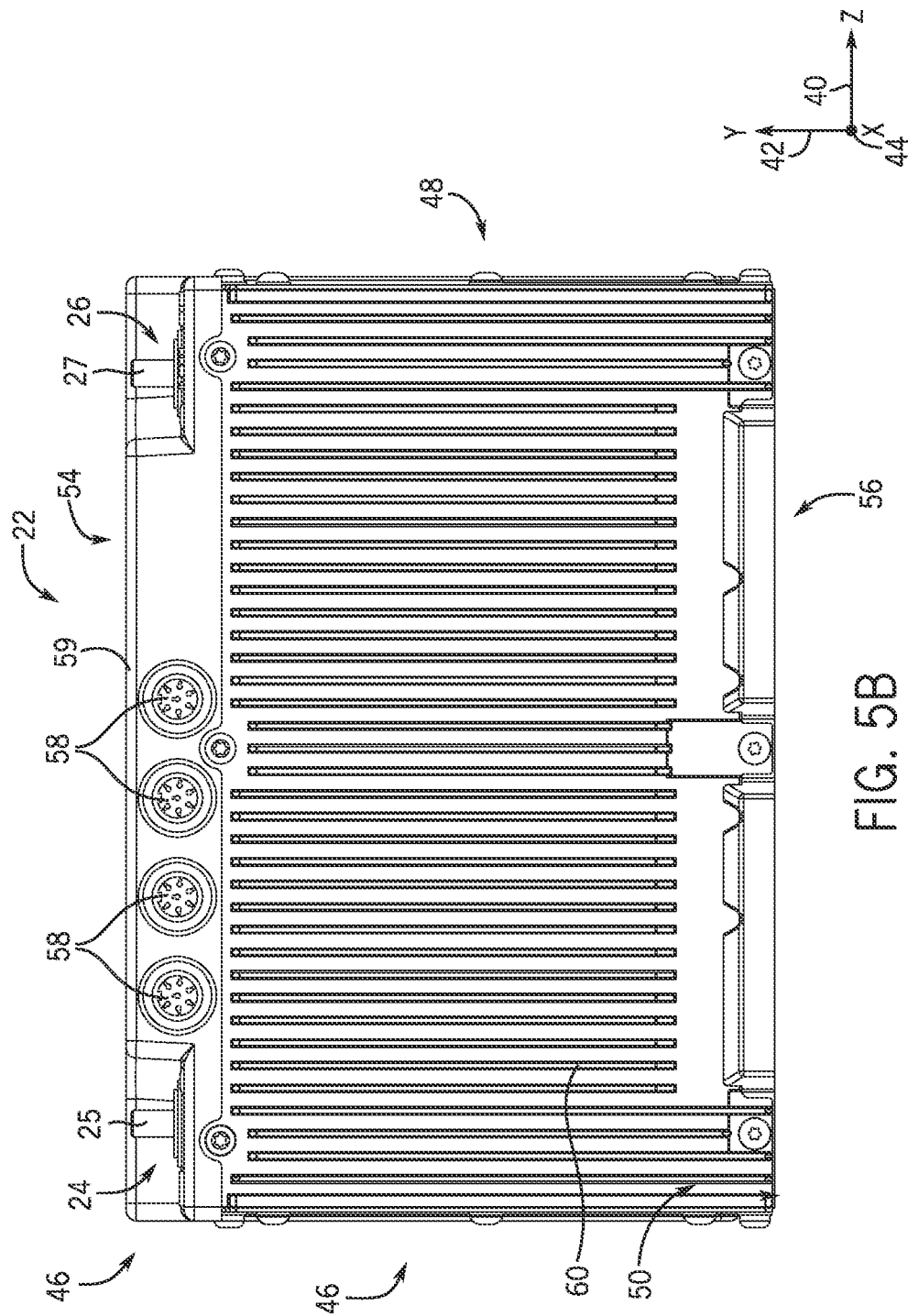

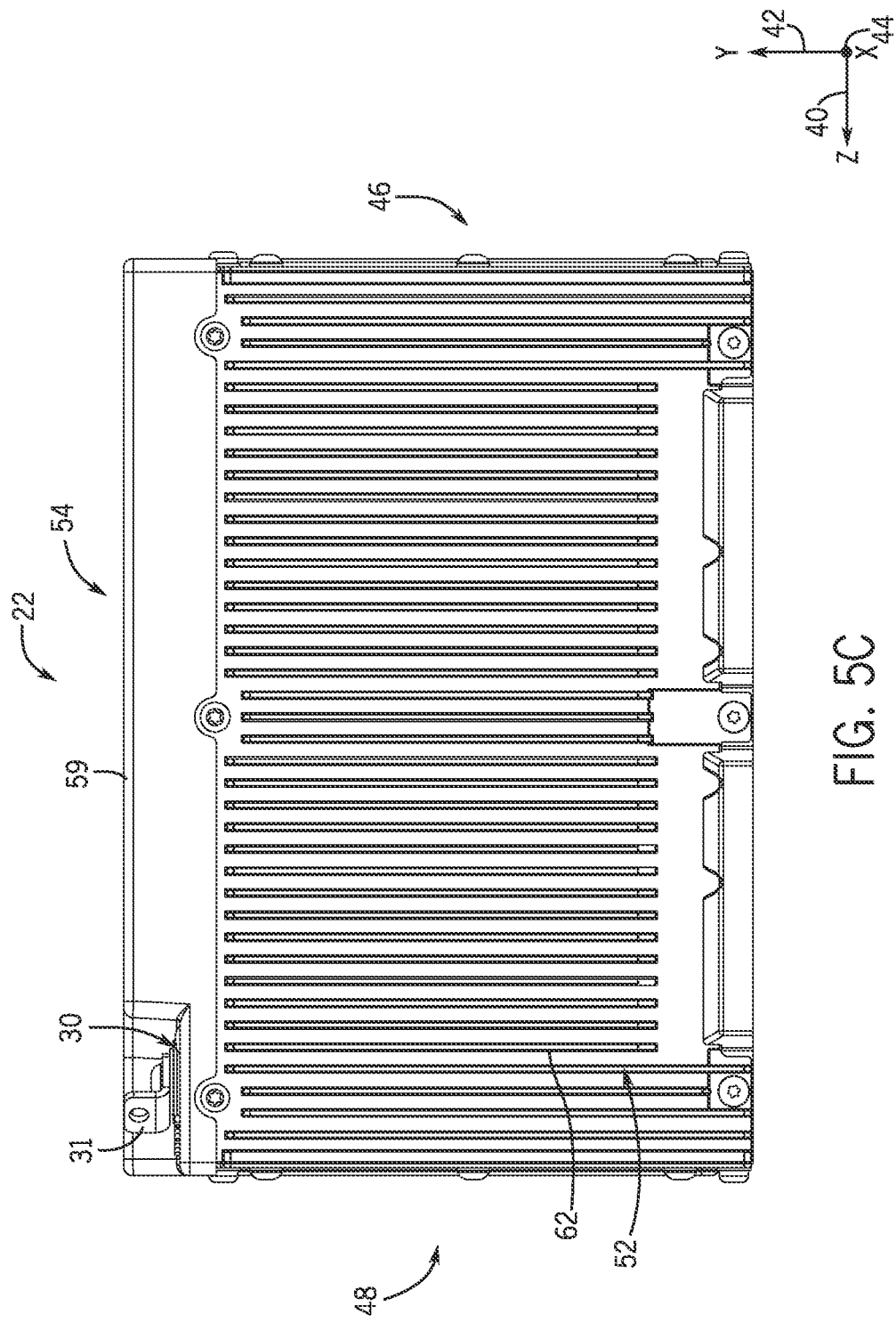

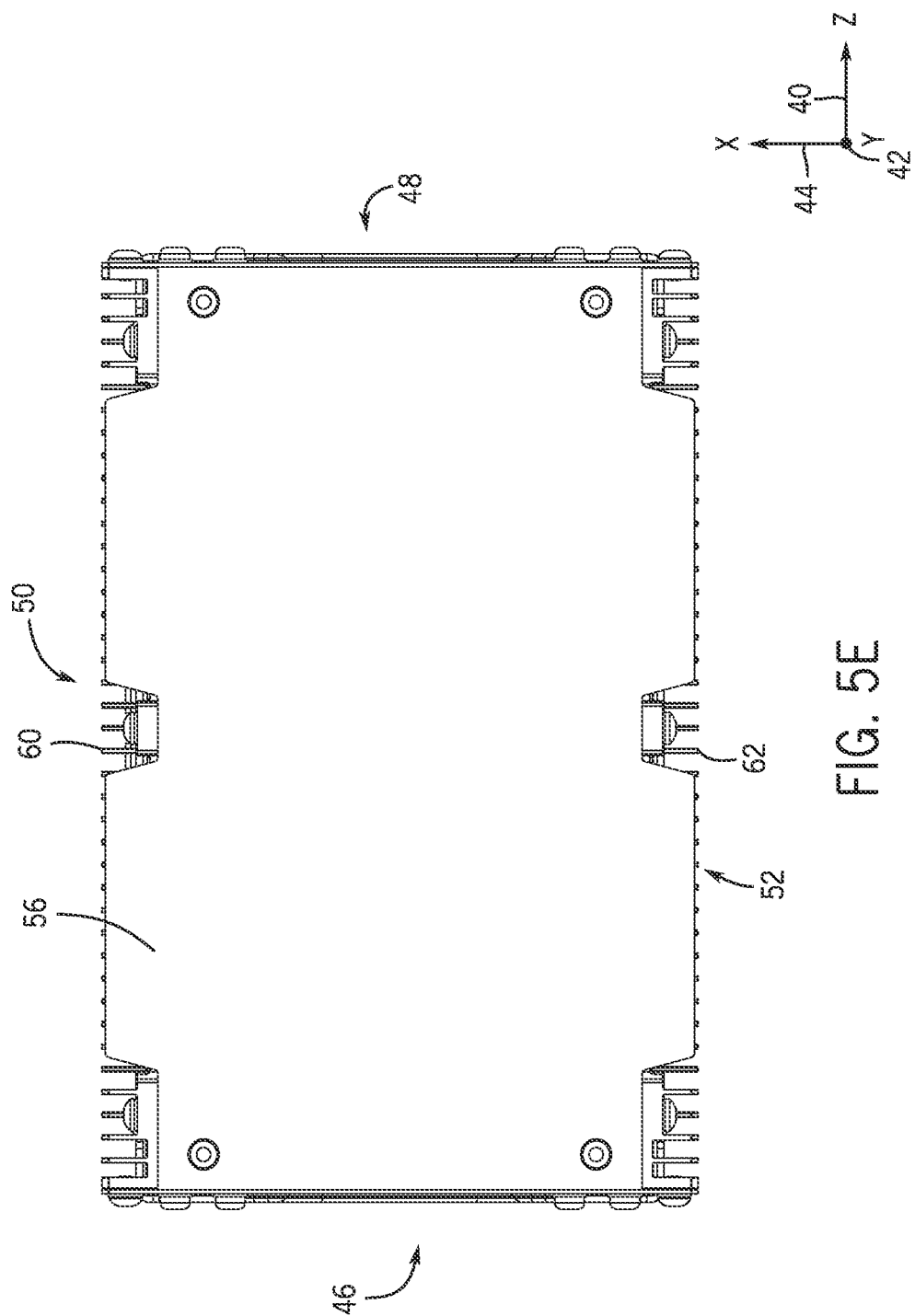

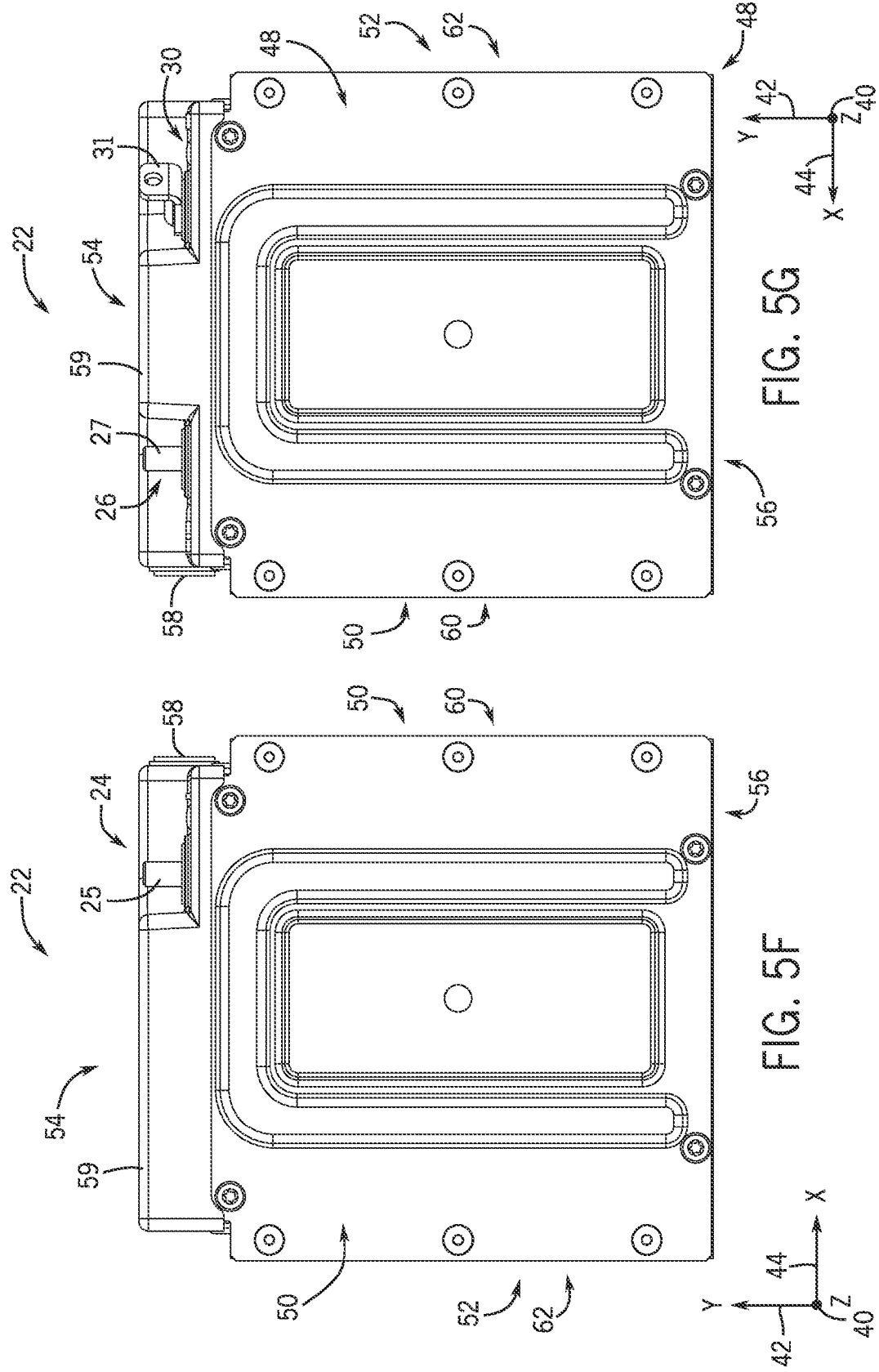

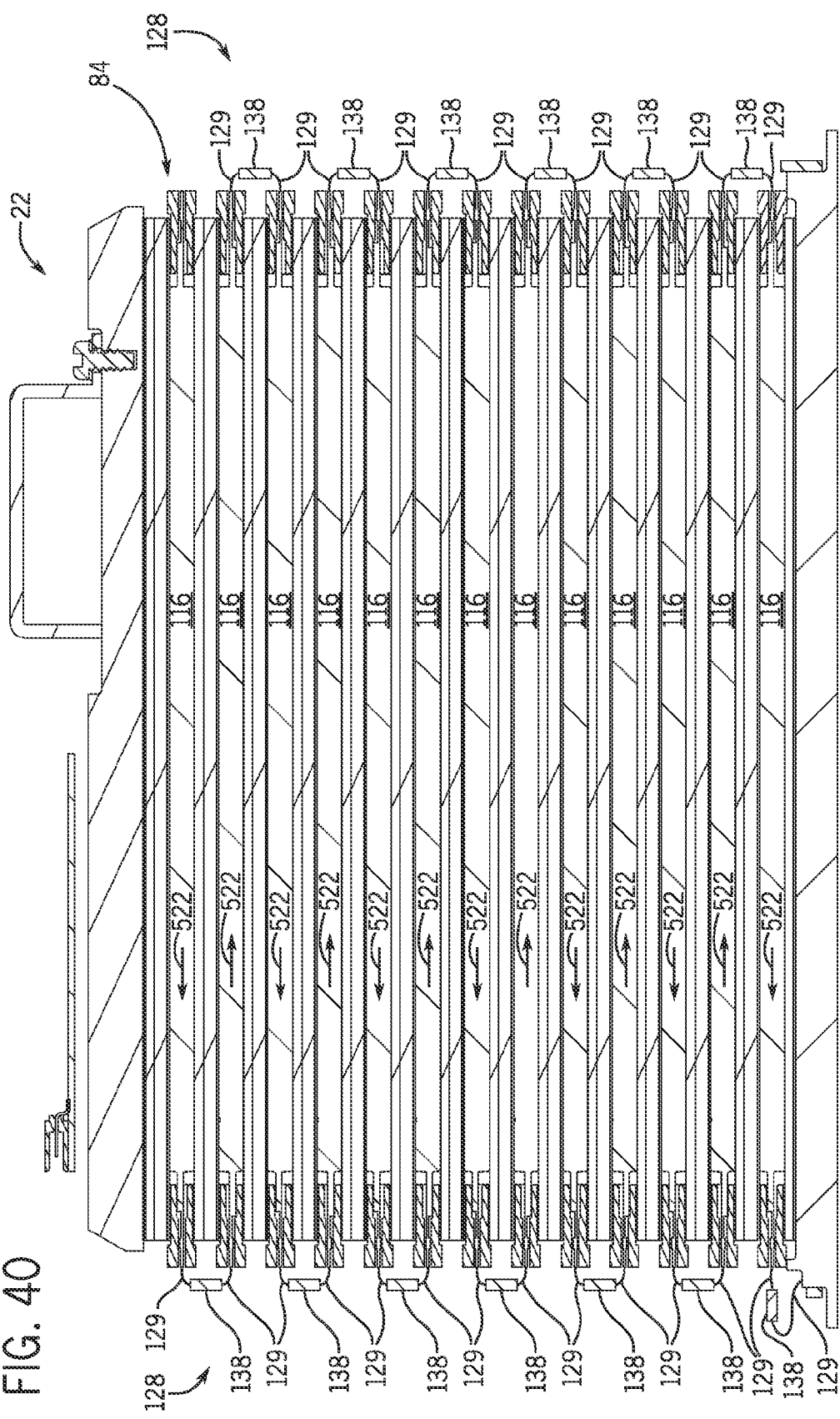

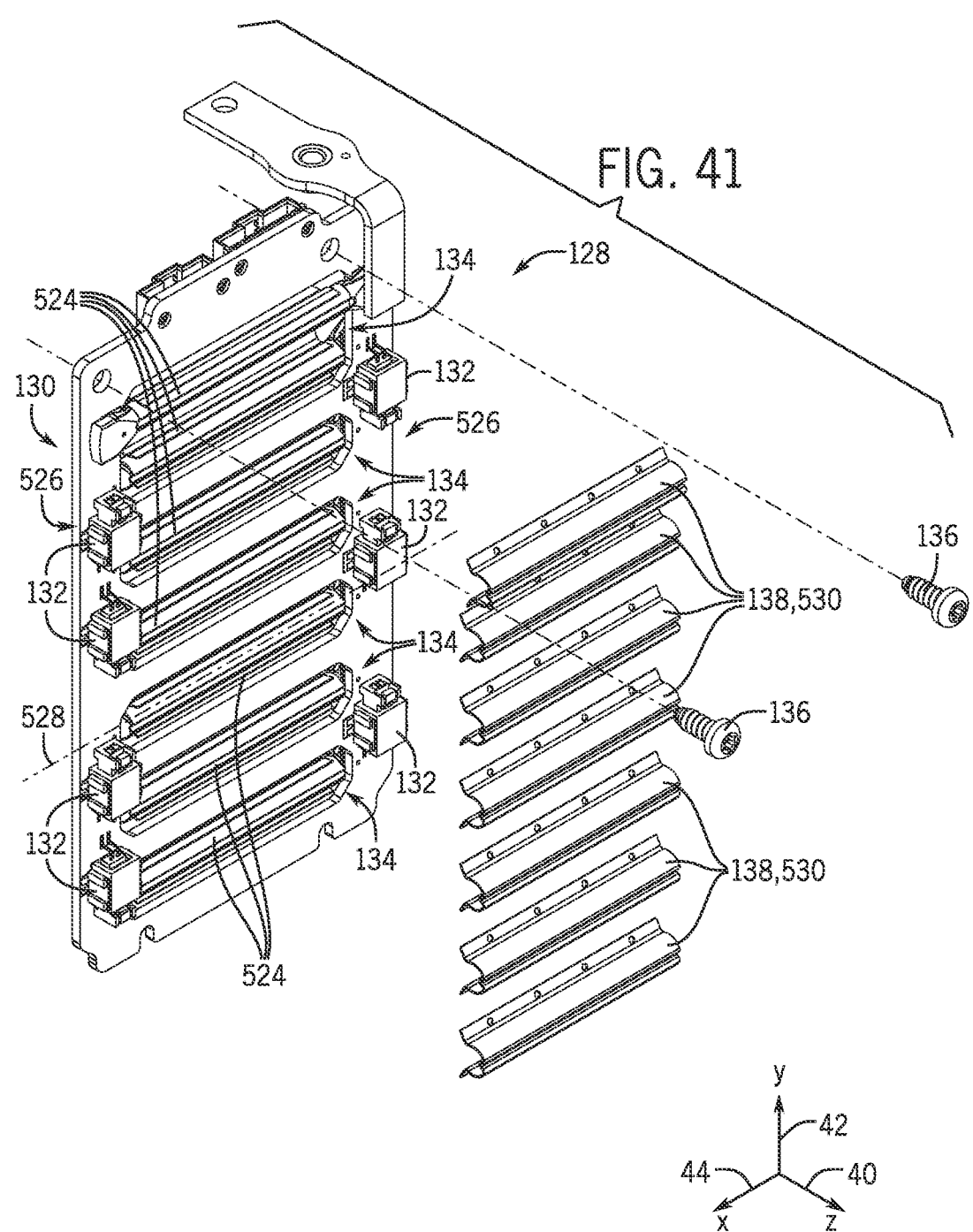

PRINTED CIRCUIT BOARD INTERCONNECT FOR CELLS IN A BATTERY SYSTEM

BACKGROUND

The present disclosure relates generally to the field of batteries and battery modules. More specifically, the present disclosure relates to battery cells that may be used in vehicular contexts, as well as other energy storage/expending applications.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. As will be appreciated by those skilled in the art, hybrid electric vehicles (HEVs) combine an internal combustion engine propulsion system and a battery-powered electric propulsion system, such as 48 volt or 130 volt systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of electric vehicles that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12 volt systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of PHEVs.

As xEV technology continues to evolve, there is a need to provide improved power sources (e.g., battery systems or modules) for such vehicles. For example, it is desirable to increase the distance that such vehicles may travel without the need to recharge the batteries. Additionally, it may also be desirable to improve the performance of such batteries and to reduce the cost associated with the battery systems.

SUMMARY

Certain embodiments commensurate in scope with the originally claimed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

The present disclosure relates to batteries and battery modules. More specifically, the present disclosure relates to all electrochemical and electrostatic energy storage technologies (e.g. ultracapacitors, nickel-zinc batteries, nickel-metal hydride batteries, and lithium batteries). Particular embodiments are directed to lithium ion battery cells that may be used in vehicular contexts (e.g., xEVs) as well as other energy storage/expending applications (e.g., energy storage for an electrical grid).

In another embodiment, a part of a flexible terminal on a battery cell extends away from the rest of the flexible terminal. This part may be directly coupled to a pad on the PCB, while the rest of the flexible terminal is wrapped and secured around the interconnects attached to the PCB.

In another embodiment, the top and bottom interconnects attached to the PCB are connected via bus bars to a terminal block attached to the PCB. The battery cells are all connected in series via the interconnects, and the connection of the interconnects to the terminal block allows access to the voltage produced by the series connection of the battery cells.

In yet another embodiment, the battery cells are divided into groups. The interconnects within each battery cell group are connected in parallel, and each battery cell groups is connected via bus bars in series to a terminal block attached to the PCB.

DRAWINGS

These and other features, aspects, and advantages of the present disclosure will become better understood when the following detailed description is read with reference to the accompanying drawings in which like characters represent like parts throughout the drawings, wherein:

FIG. 5B is a first side view of the battery module of FIG. 5A, in accordance with an embodiment of the present approach;

FIG. 5C is a second side view of the battery module of FIG. 5A, in accordance with an embodiment of the present approach;

FIG. 5E is a bottom view of the battery module of FIG. 5A, in accordance with an embodiment of the present approach;

FIG. 5F is a back view of the battery module of FIG. 5A, in accordance with an embodiment of the present approach;

FIG. 5G is a front view of the battery module of FIG. 5A, in accordance with an embodiment of the present approach;

Figure 7:
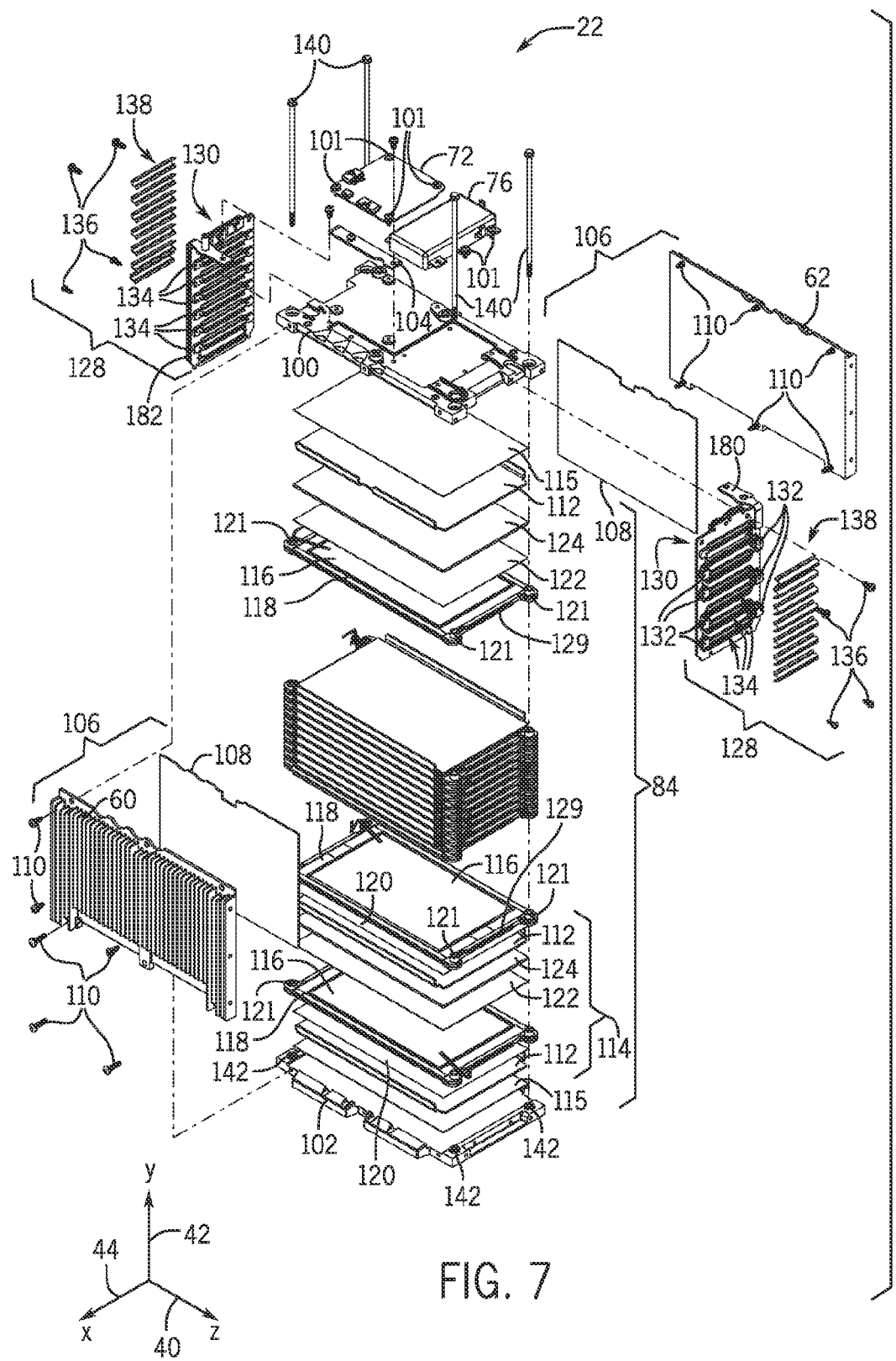
FIG. 7 is another exploded view of the battery module embodiment of FIGS. 5A-G, in accordance with an embodiment of the present approach.
Figure 23:
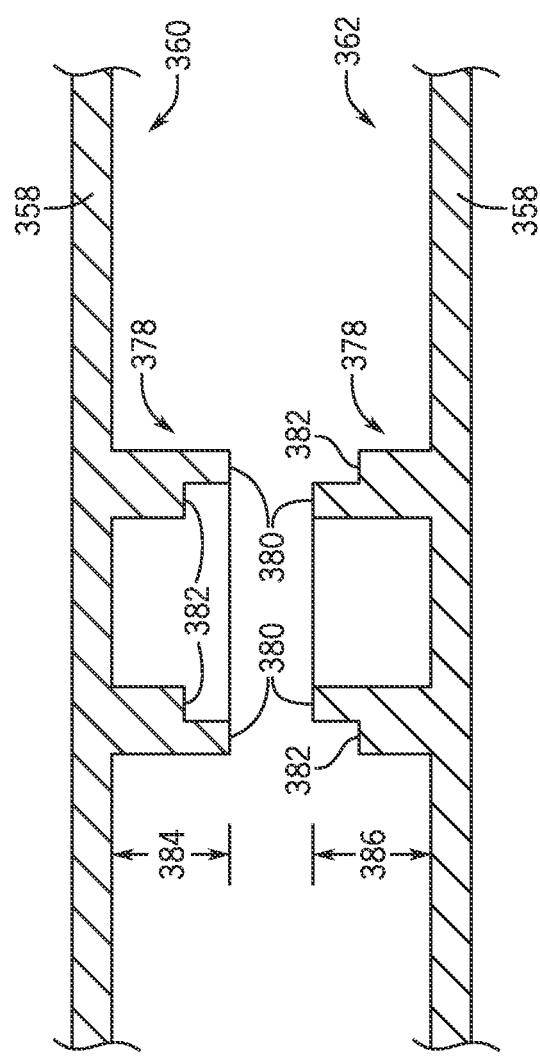
Figure 24:
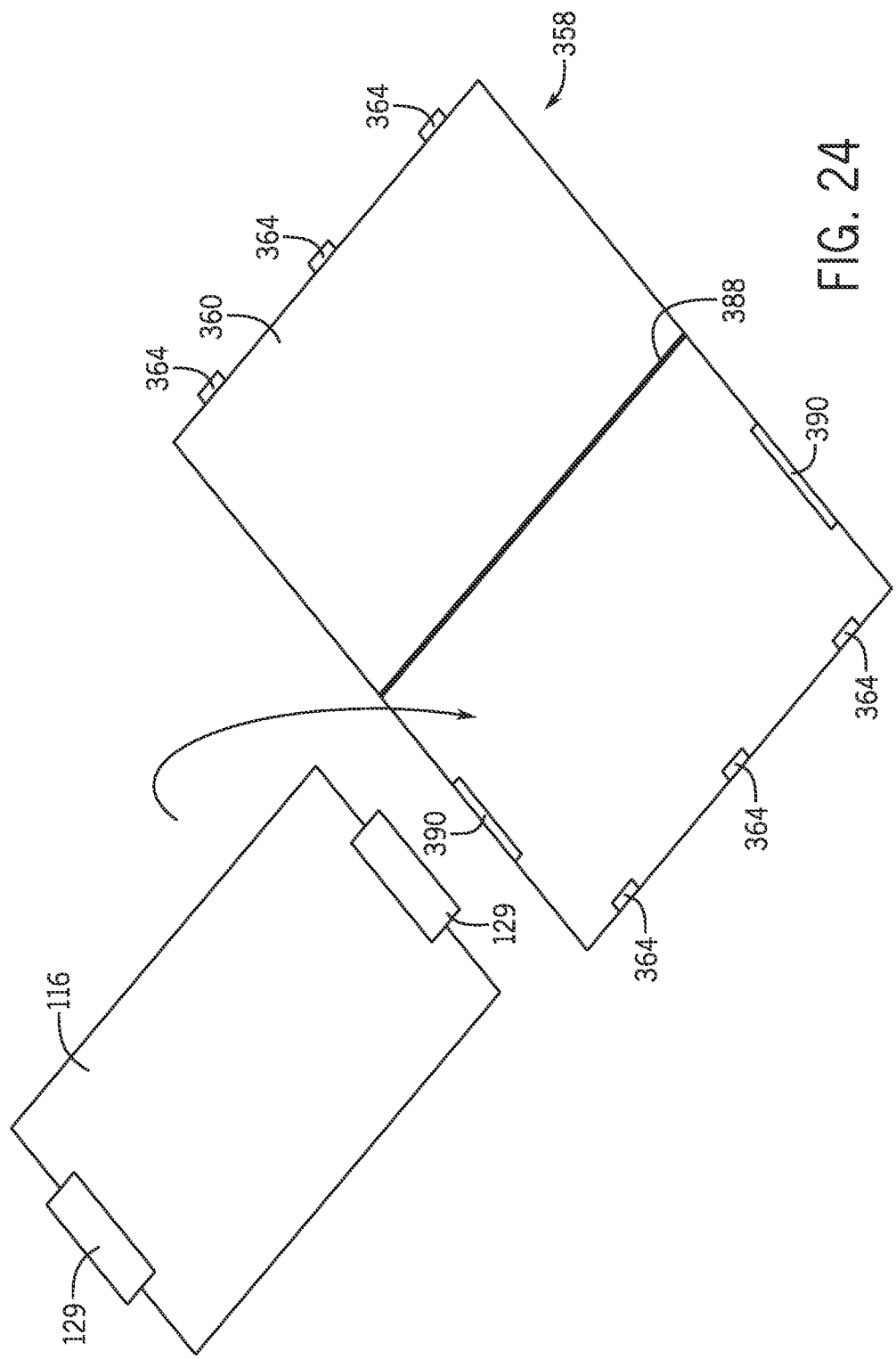
Figure 25:
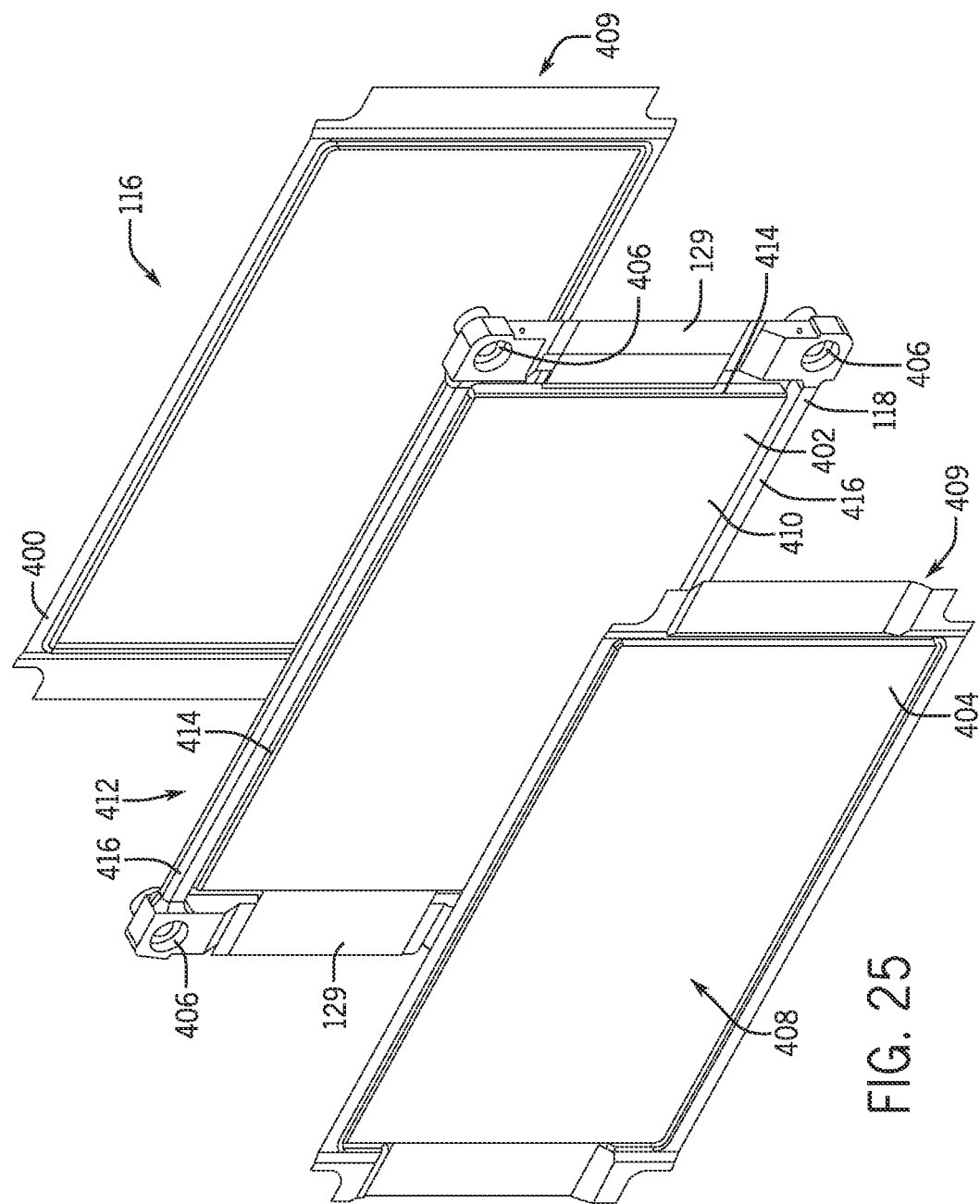
Figure 26:
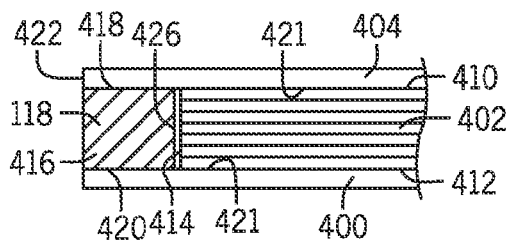
Figure 27:
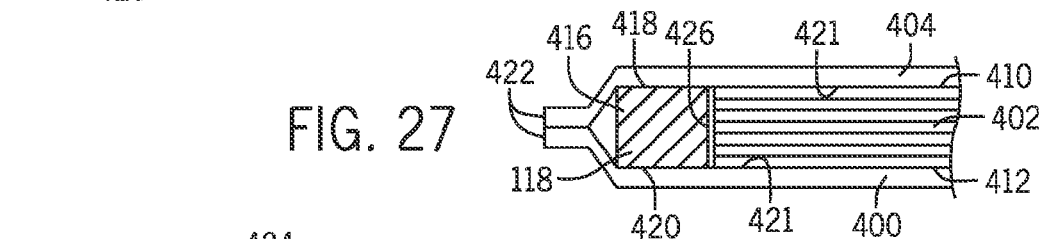
Figure 28:
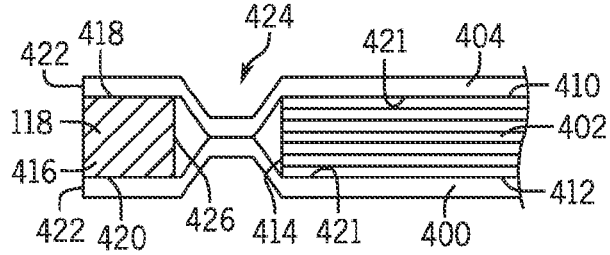
Figure 29:
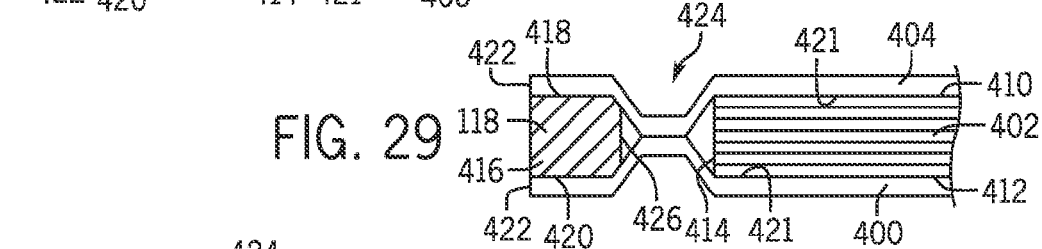
Figure 30:
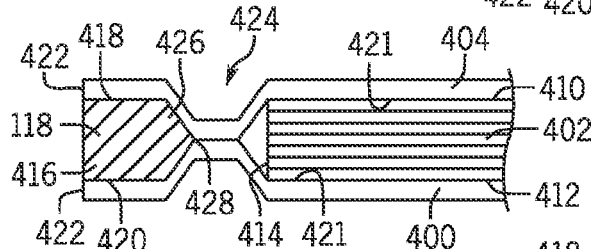
Figure 31:
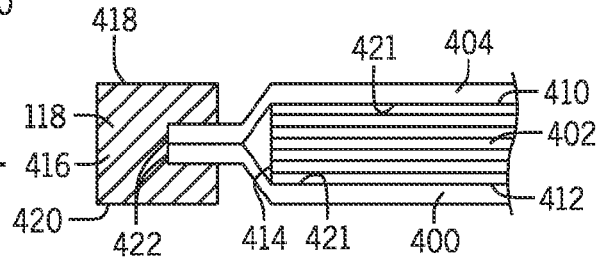
Figure 32:
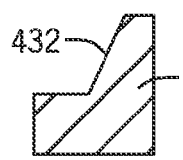
Figure 33:
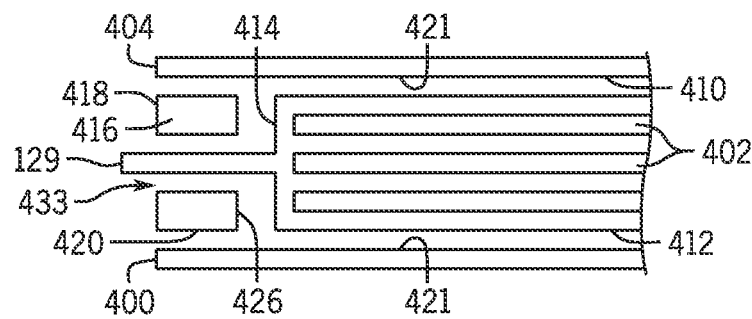
Figure 34:
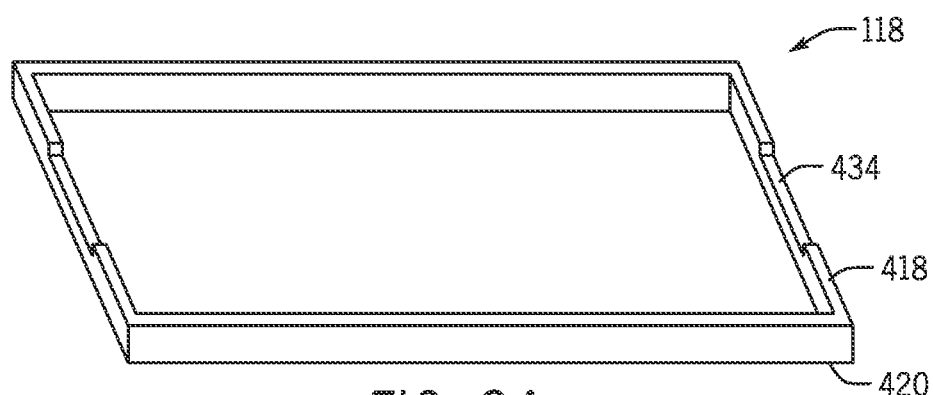
Figure 35:
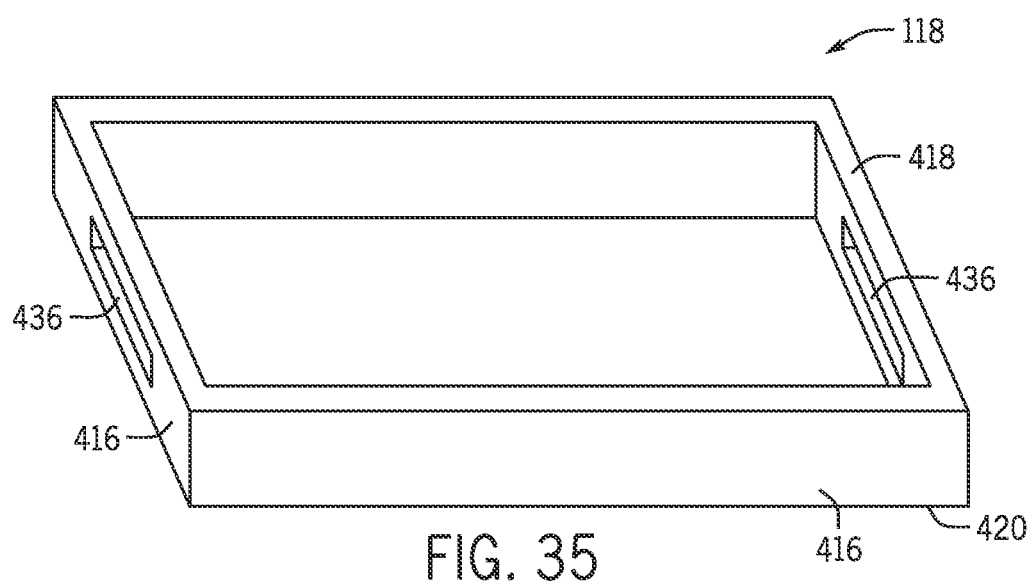
Figure 36:
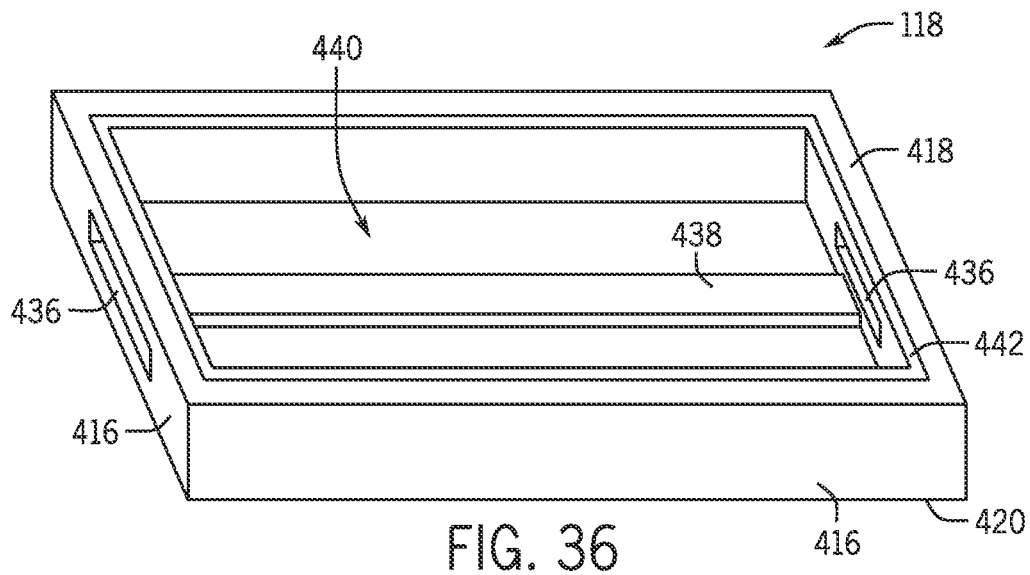
Figure 37:
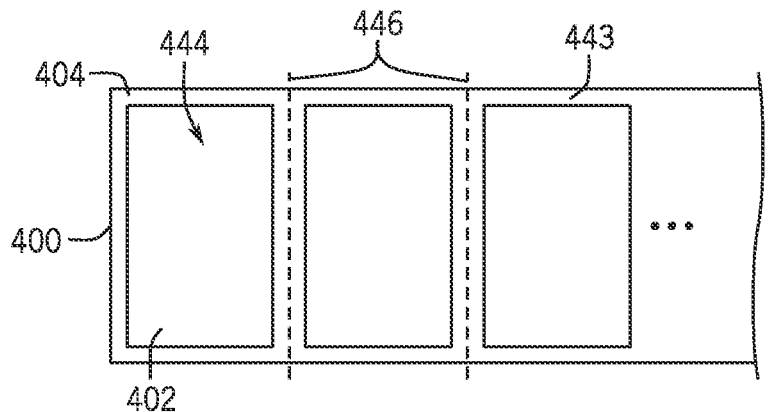
Figure 38:
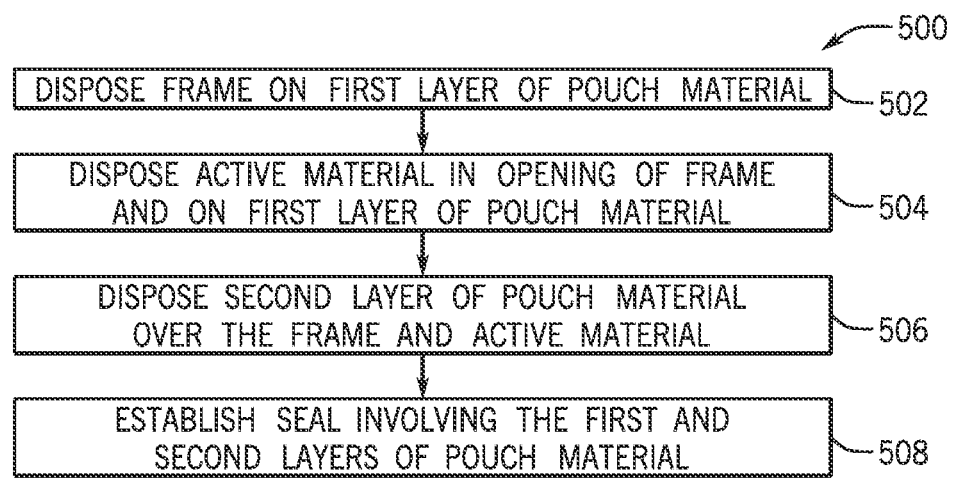
Figure 39:
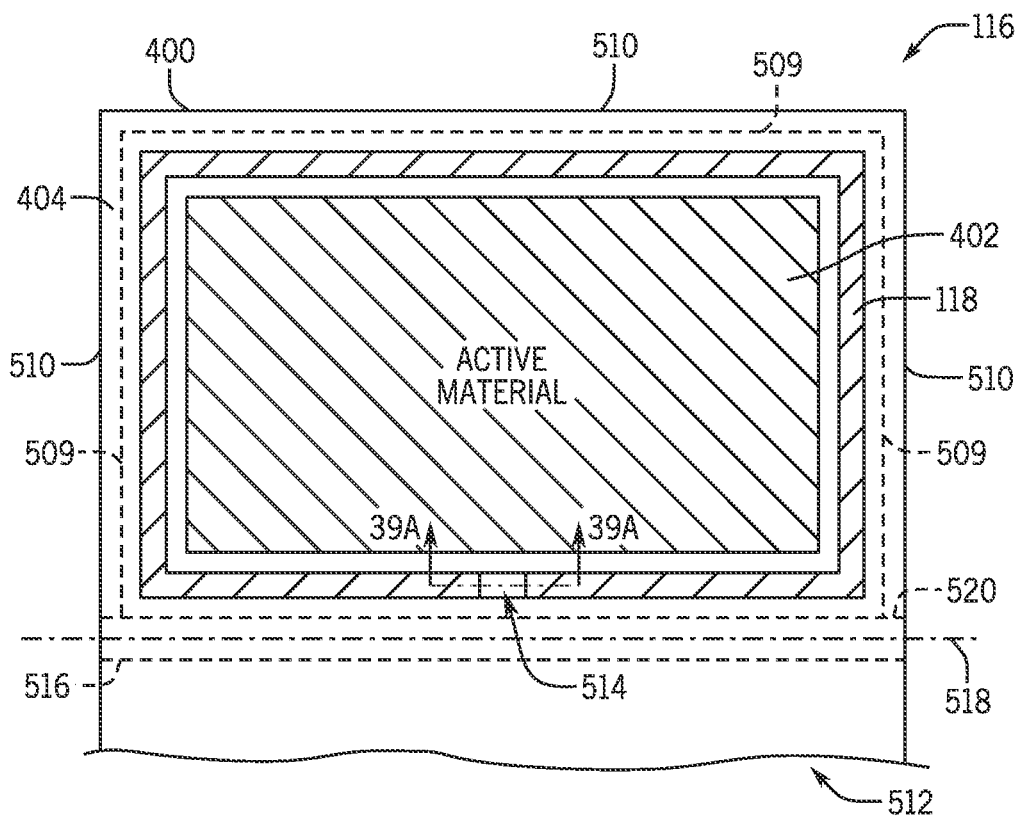
Figure 39A:
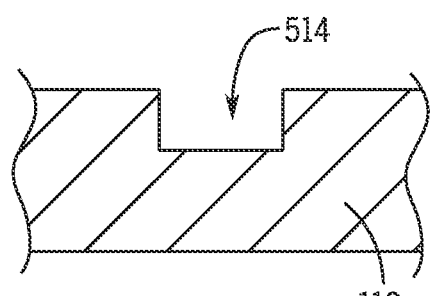
Figure 42:
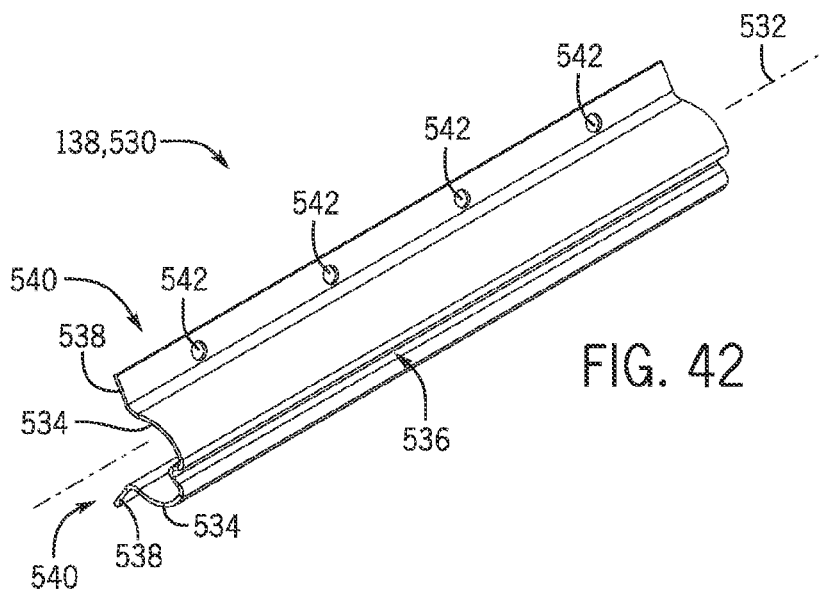
Figure 43:
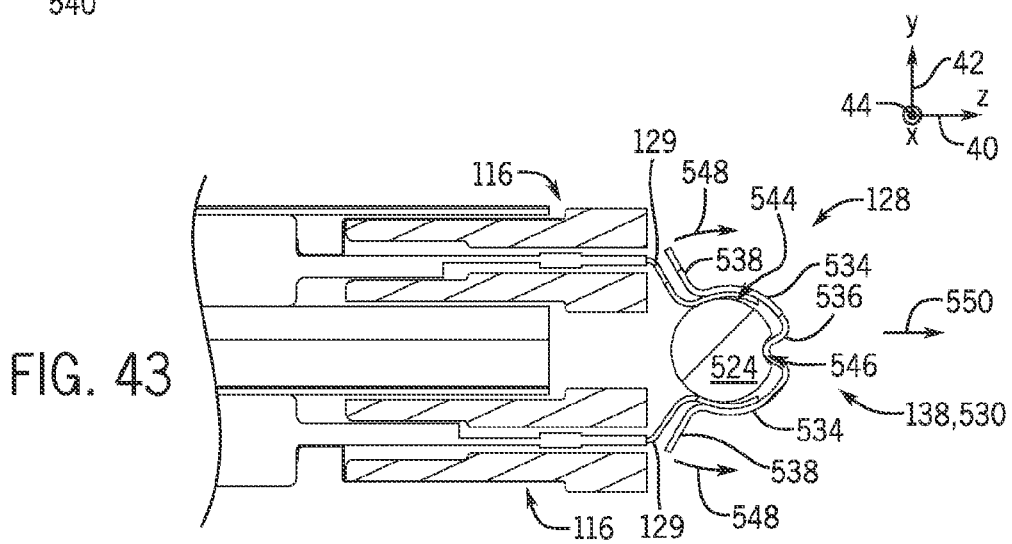
Figure 44:
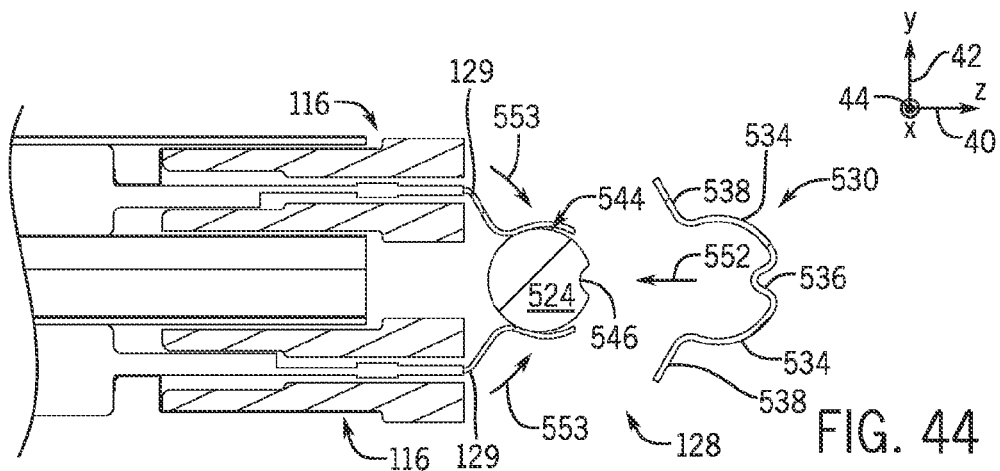
Figure 45:
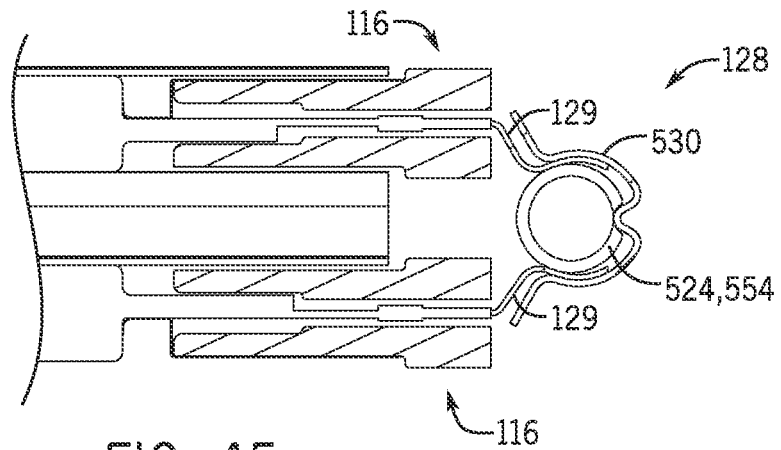
Figure 46:
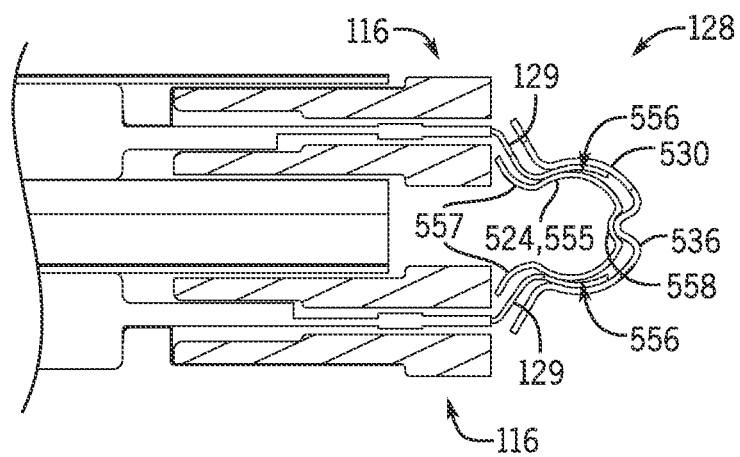
Figure 47:
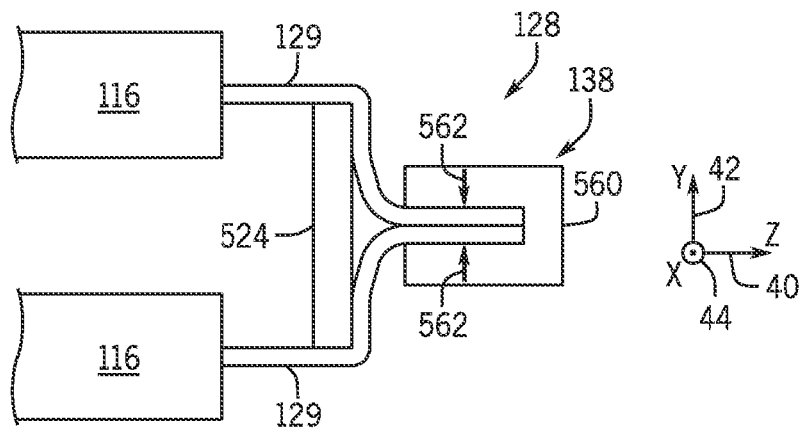
Figure 48:
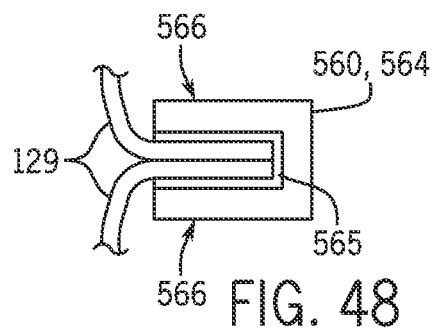
Figure 49:
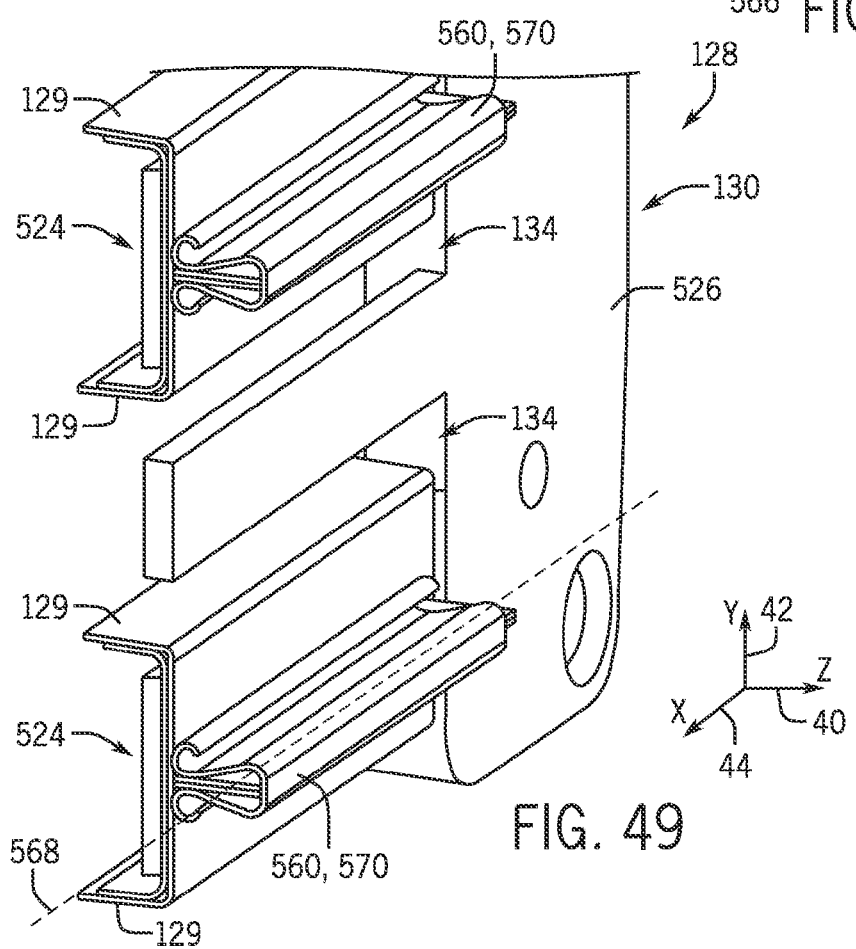
Figure 50:
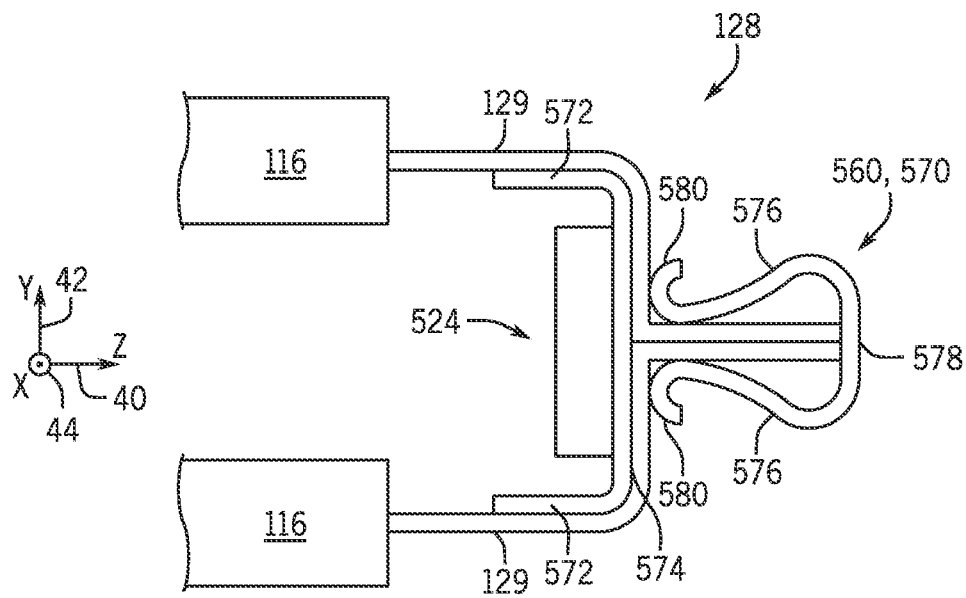
Figure 51:
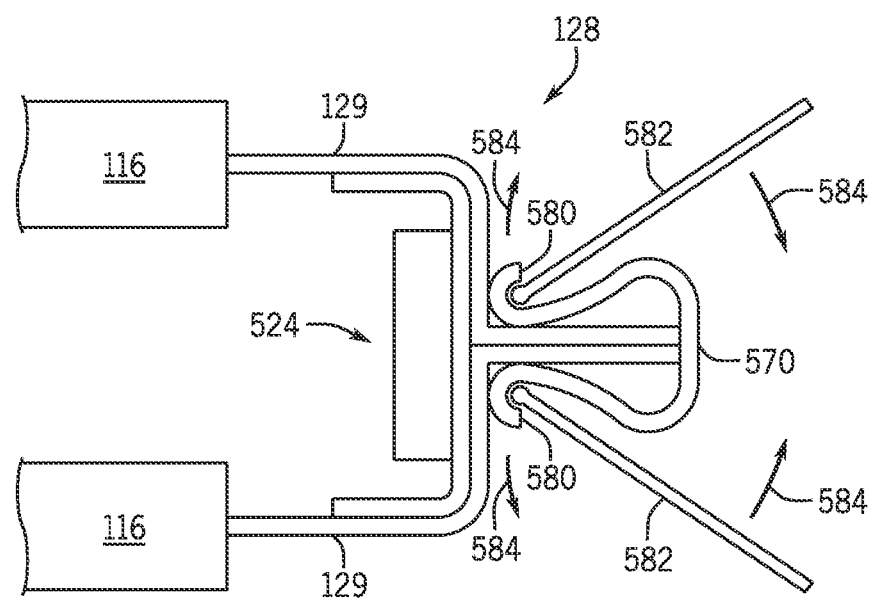
Figure 52:
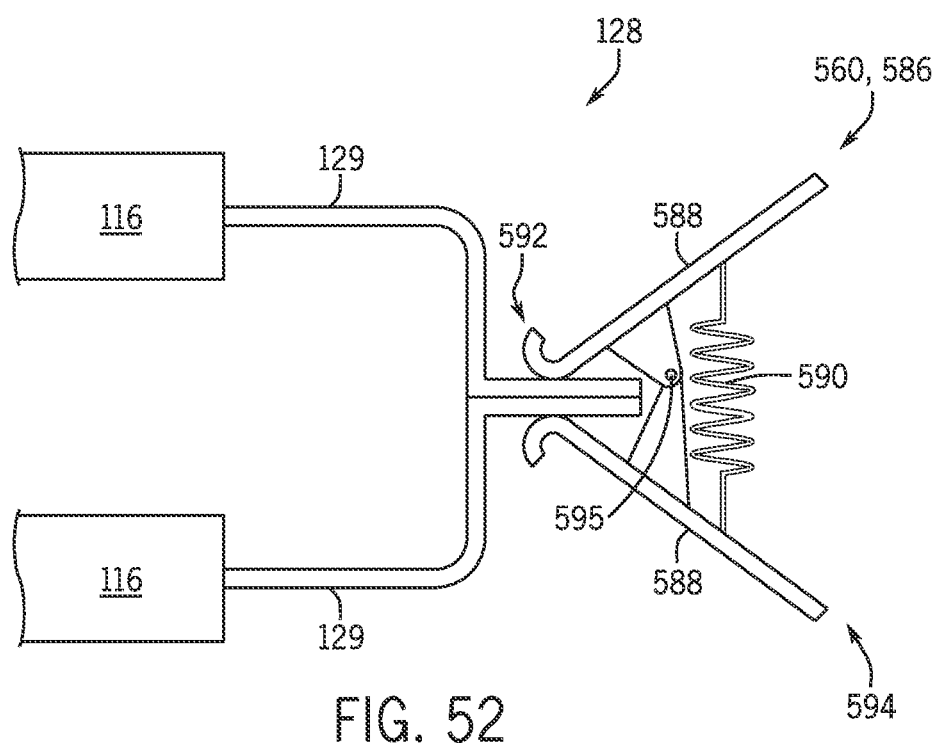
Figure 53:
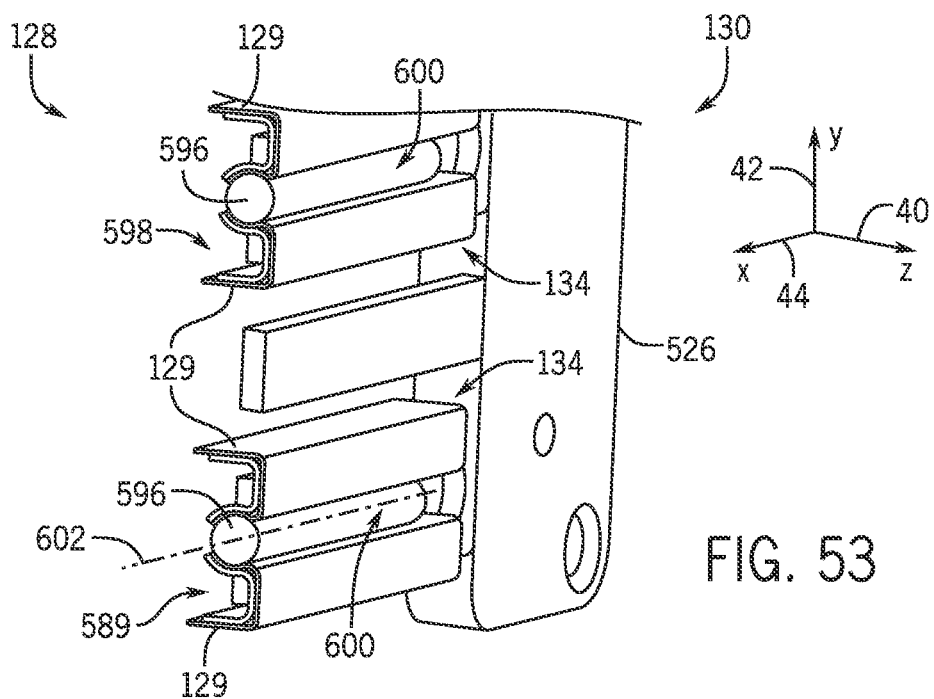
Figure 54:
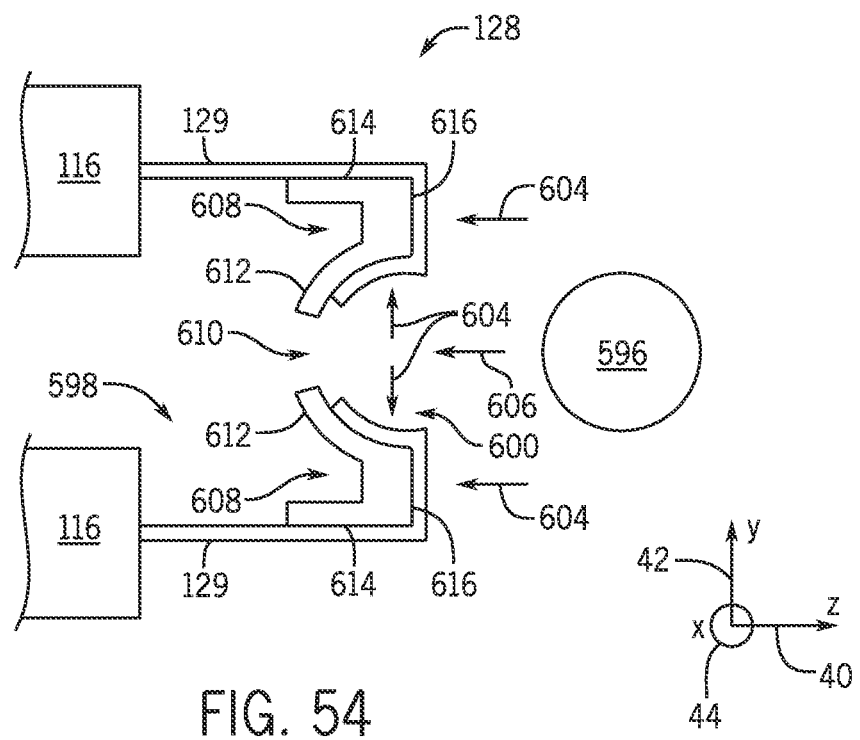
Figure 55:
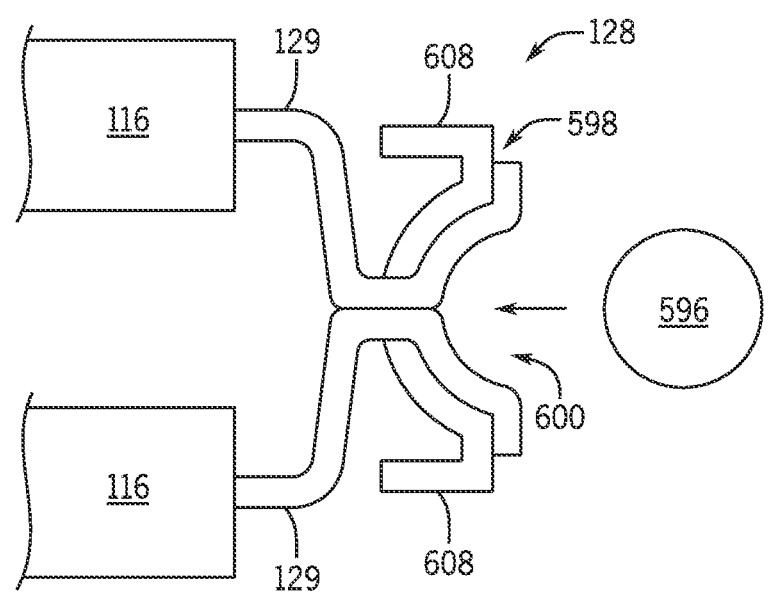
Figure 56:
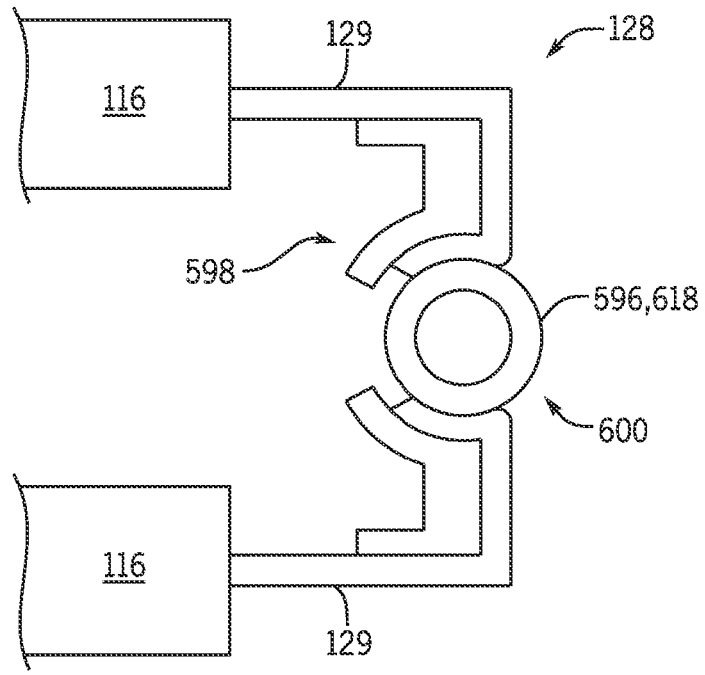
Figure 57:
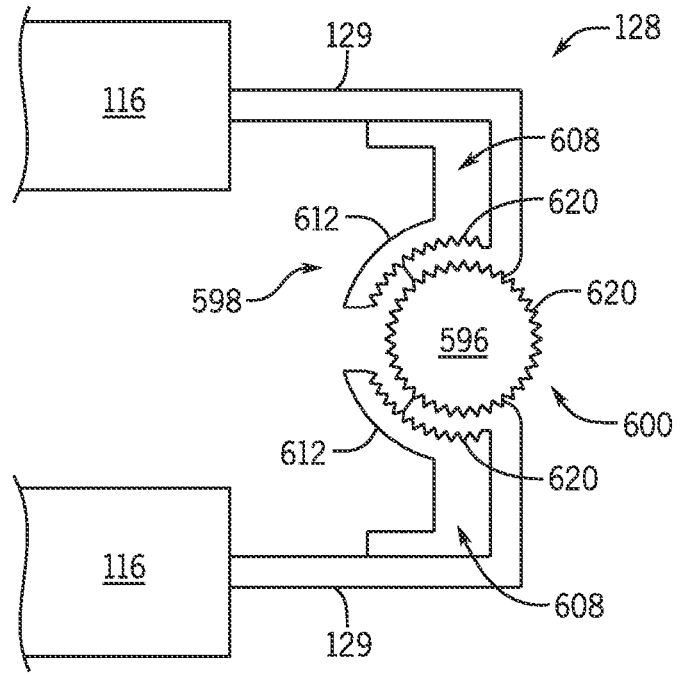
Figure 58:
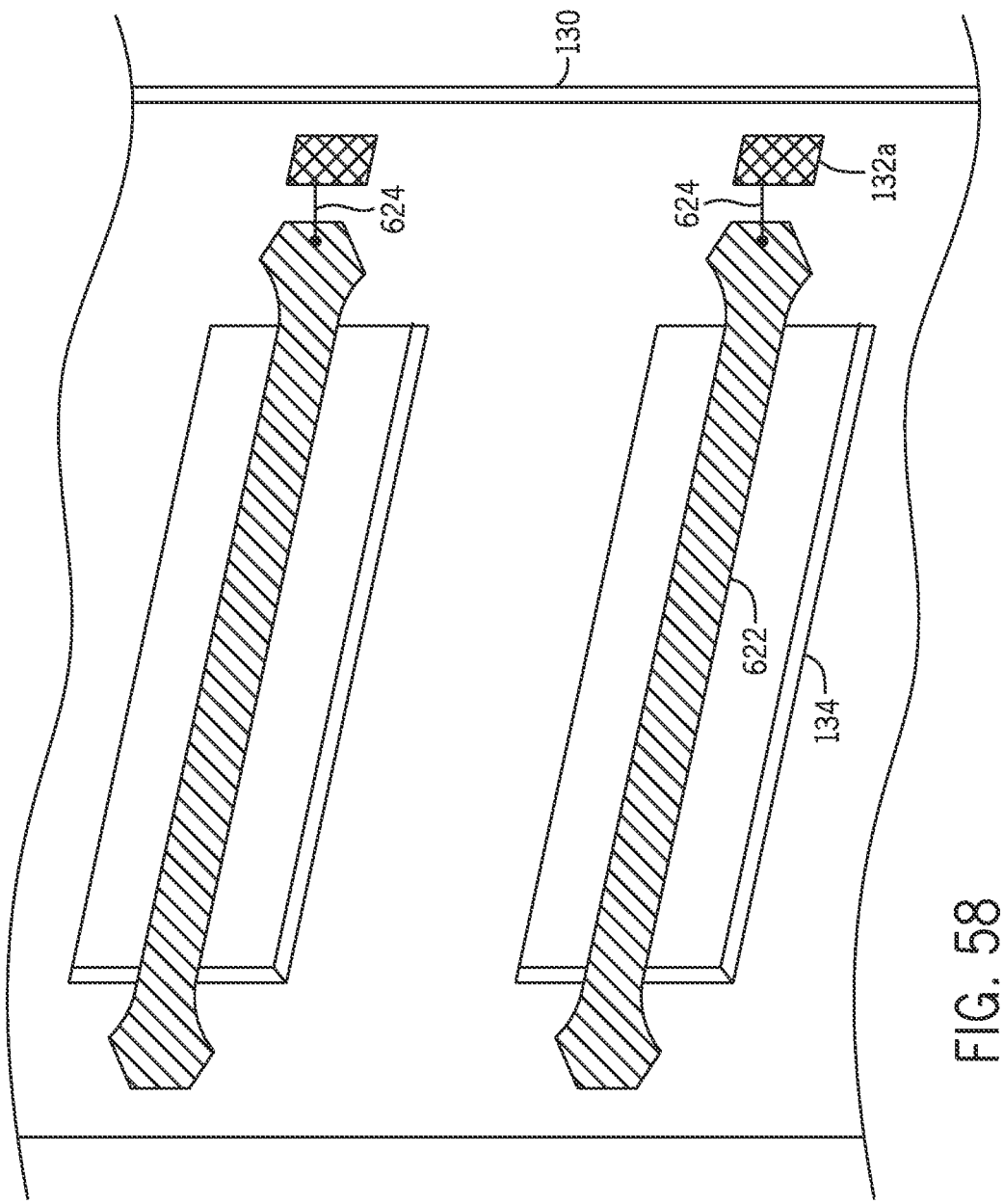
Figure 59:
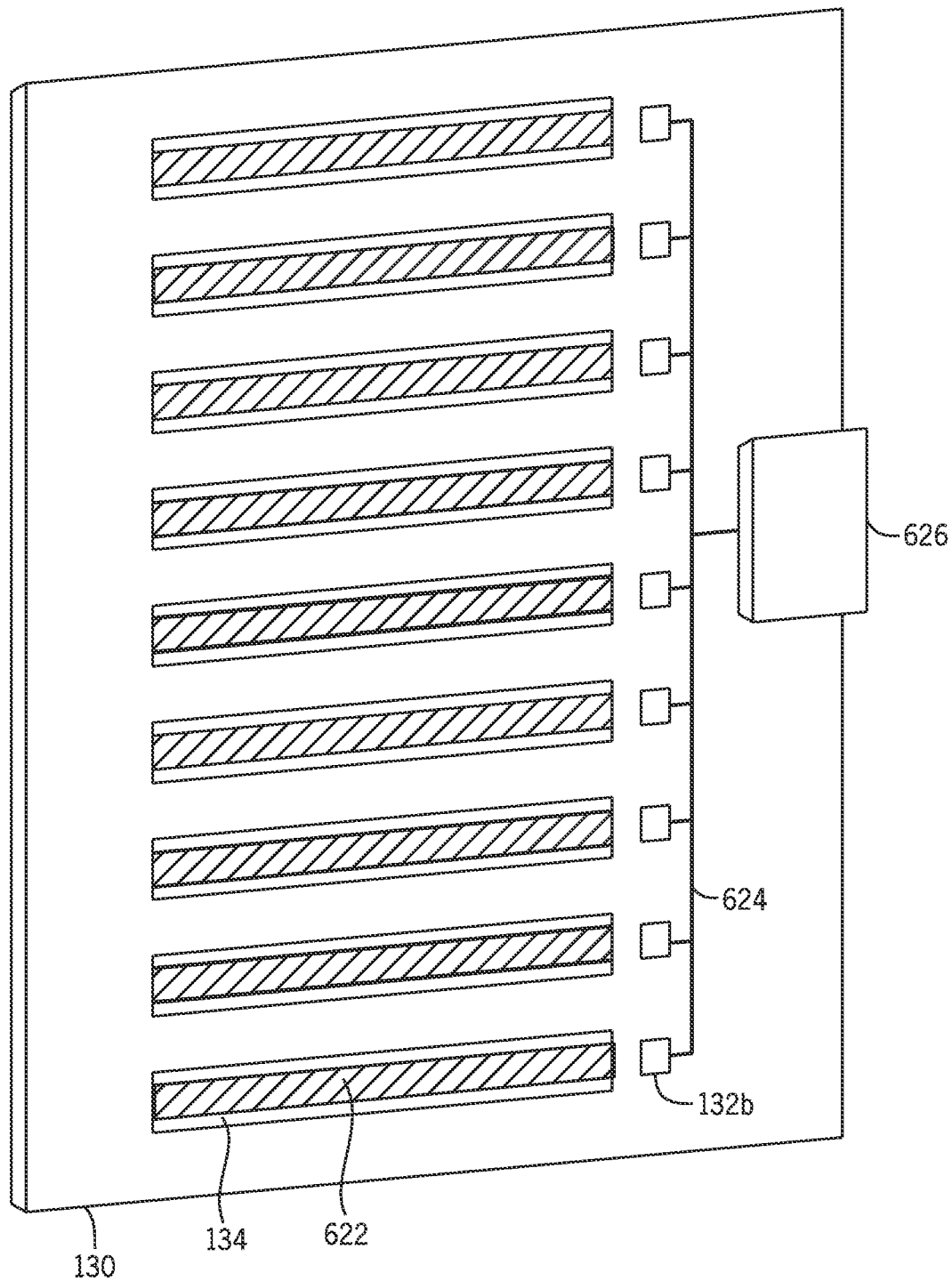
Figure 60:
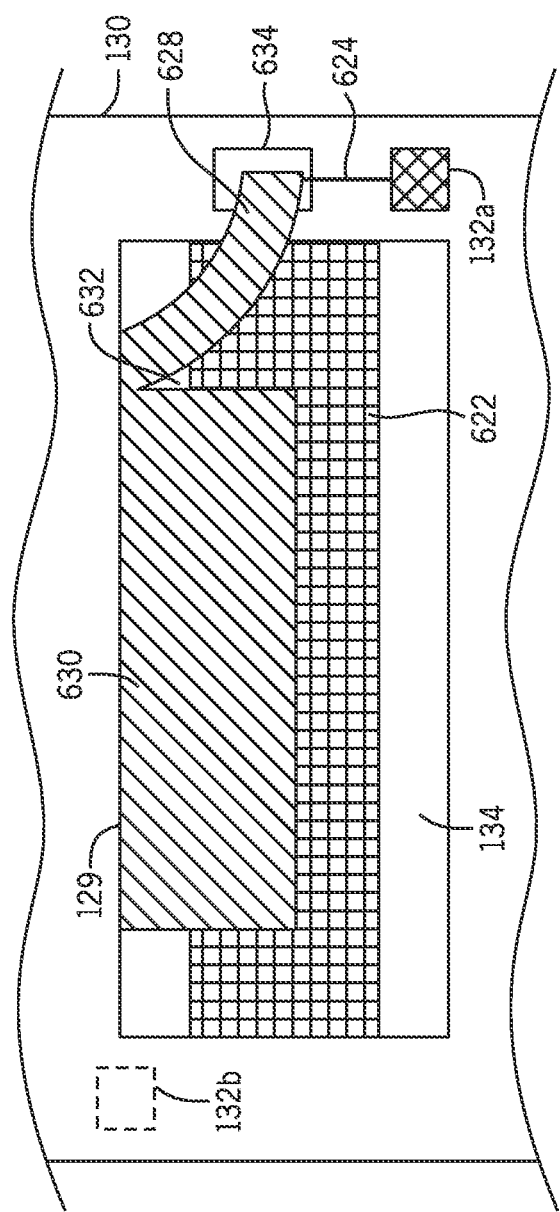
Figure 61:
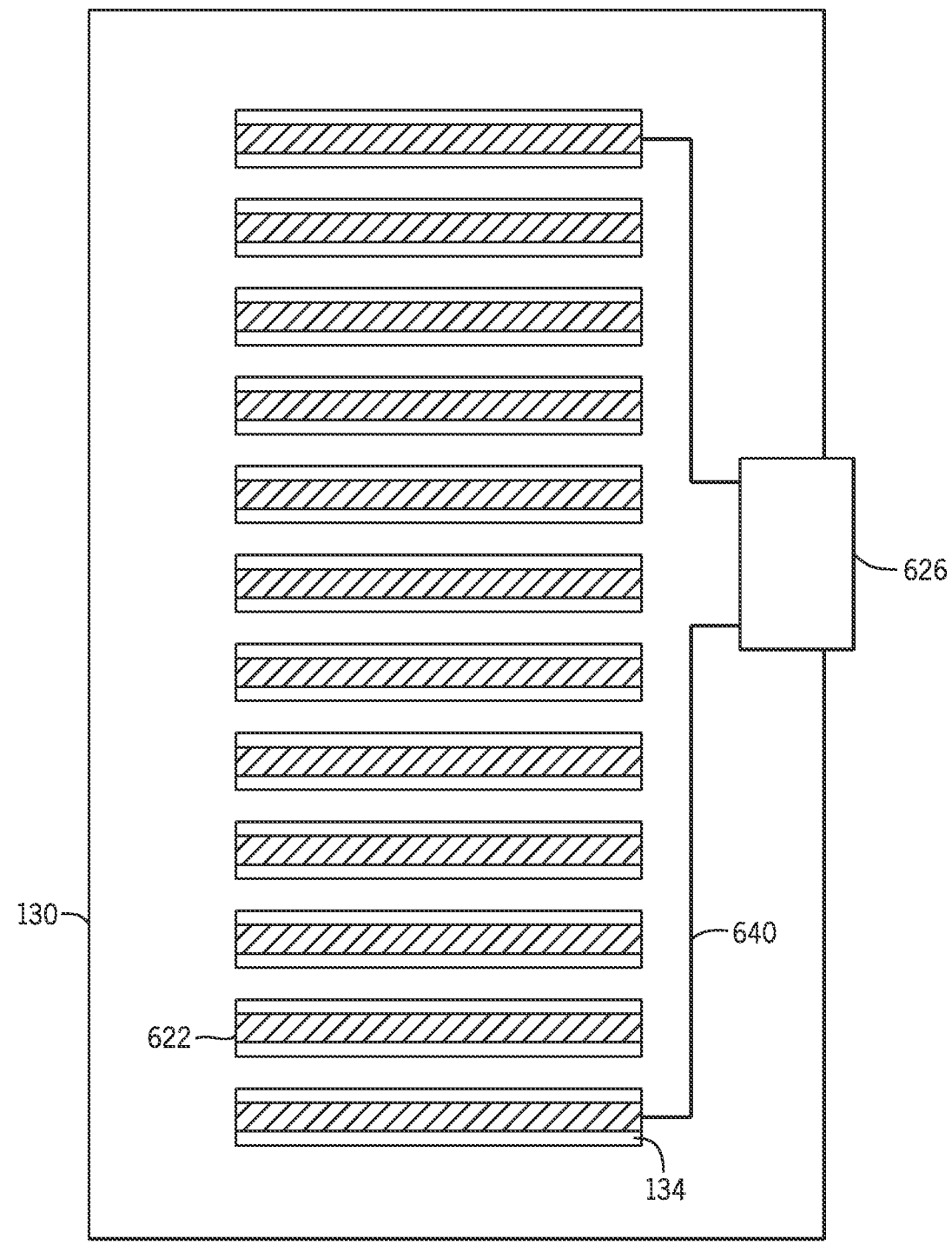
Figure 62:
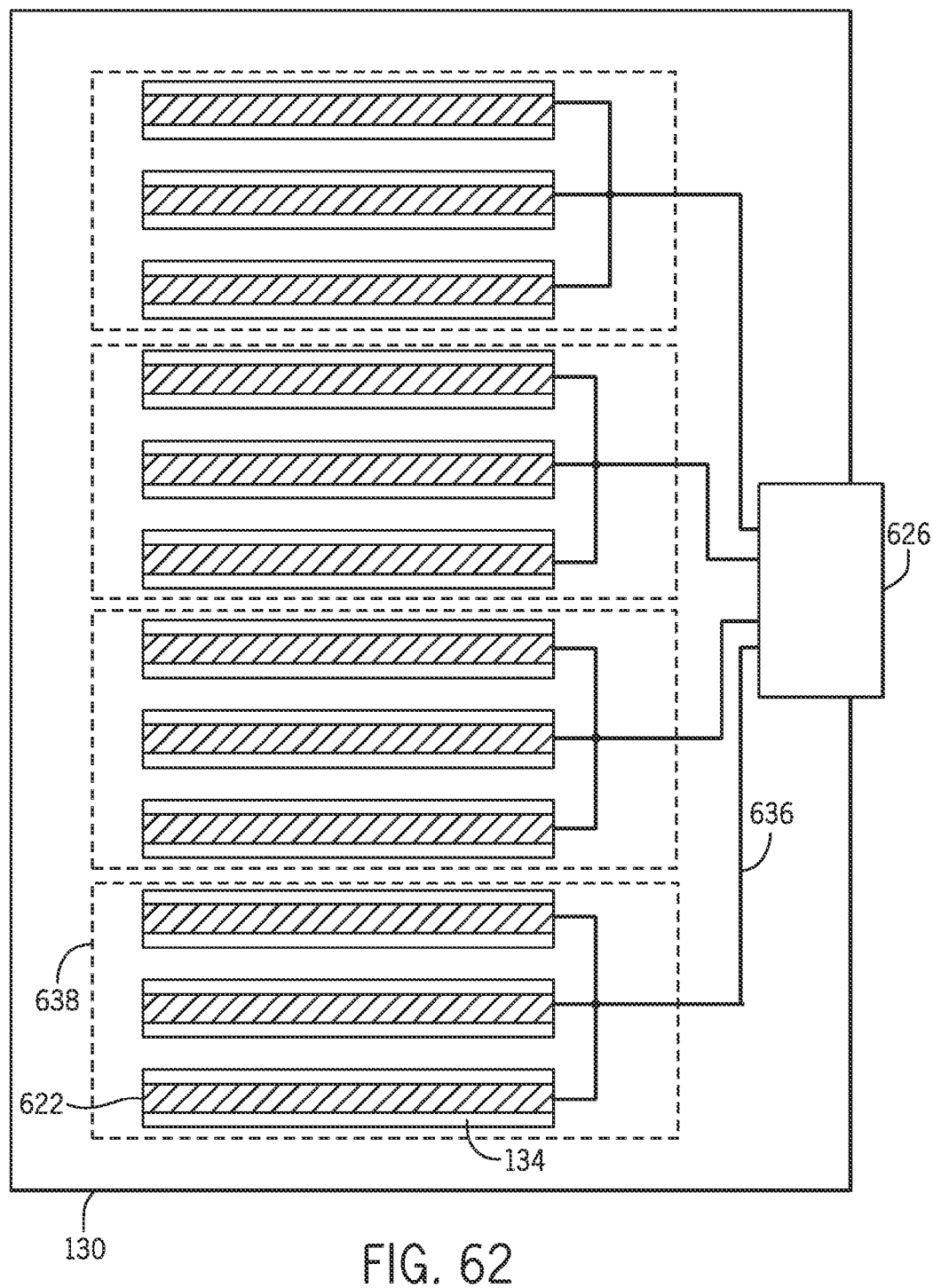
Figure 63:
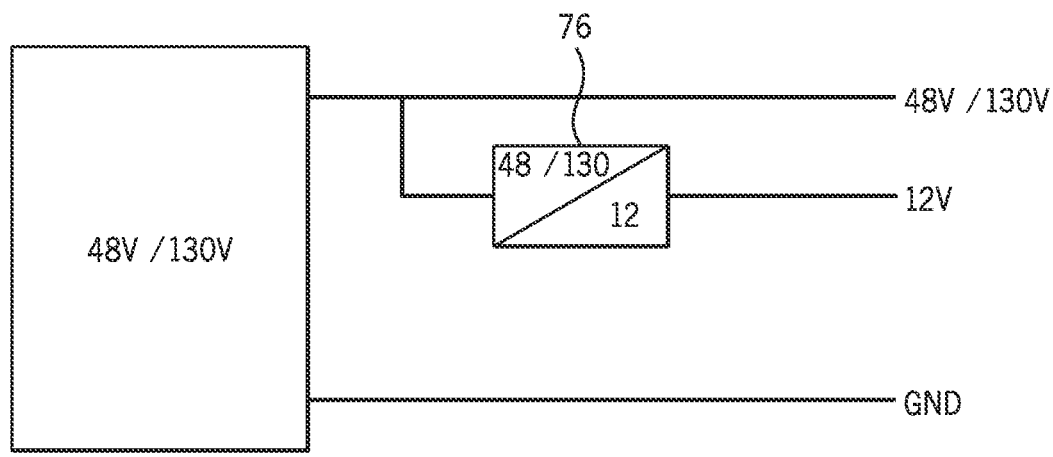
Figure 64:
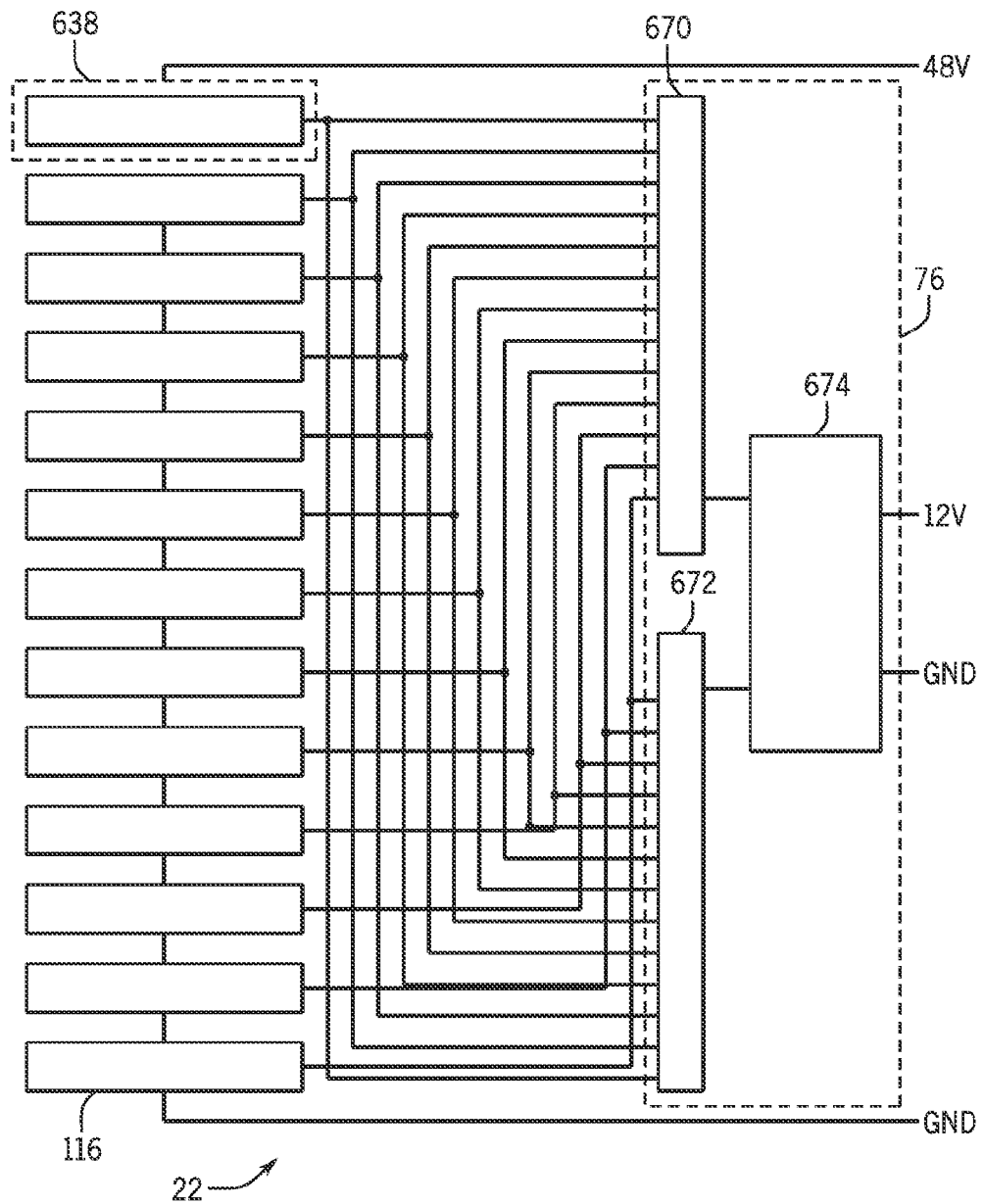
Figure 65:
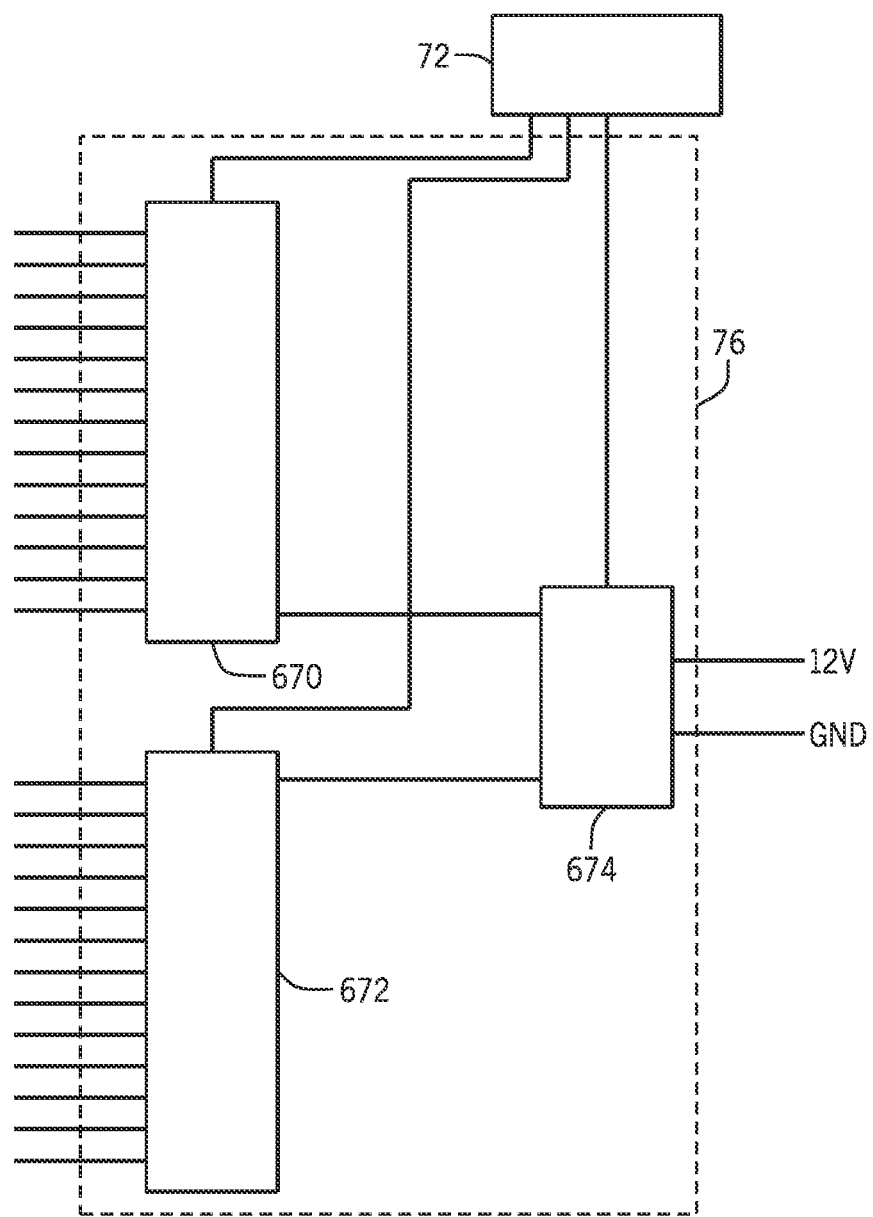
Figure 66:
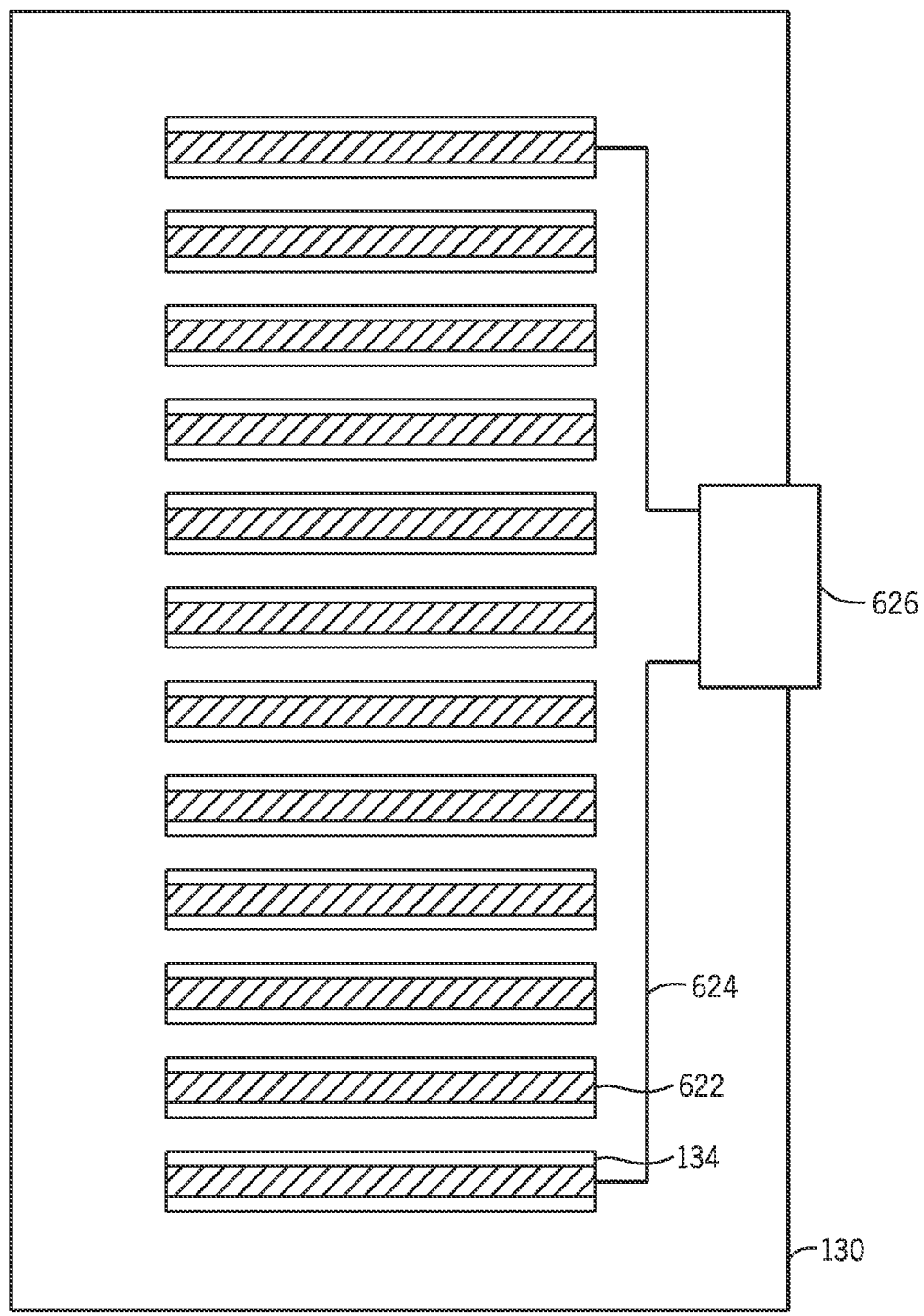
Figure 67:
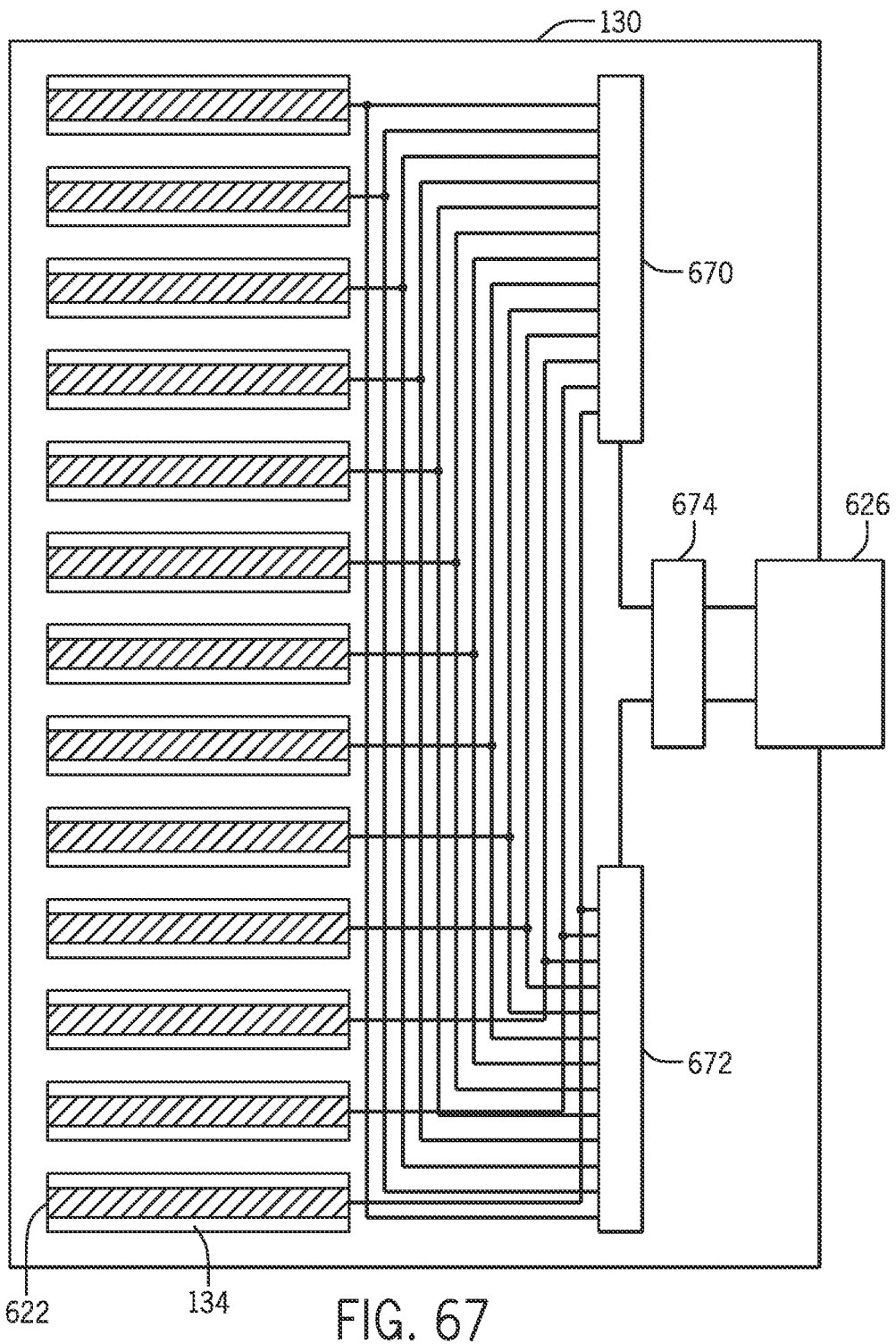
Figure 68:
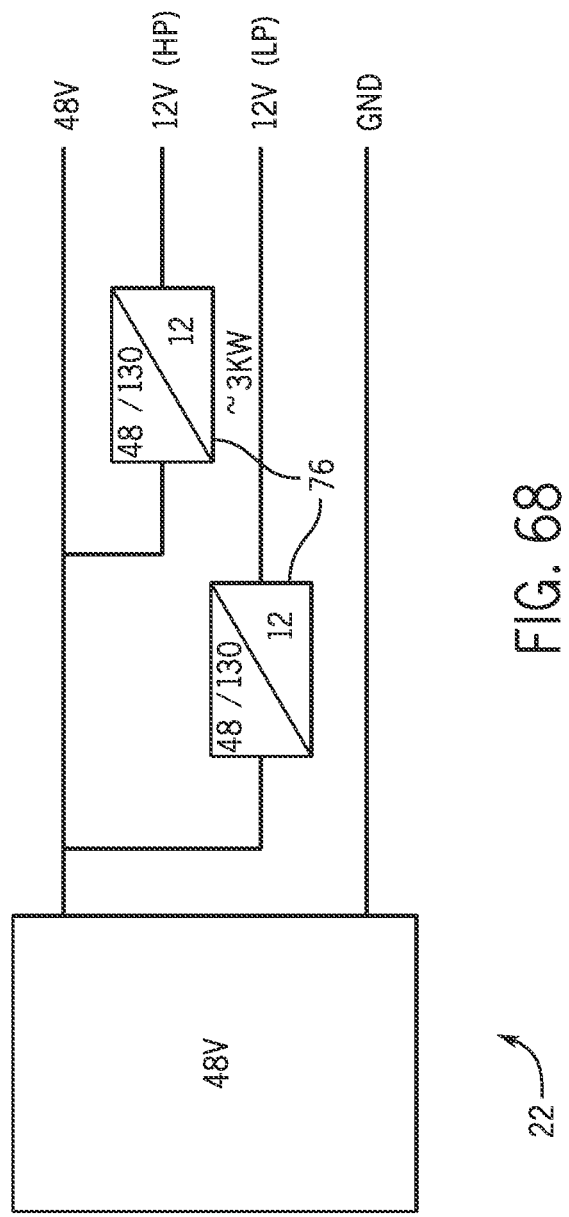
Figure 69:
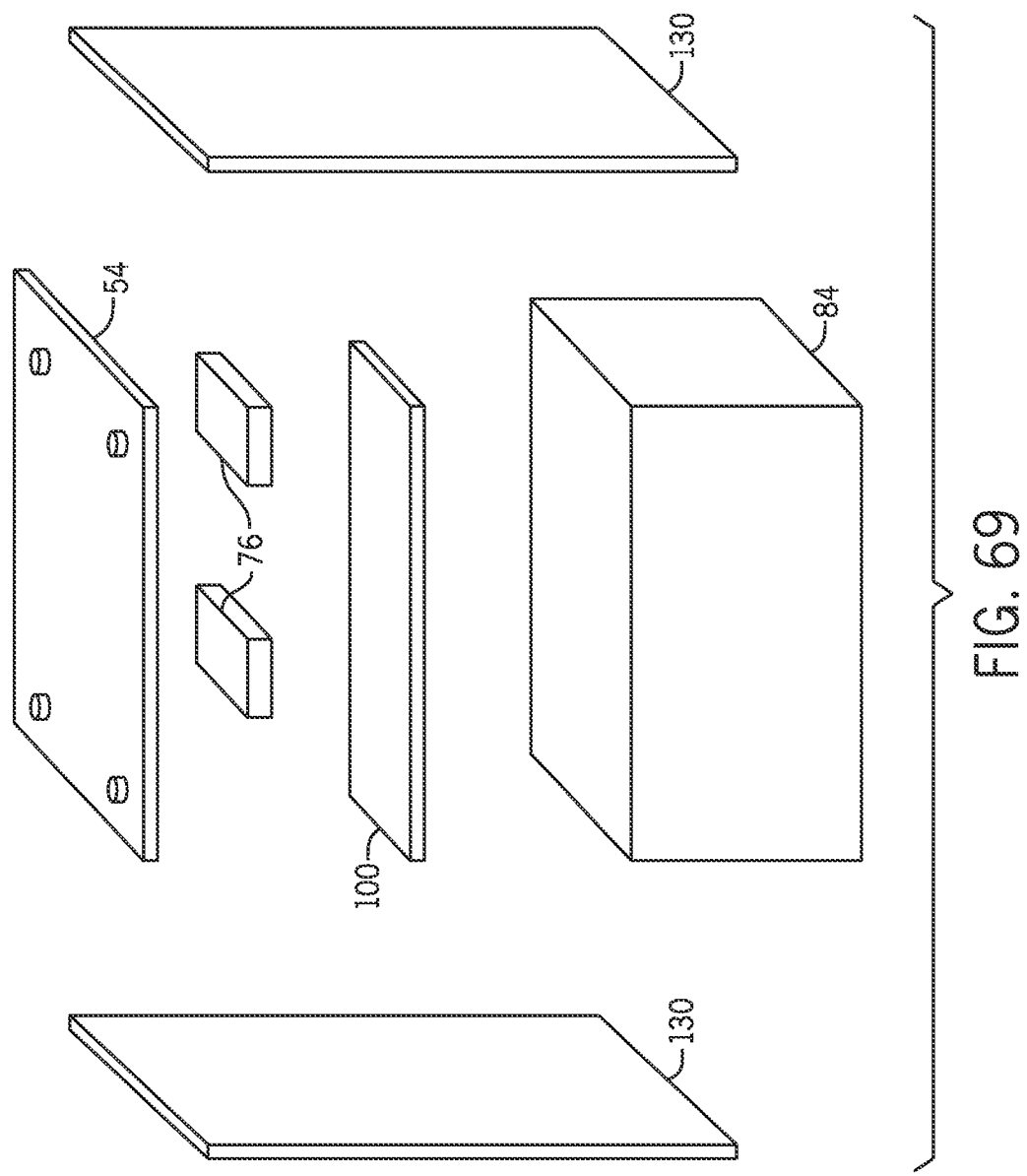
Figure 70:
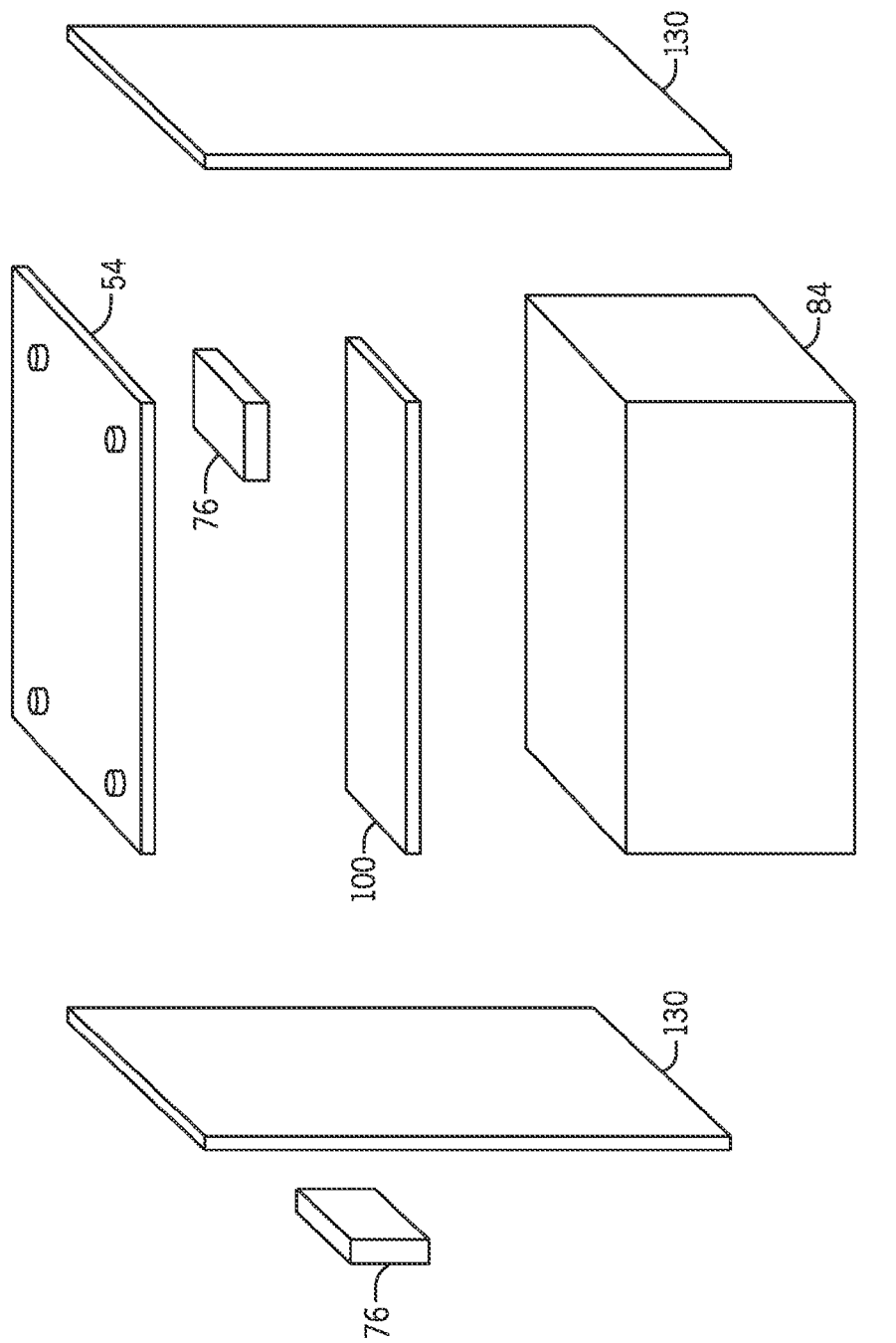
Figure 71:
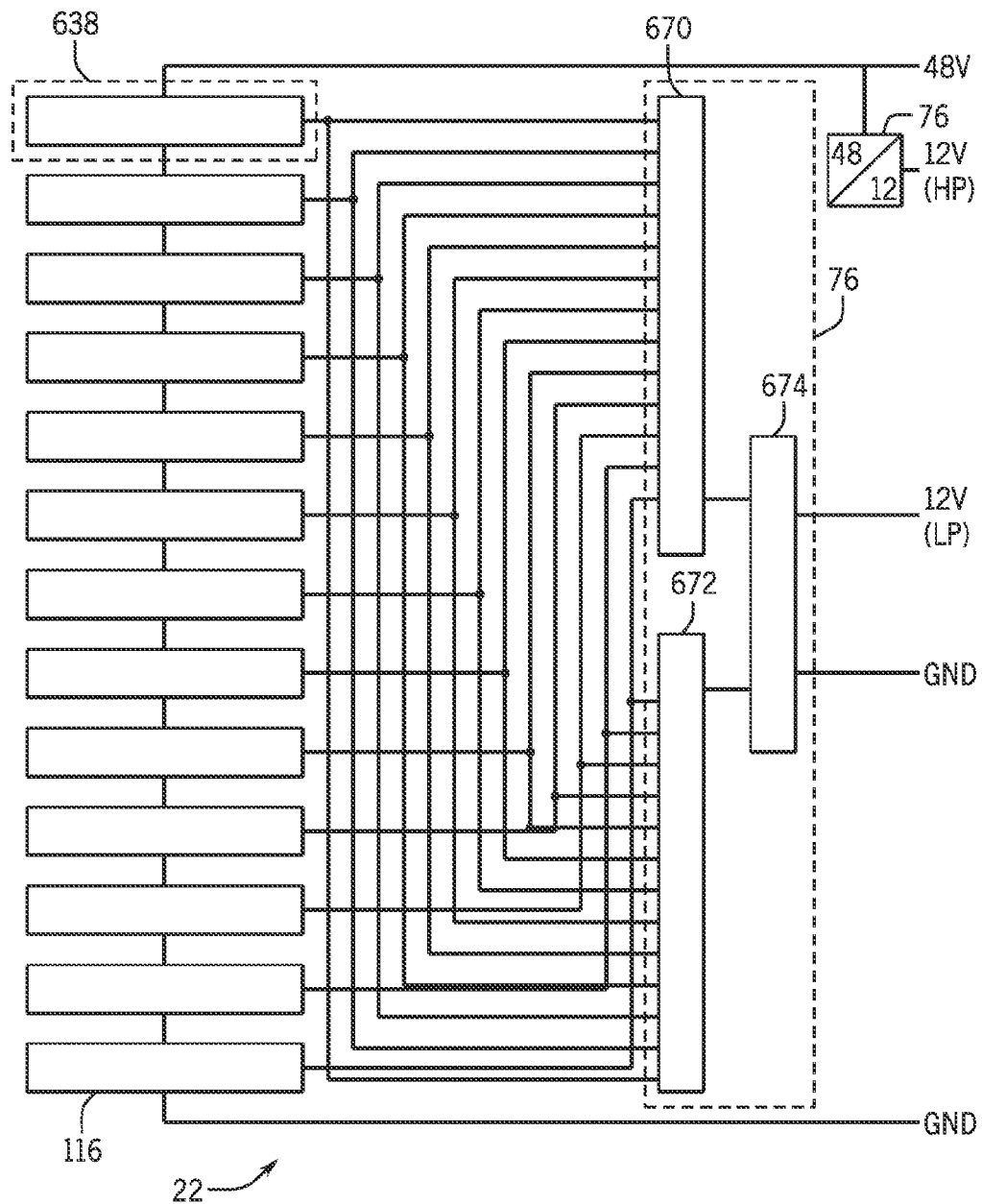
Figure 72:
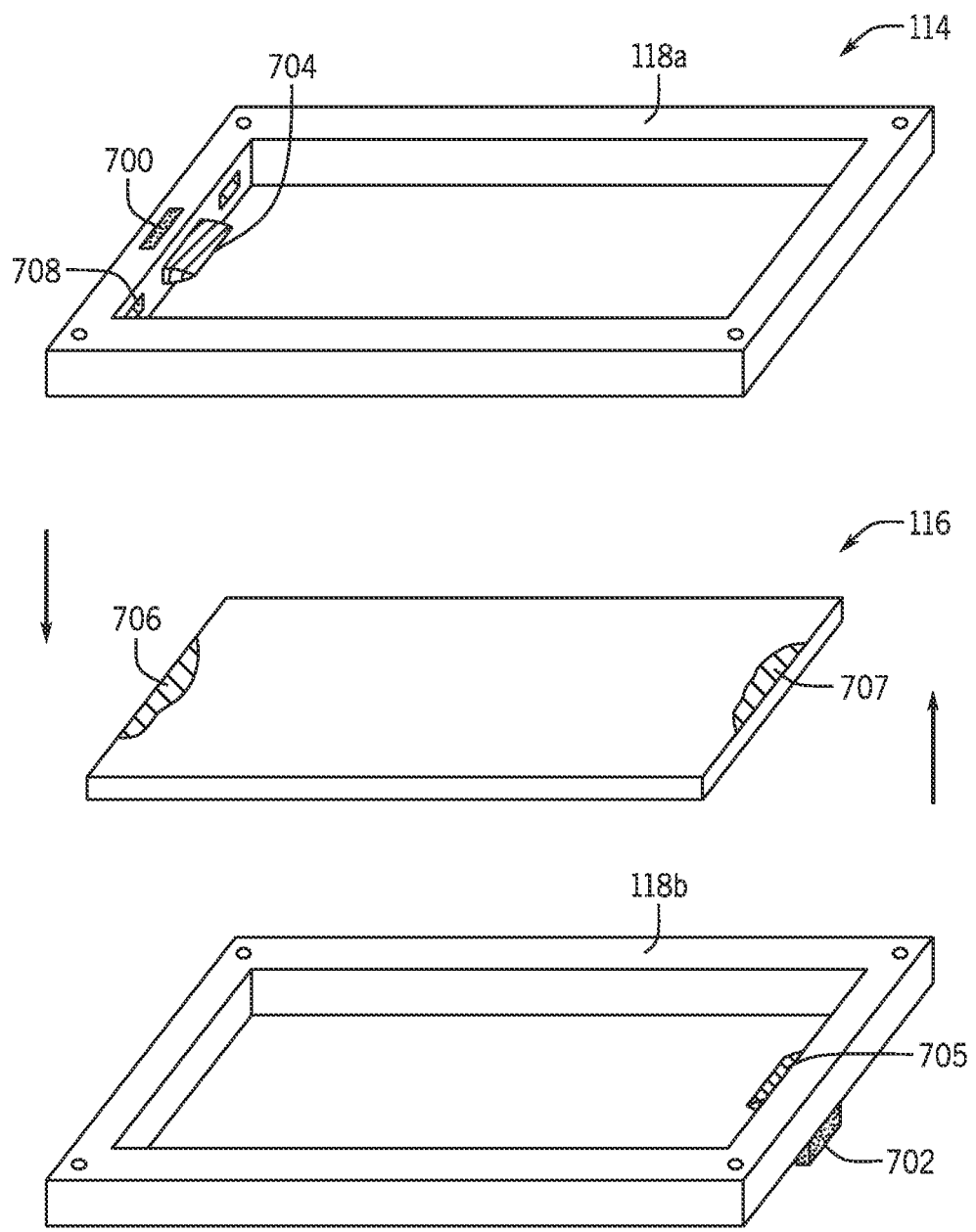
Figure 73:
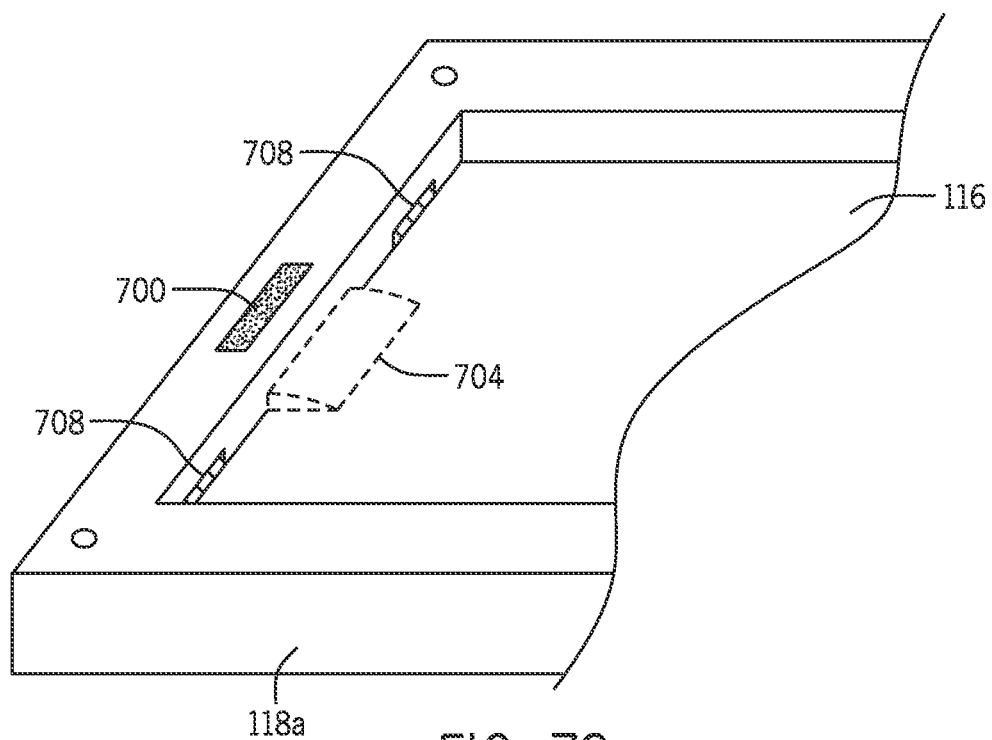
Figure 74:
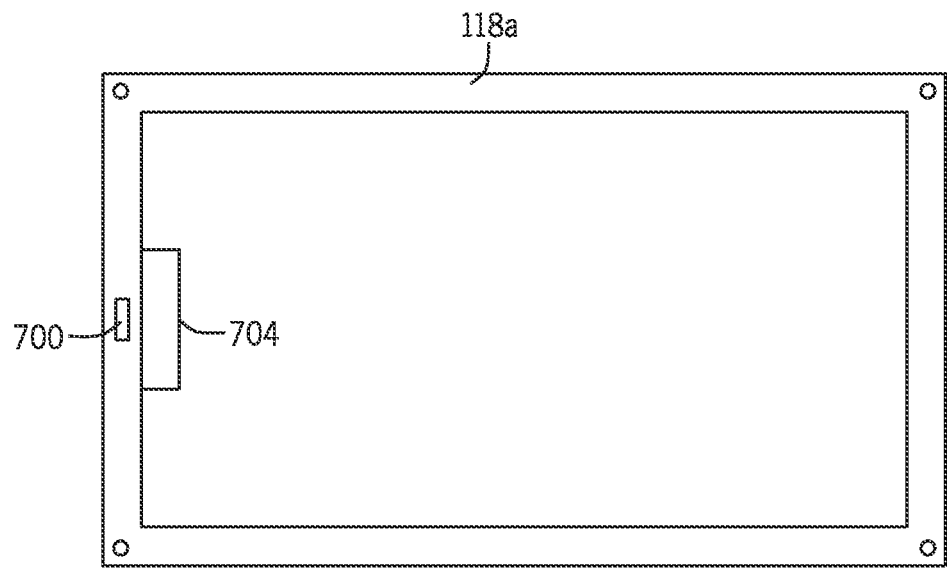
Figure 75:
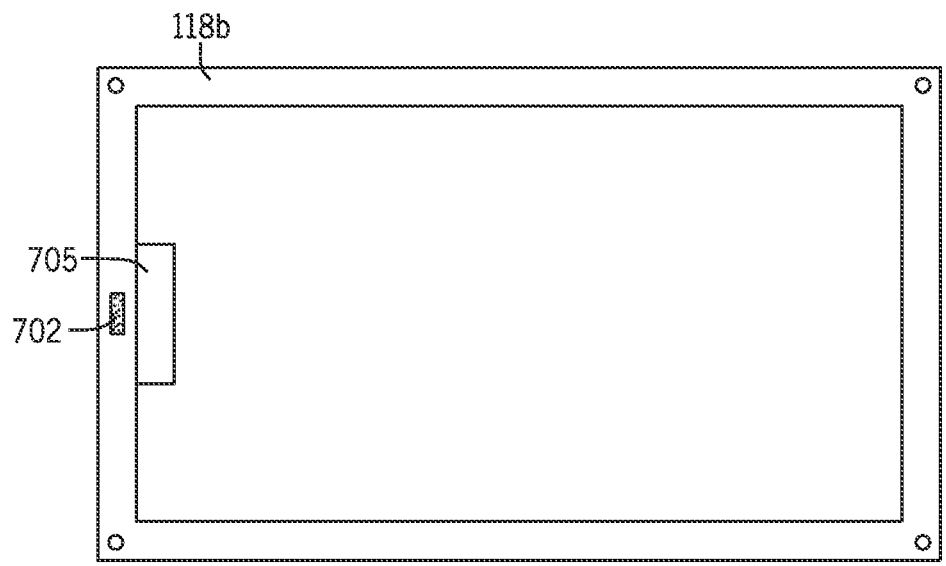
Figure 76:
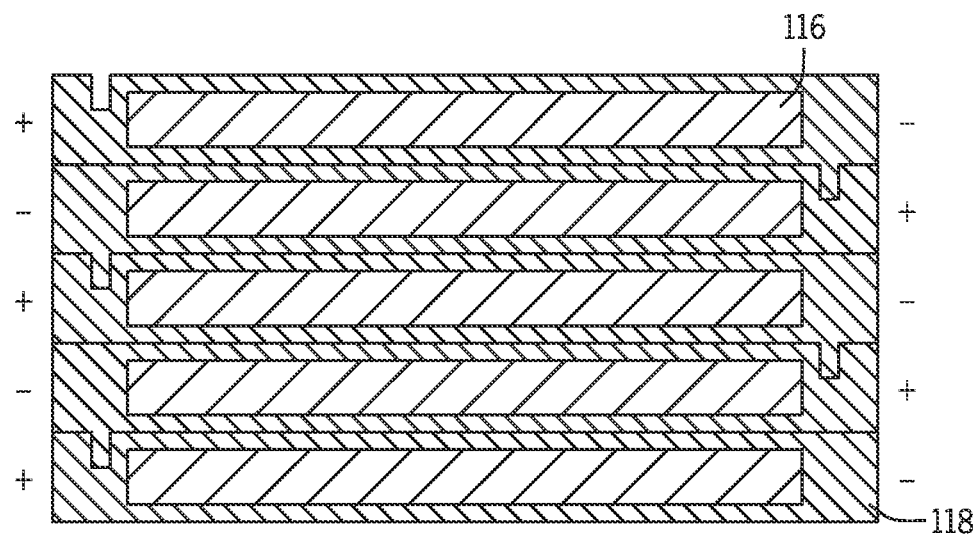
Figure 77:
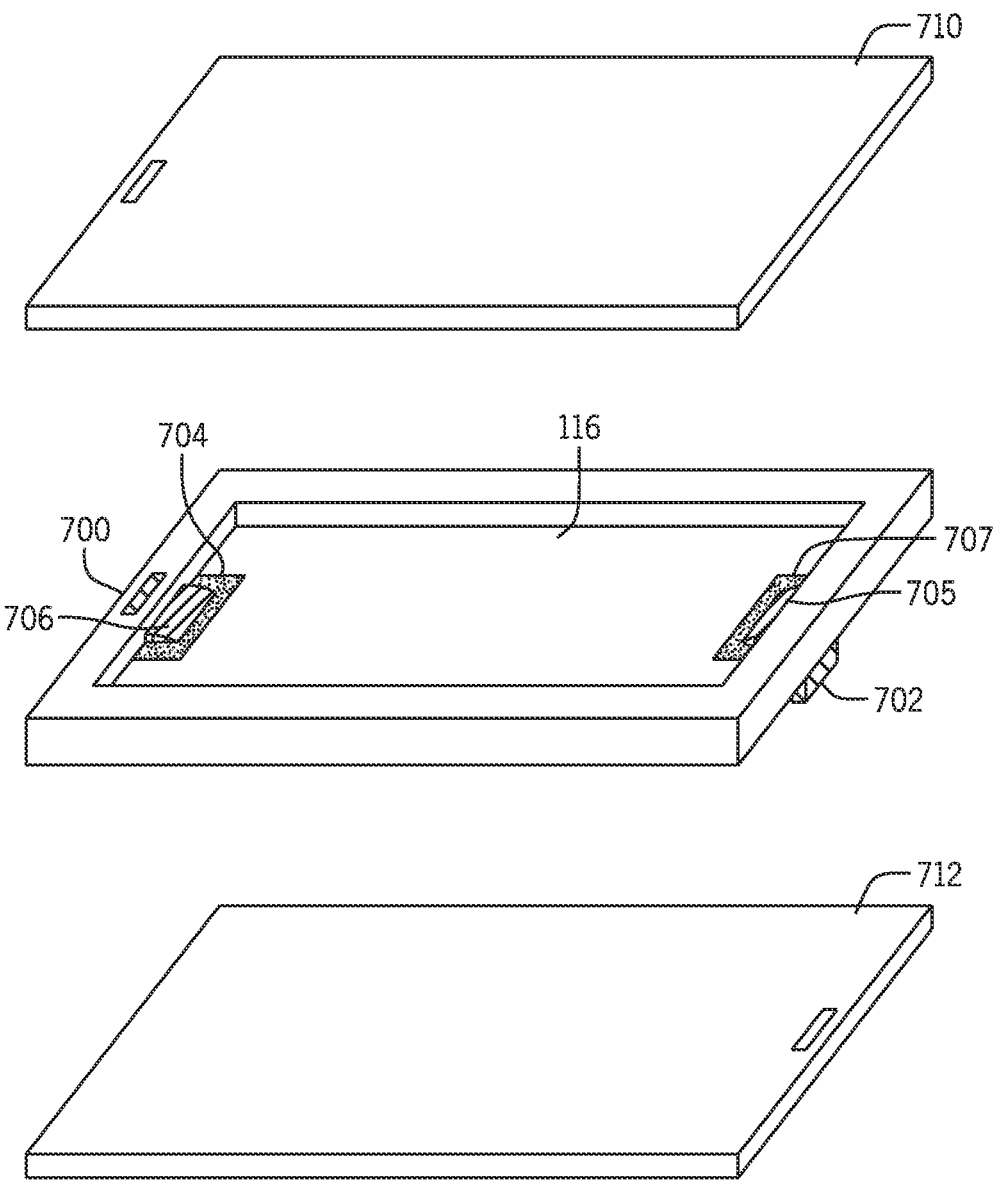
Figure 78A:
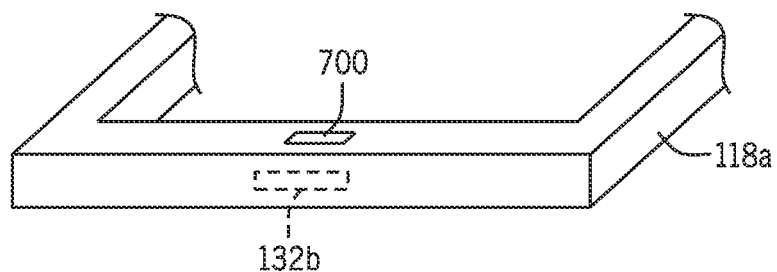
Figure 78B:
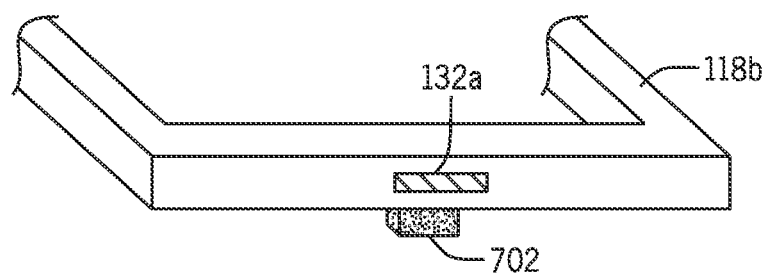
Figure 79:
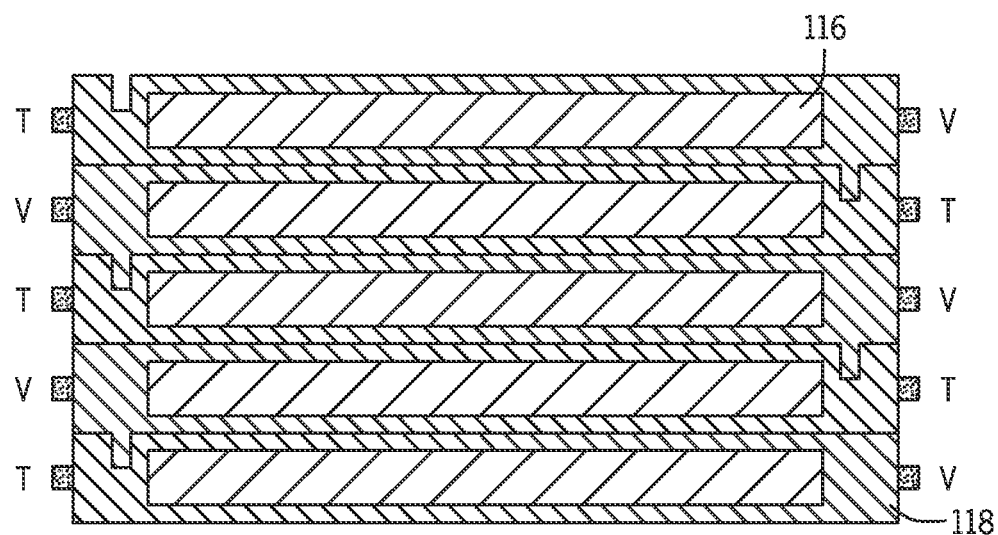
Figure 80:
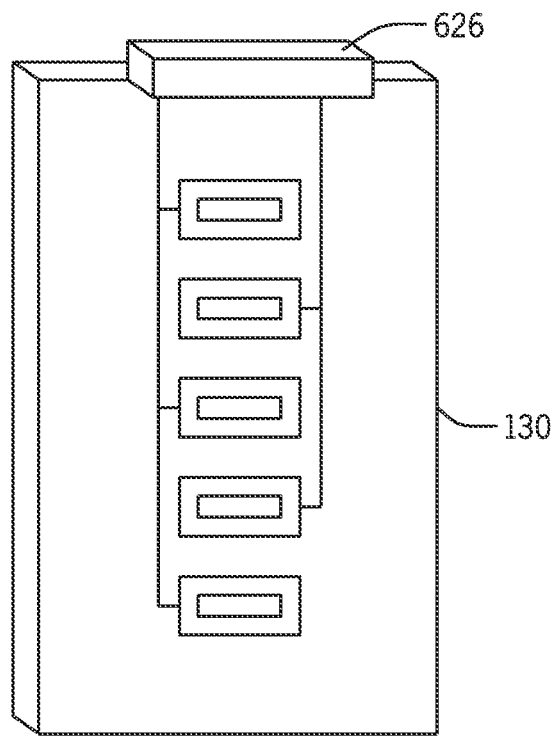
Figure 81:
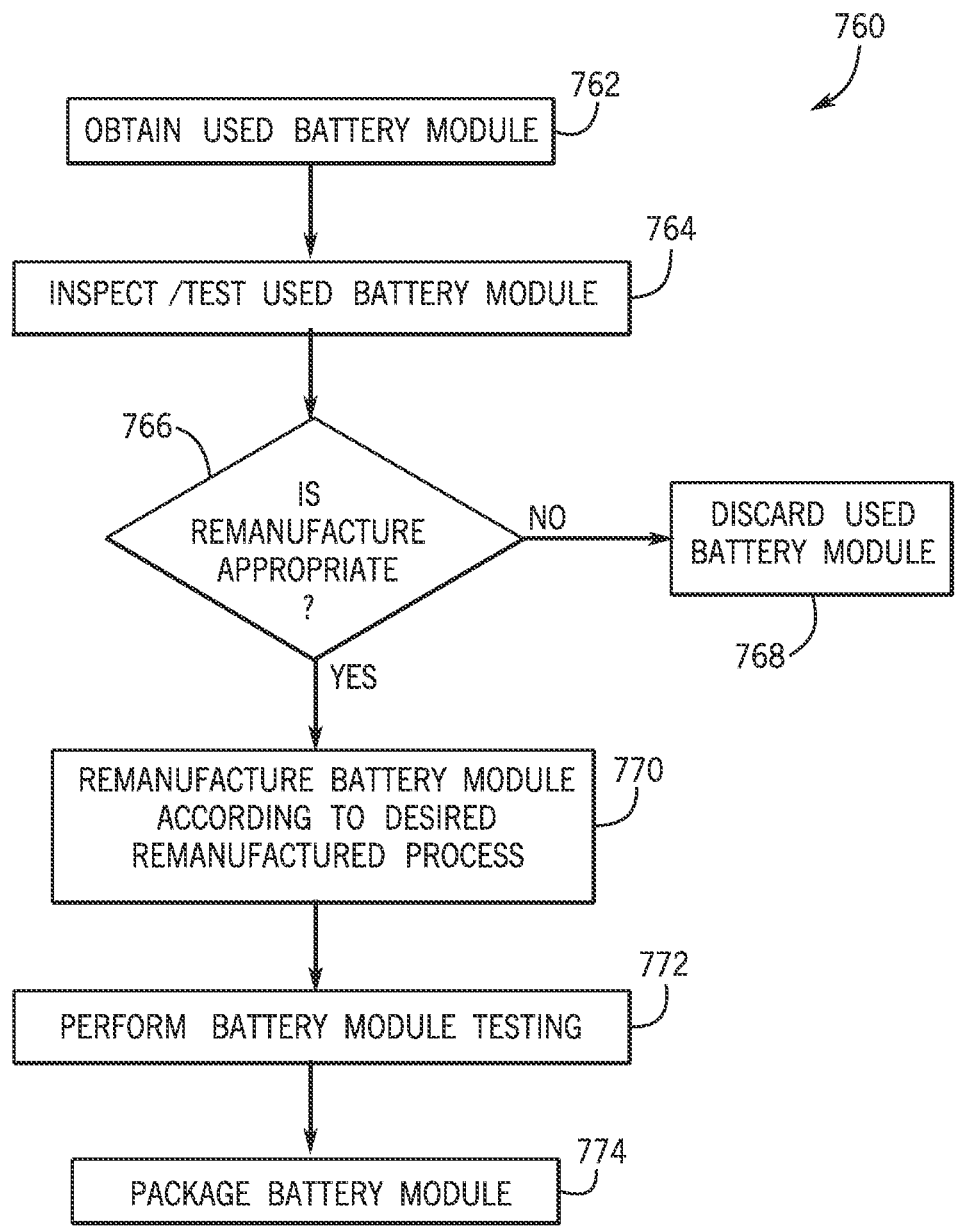
Figure 82:
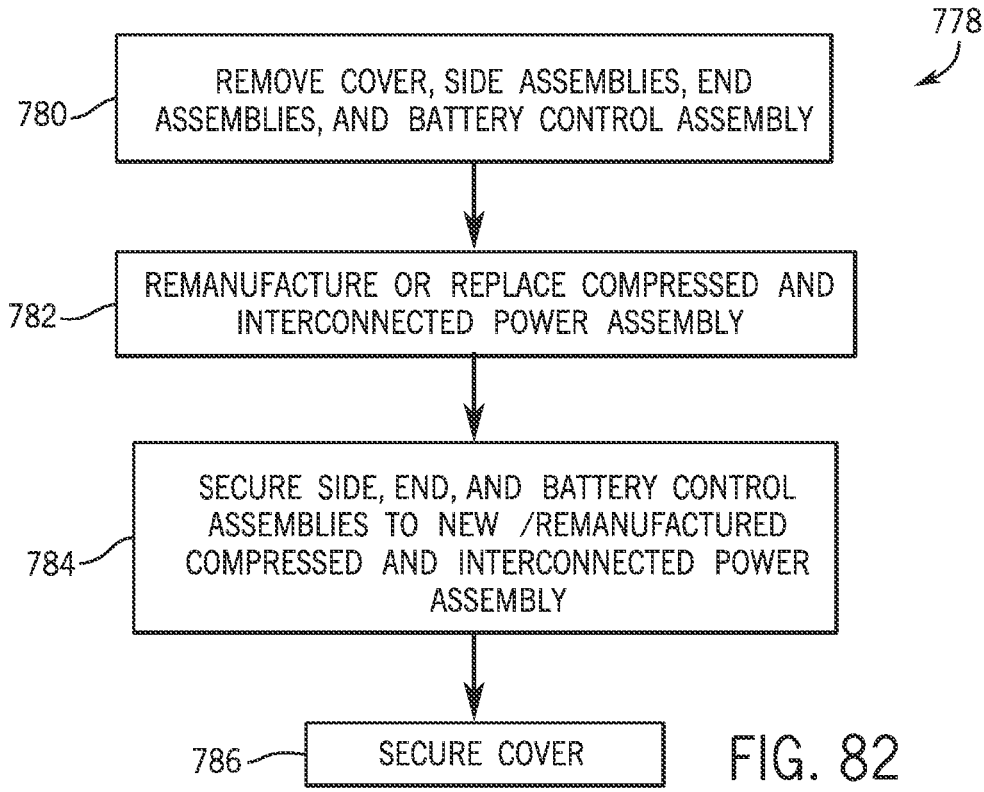
Figure 83:
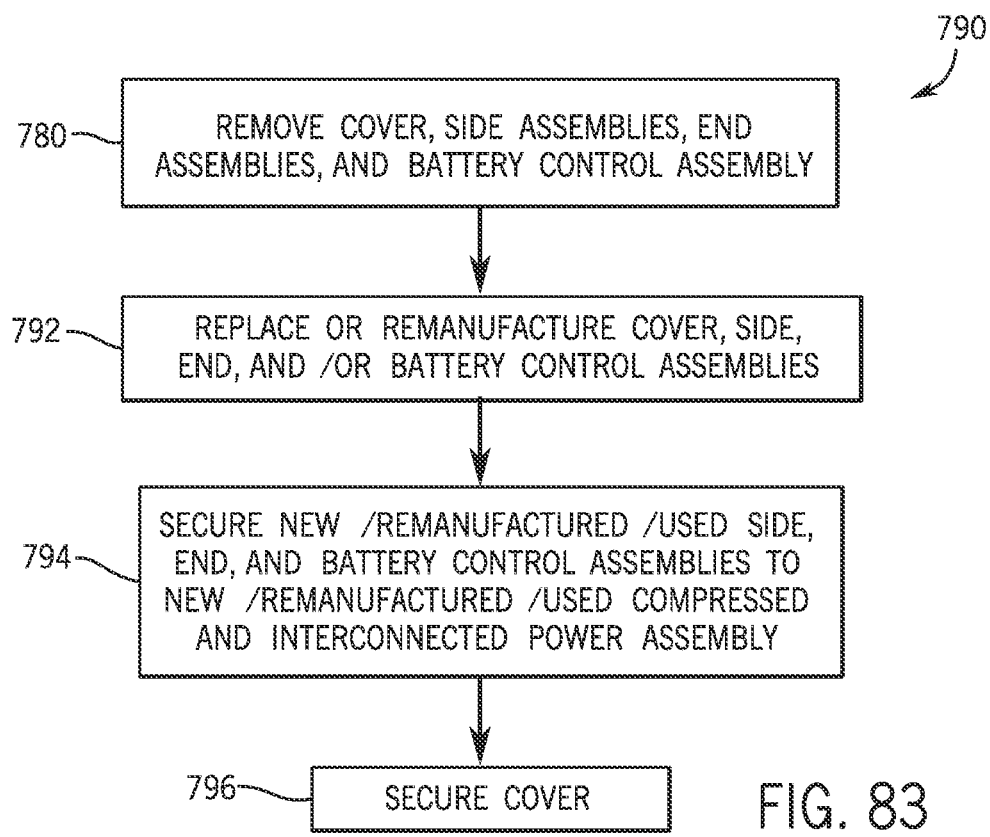
Figure 84:
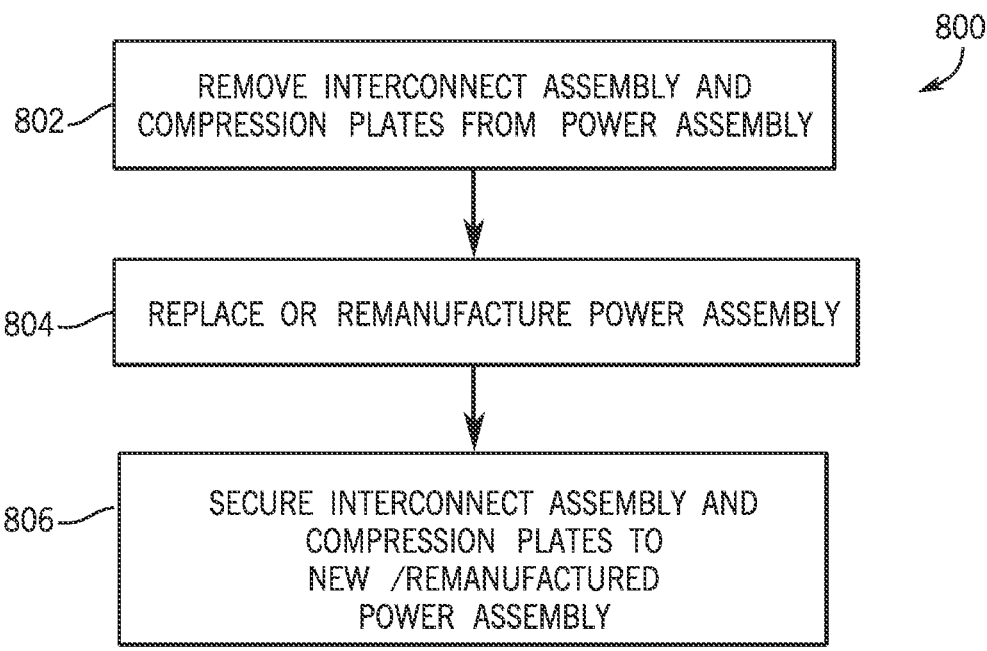
Figure 85:
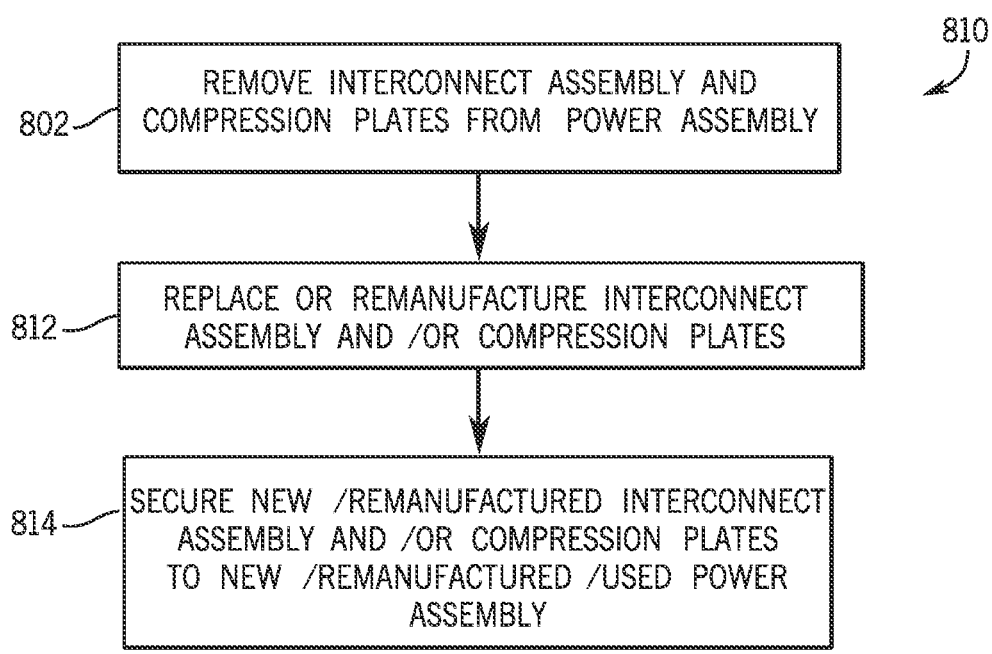
Figure 86:
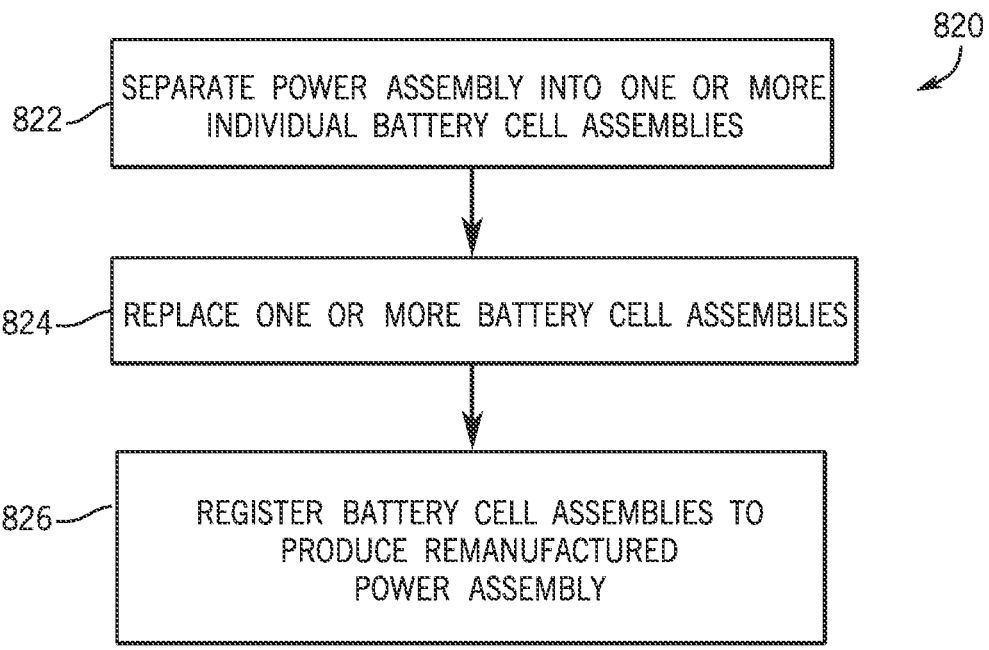
Figure 87:
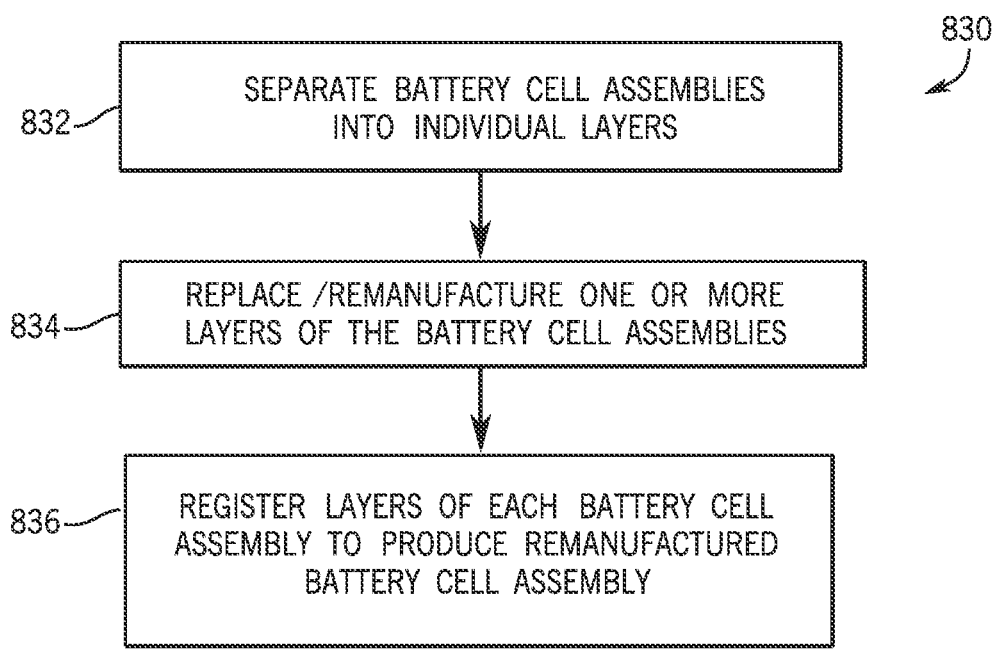
Figure 88:
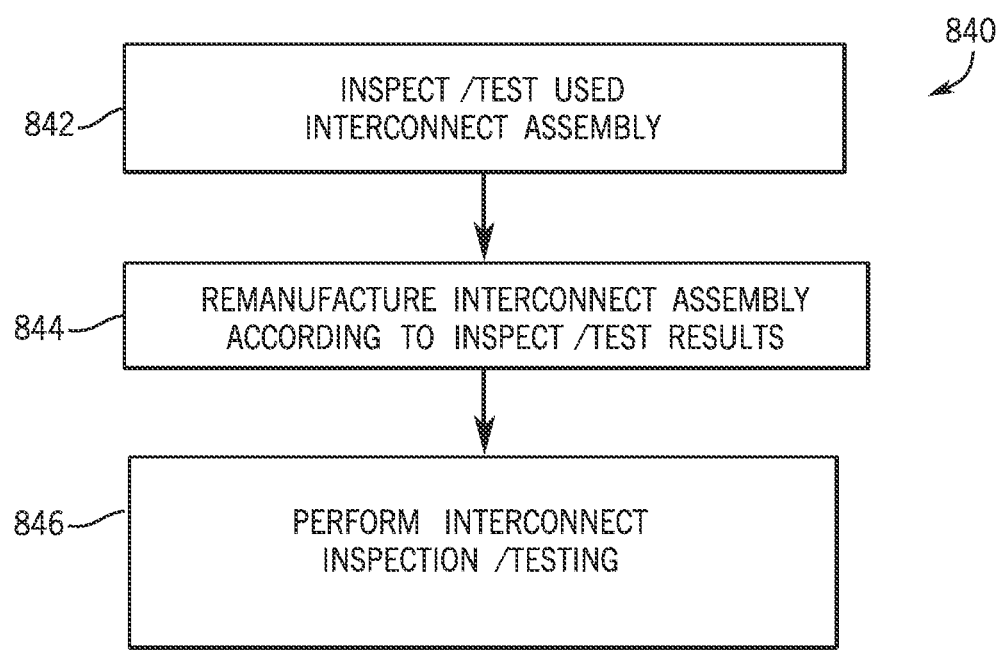
Figure 89:
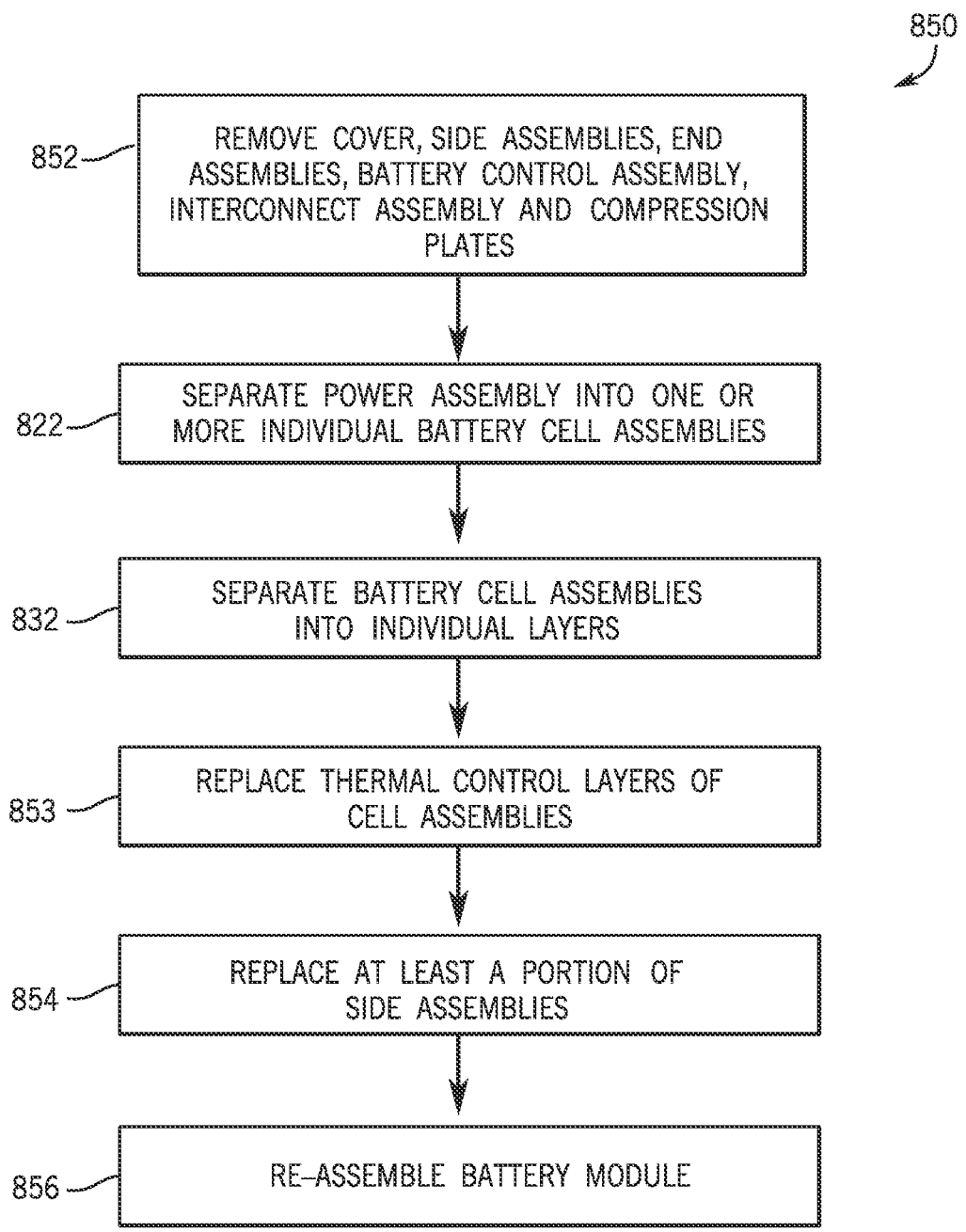
Figure 90:
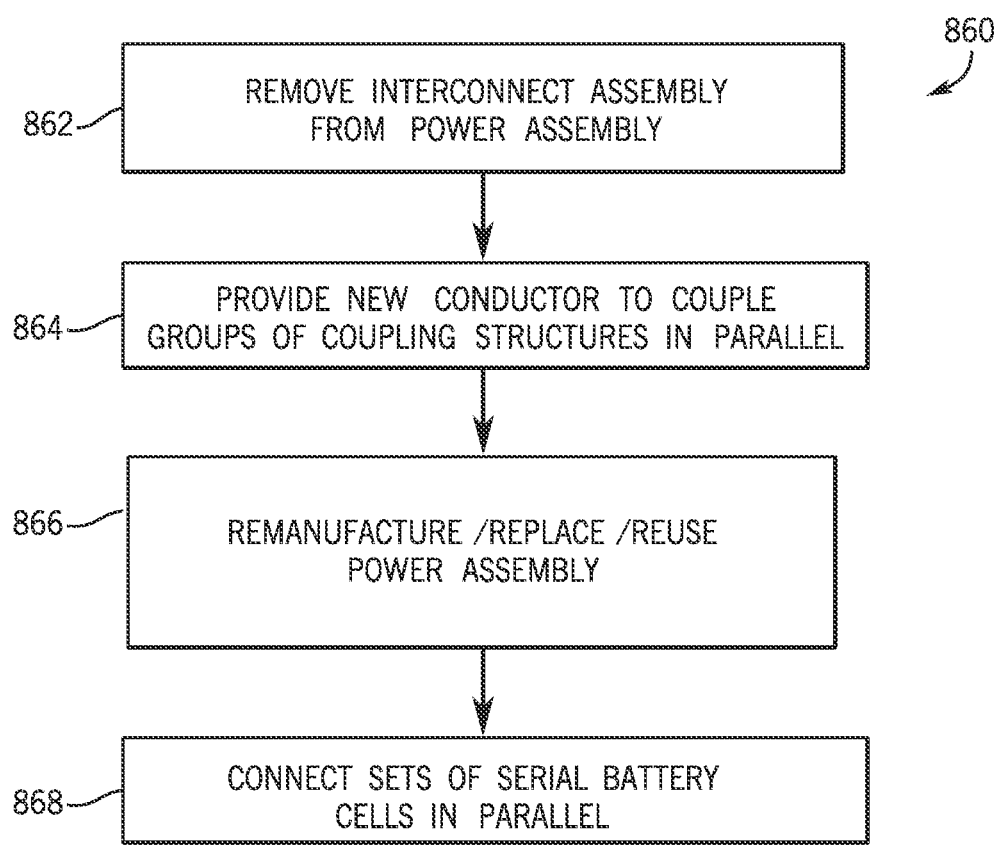
Figure 91:
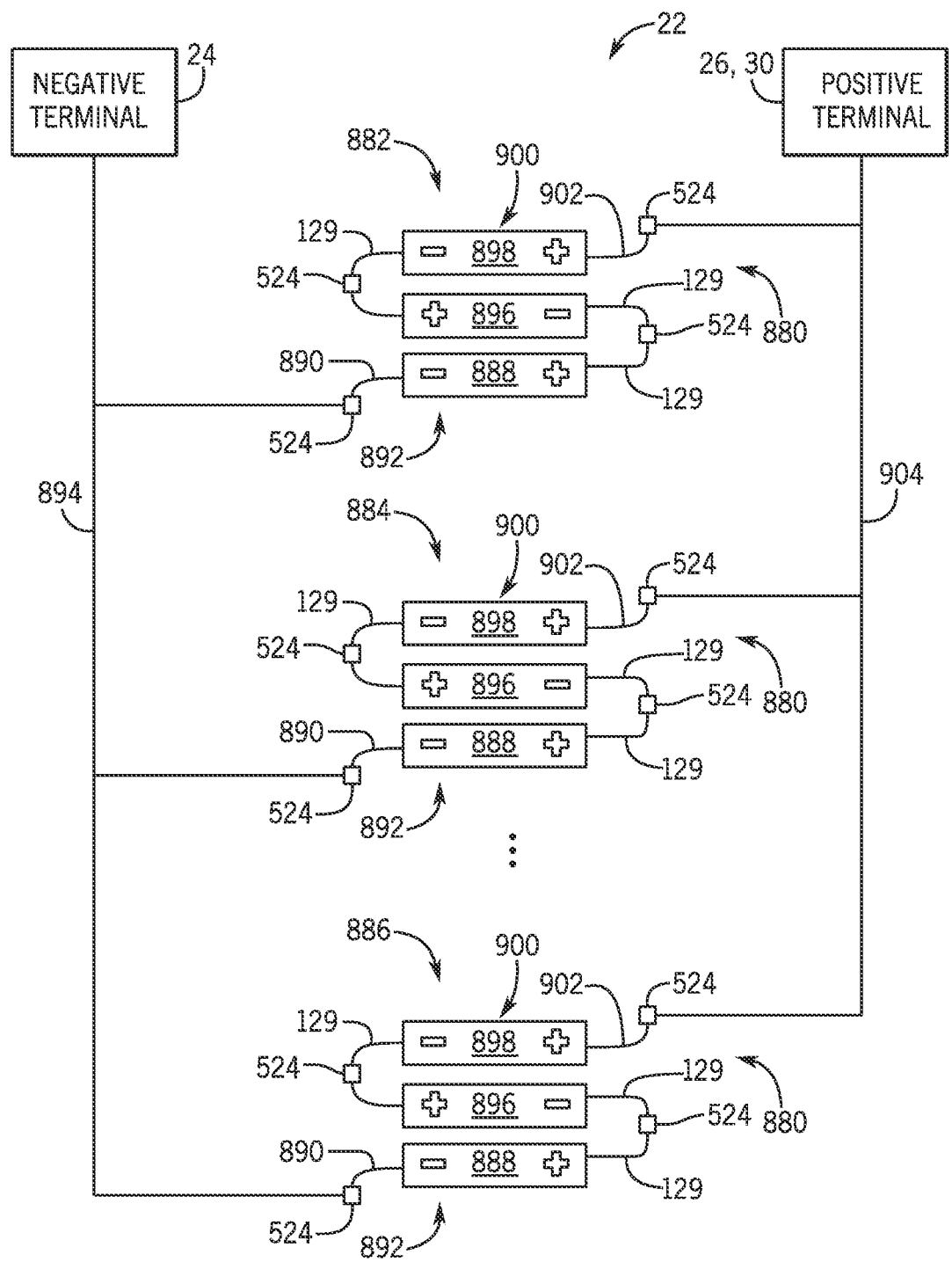

FIG. 23 is a schematic cross-sectional view of interlocking standoffs on adjacent cell casings, in accordance with an embodiment of the present approach; and FIG. 24 is a schematic perspective view of a battery cell being disposed in a cell casing that is in an open configuration and includes a hinge about which upper and lower sides of the cell casing rotate during opening and closing of the cell casing, in accordance with an embodiment of the present approach;

FIG. 25 is a schematic exploded view of a battery cell having a frame, active material, an upper layer of pouch material, and a lower layer of pouch material in accordance with an embodiment of the present approach;

FIG. 26 is a partial cross-sectional view of a battery cell wherein upper and lower pouch material layers are sealed about a frame and active material via sealed engagement of the upper and lower material layers with the frame in accordance with an embodiment of the present approach;

FIG. 27 is a partial cross-sectional view of a battery cell wherein pouch material layers are sealed together about a frame and active material in accordance with an embodiment of the present approach;

FIG. 28 is a partial cross-sectional view of a battery cell wherein upper and lower pouch material layers are sealed about a frame and active material using a grooved seal arrangement wherein the upper and lower layers are sealed together within boundaries of the frame and also with the frame in accordance with an embodiment of the present approach;

FIG. 29 is a partial cross-sectional view of a battery cell wherein upper and lower pouch material layers are sealed about a frame and active material using a grooved seal arrangement wherein the upper and lower layers are sealed together within boundaries of the frame and also with the frame in accordance with an embodiment of the present approach;

FIG. 30 is a partial cross-sectional view of a battery cell wherein upper and lower pouch material layers are sealed about a frame and active material using a grooved seal arrangement wherein the upper and lower layers are sealed together within boundaries of the frame and also with the frame in accordance with an embodiment of the present approach;

FIG. 31 is a partial cross-sectional view of a battery cell including a frame wherein upper and lower layers of pouch material are sealed inside the frame in accordance with an embodiment of the present approach;

FIG. 32 is a schematic representation of a tool configured to facilitate sealing the layers of pouch material together as illustrated in FIGS. 28-31 in accordance with an embodiment of the present approach;

FIG. 33 is a partially exploded cross-sectional side view of upper and lower layers of pouch material sealed about a frame and active material wherein an electrode tab extends beyond the frame in accordance with an embodiment of the present approach;

FIG. 34 is a schematic of a frame having grooves configured to receive electrode tabs in accordance with an embodiment of the present approach;

FIG. 35 is a schematic of a frame having openings configured to receive electrode tabs in accordance with an embodiment of the present approach;

FIG. 36 is a schematic of a frame having openings configured to receive the electrode tabs and a center support feature in accordance with an embodiment of the present approach;

FIG. 37 is a schematic representation of a sheet of frame sections arranged for assembly of multiple battery cells via a method of manufacturing in accordance with an embodiment of the present approach;

FIG. 38 is a block diagram of a method of assembling one or more battery cells in accordance with an embodiment of the present approach;

FIG. 39 is a schematic representation of a battery cell including features configured to facilitate filling and degassing the battery cell in accordance with an embodiment of the present approach;

FIG. 39A is a partial cross-section taken of the battery cell of FIG. 39 taken along line 39A-39A in accordance with an embodiment of the present approach;

FIG. 40 is a schematic cross-sectional view of the battery module embodiment of FIGS. 5A-G, taken along the Z axis of the battery module, in accordance with an embodiment of the present approach;

FIG. 41 is an exploded perspective view of a battery cell interconnect assembly of the battery module embodiment of FIGS. 5A-G, in accordance with an embodiment of the present approach;

FIG. 42 is a perspective view of a clamp of the battery cell interconnect assembly embodiment of FIG. 41, in accordance with an embodiment of the present approach;

FIG. 43 is a schematic cross-sectional view of certain components of the battery cell interconnect assembly embodiment of FIG. 41, in accordance with an embodiment of the present approach;

FIG. 44 is a schematic cross-sectional view of a clamp being positioned over a structure of the battery cell interconnect assembly embodiment of FIG. 41, in accordance with an embodiment of the present approach;

FIG. 45 is a schematic cross-sectional view of a battery cell interconnect assembly embodiment having a hollow bar and a complementary clamp, in accordance with an embodiment of the present approach;

FIG. 46 is a schematic cross-sectional view of a battery cell interconnect assembly embodiment having a clamp structure and a clamp, in accordance with an embodiment of the present approach;

FIG. 47 is a schematic cross-sectional view of a battery cell interconnect assembly embodiment having a crimping element, in accordance with an embodiment of the present approach;

FIG. 48 is a schematic cross-sectional view of a battery cell interconnect assembly embodiment having a high-voltage tape crimping element;

FIG. 49 is a perspective sectional view of a battery cell interconnect assembly embodiment having a single-piece spring crimping element, in accordance with an embodiment of the present approach;

FIG. 50 is a schematic cross-sectional view of the battery cell interconnect assembly embodiment of FIG. 49, in accordance with an embodiment of the present approach;

FIG. 51 is a schematic cross-sectional view of the battery cell interconnect assembly embodiment of FIG. 49, showing a removal of the crimping element using a tool in accordance with an embodiment of the present approach;

FIG. 52 is a schematic cross-sectional view of a battery cell interconnect assembly embodiment having a clip to hold battery cell tab electrodes together, in accordance with an embodiment of the present approach;

FIG. 53 is a perspective sectional view of a battery cell interconnect assembly embodiment having a roller housing structure and complementary roller, in accordance with an embodiment of the present approach;

FIG. 54 is a schematic cross-sectional view of the roller being positioned in the roller housing structure of the battery cell interconnect assembly embodiment of FIG. 53, in accordance with an embodiment of the present approach;

FIG. 55 is a schematic cross-sectional view of the roller housing structure of FIG. 53 with the tab electrodes extending from within an opening of the roller housing structure to an outer portion of the roller housing structure, in accordance with an embodiment of the present approach;

FIG. 56 is a schematic cross-sectional view of a battery cell interconnect assembly embodiment having a roller housing structure and a hollow roller, in accordance with an embodiment of the present approach;

FIG. 57 is a schematic cross-sectional view of a battery cell interconnect assembly embodiment having a roller housing structure and a roller with teeth, in accordance with an embodiment of the present approach;

FIG. 58 is a perspective view of a portion of a first side of the cell interconnect board of the battery module in FIG. 7, in accordance with an embodiment of the present approach;

FIG. 59 is a perspective view of a second side of the cell interconnect board of the battery module as shown in FIG. 58, in accordance with an embodiment of the present approach;

FIG. 60 is a front view of an alternative embodiment of a battery cell tab and of the cell interconnect board of FIG. 7, in accordance with an embodiment of the present approach;

FIG. 61 is a front view of a first side of the cell interconnect board of FIG. 7, in accordance with an embodiment of the present approach;

FIG. 62 is a front view of a first side of the cell interconnect board of FIG. 7, in accordance with an embodiment of the present approach;

FIG. 63 is a block diagram of a three-terminal battery module, in accordance with one embodiment of the present approach;

FIG. 64 is a block diagram of a three-terminal battery module, in accordance with another embodiment of the present approach;

FIG. 65 is a schematic of the three-terminal battery module of FIG. 64, in accordance with an embodiment of the present approach;

FIG. 66 is a front view of a cell interconnect board of the three-terminal battery module of FIG. 65, in accordance with an embodiment of the present approach;

FIG. 67 is a front view of another cell interconnect board of the three-terminal battery module of FIG. 65, in accordance with an embodiment of the present approach;

FIG. 68 is a block diagram of a four-terminal battery module, in accordance with one embodiment of the present approach;

FIG. 69 is a partially exploded perspective view of the four-terminal battery module of FIG. 68, in accordance with one embodiment of the present approach;

FIG. 70 is a partially exploded perspective view of the four-terminal battery module of FIG. 68, in accordance with another embodiment of the present approach;

FIG. 71 is a block diagram of a four-terminal battery module, in accordance with another embodiment of the present approach;

FIG. 72 is a partially exploded perspective view of a battery cell assembly of a battery module, in accordance with an embodiment of the present approach;

FIG. 73 is a perspective view of a portion of the battery cell assembly of FIG. 72, in accordance with an embodiment of the present approach;

FIG. 74 is a top view of a portion of the battery cell assembly of FIG. 73, in accordance with an embodiment of the present approach;

FIG. 75 is a bottom view of a portion of the battery cell assembly of FIG. 72, in accordance with an embodiment of the present approach;

FIG. 76 is a cross-sectional view of a stack of the battery cell assemblies of FIG. 72, in accordance with an embodiment of the present approach;

FIG. 77 is a partially exploded front view of an alternative embodiment of a battery cell assembly of a battery module, in accordance with an embodiment of the present approach;

FIG. 78A is a perspective view of a portion of a battery cell assembly of a battery module, in accordance with an embodiment of the present approach;

FIG. 78B is a perspective view of another portion of the battery cell assembly of FIG. 78A, in accordance with an embodiment of the present approach;

FIG. 79 is a cross-sectional view of a stack of the battery cell assemblies of FIG. 78A, in accordance with an embodiment of the present approach;

FIG. 80 is a perspective view of a cell interconnect board that couples to the battery cell assembly of FIG. 78A, in accordance with an embodiment of the present approach;

FIG. 81 is a process flow diagram of an embodiment of a general method for remanufacturing a used battery module, in accordance with an embodiment of the present approach;

FIG. 82 is a process flow diagram of an embodiment of a method for remanufacturing a used battery module in which a compressed and interconnected power assembly of the used battery module is remanufactured or replaced, in accordance with an embodiment of the present approach;

FIG. 83 is a process flow diagram of an embodiment of a method for remanufacturing a used battery module in which a cover, a side assembly, an end assembly, or a battery control assembly of the used battery module is remanufactured or replaced, in accordance with an embodiment of the present approach;

FIG. 84 is a process flow diagram of an embodiment of a method for remanufacturing a used battery module in which a power assembly of the used battery module is remanufactured or replaced, in accordance with an embodiment of the present approach;

FIG. 85 is a process flow diagram of an embodiment of a method for remanufacturing a used battery module in which an interconnect assembly and/or top and bottom compression plates of the used battery module are remanufactured or replaced, in accordance with an embodiment of the present approach;

FIG. 86 is a process flow diagram of an embodiment of a method for remanufacturing a used battery module in which one or more battery cell assemblies of the used battery module are remanufactured or replaced, in accordance with an embodiment of the present approach;

FIG. 87 is a process flow diagram of an embodiment of a method for remanufacturing a used battery module in which one or more layers of one or more battery cell assemblies of the used battery module are remanufactured or replaced, in accordance with an embodiment of the present approach;

FIG. 88 is a process flow diagram of an embodiment of a method for remanufacturing a used battery module in which an interconnect assembly of the used battery module is remanufactured, in accordance with an embodiment of the present approach;

FIG. 89 is a process flow diagram of an embodiment of a method for remanufacturing a used battery module in which thermal control features of the used battery module are remanufactured, in accordance with an embodiment of the present approach;

FIG. 90 is a process flow diagram of an embodiment of a method for remanufacturing a used battery module in which the interconnect assembly is remanufactured in a manner that repurposes the battery module, in accordance with an embodiment of the present approach; and FIG. 91 is a schematic side view of an embodiment of a battery module in which sets including battery cells connected in series are connected in parallel.

DETAILED DESCRIPTION

It should be noted that terms such as "above", "below", "on top of", and "beneath" may be used to indicate relative positions for elements (e.g., stacked components of the power and battery assemblies described below) and are not limiting embodiments to either of a horizontal or vertical stack orientation. Further, should be noted that terms such as "above", "below", "proximate", or "near" are intended to indicate the relative positions of two layers in the stack that may or may not be in direct contact with one another. Additionally, geometric references are not intended to be strictly limiting. For example, use of the term "perpendicular" does not require an exact right angle, but defines a relationship that is substantially perpendicular, as would be understood by one of ordinary skill in the art. Similarly, for example, the term "parallel" used in reference to geometric relationships does not require a perfect mathematical relationship but indicates that certain features are generally extending in the same directions. Additionally, the term "planar" is used to describe features that are substantially flat, but does not require perfect mathematical planarity.

As discussed above, there are several different types of xEVs. Although some vehicle manufacturers, such as Tesla, produce only xEVs and, thus, can design the vehicle from scratch as an xEV, most vehicle manufacturers produce primarily traditional internal combustion vehicles. Thus, when one of these manufacturers also desires to produce an xEV, it often utilizes one of its traditional vehicle platforms as a starting point. As can be appreciated, when a vehicle has been initially designed to use a traditional electrical system powered by a single lead acid battery and to utilize only an internal combustion engine for motive power, converting such a vehicle into its HEV version can pose many packaging problems. For example, a FHEV uses not only these traditional components, but one or more electric motors must be added along with other associated components. As another example, a mHEV also uses not only these traditional components, but a higher voltage battery (e.g., a 48V lithium ion battery module) must be placed in the vehicle in addition to the 12V lead acid battery along with other components such as a belt integrated starter-generator, sometimes referred to as a belt alternator starter (BAS) as described in further detail below. Hence, if a battery system can be designed to reduce such packaging problems, it would make the conversion of a traditional vehicle platform into an xEV less costly and more efficient.

The battery systems described herein may be used to provide power to a number of different types of xEVs as well as other energy storage applications (e.g., electrical grid power storage systems). Such battery systems may include one or more battery modules, each battery module having a number of battery cells (e.g., lithium ion electrochemical cells) arranged to provide particular voltages and/or currents useful to power, for example, one or more components of an xEV. Presently disclosed embodiments include lithium ion battery modules that are capable of providing more than one voltage. In particular, certain disclosed battery systems may provide a first voltage (e.g., 12V), for example, to power ignition of a combustion engine using a traditional starter motor and/or support conventional 12V accessory loads, and may provide a second voltage (e.g., 48V), for example, to power a BAS and to power one or more vehicle accessories when the combustion engine is not running, for use in a microhybrid system for example. Indeed, in certain embodiments, not only may a single battery system provide two voltages (e.g., 12V and 48V), but it can provide them from a package having a form factor equivalent to a traditional lead acid 12V battery, thus making packaging and conversion of a traditional vehicle to a mHEV simpler, less costly and more efficient.

Present embodiments also include physical battery module features, assembly components, manufacturing and assembling techniques, and so forth, that facilitate providing disclosed battery modules and systems that have a desired form factor (e.g., dimensions corresponding to a traditional lead acid battery). Further, as set forth in detail below, the disclosed battery module embodiments include a number of heat transfer devices (e.g., heat sinks, liquid-cooling blocks, heat transfer foams, phase change materials (PCMs), and so forth) that may be used to passively or actively maintain one or more temperatures of the battery module during operation.

Figure 1:
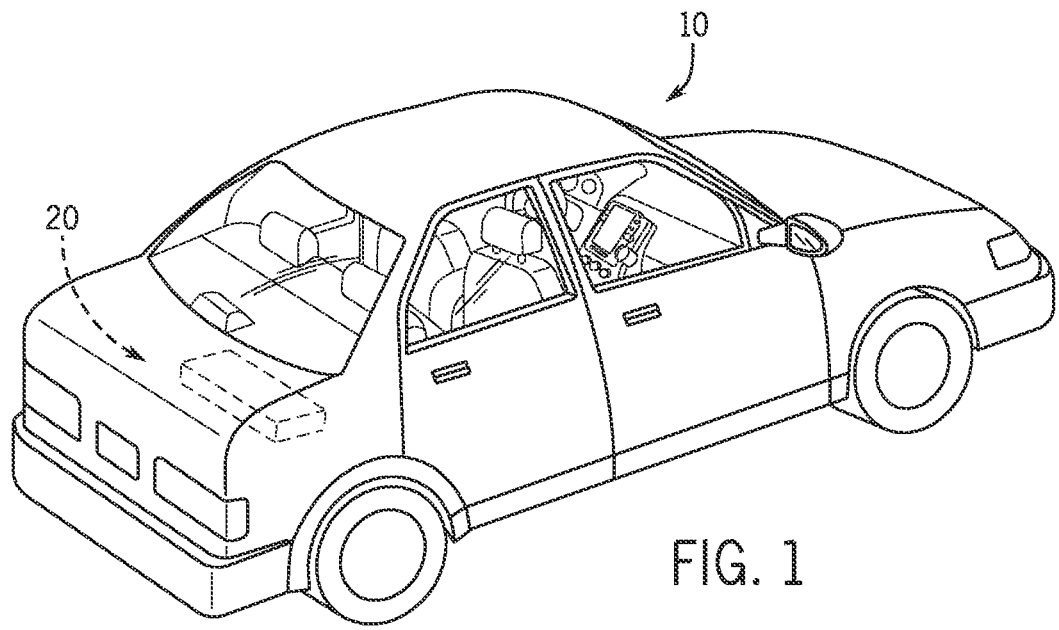
FIG. 1 is a perspective view of a vehicle (an xEV) having a battery system contributing all or a portion of the power for the vehicle, in accordance with an embodiment of the present approach.

With the foregoing in mind, FIG. 1 is a perspective view of an xEV 10 in the form of an automobile (e.g., a car) having a battery system 20 in accordance with present embodiments for providing all or a portion of the power (e.g., electrical power and/or motive power) for the vehicle 10, as described above. Although the xEV 10 may be any of the types of xEVs described above, by specific example, the xEV 10 may be a mHEV, including an internal combustion engine equipped with a microhybrid system which includes a start-stop system that may utilize the battery system 20 to power at least one or more accessories (e.g., AC, lights, consoles, etc.), as well as the ignition of the internal combustion engine, during start-stop cycles.

Further, although the xEV 10 is illustrated as a car in FIG. 1, the type of vehicle may differ in other embodiments, all of which are intended to fall within the scope of the present disclosure. For example, the xEV 10 may be representative of a vehicle including a truck, bus, industrial vehicle, motorcycle, recreational vehicle, boat, or any other type of vehicle that may benefit from the use of electric power. Additionally, while the battery system 20 is illustrated in FIG. 1 as being positioned in the trunk or rear of the vehicle, according to other embodiments, the location of the battery system 20 may differ. For example, the position of the battery system 20 may be selected based on the available space within a vehicle, the desired weight balance of the vehicle, the location of other components used with the battery system 20 (e.g., battery management systems, vents or cooling devices, etc.), and a variety of other considerations.

Figure 2:
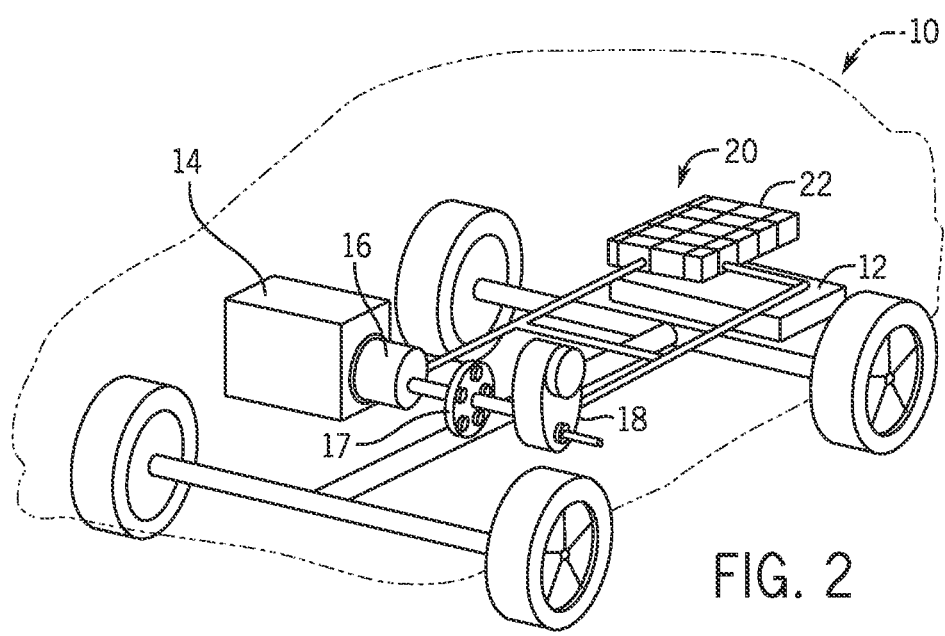
FIG. 2 is a cutaway schematic view of the xEV embodiment of FIG. 1 in the form of a hybrid electric vehicle (HEV), in accordance with an embodiment of the present approach.

FIG. 2 illustrates a cutaway schematic view of an embodiment of the xEV 10 of FIG. 1, provided in the form of an HEV having the battery system 20, which includes one or more battery modules 22. In particular, the battery system 20 illustrated in FIG. 2 is disposed toward the rear of the vehicle 10 proximate a fuel tank 12. In other embodiments, the battery system 20 may be provided immediately adjacent the fuel tank 12, provided in a separate compartment in the rear of the vehicle 10 (e.g., a trunk), or provided in another suitable location in the xEV 10. Further, as illustrated in FIG. 2, an internal combustion engine 14 may be provided for times when the xEV 10 utilizes gasoline power to propel the vehicle 10. The vehicle 10 also includes an electric motor 16, a power split device 17, and a generator 18 as part of the drive system.

The xEV vehicle 10 illustrated in FIG. 2 may be powered or driven by the battery system 20 alone, by the combustion engine 14 alone, or by both the battery system 20 and the engine 14. It should be noted that, in other embodiments of the present approach, other types of vehicles and configurations for the vehicle drive system may be utilized, and that the schematic illustration of FIG. 2 should not be considered to limit the scope of the subject matter described in the present application. According to various embodiments, the size, shape, and location of the battery system 20, the type of vehicle, the type of xEV technology, and the battery chemistry, among other features, may differ from those shown or described.

The battery system 20 may generally include one or more battery modules 22, each having a plurality of battery cells (e.g., lithium ion electrochemical cells), which are discussed in greater detail below. The battery system 20 may include features or components for connecting the multiple battery modules 22 to each other and/or to other components of the vehicle electrical system. For example, the battery system 20 may include features that are responsible for monitoring and controlling the electrical and thermal performance of the one or more battery modules 22.

Figure 3:
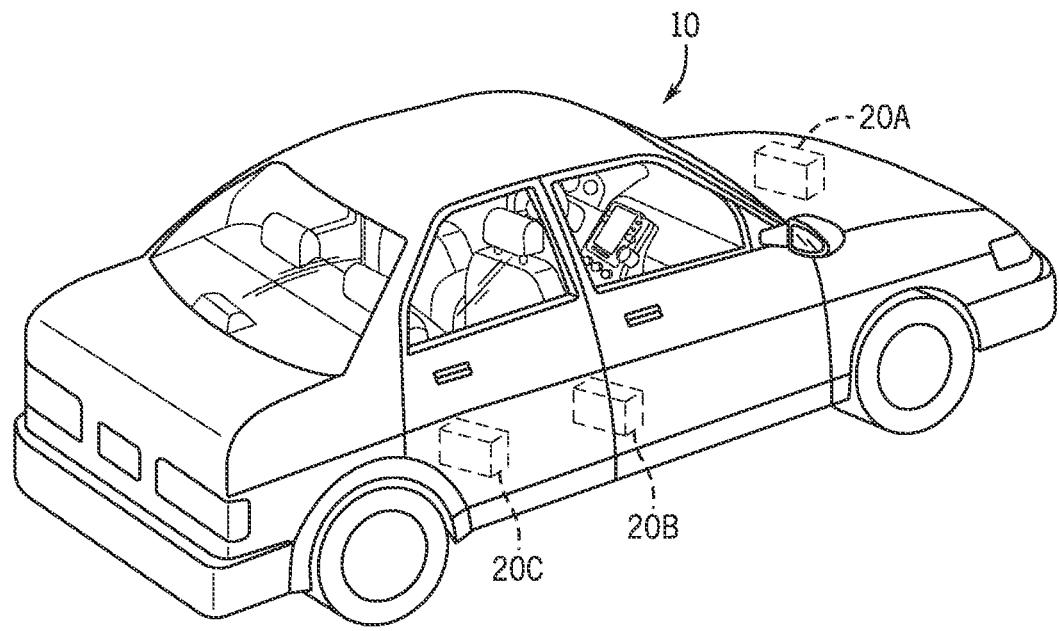
FIG. 3 is a cutaway schematic view of an embodiment of the xEV of FIG. 1 in the form of a microhybrid electric vehicle (mHEV), in accordance with an embodiment of the present approach.

FIG. 3 illustrates a cutaway schematic view of another embodiment of the xEV 10 of FIG. 1, provided in the form of a mHEV 10 having the battery system 20. As discussed above, the battery system 20 for use with a microhybrid system of an mHEV 10 may include a single battery that provides a first voltage (e.g. 12V) and a second voltage (e.g. 48V) and that is substantially equivalent in size to a traditional 12V lead acid battery used in traditional internal combustion vehicles. Hence, such a battery system 20 may be placed in a location in the mHEV 10 that would have housed the traditional battery prior to conversion to an mHEV. For example, as illustrated in FIG. 3, the mHEV 10 may include the battery system 20A positioned similarly to a lead-acid battery of a typical combustion-engine vehicle (e.g., under the hood of the vehicle 10). By further example, in certain embodiments, the mHEV 10 may include the battery system 20B positioned near a center of mass of the mHEV 10, such as below the driver or passenger seat. By still further example, in certain embodiments, the mHEV 10 may include the battery system 20C positioned below the rear passenger seat or near the trunk of the vehicle. It should be appreciated that, in certain embodiments, positioning a battery system 20 (e.g., battery system 20B or 20C) in or about the interior of the vehicle may enable the use of air from the interior of the vehicle to cool the battery system 20 (e.g., using a heat sink or a forced-air cooling design, as set forth in detail below).

Figure 4:
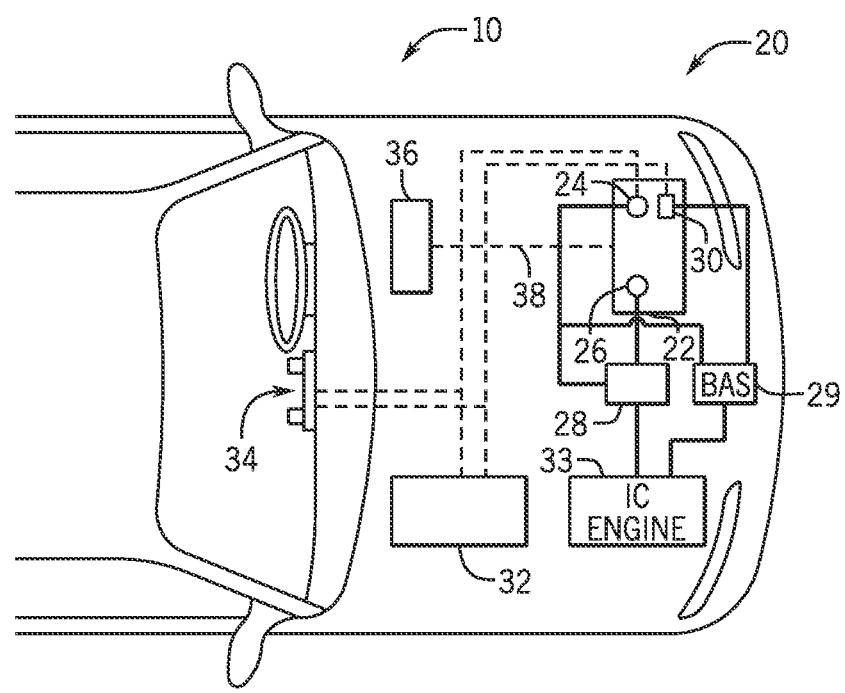
FIG. 4 is a schematic view of the mHEV embodiment of FIG. 3 illustrating power distribution throughout the mHEV, in accordance with an embodiment of the present approach.

FIG. 4 is a schematic view of an embodiment of the mHEV 10 of FIG. 3 having an embodiment of the battery system 20 disposed under the hood of the vehicle 10. As previously noted and as discussed in detail below, the battery system 20 may further have dimensions comparable to those of a typical lead-acid battery to limit or eliminate modifications to the mHEV 10 design to accommodate the battery system 20. Further, the battery system 20 illustrated in FIG. 4 is a three-terminal battery that is capable of providing two different output voltages. For example, a first terminal 24 may provide a ground connection, a second terminal 26 may provide a 12V output, and a third terminal 30 may provide a 48V output. As illustrated, the 48V output of the battery module 22 may be coupled to a BAS 29, which may be used to start the internal combustion engine 33 during start-stop cycle, and the 12 V output of the battery module 22 may be coupled to a traditional ignition system (e.g., starter motor 28) to start the internal combustion engine 33 during instances when the BAS 29 is not used to do so. It should also be understood that the BAS 29 may also capture energy from a regenerative braking system or the like (not shown) to recharge the battery module 22.

It should be appreciated that the 48 V and 12 V outputs of the battery module 22 may also be provided to other components of the mHEV 10. Examples of components that may utilize the 48 V output in accordance with present embodiments include radiator cooling fans, climate control fans, electric power steering systems, active suspension systems, electric air-conditioning systems, auto park systems, cooled seats, electric oil pumps, electric super/turbochargers, electric water pumps, heated seats, heated windscreen/defrosters, and engine ignitions. Examples of components that may utilize the 12 V output in accordance with present embodiments include window lift motors, vanity lights, tire pressure monitoring systems, sunroof motor controls, power seats, alarm systems, infotainment online features, navigation features, lane departure warning systems, electric parking brakes, and external lights. The examples set forth above are not exhaustive and there may be overlap between the listed examples. Indeed, for example, in some embodiments, features listed above as being associated with a 48 V load may utilize the 12 V output instead and vice versa.

In the illustrated embodiment, the 48 V output of the battery module 22 may be used to power one or more accessories of the mHEV 10. For example, as illustrated in FIG. 4, the 48 V output of the battery module 22 may be coupled to the heating, ventilation, and air conditioning (HVAC) system 32 (e.g., including compressors, heating coils, fans, pumps, and so forth) of the mHEV 10 to enable the driver to control the temperature of the interior of the mHEV 10 during operation of the vehicle. This is particularly important in an mHEV 10 during idle periods when the internal combustion engine 33 is stopped and, thus, not providing any electrical power via engine charging. As also illustrated in FIG. 4, the 48 V output of the battery module 22 may be coupled to the vehicle console 34, which may include entertainment systems (e.g., radio, CD/DVD players, viewing screens, etc.), warning lights and indicators, controls for operating the mHEV 10, and so forth. Hence, it should be appreciated that the 48 V output may, in certain situations, provide a more efficient voltage at which to operate the accessories of the mHEV 10 (e.g., compared to 12 V), especially when the internal combustion engine 33 is stopped (e.g., during start-stop cycles). It should also be appreciated that, in certain embodiments, the 48 V output of the battery module 22 may also be provided to any other suitable components and/or accessories (e.g., lights, switches, door locks, window motors, windshield wipers, and so forth) of the mHEV 10.

Also, the mHEV 10 illustrated in FIG. 4 includes a vehicle control module (VCM) 36 that may control one or more operational parameters of the various components of the vehicle 10, and the VCM 36 may include at least one memory and at least one processor programmed to perform such tasks. Like other components of the mHEV 10, the battery module 22 may be coupled to the VCM 36 via one or more communication lines 38, such that the VCM 36 may receive input from the battery module 22, and more specifically, the battery control module (BCM) of the battery module 22 (discussed in detail below). For example, the VCM 36 may receive input from the battery module 22 regarding various parameters, such as state of charge and temperature, and the VCM 36 may use these inputs to determine when to charge and/or discharge the battery module 22, when to discontinue charging the battery module 22, when to start and stop the internal combustion engine 33 of the mHEV 10, whether to use the BAS 29 or the starter 28, and so forth.

FIGS. 5A-G are seven different views of an embodiment of the battery module 22 of FIG. 4. As mentioned above and discussed in detail below, the size and shape of the battery module 22 illustrated in FIGS. 5A-G may be similar to or exactly the same size and shape of a typical lead-acid battery. For example, a housing 39 of the battery module 22 may conform to standardized dimensions for lead acid batteries. To facilitate discussion of the battery module 22 and the various assemblies and components thereof, a Z axis 40 is defined as extending through the length of battery module 22, a Y axis 42 is defined as extending through the height of the battery module 22, and an X axis 44 is defined as extending through a width of the battery module 22. Further, the battery module 22 may be referred to as having two end portions 46 and 48 (e.g., capping ends along the Z axis 40), two side portions 50 and 52 (e.g., capping ends along the X axis 44), a top portion 54, and a bottom portion 56 (e.g., capping ends along the Y axis 42). Outer portions of the battery module 22 discussed in the present disclosure may cumulatively form the housing 39.

As mentioned above, the illustrated top portion 54 of the battery module 22 may include three terminals (e.g., the ground terminal 24, the 12 V positive terminal 26, and the 48 V positive terminal 30) that, as set forth above, may be used to power various components of an xEV 10 during operation. As illustrated, in certain embodiments, the 48 V positive terminal 30 may use a different type of connection (e.g., post, connector, or bracket 31) than the connection provided by the other terminals (e.g., different sized posts 25 and 27), which may prevent the battery module 22 from being improperly connected to an xEV 10 or another load.

Furthermore, the top portion 54 of the battery module 22 may also include a suitable number of connections 58 (e.g., illustrated as four DIN connectors) that may be used to couple the battery module 22 to the VCM 36, as discussed above, such that the VCM 36 may receive inputs regarding the status of the battery module 22 and/or provide control instructions to the battery module 22. Of course, in embodiments where the battery module 22 includes only two terminals, such as the ground terminal 24 and the 48V terminal 30, the communication port may only include two connections 58 that couple to a communication network such as CAN or LIN, which may or may not connect to the VCM 36.

Additionally, as discussed in greater detail below, the top portion 54 may include a plastic or composite cover 59, which may generally protect the components of the battery control assembly (e.g., including the battery control module (BCM) and a DC-to-DC converter, discussed below) that are disposed below the cover 59. Furthermore, as illustrated in at least FIG. 5, the side portions 50 and 52 of the battery module 22 include heat sink side plates 60 and 62. As set forth in greater detail below, these heat sink side plates 60 and 62 may function in conjunction with internal components of the battery module 22 (e.g., the internal heat fins, phase change material (PCM) layers, thermal foam layers, and so forth) to passively dissipate heat from the interior of the battery module 22 to the ambient environment external to the battery module 22. In other embodiments discussed below, one or more of the heat sink side plates (e.g., heat sink side plates 60 and/or 62) may enable active cooling via one or more fans or liquid cooling blocks to enable enhanced temperature control to the battery module 22.

Figure 5A:
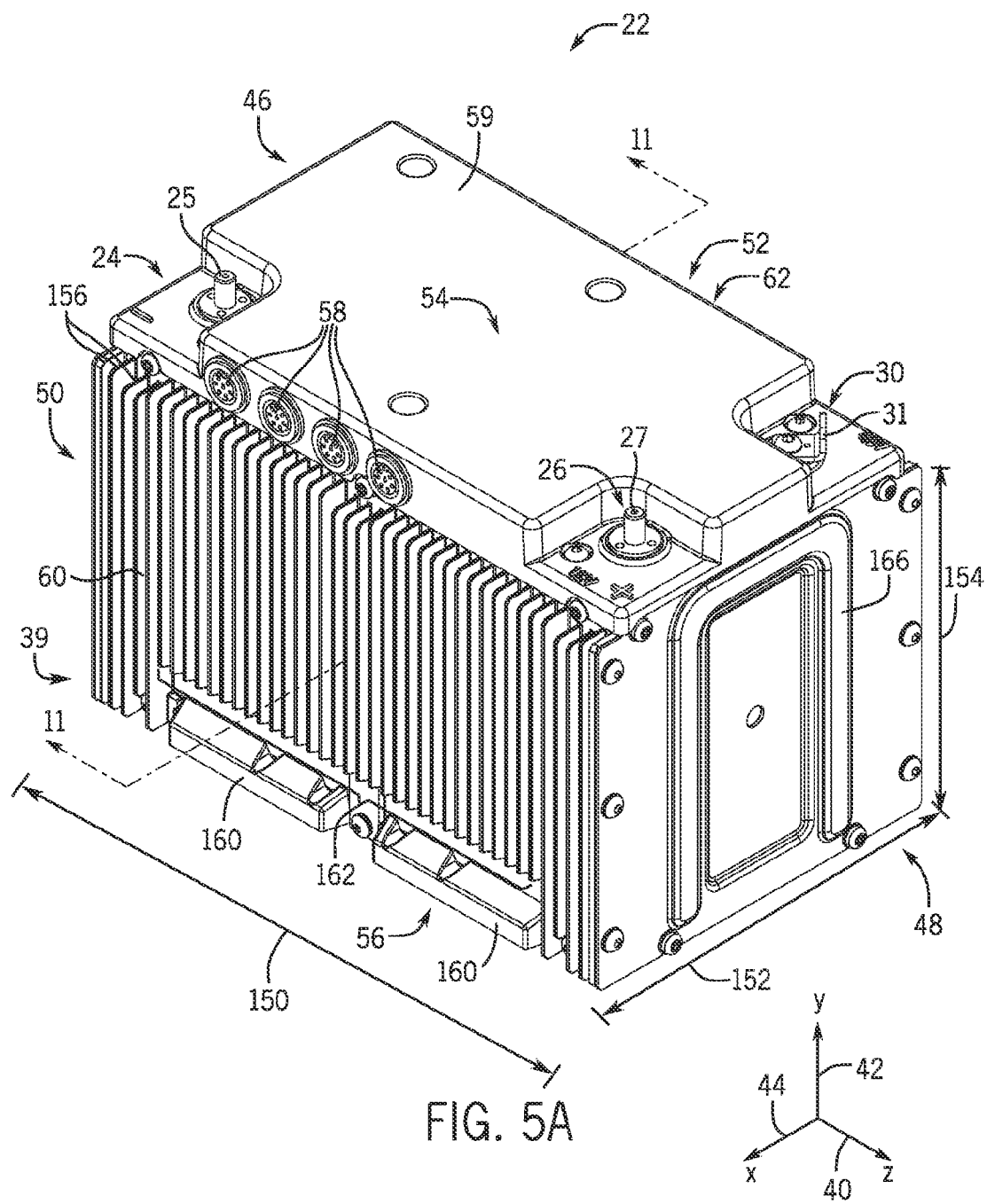
FIG. 5A is a front top perspective view of a battery module, in accordance with an embodiment of the present approach.
Figure 5D:
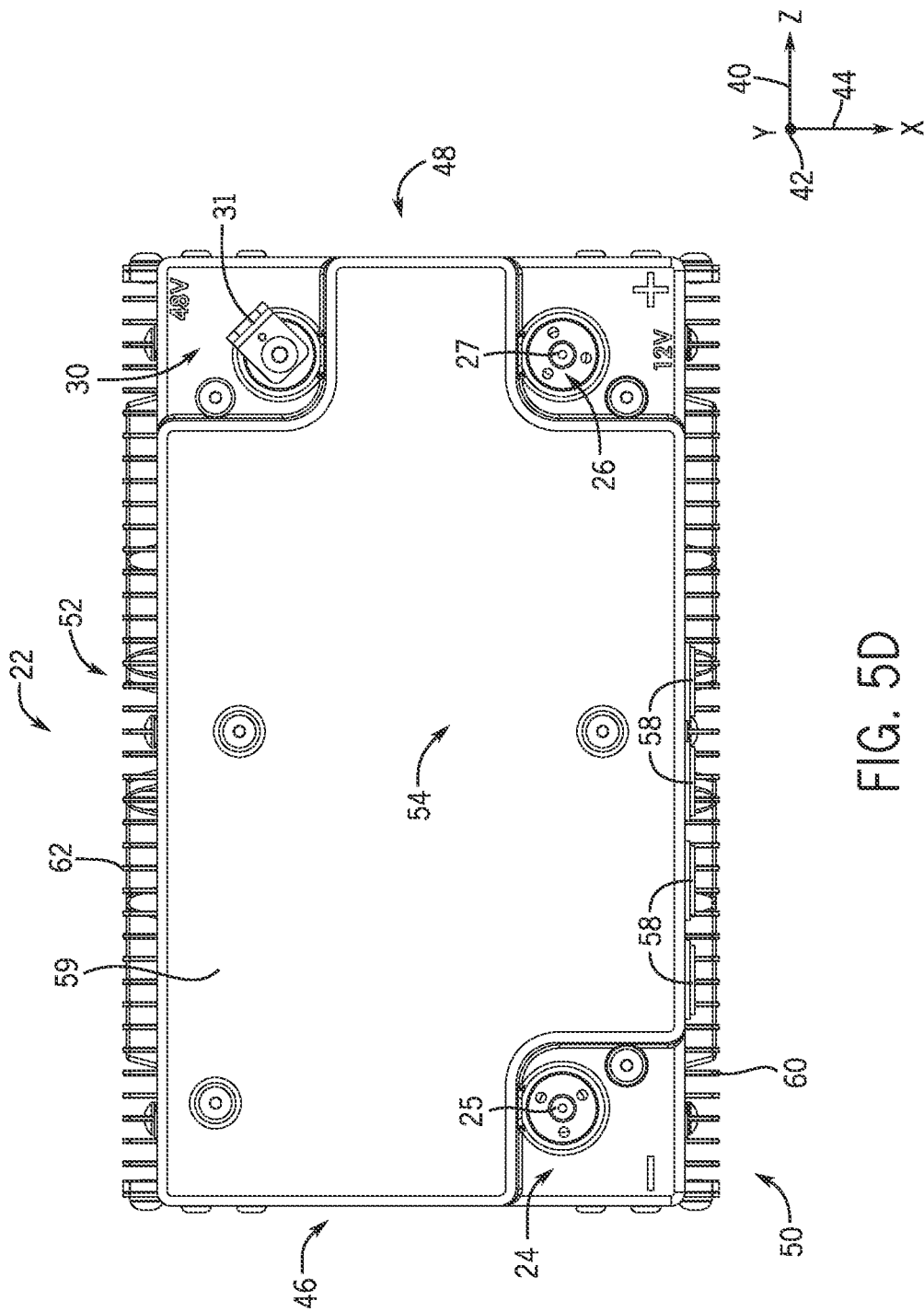
FIG. 5D is a top view of the battery module of FIG. 5A, in accordance with an embodiment of the present approach.
Figure 6:
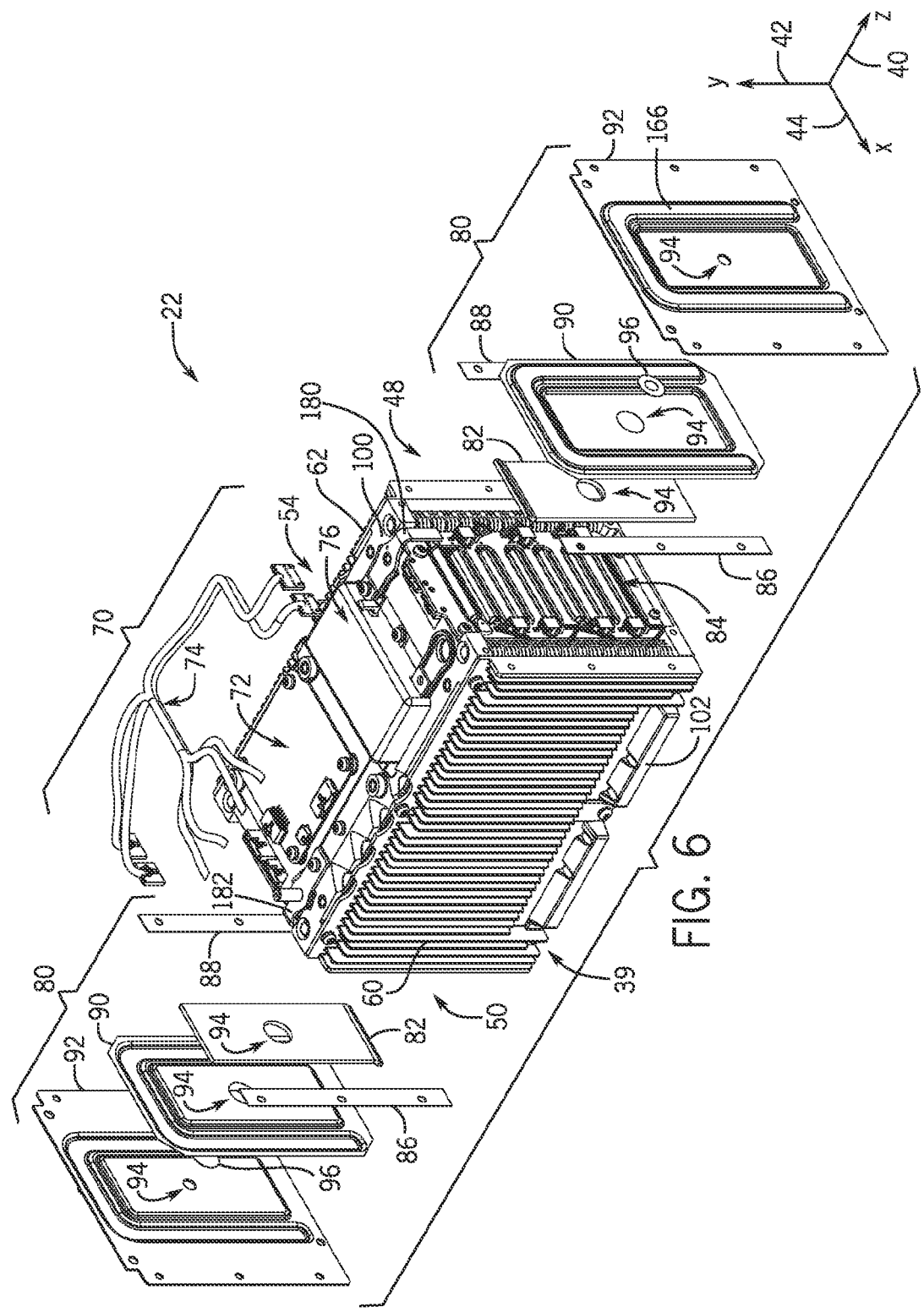
FIG. 6 is an end exploded perspective view of the battery module embodiment of FIGS. 5A-G, in accordance with an embodiment of the present approach.

FIG. 6 is an end exploded view of the embodiment of the battery module 22 illustrated in FIGS. 5A-G. It may be appreciated that the battery module 22 illustrated in FIG. 6 has the plastic cover 59 and the connectors 31, 25, and 27 (as discussed above) removed in order to better illustrate other assemblies and components of the battery module 22. With these components removed, a view of the top portion 54 of the battery module 22 shows a battery control assembly 70. The battery control assembly 70 may include, for example, a battery control module (BCM) 72 that may generally monitor and control operation of the battery module 22. The BCM 72, which may also be referred to as a battery management unit (BMU) 72, may comprise one or more circuit boards (e.g., printed circuit boards (PCBs)) that may include a processor and memory programmed to monitor and control the battery module 22 based on stored instructions. For example, the BCM 72 may receive input from at least one sensors disposed within the battery module 22 to determine at least one temperature within the battery module 22. Based on the determined temperature(s), the BCM 72 may regulate (e.g., restrict or increase) power output of the battery module 22. Further, in certain embodiments, the BCM 72 may, for example, perform load balancing of the battery cells of the battery module 22, control charging and discharging of the battery cells of the battery module 22, determine a state of charge of individual battery cells and/or the entire battery module 22, activate an active cooling mechanism via one or more fans, liquid cooling blocks, thermoelectric system, heat pipes, or other cooling devices to facilitate enhanced temperature control of the battery module 22.

The battery control assembly 70 illustrated in FIG. 6 also may include a number of cables 74 that respectively couple one or more sensors (e.g., temperature sensors, voltage sensors, current sensors, pressure sensors, or another suitable sensor) to the BCM 72 to provide information to the VCM 36 of the xEV 10 regarding the status of the battery module 22. Furthermore, in certain embodiments, the cables 74 may communicatively couple the BCM 72 of the battery module 22 to the VCM 36 of an xEV 10 such that the two control modules may work in tandem to, for example, regulate power usage in the vehicle 10, regulate power output of the battery module 22, regulate the temperature of the battery module 22, or other suitable control activities with respect to the battery module 22.

The battery control assembly 70 illustrated in FIG. 6 also includes a DC-to-DC converter 76, as will be discuss in further detail in a section below. The DC-to-DC converter 76 may be any suitable power conversion device that may be used to provide one of the output voltages (e.g., 12 V) of the battery module 22. That is, as set forth in detail below, the battery cells of the battery module 22 may be coupled in series to provide a first output voltage (e.g., 48 V), which may then be transformed to a different output voltage (e.g., 12 V) by the DC-to-DC converter 76. In certain embodiments, the DC-to-DC converter 76 may be communicatively coupled to and controlled by the BCM 72, which may determine or estimate a relative demand or priority for the two output voltages (e.g., when the mHEV 10 is starting or stopping the combustion engine), and may accordingly adjust the output of the DC-to-DC converter 76 to provide more or less of the second output voltage. Further, it may be appreciated that the illustrated 12 V DC-to-DC converter is merely provided as an example, and accordingly, in certain embodiments, the DC-to-DC converter 76 may output, for example, 3 V, 5 V, 10 V, 18 V, 20 V, or another suitable output voltage. In other embodiments, multiple DC-to-DC converters 76 may be included in the battery module 22 such that the battery module 22 may have three or more output voltages distributed over four or more terminals. Additionally, in certain embodiments, the DC-to-DC converter 76 may not be integrated into the battery module 22, but may instead be integrated into, for example, the xEV 10. The DC-to-DC converter 76 is discussed in greater detail below.

The exploded end portions 48 and 50 of FIG. 6 each illustrate an end assembly 80 of the battery module 22. Each end assembly 80 may include a thermal gap pad 82 that is disposed directly over the interconnected power assembly 84, which is discussed in greater detail below. Each end assembly 80 also includes rectangular gaskets 86 and 88, which are respectively disposed over the end portions 48 and 50 of the heat sink side plates 60 and 62. Additionally, each end assembly 80 includes an insulating polymer layer 90 (e.g., KAPTON® polyimide available from DuPont™ or another suitable insulating polymer) that may be adhered to an end plate 92 of the end assembly 80 and/or the thermal gap pad 82. Further, the thermal gap pad 82, the insulating polymer layer 90, and the end plate 92 of each end assembly 80 may include a vent feature 94 (e.g., a circular hole of varying sizes) such that each corresponding vent feature 94 aligns with one another and with a vent disk 96 disposed between the insulating polymer layer 90 and the end plate 92 (e.g., adhered to the end plate 92 by the insulating polymer layer 90). It may be appreciated that the vent disk 96 may be a selective membrane that may allow, for example, air to be exchanged with the ambient environment outside the battery module 22 without allowing moisture or humidity to enter the battery module 22. Additionally, as discussed in greater detail below, the vent features 94 and the vent disk 96 may cooperate to properly vent pressurized fluids if one or more of the battery cells of the interconnected power assembly 84 vents internal fluids. Finally, the end assemblies 80 may be coupled to the heat sink side plates 60 and 62 and to a top compression plate 100 and a bottom compression plate 102, which are discussed in greater detail below, using a plurality of screws (not illustrated) and the illustrated screw holes in the end plates 92 to seal the end assemblies to the remainder of the battery module 22.

FIG. 7 is another exploded view of the embodiment of the battery module 22 illustrated in FIG. 6, less the plastic cover 59, the end assemblies 80, cables 74, and connectors 58, discussed above. In FIG. 7, the battery module 22 includes the BCM 72 and the DC-to-DC converter 76 coupled to top plate 100 via a plurality of screws 101, as illustrated. The battery module 22 of FIG. 7 also includes a negative bus bar 104, which is configured to couple the DC-to-DC converter 76 to the negative terminal 24 of the battery module 22, and is secured to the top plate 100.

Additionally, as illustrated in FIG. 7, the heat sink side plates 60 and 62 discussed above are each part of a side assembly 106. Each side assembly 106 includes a heat sink side plate (e.g., heat sink side plates 60 or 62) and a thermal gap pad 108 secured to the top compression plate 100 and the bottom compression plate 102 using a number of screws 110, as illustrated. The thermal gap pads 108 of the side plate assemblies 106 are thermally conductive and have a suitable thickness that enables good contact and efficient thermal conduction between the sides of the internal heat fins 112 of the power assembly 84 (discussed in greater detail below) and the heat sink side plates 60 and 62. By specific example, in certain embodiments, the thermal gap pad 108 of the side assembly 106 may be a silicone elastomer (e.g., silicone rubber) impregnated with other materials (e.g., fiber glass), such as a SIL-PAD® elastomeric thermal interface (available from The Bergquist Company of Chanhassen, Minn.), or another suitable thermal gap pad material. It may be noted that, as discussed in detail below, when the side assemblies 106 are coupled to the top and bottom compression plates 100 and 102, as illustrated, the power assembly 84 may be removed through the opened end portions 48 and 50 of the battery module 22 (e.g., after removal of the end assemblies 80) without further disassembly of the battery module 22.

As illustrated in FIG. 7, the power assembly 84 is disposed between the top and bottom compression plates 100 and 102. The power assembly 84 illustrated in FIG. 7 includes a stack of battery cell assemblies 114, wherein each battery cell assembly 114 includes a number of layers discussed in detail below. It may be appreciated that the stack of battery cell assemblies 114 of the power assembly 84 may include a number of features, examples of which are set forth below, to enable the battery module 22 to efficiently transfer heat away from the battery cell assemblies 114 and toward the heat sink side plates 60 and 62. Further, the power assembly 84 may additionally include other layers, such as the thermal gap pads 115, which may be disposed between the power assembly 84 and the top and bottom compression plates 100 and 102. In certain embodiments, the power assembly 84 may include any suitable number of battery cell assemblies 114 (e.g., 1, 2, 3, 4, 5, 6, 7, 8, 9, 10, 11, 12, 13, 14, 15, or more) battery cell assemblies 114.

As illustrated in FIG. 7, each battery cell assembly 114 includes a pouch battery cell 116 disposed within a frame 118 (e.g., a polymer frame) and a polymer film 120 (e.g., polyethylene terephthalate (PET)) that may electrically isolate the pouch battery cell 116 from the internal heat fin 112. As discussed in detail below, each of the illustrated frames 118 include registration features 121 (e.g., alternating cup-like protruding and inset features), discussed in detail below, that may align each battery cell 116 to enable a uniform power assembly 84. On top of the pouch battery cell 116, a thermal gap pad 122 is disposed, followed by a phase change material (PCM) layer 124. The structure and properties of the various layers of the battery cell assembly 114 is discussed in detail below with respect to FIG. 12.

Additionally, as illustrated in FIG. 7, the battery module 22 also includes two interconnect assemblies 128 that may, in combination, couple each of the battery cells 116 of the power assembly 84. Specifically, tab electrodes 129 of the battery cells 116 may be communicatively coupled in series or in parallel. In particular, each illustrated interconnect assembly 128 may include a component, referred to herein as a cell interconnect board 130, which may provide structural support for the interconnection of the battery cells 116 and a number of sensors 132 (e.g., temperature sensors, voltage sensors, current sensors, pressure sensors, or another suitable sensor). Each cell interconnect board 130, which may be manufactured from a printed circuit board (PCB), may include a number of slots 134. These slots 134 may allow the tab electrodes 129 (discussed in greater detail below) of neighboring battery cells 116 of the power assembly 84 to pass through the cell interconnect board 130 as the cell interconnect board 130 is coupled to the top compression plate 100 and the bottom compression plate 102 via the screws 136. Further, after traversing the slots 134 of the cell interconnect board 130, the tab electrodes 129 neighboring battery cells 116 in the power assembly 84 may be coupled to one another using, for example, using the interconnection devices 138, which are illustrated as clamps in FIG. 7. In certain embodiments, the interconnection devices 138 may be coupled to the cell interconnect board 130 using pins or screws. Additionally, in certain embodiments, the interconnection devices 138 may further electrically couple to the one or more of the sensors 132 (e.g., current and/or voltage sensors) disposed on the cell interconnect board 130 to enable measurements of particular battery cells 116 in the power assembly 84, as discussed further below.

The embodiment of the battery module 22 illustrated in FIG. 7 also includes four compression bolts 140. Each illustrated compression bolt 140 passes through an opening in the top compression plate 100, through an opening in a registration feature 121 of the frames 118 surrounding each battery cell 116 of the power assembly 84, and extend to enable screwing into a locked nut feature 142 disposed in the bottom compression plate 102. The compression bolts 140 generally serve to compress the power assembly 84 such that each of the layers of the various battery cell assemblies 114 of the power assembly 84 are in intimate contact with one another (e.g., to encourage efficient thermal transfer). Accordingly, in certain embodiments, the compression bolts 140 may be torque-limited to prevent over tightening and/or over compression of the power assembly 84. It may also be appreciated that the compression bolts 140 further ensure that the frames 118 surrounding each battery cell 116 remain aligned or registered with one another, for example, as the battery module 22 is tilted and/or subjected to vibrations. In other embodiments, other compression methods may be used, as set forth in detail below.

Lithium Ion Battery with Lead Acid Form Factor

Present embodiments may provide non-lead acid batteries with form factors of standard lead acid batteries. For example, present embodiments include a single lithium ion battery system that provides two voltages (e.g., 12V and 48V) from a package having a form factor within boundaries defined for standardized lead acid batteries (e.g., standard 12V lead acid batteries). Accordingly, present embodiments may facilitate retrofitting systems (e.g., vehicles) designed to accommodate traditional lead acid batteries. For original equipment manufacturers, such as vehicle manufacturers, systems in accordance with present embodiments may be installed as original equipment in the place of conventional lead acid batteries with little or no alteration in the location or physical configuration of support structures and electrical connections. The presently disclosed embodiments may thus be used in connection with conventional internal combustion engines, hybrid vehicles, electric vehicles, and so forth. Moreover, present embodiments may be used for non-vehicular applications, such as for home or building energy storage, energy generation systems (e.g., wind or engine generators) and so forth.

Turning to FIG. 5A, present embodiments include the battery module 22, which may be considered generally representative of a battery module that is a non-lead acid battery (e.g., a battery module including ultracapacitors, nickel-zinc batteries, nickel-metal hydride batteries, and lithium batteries). In particular, the battery module 22 illustrated in FIG. 5A is a lithium ion battery module. Further, the battery module 22 is a lithium ion battery module with an overall geometry or dimensions that conform to the overall dimensions of a standard lead acid battery. In other words, the battery module 22 has overall dimensions (e.g., length, width, and height) that generally correspond to or fit within maximum overall dimensions for a standard lead acid battery. Specifically, the battery module 22 in the illustrated embodiment has dimensions that conform to the dimensions for a standard lead acid battery having DIN (Deutsches Institut für Normung) code H6, which is a European standard. However, in accordance with present embodiments, the battery module 22 may include a lithium ion battery module or other non-lead acid battery that conforms to any of various different lead acid dimensional standards, which may be generally referred to as falling within certain standardized form factors.

As generally suggested above, certain industry standards have been developed for use in configuring the physical packaging of lead acid batteries for many applications. For example, the Battery Council International (BCI) is a trade association that sets certain standards for vehicle batteries. A number of battery groups and sizes have been specified by the BCI. The listings below provide examples of certain of these, including European standards (e.g., DIN code H6):

| | | BCI/DIN/EN Reference Chart European Reference Information | | |
|---|---|---|---|---|
| | | | Maximum Dimensions—Millimeters | |
| DIN Code | EN Code | L | W | H |
| T6 | LB3 | 66LB | 278 | 175 | 175 |
| T65 | N/A | 54LB | 293 | 175 | 175 |
| T5 | LB2 | 45LB | 242 | 175 | 175 |
| H5 | L2 | 55L2 | 242 | 175 | 190 |
| H6 | L3 | 66L3 | 278 | 175 | 190 |
| H8 | L5 | 88L5 | 354 | 175 | 190 |
| T5 | LB2 | 45LB | 242 | 175 | 175 |
| T6 | LB3 | 66LB | 278 | 175 | 175 |
| T7 | LB4 | 77LB | 315 | 175 | 175 |
| T8 | LB5 | 88LB | 354 | 175 | 175 |
| H7 | L4 | 77L4 | 315 | 175 | 190 |
| H9 | L6 | | 394 | 175 | 190 |
| T5 | LB2 | 45LB | 242 | 175 | 175 |
| H5 | L2 | 55L2 | 252 | 175 | 190 |
| H6 | L3 | 66L3 | 283 | 175 | 190 |
| T4 | LB1 | 36LB | 207 | 175 | 175 |
| T4 | LB1 | 36LB | 210 | 175 | 175 |
| H3 | L0 | 32L0 | 175 | 175 | 190 |
| H4 | L1 | 45L1 | 207 | 175 | 190 |

| | Typical Maximum Overall Dimensions | | | | | |
|---|---|---|---|---|---|---|
| BCI Group | Millimeters | | | Inches | | |
| Number | L | W | H | L | W | H |
| PASSENGER CAR AND LIGHT COMMERCIAL_BATTERIES 12-VOLT (6 CELLS) | | | | | | |
| 21 | 208 | 173 | 222 | 8 3/16 | 6 13/1 | 6 83/4 |
| 22F | 241 | 175 | 211 | 9 1/2 | 6 7/8 | 8 5/16 |
| 22HF | 241 | 175 | 229 | 9 1/2 | 6 7/8 | 9 |
| 22NF | 240 | 140 | 227 | 9 7/16 | 5 1/2 | 8 15/16 |
| 22R | 229 | 175 | 211 | 9 | 6 7/8 | 8 5/16 |
| 24 | 260 | 173 | 225 | 10 1/4 | 6 13/16 | 8 7/8 |
| 24F | 273 | 173 | 229 | 10 3/4 | 6 13/16 | 9 |
| 24H | 260 | 173 | 238 | 10 1/4 | 6 13/16 | 9 3/8 |
| 24R | 260 | 173 | 229 | 10 1/4 | 6 13/16 | 9 |
| 24T | 260 | 173 | 248 | 10 1/4 | 6 13/16 | 9 3/4 |
| 25 | 230 | 175 | 225 | 9 1/16 | 6 7/8 | 8 7/8 |
| 26 | 208 | 173 | 197 | 8 3/16 | 6 13/16 | 7 3/4 |
| 26R | 208 | 173 | 197 | 8 3/16 | 6 13/16 | 7 3/4 |
| 27 | 306 | 173 | 225 | 12 1/16 | 6 13/16 | 8 7/8 |
| 27F | 318 | 173 | 227 | 12 1/2 | 6 13/16 | 8 15/16 |
| 27H | 298 | 173 | 235 | 11 3/4 | 6 13/16 | 9 1/4 |

-continued

BCI/DIN/EN Reference Chart
European Reference Information

| | | | | | | |
|---|---|---|---|---|---|---|
| 29NF | 330 | 140 | 227 | 13 | 5 1/2 | 8 15/16 |
| 31 | 325 | 167 | 238 | 12 13/16 | 6 9/16 | 9 3/8 |
| 31A | 325 | 167 | 238 | 12 13/16 | 6 9/16 | 9 3/8 |
| 31T | 325 | 167 | 238 | 12 13/16 | 6 9/16 | 9 3/8 |
| 33 | 338 | 173 | 238 | 13 5/16 | 6 13/16 | 9 3/8 |
| 34 | 260 | 173 | 200 | 10 1/4 | 6 13/16 | 7 7/8 |
| 34/78 | 260 | 175 | 200 | 10 1/16 | 6 7/8 | 7 7/8 |
| 34R | 260 | 173 | 200 | 10 1/4 | 6 15/16 | 7 7/8 |
| 35 | 230 | 175 | 225 | 9 1/16 | 6 7/8 | 8 7/8 |
| 36R | 263 | 183 | 206 | 10 3/8 | 7 1/4 | 8 1/8 |
| 40R | 277 | 175 | 175 | 10 15/16 | 6 7/8 | 6 7/8 |
| 41 | 293 | 175 | 175 | 11 3/16 | 6 7/8 | 6 7/8 |
| 42 | 243 | 173 | 173 | 9 5/16 | 6 13/16 | 6 13/16 |
| 43 | 334 | 175 | 205 | 13 1/8 | 6 7/8 | 8 1/16 |
| 45 | 240 | 140 | 227 | 9 7/16 | 5 1/2 | 8 15/16 |
| 46 | 273 | 173 | 229 | 10 3/4 | 6 13/16 | 9 |
| 47 | 246 | 175 | 190 | 9 11/16 | 6 7/8 | 7 1/2 |
| 48 | 306 | 175 | 192 | 12 1/16 | 6 7/8 | 7 9/16 |
| 49 | 381 | 175 | 192 | 15 | 6 7/8 | 7 3/16 |
| 50 | 343 | 127 | 254 | 13 1/2 | 5 | 10 |
| 51 | 238 | 129 | 223 | 9 3/8 | 5 1/16 | 8 13/16 |
| 51R | 238 | 129 | 223 | 9 3/8 | 5 1/16 | 8 13/16 |
| 52 | 186 | 147 | 210 | 7 5/16 | 5 13/16 | 8 1/4 |
| 53 | 330 | 119 | 210 | 13 | 4 11/16 | 81/4 |
| 54 | 186 | 154 | 212 | 7 5/16 | 6 1/16 | 8 3/8 |
| 55 | 218 | 154 | 212 | 8 5/8 | 6 1/16 | 8 3/8 |
| 56 | 254 | 154 | 212 | 10 | 6 1/16 | 8 3/8 |
| 57 | 205 | 183 | 177 | 8 1/16 | 7 3/16 | 6 15/16 |
| 58 | 255 | 183 | 177 | 10 1/16 | 7 3/16 | 6 15/16 |
| 58R | 255 | 183 | 177 | 10 1/16 | 7 3/16 | 6 15/16 |
| 59 | 255 | 193 | 196 | 10 1/16 | 7 5/8 | 7 3/4 |
| 60 | 332 | 160 | 225 | 13 1/16 | 6 5/16 | 8 7/8 |
| 61 | 192 | 162 | 225 | 7 9/16 | 6 3/8 | 8 7/8 |
| 62 | 225 | 162 | 225 | 8 7/8 | 6 3/8 | 8 7/8 |
| 63 | 258 | 162 | 225 | 10 3/16 | 6 3/8 | 8 7/8 |
| 64 | 296 | 162 | 225 | 11 11/16 | 6 3/8 | 8 7/8 |
| 65 | 306 | 190 | 192 | 12 1/16 | 7 1/2 | 7 9/16 |
| 70 | 208 | 179 | 196 | 8 3/16 | 7 1/16 | 7 11/16 |
| 71 | 208 | 179 | 216 | 8 3/16 | 7 1/16 | 8 1/2 |
| 72 | 230 | 179 | 210 | 9 1/16 | 7 1/16 | 8 1/4 |
| 73 | 230 | 179 | 216 | 9 1/16 | 7 1/16 | 8 1/2 |
| 74 | 260 | 184 | 222 | 10 1/4 | 7 1/4 | 8 3/4 |
| 75 | 230 | 179 | 196 | 9 1/16 | 7 1/16 | 7 11/16 |
| 75/25 | 238 | 173 | 197 | 9 3/8 | 6 13/16 | 7 3/4 |
| 76 | 334 | 179 | 216 | 13 1/8 | 7 1/16 | 8 1/2 |
| 78 | 260 | 179 | 196 | 10 1/4 | 7 1/16 | 7 11/16 |
| 85 | 230 | 173 | 203 | 9 1/16 | 6 13/16 | 8 |
| 86 | 230 | 173 | 203 | 9 1/16 | 6 13/16 | 8 |
| 90 | 246 | 175 | 175 | 9 11/16 | 6 7/8 | 6 7/8 |
| 91 | 280 | 175 | 175 | 11 | 6 7/8 | 6 7/8 |
| 92 | 317 | 175 | 175 | 12 1/2 | 6 7/8 | 6 7/8 |
| 93 | 354 | 175 | 175 | 15 | 6 7/8 | 6 7/8 |
| 95R | 394 | 175 | 190 | 15 9/16 | 6 7/8 | 7 1/2 |
| 96R | 242 | 173 | 175 | 9 9/16 | 6 13/16 | 6 7/8 |
| 97R | 252 | 175 | 190 | 9 15/16 | 6 7/8 | 7 1/2 |
| 98R | 283 | 175 | 190 | 11 3/16 | 6 7/8 | 7 1/2 |
| PASSENGER CAR AND LIGHT COMMERCIAL BATTERIES 6-VOLT(3 CELLS) | | | | | | |
| 1 | 232 | 181 | 238 | 9 1/8 | 7 1/8 | 9 3/8 |
| 2 | 264 | 181 | 238 | 10 3/8 | 7 1/8 | 9 3/8 |
| 2E | 492 | 105 | 232 | 19 7/16 | 4 1/8 | 9 1/8 |
| 2N | 254 | 141 | 227 | 10 | 5 9/16 | 8 15/16 |
| 17HF | 187 | 175 | 229 | 7 3/8 | 6 7/8 | 9 |
| HEAVY-DUTY COMMERCIAL BATTERIES 12-VOLT (6 CELLS) | | | | | | |
| 4D | 527 | 222 | 250 | 20 3/4 | 8 3/4 | 9 7/8 |
| 6D | 527 | 254 | 260 | 20 3/4 | 10 | 10 1/4 |
| 8D | 527 | 283 | 250 | 20 3/4 | 11 1/8 | 9 7/8 |
| 28 | 261 | 173 | 240 | 10 5/16 | 6 13/16 | 9 7/16 |
| 29H | 334 | 171 | 232 | 13 1/8 | 6 3/4 | 9 1/8 10 |
| 30H | 343 | 173 | 235 | 13 1/2 | 6 13/16 | 9 1/4 10 |
| 31 | 330 | 173 | 240 | 13 | 6 13/18 | 9 7/16 |

-continued

BCI/DIN/EN Reference Chart
European Reference Information

| ELECTRIC VEHICLE BATTERIES 6-VOLT (3 CELLS) | | | | | | |
|---|---|---|---|---|---|---|
| GC2 | 264 | 183 | 270 | 10 3/8 | 7 3/16 | 10 5/8 |
| GC2H | 264 | 183 | 295 | 10 3/8 | 7 3/16 | 11 5/8 |

The listings set forth above are not exhaustive and the battery module 22 may generally be representative of a non-lead acid battery that conforms to other standardized form factors for lead acid batteries. It should also be noted that a number of variations in the form factors listed above may be due to such factors as rated voltages, capacity, application, the physical mounting requirements (which may vary for different original equipment manufacturers), the terminal types and configurations, the country or region, and so forth. Terminals may be placed, for example, in top, front, side or a combination of locations. Hold-down ledges (e.g., footings) and features may similarly vary with the different enclosures.

In some embodiments, the housing 39 of the battery module 22 may be substantially smaller than the standard dimensions for a lead acid battery. Accordingly, various adapters, shims, and so forth may be used to more closely conform to existing mounting structures for lead acid batteries. Such adapters and similar hardware may be designed to allow the battery module 22 to fit within particular systems (e.g., vehicles). These adapters may fit on sides, the base, the top, or generally anywhere on the housing 39 that may not directly conform to the desired mounting position or structures.

The particular outside geometry and configuration of internal features of the battery module 22, such as the power assembly 85, may be adapted based on the available space and layout dictated by the standard lead acid battery dimensions to which the housing 39 of the battery module 22 conforms. Indeed, many variations of such structures may be designed and implemented in accordance with present embodiments. Specifically, for example, present embodiments include certain arrangements and configurations of external and internal features in conformance with the overall dimensions of a desired lead acid battery standard while still achieving certain performance goals. For example, to more efficiently utilize available space for heat transfer, present embodiments may include side portions (e.g., heat sink side plates 60 and 62, end plates 92) that substantially extend to the outermost limits of standard dimensions for a lead acid battery. This may include extending a large percentage (e.g., 90%, 91%, 92%, 93%, 94%, 95%, 96%, 97%, 98%, 99%) of the maximum available distance within the standard and even all the way (100%).

Present embodiments may also include, for example, configurations for providing internal space within the housing 103 to accommodate a number of battery cells 116 and/or the battery control assembly 84 such that one or more voltages beyond or differing from what would be provided by a standard lead acid battery of the same size can be provided while still conforming to the associated standardized dimensions of the standard lead acid battery. Present embodiments may also be configured to accommodate certain heat transfer goals by including lengthened internal heat fins 112 or lengthened heat sink side plates 60 and 62. Utilizing available space to facilitate heat transfer or incorporate internal battery components (e.g., lithium ion components) may also result in changes relative to typical lead acid battery configurations, such as elimination of recesses along the sides or elimination of certain attachment features.

As a specific example of certain configuration aspects discussed above, in the illustrated embodiment, certain features of the housing 39 substantially extend in at least one direction to an outermost dimension of a standard lead acid battery. Such features include the end plates 92, the heat sink side plates 60 and 62 (or heat sink outer wall feature), the plastic or composite cover 59, the bottom compression plate 102, aspects of such features, and so forth. As an example of extending in at least one direction to an outermost dimension of a standard lead acid battery, an outer surface of an outer wall (e.g., end plate 92) of the housing 39 may extend (relative to a corresponding opposite surface) to an outer boundary of a standard length dimension associated with a particular lead acid battery code or standard. As previously noted, the illustrated battery module 22 conforms with DIN code H6, which has a maximum length dimension of 278 millimeters (10.94 inches), a maximum width dimension of 175 millimeters (6.88 inches), and a maximum height dimension of 190 millimeters (7.48 inches). As illustrated by FIG. 5A, the length 150, width 152, and height 154 dimensions of the battery module 22 are approximately 277.11 millimeters (10.91 inches), 173.99 millimeters (6.85 inches), and 189.99 (7.48 inches), respectively. Thus, the battery module 22 conforms to the dimensions associated with DIN code H6 and substantially extends in the length, width, and height dimensions to the corresponding maximum dimensions of DIN code H6.

Specifically, for example, a length of the heat sink outer wall feature, which includes the heat sink side plates 60 and 62 in the illustrated embodiment, substantially extends to the maximum length dimension for DIN code H6. Indeed, each of the heat sink side plates 60 and 62 may be approximately 10.71 inches in length. This extension substantially to the standard limit may prevent inclusion of a recessed area between the top portion 54 and the bottom portion 55 (e.g., a recessed battery wall relative to a base and top cover). Further, in conjunction with other features of the housing (e.g., the end plates 92), such an extension may prevent inclusion of features for coupling with the battery module 22. However, such an extension may also accommodate various features of the battery module 22, such as by providing extra space for certain functional features within the available standardized area. For example, the extra space may facilitate inclusion of heat transfer features along the outside of the heat sink side plates 60 and 62. Also, the associated added internal length may accommodate the cell interconnect boards 130, which may be spaced apart to enable positioning of battery cells 116 in between and to properly align with tab electrodes 129 extending from the battery cells. Similarly, the space may be utilized to accommodate the internal heat fins 112, the PCM 124, and so forth.

As specific example of space utilization in accordance with present embodiments, it is noted that heat transfer features 156 (e.g., fins) on the heat sink side plates 60 and 62 are spaced apart by approximately 4.32 millimeter (0.17 inches) and have a thickness of approximately 0.25 millimeters (0.1 inches) in the illustrated embodiment. Thus, the additional space provided by extending the heat sink side plates 60 and 62 substantially to the outer dimensional boundaries of the standard (lead acid battery standard) provides room for additional heat transfer features 156 that can be used to achieve a desired overall level of heat transfer. It should be noted that the end plates 92 may be coupled to the distal ends of the heat sink outer wall feature to further extend toward the standard boundaries, as illustrated in FIG. 6. Further, it should be noted that, while the heat sink outer wall feature is presently described and illustrated as including the heat sink side plates 60 and 62, in other embodiments it may include a single such plate or multiple plate components.

Also, the heat transfer features 156, which include fins or ridges that run or extend along a majority of the height of the housing 39, also extend outward from the heat sink side plates 60 and 62 along the X axis 44 by a certain amount (e.g., approximately 9.9 millimeters (0.39 inches)). These heat transfer features 156 may have a consistent alignment along the length of each of the heat transfer features 156 such that a consistent outer boundary is defined by the outer surfaces of the heat transfer features 156. These outer boundaries of the heat transfer features 156 on both heat sink side plates 60 and 62 may substantially extend to the outer dimensions of a lead acid battery standard. This substantially consistent extension to the width dimension along the height of the battery module 22 is in contrast to traditional batteries that have recessed sidewalls. The distance between outer surfaces of heat transfer features 156 on the heat sink side plate 60 and outer surfaces of heat transfer features 156 on the heat sink side plate 62 may substantially extend to the width dimension for a standard lead acid battery. In other words, outer edges of the two heat sink side plates 60 and 62 are spaced apart by a distance substantially equal to an outermost width dimension of the standard. The extra heat transfer capability achieved by extending the heat transfer features 156 in this manner may facilitate inclusion of footings 160 under a subset 162 of heat transfer features 156 that are shortened relative to other heat transfer features 156, as illustrated in FIG. 5A. Indeed, the subset 162 may have a height of approximately 129.53 millimeters (5.1 inches) relative to other heat transfer features 156 that generally have a height of approximately 162.56 millimeters (6.4 inches). There may be approximately 27.94 millimeters (1.1 inches) (e.g., approximately 15% of the overall height of the battery module 22) of space between the bottom of the subset 162 and the bottom portion 56 for incorporation of the footings 160.

As noted above, the battery module 22 includes footings 160. The footings 160 facilitate coupling or securing of the battery module 22 to a support (e.g., a battery receptacle in a vehicle) and are generally aligned with the bottom portion 56. The footings 160 are included on two sides of the battery module 22 and excluded on the other sides. Specifically, in the illustrated embodiment, the footings 160 are positioned on the same sides as the heat sink side plates 60 and 62. However, no footings are included on the sides with the two end portions 46 and 48 (e.g., end plates 92). In other embodiments this relationship may be reversed. While a typical lead acid battery may include footings on all sides, present embodiments may utilize the space that would be taken up by including the excluded footings to accommodate the end plates 92. Indeed, protuberances 166 in the end plates 92, which are generally U-shaped in the illustrated embodiment, provide structural integrity for the end plates 92 and accommodate buses 180 and 182, may substantially extend outward along the Z axis 40 to a maximum length dimension for a standard lead acid battery. In other words, the space between the outermost surfaces of the protuberances on the end plates 92 for the ends of the battery module 22 may be spaced apart by a distance substantially equal to the maximum length dimension for the lead acid battery standard. Because the end plates 92 are substantially planar and base portions of the end plates 92 substantially align with the bottom portion 56, no space is available for footings at the ends along the Z axis 40. This positioning of the end plates 92 may be desirable for accommodation of internal components, such as accommodation of a length of the battery cells 116, accommodation of positioning of cell interconnect boards 130, accommodation of extra length for the heat fins 112 or the PCM 124, and so forth.

As noted above, the battery module 22 may include a lithium ion battery and the housing 39 may have dimensions that conform to overall dimensions for a standard lead acid battery. The battery module 22 may also include the top compression plate 100, the bottom compression plate 102, and a plurality of lithium ion battery cells 116 arranged in a stack within the housing 39 and between the top compression plate 100 and the bottom compression plate 103. Furthermore, to facilitate functionality beyond the nature of a particular standard lead acid battery, yet within the same standard dimension, the battery module 22 may include the battery control assembly 70. This battery control assembly 70, which may include the BCM 72, cables 74, and the DC-to-DC converter 76, may enable provision of multiple different voltages from different terminals of the battery module 22. The negative terminal 24 may couple (e.g., via one of the busses 180 and 182) with an anode of the stack of battery cells 116, the first positive terminal 26 may couple with a cathode of the stack of battery cells 116, and the second positive terminal 30 may coupled with the DC-to-DC converter 76, which may in turn couple with the cathode of the stack of battery cells 116. While the illustrated battery module 22 includes a three terminal battery that utilizes the terminal 24 as a common ground between two voltage networks, in other embodiments the voltage networks may be isolated through the DC-to-DC converter and provide four terminals. Furthermore, to facilitate access and maintain the overall form factor of a standard lead acid battery, the battery control assembly (e.g., the BCM 72) is disposed within the housing 39 on a side of the top compression plate 100 opposite the plurality of lithium ion battery cells 116.

One or more of the disclosed embodiments, alone or in combination, may provide one or more technical effects useful in the manufacture, assembly (e.g., retrofitting) and defining of operational characteristics of battery modules. For example, certain embodiments of the present approach may enable improved capabilities relative to the capabilities of a standard lead acid battery but within standardized dimensions for the standard lead acid battery. This may facilitate inclusion of updated batteries in systems designed for traditional lead acid batteries. By specific example, providing a stack of lithium ion cells within a housing that incorporates heat transfer features extending substantially to the maximum standard dimensions of a lead acid battery and a DC-to-DC converter, present embodiments may offer substantially improved functionality (e.g., supply of multiple different voltage levels) within the same package compared to traditional lead acid battery systems. The technical effects and technical problems in the specification are exemplary and are not limiting. It should be noted that the embodiments described in the specification may have other technical effects and can solve other technical problems.

Battery Module with Cooling Features

Figure 8:
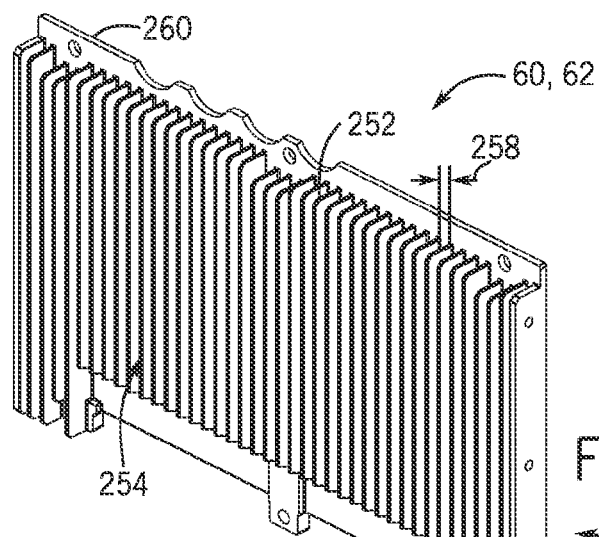
FIG. 8 is perspective view of a passively-cooled heat sink side plate of a battery module, in accordance with an embodiment of the present approach.
Figure 9:
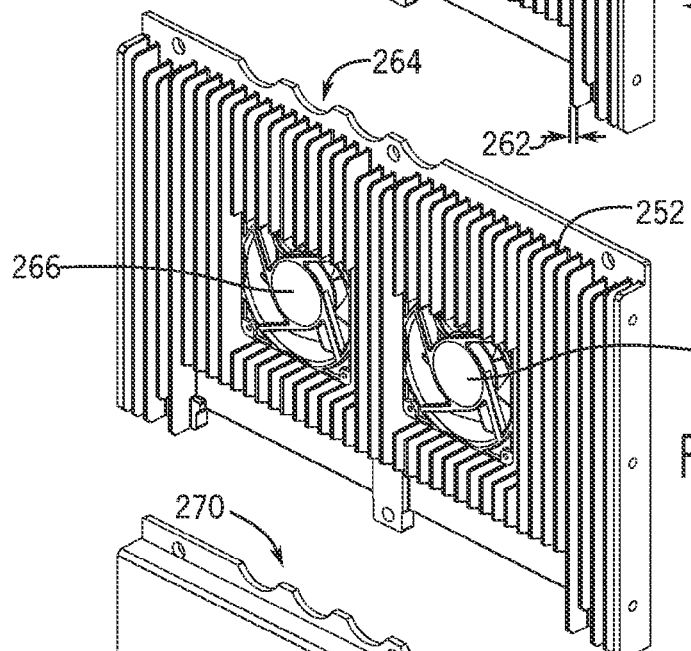
FIG. 9 is perspective view of an actively-cooled heat sink side plate of a battery module that includes one or more fans, in accordance with an embodiment of the present approach.
Figure 10:
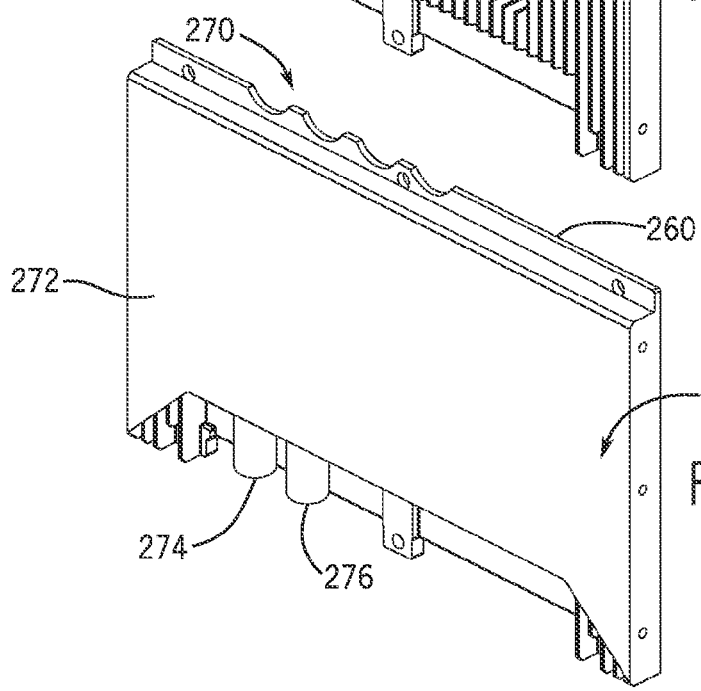
FIG. 10 is perspective view of an actively-cooled heat sink side plate of a battery module having a liquid cooling block, in accordance with an embodiment of the present approach.

FIGS. 8-10 illustrate different embodiments of heat sink outer wall features of the battery module 22. Each of the heat sink outer wall features of FIGS. 8-10 may correspond to or replace one or both of the heat sink side plates 60 and 62, as illustrated in FIGS. 5-7. Accordingly, it may be appreciated that, any of the heat sink side plate embodiments illustrated in FIGS. 8-10 may be used in various combinations on the first or second side portions 50 and 48 of the battery module 22. Further, as set forth below, the heat sink side plate embodiments set forth in FIGS. 8-10 may provide passive cooling, active cooling, or combinations thereof. It may be appreciated that a number of the features discussed below (e.g., the heat sink side plates 60 and 62, the internal heat fins 112, the PCM layers 124, the thermal gap pads 108, 122, and 115, the housing 39, sensors 132, and/or the battery control module 72) may be collectively referred to in various combinations as the thermal management system of the battery module 22.

For example, FIG. 8 illustrates the heat sink side plate 60 (or 62), which is a passive cooling device. The illustrated heat sink side plate 60 may be manufactured from a metal or alloy, such as steel, aluminum, copper, nickel, tin, or another suitable metal or alloy. In particular, the heat sink side plate 60 illustrated in FIG. 8 includes 39 external heat fins 252 as well as two mounting plates 253 positioned at opposite ends of the heat sink side plate 60. The illustrated external heat fins 252 are disposed vertically along the outer side 254 of the heat sink side plate 60 and are configured to radiate heat from the power assembly 84 of the battery module 22 to the ambient environment outside the battery module 22. For example, as set forth in detail below, the internal heat fins 112 of the power assembly 114 may be positioned to be in thermal contact (e.g., thermal communication) with an inner side 256 of the heat sink side plate 60. As such, as each battery assembly 114 imparts thermal energy to the inner side 256 of the heat sink side plate 60, the external heat fins 252 of the heat sink side plate dissipates the received thermal energy into the environment surrounding the battery module 22.

It may be appreciated that, in certain embodiments, a heat sink side plate 60 of FIG. 8 may include any number of (e.g., 5, 10, 15, 20, 25, 30, 35, 40, 45, 50 or more) external heat fins 252 arranged vertically, horizontally, diagonally, or any combination thereof. It may also be appreciated that the vertical orientation of the illustrated external heat fins 252 may facilitate the convection (e.g., heat-driven circulation) of a cooling fluid (e.g., air) between the external heat fins 252 to enable better passive cooling of the battery module 22 than horizontal or diagonal fins may provide. In certain embodiments, the external heat fins 252 may also be tapered to enable better heat flow. For example, in an embodiment with a vertical arrangement of external heat fins 252, the external heat fins 252 may be wider in the bottom and narrower on top to enable a jet stream flow of cooling fluid (e.g., air) from bottom to top. In certain embodiments, the spacing 258 between the external heat fins 252 may be approximately 2 mm, 3 mm, 4 mm, 5 mm, 6 mm, 7 mm, 8 mm, 9 mm, 10 mm, or more. In certain embodiments, the external heat fins 252 may extend away from a back plate 260 approximately 5 mm, 6 mm, 7 mm, 8 mm, 9 mm, 10 mm, 11 mm, 12 mm, or more. Further, in certain embodiments, the fins 252 may have a thickness 262 of 0.5 mm, 1 mm, 1.5 mm, 2 mm, 2.5 mm, 3 mm, 3.5 mm, 4 mm, 4.5 mm, 5 mm, or more. In certain embodiments, the fins 252 may have a thickness of greater than or equal to 0.3 mm, while the spacing 258 between the fins 258 may be greater than or equal to approximately 1 mm.

FIG. 9 illustrates an embodiment of a heat sink side plate 264 that is similar to the heat sink side plate 60 illustrated in FIG. 8, but with additional active cooling features. That is, in addition to the external heat fins 252 extending from the back plate 260 discussed above, the heat sink side plate 264 illustrated in FIG. 9 includes two cooling fans 266 that are coupled to the heat sink side plate 264. It may be appreciated that certain embodiments of the heat sink side plates 264 may lack the external heat fins 252 altogether. During operation, in addition to the airflow provided by convection, the cooling fans 266 provide additional cooling airflow to maintain the temperature of the battery module 22. In certain embodiments, the operation of the cooling fans 266 may be controlled by the BCM 72 of the battery module 22 or by the VCM 36 of an xEV 10, as illustrated in FIG. 4, such that the cooling fans 266 are only operated when the battery module 22 is at or above a particular threshold temperature.

FIG. 10 illustrates an embodiment of an active cooling heat sink side plate 270 having a liquid cooling block 272 attached to the back plate 260. Additionally, the liquid cooling block 272 of the heat sink side plate 270 includes a liquid input port 274 and a liquid output port 276. While the embodiment of FIG. 10 illustrates the liquid input port 274 and the liquid output port 276 as being positioned at the bottom of the heat sink side plate 270, in other embodiments, these ports 274 and 276 may be positioned anywhere (e.g., top, middle, or near the end portions) on the heat sink side plate 270. During operation, a liquid coolant is delivered to the liquid cooling block 272 via the liquid input port 274, and the liquid coolant subsequently traverses an internal cavity of the liquid cooling block 272 to absorb heat from the battery module 22. In certain embodiments, the internal cavity of the liquid cooling block 272 may include a number of internal fins, ribs, ducts, and/or channels that are arranged to provide a particular flow path through the liquid cooling block 272 for the coolant liquid to flow. After traversing the liquid cooling block 272, the heated liquid coolant may exit the liquid cooling block 272 via the liquid output port 276. In certain embodiments, the flow of the liquid coolant may be driven by convection alone, while in other embodiments, an active mechanism (e.g., a pump) may be used. In certain embodiments, after exiting the liquid output port 276 of the liquid cooling block 272, the liquid coolant may be directed to a radiator or a similar cooling device before being returned to the liquid input port 274 of the liquid cooling block 272 once again. Further, in other embodiments, the liquid cooling block 272 may include a front plate (e.g., like the back plate 260, but disposed on a front face 278 of the liquid cooling block 272) that may be coupled to a second battery module such that a single liquid cooling block 272 may be used to cool both battery modules. It may be appreciated that the liquid cooling block 272 is merely provided as an example, and in other embodiments, other suitable devices (e.g., thermoelectric devices) may also be used to control the temperature of the battery module 22. It may also be appreciated that, in certain embodiments, the battery module 22 may utilize a liquid cooling block 272 and a heated fluid (or a thermoelectric device) to warm the battery module 22 for improved operation in colder environments.

Figure 11:
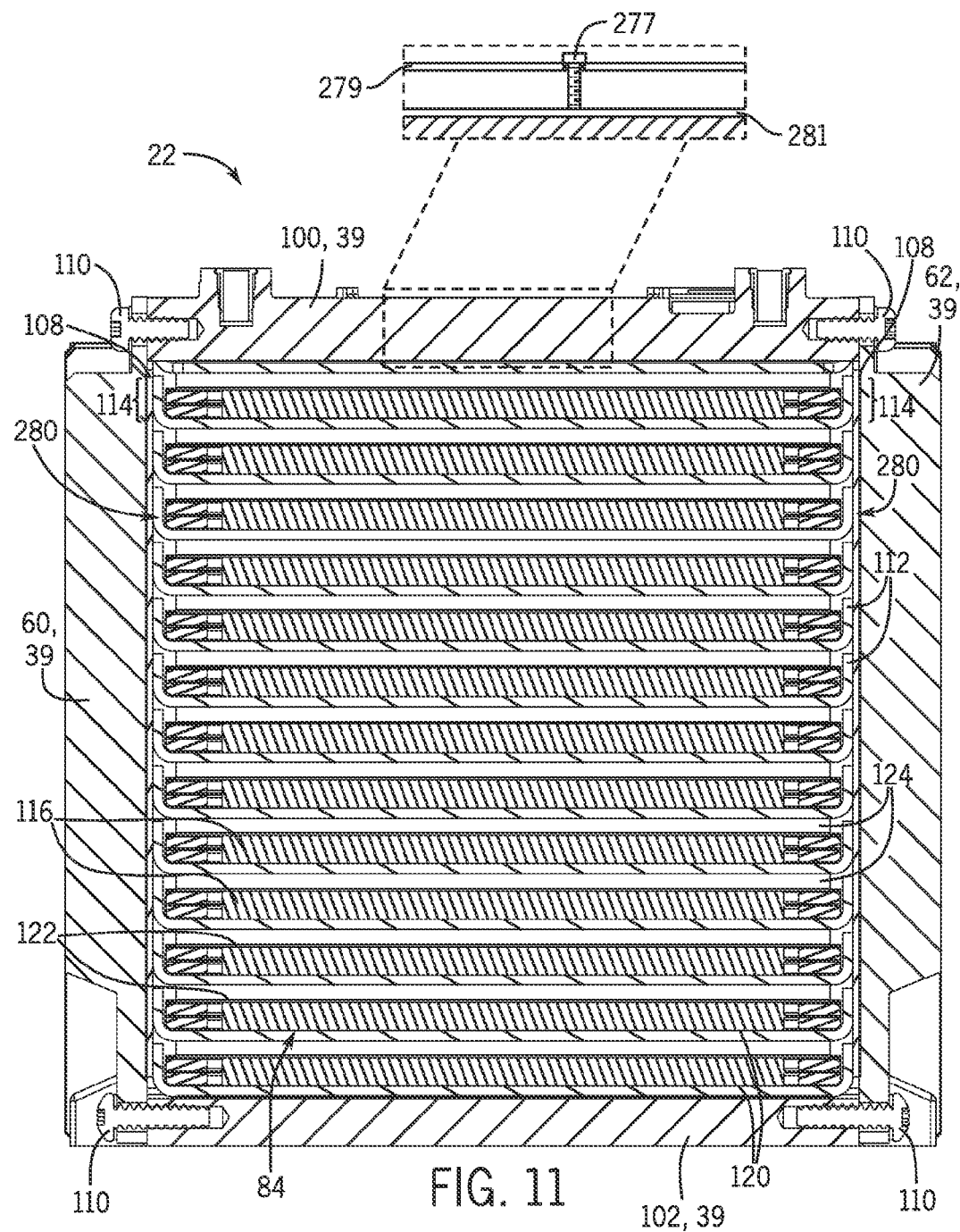
FIG. 11 is a cross-sectional view of the battery module embodiment of FIG. 5A taken along line 11-11, in accordance with an embodiment of the present approach.

To better illustrate other features of the thermal management system of the battery module 22, FIG. 11 is a cross-sectional view of the battery module 22 of FIG. 5A taken along line 11-11. For the embodiment of the battery module 22 illustrated in FIG. 11, the housing 39 of the battery module 22 (e.g., including the top compression plate 100, the bottom compression plate 102, and the heat sink side plates 60 and 62) is disposed around the power assembly 84 of the battery module 22. As illustrated, the heat sink side plates 60 and 62 are respectively coupled to the top compression plate 100 and the bottom compression plate 102 by the screws 110. Further, thermal gap pads 108 are respectively positioned below the heat sink side plates 60 and 62, against the stacked curved side portions 280 of the internal heat fins 112 of the power assembly 84. It should also be appreciated that, in certain embodiments, since the housing 39 of the battery module 22 may be manufactured from a metal or alloy (e.g., steel, aluminum, copper, tin, nickel, or another suitable metal or alloy), the entire housing 39 of the battery module 22 may radiate or otherwise dissipate heat from the power assembly 84 during operation.

It should be appreciated that the housing 39 may include one or more compression management features to compress the individual battery assemblies 114 of the power assembly 84 of the battery module 22. In certain embodiments, as previously discussed, the compression bolts 140 may pass through a portion of the top compression plate 101, extend through one or more registration features 121 of the frames 118 of each battery cell 116, and thread into portions of the bottom compression plate 102 (e.g., in a torque limited fashion) to compress the power assembly 84. In other embodiments, as illustrated in FIG. 11, the top compression plate 39 may include an expansion bolt 277 that may extend between a top portion 279 and a bottom portion 281 of the top compression plate 100. As illustrated, the top portion 279 and the bottom portion 281 may be implemented as two separate plates, in which the top portion 279 is fixed relative to the housing 39, while the bottom portion 281 is able to move. Upon tightening the expansion bolt 277, the bottom portion 281 of the top compression plate 100 may be forced away from the top portion 279 of the top compression plate 100 (e.g., along the Y axis 42), which may compress the power assembly 84 (e.g., along the Y axis 42). It may be appreciated that, in certain embodiments, the compression features 277, 279, and 281 may be include, additionally or alternative, in the bottom compression plate 102 to provide at least partially compress the power assembly 84.

It may be appreciated that the various thermal gap pads (e.g., thermal gap pads 108, 115, and 122) used throughout the illustrated battery module 22 may generally provide a number of functions. That is, the thermal gap pads 108, 115, and 122 are thermally conductive layers (e.g., such as a SIL-PAD® elastomeric thermal interface), enabling a relatively high-efficiency heat transfer across the thermal gap pads. Further, the thermal gap pads 108, 115, and 122 may each generally enable good thermal contact (e.g., limiting or preventing insulating air gaps) between components disposed on opposite sides of the thermal gap pads (e.g., directly between the curved side portions 280 of the internal heat fins 112 and the heat sink side plates 60 and 62, directly between the battery cell 116 and the PCM layer 124, and directly between the top and bottom of the power assembly 84 and the battery housing 39). In particular, the thermal gap pads 108, 115, and 122 may be a foam-like material that ensures good contact between components by expanding and contracting to account for manufacturing variability and/or surface deformities of the components of the battery module 22 (e.g., a slightly thicker or thinner battery cell 116). For example, the thermal gap pads 115 and 122 may serve as spring elements that enable a uniform pressure to be provided to each battery cell 116 of the power assembly 84 of the battery module 22. Additionally, in certain embodiments, the thermal gap pads 108, 115, and 122 may also provide at least some vibration dampening for the components disposed near the thermal gap pads 108, 115, and 122. Further, it may be appreciated that, in certain embodiments, each of the thermal gap pads 108, 115, and 122 may be manufactured from a particular material and/or have a particular set of dimensions to provide the desired heat transfer, expansion/compression, and/or vibration absorption properties.

As discussed above, in certain embodiments, the power assembly 84 of the battery module 22 may include a plurality of battery assemblies 114. Additionally, each illustrated battery assembly 114 of FIG. 11 includes an internal heat fin 112, insulating polymer layer 120, a battery cell 116, a thermal gap pad 122, and a PCM layer 124, disposed directly atop one another in a tightly packed horizontal stack. In other words, the illustrated power assembly 84 includes a plurality of internal heat fins 112 that are interleaved or interdigitated with the plurality of battery cells 116. While the illustrated embodiment of FIG. 11 provides a horizontal stack of battery assemblies 114, in other embodiments, the power assembly 84 may be provided as a vertical stack of battery assemblies 114 without negating the effect of the present approach. Further, as mentioned above, FIG. 11 illustrates the curved side portions 280 of the internal heat fins 112, which are compressed against the thermal gap pads 108 below the heat sink side plates 60 and 62, respectively. It may be appreciated that the curved side portions 280 may enable the internal heat fins 112 to have greater overlap, and accordingly better heat transfer (e.g., improved thermal contact or communication), with the heat sink side plates 60 and 62 than would be provided if the curved side portions 280 were not present. In other embodiments, the internal heat fins 112 may have an angled portion (e.g., a right angled portion) to provide this overlap without the use of the curved side portions 114 illustrated in FIG. 11.

Figure 12:
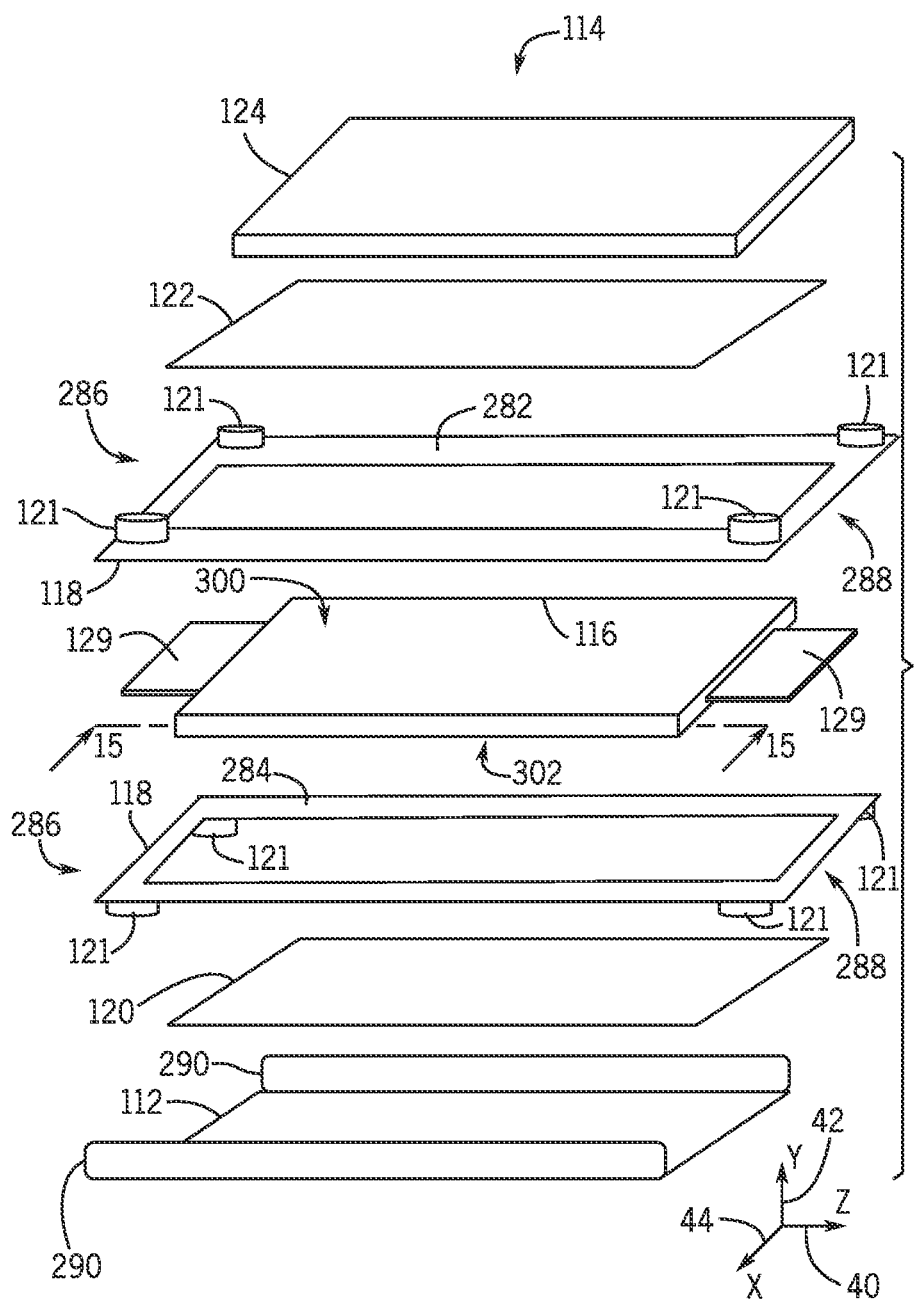
FIG. 12 is a exploded schematic of a battery cell assembly of a battery module, in accordance with an embodiment of the present approach.

With the foregoing in mind, FIG. 12 is an exploded schematic of an embodiment of a battery cell assembly 114. It should be appreciated that the various components of the battery cell assembly illustrated in FIG. 12 are configured to form a stack (e.g., a horizontal "pancake" stack or a vertical "bookshelf" stack); therefore, while the present discussion may be directed toward a horizontal stack, this is merely provided as a non-limiting example. As illustrated in FIG. 12, in certain embodiments, the battery cell assembly 114 may include the internal heat fin 112, having the curved side portions 280 to enhance heat transfer to the heat sink side plates 60 and 62, as set forth above. Additionally, for embodiments in which the internal heat fin 112 is also electrically conductive (e.g., for an internal heat fin 112 manufactured from a metal, alloy, HOPG, or another conductive material), the electrically insulating polymer layer 120 (e.g., a polyimide electrically insulating layer) may be positioned directly between the internal heat fin 112 and the battery cell 116 to electrically insulate the battery cell 116 from the electrically conductive internal heat fin 112. It may be appreciated that, for embodiments in which the internal heat fin 112 is not electrically conductive, the electrically insulating polymer layer 120 may not be used. In certain embodiments of the battery module 22, there may be exactly one internal heat fin 112 for each battery cell 116 of the battery module. In other embodiments, the battery module 22 may include one extra internal heat fin 112 that is disposed directly on top of the first battery cell assembly 114 (e.g., directly on top of the illustrated PCM layer 124) of the battery module 22. Further, as illustrated, in certain embodiments, the internal heat fin 112 may be manufactured from a single piece of heat conductive material, which may limit manufacturing costs, simplify assembly of the battery cell assembly 114, and ensure good heat transfer within the internal heat fin 112.

For the embodiment of the battery cell assembly 114 illustrated in FIG. 12, the battery cell 116, which is illustrated as a pouch battery cell 116, is configured to be sandwiched directly between a top portion 282 and a bottom portion 284 of the frame 118. As set forth in detail below, the frame 118 may be coupled to the pouch battery cell 116 in a number of different ways, including embodiments where the frame 118 may be disposed within the pouch battery cell 116. Additionally, in certain embodiments, the top portion 282 and the bottom portion 284 of the frame 118 may be coupled to one another (e.g., near an end portion 286 or 288) via a hinge element configured to allow the frame 118 to open to receive and to subsequently close around the pouch battery cell 116. For the embodiment illustrated in FIG. 12, the top portion 282 and the bottom portion 284 of the frame 118 may include mating features (e.g., snaps, hooks, clasps, etc.) that secure the top and bottom portion 282 and 284 to one another around the pouch battery cell 116. It may also be appreciated that, as set forth in detail below, the frame 118 may include features (e.g., openings, windows, slots, etc.) to allow the tab electrodes 129 of the pouch battery cell 116 to extend through the end portions 286 and 288 of the assembled frame 118. Further, when the frame 118 is disposed around the pouch battery cell 116, the planar top surface 300 and the planar bottom surface 302 of the pouch battery cell 116 remain exposed to contact or provide a thermal pathway to components of the battery cell assembly 114 (e.g., the internal heat fin 112, the thermal gap pad 122, and/or the PCM layer 124) that may be disposed above and below the pouch battery cell 116 in the stack.

Additionally, the embodiment of the battery cell assembly 114 illustrated in FIG. 12 also includes the thermal gap pad 122. For the illustrated embodiment, the thermal gap pad 122 is disposed above the top portion 282 of the frame 118 and is in direct contact with the exposed planar top surface 300 of the pouch battery cell 116. As set forth above, the thermal gap pad 122 may generally provide a thermal pathway between the planar top surface 300 of the pouch battery cell 116 and the PCM layer 124. Furthermore, as set forth above, in certain embodiments, the thermal gap pad 122 may also mitigate manufacturing variability (e.g., of the pouch battery cell 116 or the PCM layer 124), ensure tight packing of the battery assembly 114, ensure uniform pressure to each pouch battery cell 116, and provide vibrational dampening to the components of the battery module 22. In other embodiments, the thermal gap pad 122 may be additionally or alternatively positioned directly between the bottom planar surface 302 of the battery cell 116 and the internal heat fin 112 or directly between the PCM layer 124 and another internal heat fin 112 (not shown) (e.g., an internal heat fin 112 of the next battery cell assembly in the stack) positioned above the PCM layer 124.

The embodiment of the battery cell assembly 114 illustrated in FIG. 12 also includes the PCM layer 124 disposed directly on top of the thermal gap pad 122. It may be appreciated that, in other embodiments, the PCM layer 124 may be disposed elsewhere in the battery cell assembly 114. For example, in certain embodiments, the PCM layer 124 may be disposed below the thermal gap pad 122, directly against the planar top surface 300 of the pouch battery cell 116. In other embodiments, the PCM layer 124 may be disposed below the pouch battery cell 116, directly against the planar bottom surface 302 of the pouch battery cell 116. In still other embodiments, the battery cell assembly 114 may include more than one PCM layer 124 (e.g., 2 or 3 or more PCM layers 124) disposed in any combination of the positions within the battery cell assembly 114 discussed herein.

Figure 13:
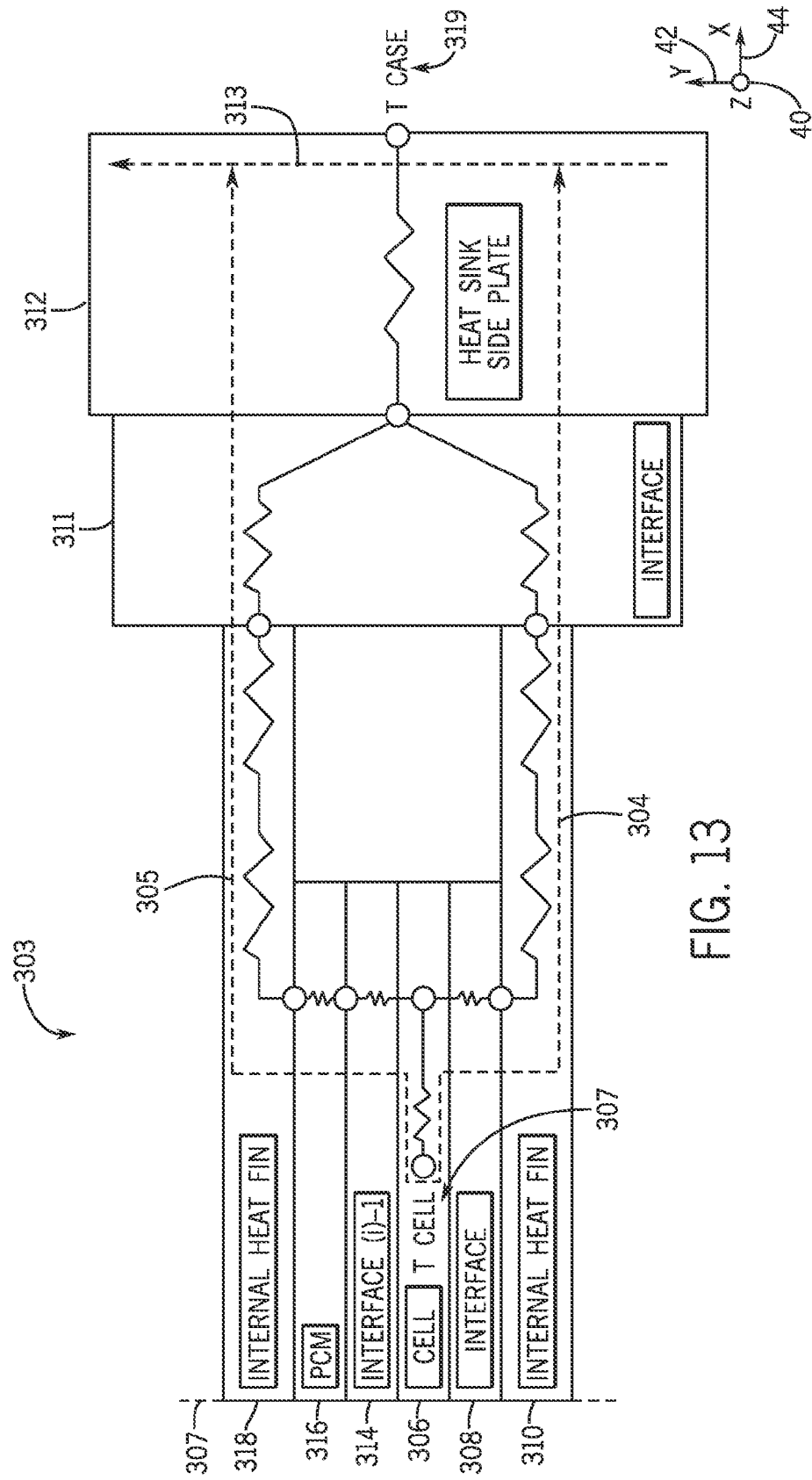
FIG. 13 is a diagram illustrating thermal dissipation pathways of a battery module, in accordance with an embodiment of the present approach.

FIG. 13 is a diagram 303 illustrating thermal pathways through the thermal management system of the battery module 22. In particular, FIG. 13 illustrates a first thermal pathway 304 and a second thermal pathway 305 by which heat generated by the battery cell 116 may be transferred to and dissipated by the heat sink outer wall features (e.g., heat sink side plates 60 and 62) of the battery module 22. In other words, the first and second thermal pathways 304 and 305 represent a number of components of the battery module 22 that are in thermal contact (e.g., thermal communication) with one another. As such, each block in the diagram 303 represents a thermal resistance (e.g., a resistance to heat flow) of individual components, as well as combinations of components, along the first and second thermal pathways 304 and 305 for the embodiment of the battery cell assembly 114 illustrated in FIG. 12. It should be appreciated that the diagram 303 illustrates a thermal management system of a battery module 22 having only one heat sink side plate 60 or 62. For embodiments of the battery module 22 having a second heat sink side plate, as illustrated in FIG. 5, the diagram 303 would include a second half (e.g., a mirror image of the diagram 303 reflected across the line 307) having a third thermal pathway (e.g., a reflection of the first thermal pathway 304) and a fourth thermal pathway (e.g., a reflection of the second thermal pathway 305) to the second heat sink side plate.

As illustrated in FIG. 13, the block 306 is representative of the battery cell 116, which may generate heat during operation and may have an associated thermal resistance. As heat is generated by the battery cell 116, at least a portion of the heat may be directed along the first thermal pathway 304. Accordingly, the heat generated by the internal components of the battery cell 116, which are discussed in greater detail below, may traverse an interface that may include one or more layers (e.g., the electrically insulating polymer layer 120 and the battery cell packaging discussed below) having a particular combined thermal resistance, which is illustrated by the block 308. Subsequently, the heat transferred through the interface represented by block 308 may reach an internal heat fin 112 disposed below the battery cell 116 in the battery cell assembly 114. Accordingly, block 310 of FIG. 13 represents the thermal resistance of the internal heat fin 112 to conduct heat horizontally (e.g., along the X axis 44, toward the heat sink side plates 60 and 62) along the thermal pathway 304. The heat conducted by the internal heat fin 112 may subsequently reach a second interface that may include the thermal gap pad 108 of the heat sink side plate assembly 106, the thermal resistance of which is represented by block 311. Finally, the heat traversing the thermal gap pad 108 may reach a heat sink side plate 60 or 62, which may have a thermal resistance that is represented by block 312. Further, in the heat sink side plate 60 or 62, the first thermal pathway 304 may merge with a thermal pathway 313 of the heat sink side plate, which may represent a convention-driven heat flow across the heat sink side plate 60 or 62 (e.g., from bottom to top). It may be appreciated that a total thermal resistance of the first thermal pathway 304 may be represented by a sum of the individual thermal resistances represented by the blocks 306, 308, 310, 311, and 312.

Additionally, at least a portion of the heat generated by the battery cell 116 may be directed along the second thermal pathway 305. For example, the heat being generated by the internal components of the battery cell 116 may first traverse a third interface, which has a thermal resistance that is represented by block 314, and which may include one or more components or layers of the battery cell assembly 114 (e.g., the thermal gap pad layer 122 and the battery cell packaging discussed below). The heat that traverses the third interface may subsequently reach the PCM layer 124, which has a thermal resistance that is represented by block 316. As discussed in detail below, depending on the temperature at or near the PCM layer 124, the PCM layer 124 may conduct a substantial portion of the heat received (e.g., primarily along the Y axis 42) to the internal heat fin 112 (not shown) disposed above the PCM layer 124. However, it may be appreciated that, as discussed in detail below, once the PCM layer 124 reaches a threshold temperature (e.g., a melting point of the phase change element of the PCM layer 124), the PCM layer 124 may instead absorb a substantial portion of the heat received along the thermal pathway 305.

Subsequently, the heat transferred through the PCM layer 124, represented by block 316 of FIG. 13, may reach a second internal heat fin 112 (e.g., an internal heat fin 112 of the next battery cell assembly 114) that is disposed above the PCM layer 124 in the battery cell assembly 114. Block 318 represents the thermal resistance of this internal heat fin 112 to conduct heat horizontally (e.g., along the X axis 44, toward the heat sink side plates 60 or 62) along the second thermal pathway 305. The heat conducted by the internal heat fin 112 may subsequently reach the second interface (e.g., including the thermal gap pad 108 of the heat sink side plate assembly 106) having the thermal resistance represented by block 311. Finally, the heat traversing the thermal gap pad 108 may reach a heat sink side plate 60 or 62, having the thermal resistance represented by block 312. Further, in the heat sink side plate 60 or 62, the second thermal pathway 305 may merge with the aforementioned thermal pathway 313 of the heat sink side plate 60 or 62. It may be appreciated that a total thermal resistance of the second thermal pathway 305 may be represented by a sum of the individual thermal resistances represented by the blocks 306, 314, 316, 318, 311, and 312. Further, it may be appreciated that, a temperature 317 of the battery cell 116 and a temperature 319 of the heat sink side plate 60 or 62 may be managed or controlled by the thermal resistances of the various layers and components of the battery assembly 114, as illustrated by FIG. 13.

One or more of the disclosed embodiments, alone or on combination, may provide one or more technical effects useful in the manufacture of battery modules and battery systems. Presently disclosed are embodiments including a thermal management system having passive or active cooling features. For example, the disclosed battery cell assembly embodiments may include a one-piece internal heat fin, a thermal gap pad, and a PCM layer that may work in conjunction with heat sink outer wall features (e.g., heat sink side plates that may include fans or liquid cooling blocks) of the battery module housing to regulate the temperature of each battery cell of the battery module. Additionally, the disclosed thermal gap pads may ensure efficient thermal transfer between layers of the battery cell assemblies and provide a uniform pressure to each of the battery cells of the battery module. Further, the PCM layer of each battery assembly may provide a more uniform temperature profile for the battery module in spite of internal or external heating. The technical effects and technical problems in the specification are exemplary and are not limiting. It should be noted that the embodiments described in the specification may have other technical effects and can solve other technical problems.

Battery Module with Phase Change Material (PCM) Layer

Figure 14:
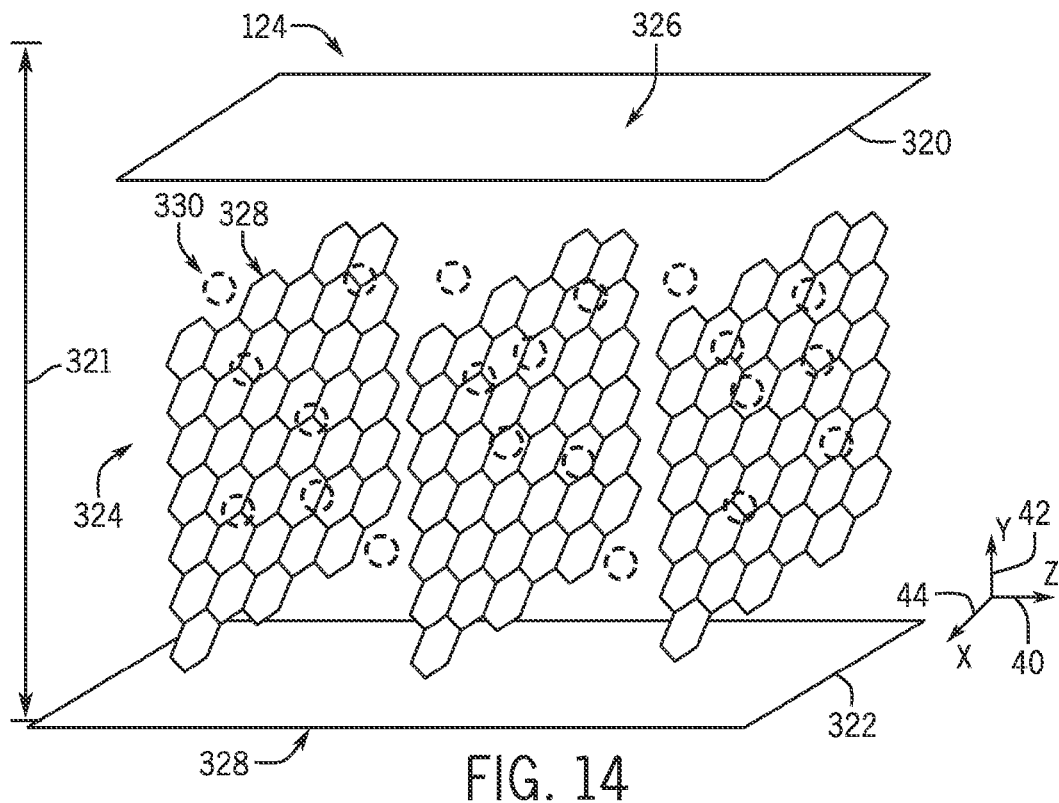
FIG. 14 is a schematic of a phase change material (PCM) of a battery cell assembly of a battery module, in accordance with an embodiment of the present approach.

FIG. 14 is a schematic illustrating an embodiment of the PCM layer 124. It may be appreciated that components of the PCM layer 124 illustrated in FIG. 14 are not drawn to scale but, rather, are disproportionally enlarged for discussion purposes. The embodiment of the PCM layer 124 illustrated in FIG. 14 includes a first packaging layer 320 and a second packaging layer 322 with a phase change material (PCM) 324 disposed directly in between. In certain embodiments, the first and second packaging layers 320 and 322, which may be referred to as the packaging of the PCM layer 124, may be manufactured from a polymer (e.g., polyvinyl chloride (PVC)) or another suitable electrically non-conductive material. In other embodiments, the packaging of the PCM layer 124 may include a single packaging layer disposed on one side of the PCM 324 or a pouch completely surrounding the PCM 324. Additionally, in certain embodiments, the illustrated first and second packaging layers 320 and 322 may be manufactured from different materials, for example, to provide different thermal properties (e.g., different thermal resistance) between the first side 326 and the second side 327 of the PCM layer 124. In addition to electrical insulation, the first and second packaging layers 320 and 322 may generally provide structural support to the PCM 324 disposed between the layers to, for example, maintain the integrity of the PCM 324 during assembly of the battery cell assembly 114. Also, in certain embodiments, the PCM 324 may be adhered (e.g., glued or otherwise bonded) to the internal surfaces of the first and second packaging layers 320 and 322. Further, the illustrated PCM layer 124 has a generally planar structure (e.g., generally disposed within or along a X-Z plane defined by the X axis 44 and the Z axis 40) having a thickness 321 (e.g., disposed along the Y axis 42). For example, in certain embodiments, the PCM layer 124 may have a thickness 321 less than or equal to approximately 1 millimeters (mm), 2 mm, 3 mm, 4 mm, 5 mm, 6 mm, 7 mm, 8 mm, 9 mm, or 10 mm. In other embodiments, the PCM layer 124 may have a thickness 321 greater than 3 mm, 4 mm, 5 mm, 6 mm, 7 mm, 8 mm, 9 mm, or 10 mm, for example, to enable tight stacking of the elements of the battery assembly 114 in a taller battery module 22.

The PCM 324 of the PCM layer 124 illustrated in FIG. 14 includes a support material (e.g., layers of highly oriented pyrolytic graphite (HOPG), graphite, or graphene) that is loaded or impregnated with a paraffin-based phase change element. These features are schematically illustrated in FIG. 14 by the layers of support material (e.g., the illustrated honeycomb-like support material layers 328) that are loaded with the paraffin-based phase change elements (e.g., represented by the dashed spheres 330). It may be appreciated that HOPG, graphite, and graphene are provided as a non-limiting example of a support material of a PCM layer 124 and that, in other embodiments, other organic or inorganic support materials may additionally or alternatively be used. It may be appreciated that the term "melting point" as used herein refers to a wide or narrow range of temperature values (e.g., 50±5° C. or 45° C. to 55° C.) over which the phase transition (e.g., a solid-to-liquid phase transition) of phase change elements 330 occurs. For example, in certain embodiments, the PCM 324 may have a melting point that ranges from approximately 47° C. to approximately 52° C.

With the forgoing in mind, when the PCM 324 is below the melting point of the phase change element 330, the phase change element 330 may remain in solid form on the support material layers 328. Within this temperature range, the PCM 324 may mainly conduct heat along least two axes through the PCM layer 124, and these axes may be defined by the orientation of the support material layers 328 of the PCM 324. For example, the PCM 324 may predominantly or primarily conduct heat along a first axis (e.g., along the Y axis 42, perpendicular to the first and second support layers 320 and 322), may secondarily conduct heat along a second axis (e.g., along the X axis 44, toward the side portions 50 and 52 of the battery module 22), and may generally have poor heat conduction along a third axis (e.g., along the Z axis, toward the end portions 46 and 56 of the battery module 22). For example, in certain embodiments, the PCM layer 124 may conduct between 60% and 98%, between 75% and 95%, or between 80% and 90% of the heat along the Y axis 42 (e.g., vertically, away from the pouch battery cell 116), and may conduct all or most the remainder of the heat along the X axis 44. As illustrated in FIG. 14, this may result from the support material layers 328 primarily residing in the X-Y plane (i.e., defined by the Y axis 42 and the X axis 44).

If the temperature of the PCM 324 is raised to the melting point of the phase change element 330, the PCM 324 may begin to absorb a substantial portion of the heat being received by the PCM layer 124 to cause the phase change elements 330 to undergo a phase transition, such as a solid-to-liquid phase transition. It should be appreciated that once the phase transition begins, the PCM 324 may generally maintain a temperature at or near the melting point of the phase change element 330 until the phase transition is complete (e.g., all of the phase change element 330 has transitioned from solid to liquid) and the heat capacity of the PCM 324 is exhausted. After completion of the phase transition, if the other components of the battery assembly 114 cool below the melting point of the phase change element 330, the PCM layer 124 may undergo a reverse phase change, dissipating the thermal energy released by the reverse phase change primarily along the Y axis 42 and secondarily along the X axis 44. Accordingly, the PCM layer 124 may generally militate against temperature fluctuations within the battery module 22, providing a more uniform temperature profile within the battery module 22 despite temperature fluctuations of the battery cells 116 and/or the ambient environment outside of the battery module 22.

In an example embodiment, the phase change element 330 of the PCM 324 of the PCM layer 124 may have a melting point of approximately 50° C. For this example, when the PCM layer 124 is below 50° C., the PCM 324 may generally conduct heat (e.g., received from the pouch battery cell 116 directly or via the thermal gap pad 122) primarily along the Y axis 42 and secondarily along the X axis 44. For this example, when the PCM layer 124 is initially heated to a temperature near or above 50° C., the PCM 324 may begin to absorb a substantial portion of the heat to affect the phase transition of the phase change element 330. Throughout this phase transition, the PCM layer 124 may continue to absorb heat without increasing in temperature due to the thermodynamics of the phase transition. Accordingly, the PCM layer 124 may substantially maintain temperatures within the battery module 22 (e.g., near each PCM layer 124) at or below the melting point of the phase change element 330 until the entire phase change element 330 has completed the solid-to-liquid phase transition. For this example, when the PCM layer 124 continues to be heated after the phase change element 330 has completed the phase transition, the PCM 324 may generally discontinue absorbing heat and resume conducting heat along the Y axis 42 and the X axis 44. Furthermore, for this example, when the battery module 22 cools to a point that one or more layers of the battery assembly 114 in thermal contact with the phase-changed PCM layer 124 (e.g., the thermal gap pad 122, the pouch battery cell 116, and/or the internal heat fin 112) are cooler than approximately 50° C., the phase change element 330 may undergo the reverse phase transition (e.g., a liquid-to-solid phase transition), and may deposit the thermal energy generated during this reverse phase transition into another layer in thermal contact with the PCM layer 124 (e.g., the internal heat fin 112 disposed above the PCM layer 124 in the battery cell assembly 124). Accordingly, the PCM 324 of the PCM layers 124 of the battery module 22 may generally provide a more uniform temperature profile for the battery module 22 despite internal or external temperature fluctuations. This more uniform temperature profile may generally increase the life of the battery module 22, decrease capacity fade and/or power fade for the battery module 22, and/or mitigate thermal runaway of the battery module 22.

Figure 15:
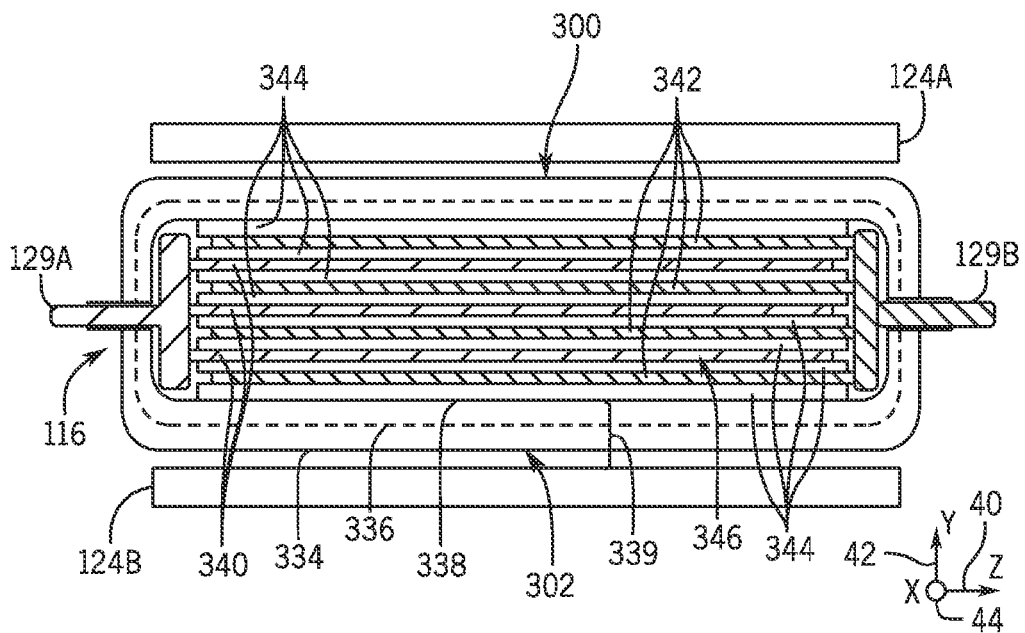
FIG. 15 is a cross-sectional schematic of a battery cell of a battery module taken along line 15-15 of FIG. 12, illustrated along with two PCM layers disposed on opposite sides of the battery cell, in accordance with an embodiment of the present approach.

FIG. 15 is a cross-sectional schematic of an embodiment of the pouch battery cell 116 illustrated FIG. 12 taken along line 15-15. In contrast to the embodiment illustrated in FG. 12, the embodiment illustrated in FG. 14 includes PCM layers 124A and 124B positioned directly adjacent the pouch battery cell 116 (e.g., contacting the top planar surface 300 and the bottom planar surface 302 of the battery cell 116). Additionally, the PCM layers 124A and 124B may function as set forth above to conduct heat (e.g., generated by the pouch battery cell 116 during operation) primarily along the Y axis 42 and secondarily along the X axis 44 at temperatures above and below the melting point of the phase change element 330, and may maintain a temperature at or near the melting point of the phase change element 330 until the phase change element 330 has completed the corresponding phase change. It may be appreciated that a battery cell assembly having two PCM layers 124A and 124B per pouch battery cell 116, as illustrated in FIG. 15, provides a greater heat capacity per battery cell assembly than using a single PCM layer 124, as illustrated in FIG. 12. It may be appreciated that, while the present discussion may be directed toward lithium ion battery cells, in certain embodiments, the pouch battery cell 114 may be a nickel hydride battery cell, or another suitable electrochemical battery cell. As discussed above, the pouch battery cell 116 illustrated in FIG. 15 includes the tab electrodes 129, which include a cathode tab electrode 129A and an anode tab electrodes 129B. It should be appreciated that the present approach may be applicable to other types of battery cells (e.g., hard case prismatic battery cells) beyond the pouch battery cell 116 illustrated in FIG. 15.

The pouch battery cell 116 illustrated in FIG. 15 includes an outer electrically insulating layer 334 (e.g., a polyimide film or another suitable electrically insulating polymer). Additionally, the pouch battery cell 116 also includes a metallic foil layer 336 (e.g., an aluminum foil layer) that may provide enhanced structural integrity, to be more resilient to pinhole deformities, to provide a better gas barrier layer, and so forth, compared to the use of insulating polymer films alone. Further, the illustrated pouch battery cell 116 includes an inner electrically insulating layer 338 (e.g., a polyimide film or another suitable electrically insulating polymer) to electrically isolate the metallic foil layer 336 from the internal components of the pouch battery cell 116. In certain embodiments, the three layers may be individually applied to the pouch battery cell or may be provided as a single film including the three layers 334, 336 and 338, which may be collectively referred to as a pouch material film 339. As illustrated in FIG. 15, the pouch material film 339 may be sealed (e.g., sonically welded, sealed with epoxy, or another suitable seal) around the tab electrodes 129 to isolate the internal components of the pouch battery cell 116.

Inside the pouch battery cell 116 illustrated in FIG. 15, the cathode tab electrode 129A may be electrically coupled to one or more cathode layers 340 while the anode tab electrode 129B may be electrically coupled to one or more anode layers 342. In certain embodiments, the cathode layers 340 may be made from an aluminum plates that are coated with a cathode active material (e.g., including a lithium metal oxide such as lithium nickel cobalt manganese oxide (NMC) (e.g., $LiNiCoMnO_2$), lithium nickel cobalt aluminum oxide (NCA) (e.g., $LiNiCoAlO_2$), or lithium cobalt oxide (LCO) (e.g., $LiCoO_2$)). In certain embodiments, the anode layers 342 may be made from copper plates that are coated with an anode active material (e.g., including graphite or graphene). It should be appreciated that these materials are merely provided as examples, and that the present approach may be applicable to a number of different lithium ion and nickel metal hydride battery modules.

Further, as illustrated in FIG. 15, the at least one cathode layer 340 and the at least one anode layer 342 are interdigitated with one another, along with an insulating polymer layer 344 (e.g., a poly-image film or another suitable electrically insulating polymer film) disposed between each cathode and anode layer, to form an electrochemical stack 346. It should be appreciated that, the illustrated electrochemical stack 346 is merely provided as an example. In other embodiments, the electrochemical stack 346 may be implemented as a "jellyroll," wherein the cathode tab electrode 129A and the at least one cathode layer 340 may be formed from a single, continuous strip of aluminum foil and the anode tab electrode 129B and the at least one anode layer 342 may be formed from a single, continuous strip of copper foil. For such an implementation, the aluminum foil strip and the copper foil strip may be stacked, along with a number of electrically insulating layers, and wound about a mandrel to provide the electrochemical stack 346.

During assembly of the illustrated pouch battery cell 116, the electrochemical stack 346 may first be formed using a stack of cathode and anode plates or using a "jellyroll," as set forth above. Subsequently, the pouch material film 339 may disposed around the electrochemical stack 346, and the pouch material film 339 may then be partially sealed to the tab electrodes 129. Then, an electrolyte 347 (e.g., including carbonate solvents and $LiPF_6$ as a salt) may be added to the electrochemical stack 346 partially sealed pouch material film 339, and the pouch material film 339 may then be completely sealed to the tab electrodes 129 to provide the pouch battery cell 116.

One or more of the disclosed embodiments, alone or on combination, may provide one or more technical effects useful in the manufacture of battery modules and battery systems. Presently disclosed are battery cell assembly embodiments that include at least one PCM layer that may work in conjunction with internal heat fins and external heat sink outer wall features (e.g., heat sink side plates that may include fans or liquid cooling blocks) to regulate the temperature of each battery cell of the battery module. The PCM layers of the battery module embodiments presently disclosed may generally provide a more uniform temperature profile for the battery module in spite of internal or external heating, which may enable more uniform power characteristics and improved longevity for the battery module. Further, the disclosed PCM layers may also enable heat conduction along particular directions (e.g., along the stack of the power assembly and/or toward the heat sink side plates) to enable efficient thermal pathways within the battery module and, thereby, enable passive cooling of the battery module. The technical effects and technical problems in the specification are exemplary and are not limiting. It should be noted that the embodiments described in the specification may have other technical effects and can solve other technical problems.

Battery Cell with Integrated Internal Heat Fin

Figure 16:
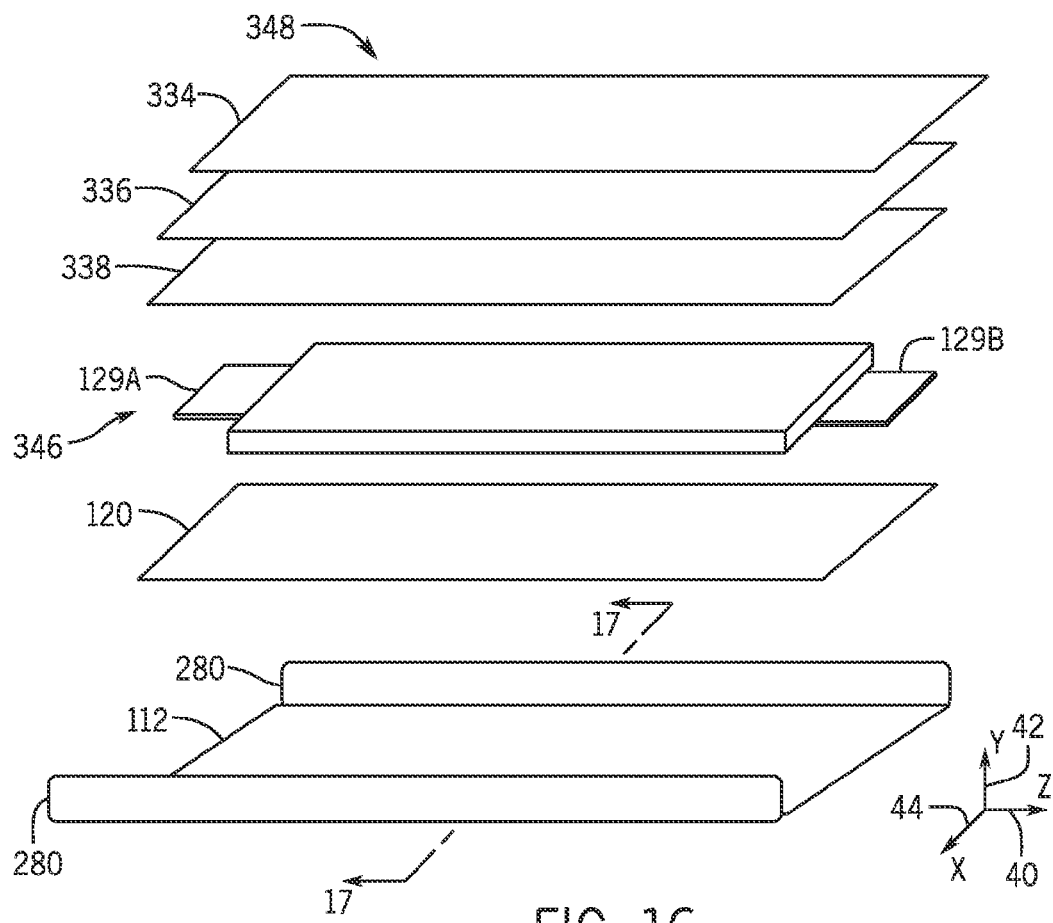
FIG. 16 is a exploded schematic of a battery cell of the battery module, wherein components of the battery cell are configured to assemble to include an integrated internal heat fin, in accordance with an embodiment of the present approach.

FIG. 16 is a schematic exploded view of an embodiment of a battery cell 348 that is integrated with the internal heat fin 112. The internal heat fin 112 may be integrated with the battery cell 348 as one of several layers that, in addition to other functions, operate to seal in the electrochemical stack 346 of the battery cell 348. The battery cell 348 illustrated in FIG. 16 includes the internal heat fin 112 with the curved side portions 280. Furthermore, the internal heat fin 112 is essentially an outermost layer of the battery cell 348 such that is remains conductively and otherwise accessible across the entirety of its outermost side. The internal heat fin 112 also serves as a base layer of the battery cell 348 in that the other components of the battery cell 348 are arranged on one side of the internal heat fin 112, including the frame 118, a illustrated in FIGS. 17 and 18.

As illustrated in FIG. 16, an electrically insulating polymer layer 120 is disposed against the surface of the internal heat fin 112 to electrically isolate the internal heat fin 112 from the electrochemical stack 346. The electrically insulating polymer layer 120 is representative of any of various electrically insulating layers. For example, the electrically insulating polymer layer 120 may be representative of multiple layers including a thermally conductive polymer layer, a phase change material layer, a layer including combinations of such material, and so forth. In the illustrated embodiment, the insulating polymer layer 120 is layered only on one side of the internal heat fin 112 and may or may not extend across the entire surface of the internal heat fin 112. It may be desirable to cover one surface of the internal heat fin 112 entirely with the polymer layer 120 for sealing and insulative purposes with respect to other components of the battery cell 348. Furthermore, it may be desirable to leave one surface of the internal heat fin 112 completely exposed for heat transfer purposes and manufacturing efficiency.

With regard to the functionality of the internal heat fin 112 and the insulating polymer layer 120, these two layers cooperate to provide thermal conductivity without electrical conductivity relative to the electrochemical stack 346 and provide one side of a sealed engagement about the electrochemical stack 346. Other layers may engage the polymer layer 120 and/or internal heat fin 112 about the electrochemical stack 346 to provide the second side of the sealed engagement. Indeed, turning to the illustrated embodiment, three layers (e.g., layers 334, 336, and 338) may be used to seal the electrochemical stack 346 to the internal heat fin 112 and/or polymer layer 120. As illustrated, the inner electrically insulating polymer layer 338 (e.g., a polyimide layer or another suitable electrically insulating polymer) may be disposed directly against the electrochemical stack 346 and may electrically isolate the electrochemical stack 346 from a metallic foil layer 336. Further, an outer electrically insulating polymer layer 334 may electrically isolate an outer surface of the metallic foil layer 336. It should be appreciated that, in certain embodiments, the three layers 334, 336, and 338 may be provided as a single film, which may collectively be referred to as the pouch material film 339. Additionally, in certain embodiments, the pouch material film 339 may include a phase change material layer (e.g., like the PCM layer 124, discussed above) sandwiched between the electrically insulating polymer layers 338 and 334.

During construction of the battery cell 348, the electrically insulating polymer layer 120 may be stacked or otherwise arranged on top of the internal heat fin 112. The internal heat fin 112 and the polymer layer 120 may have common boundaries or the polymer layer 120 may be smaller in length and width than the internal heat fin 112. For example, in one embodiment, the polymer layer 120 may be extruded on a portion of the internal heat fin 112 or extruded completely over one side of the internal heat fin 112. On top of the electrically insulating polymer layer 120, the electrochemical stack 346 (e.g., a stack of cathode and anode plates or a "jellyroll", as set forth above) may be disposed. Then, the pouch material film 339 may be disposed over the electrochemical stack 346, either as three separate layers 334, 336, and 338 or as a single pouch material film 339. The pouch material film 339 (e.g., layers 334, 336, and 338) may then be partially sealed around a perimeter of the electrochemical stack 346. That is, in certain embodiments, at least a portion of the pouch material film 339 (e.g., the layers 334, 336, and 338) may be coupled to the electrically insulating polymer layer 120 or directly to the internal heat fin 112 around a perimeter of the electrochemical stack 346. In certain embodiments, this coupling may be achieved using sonic welding, an adhesive, or another suitable method of coupling. In certain embodiments, at least a portion of the electrically insulating polymer layer 120 may be coupled to the internal heat fin using sonic welding, an adhesive, or another suitable method of coupling. Further, in certain embodiments, at least a portion of the pouch material film 339 (e.g., the layers 334, 336, and 338) may be coupled to the electrically insulating polymer layer 120 at the same time as the electrically insulating polymer layer 120 is coupled to the internal heat fin 112 (e.g., using sonic welding).

It may be appreciated that the battery cell 348 illustrated in FIG. 16 enables a reduced thermal barrier (e.g., improved thermal contact or communication) between the electrochemical stack 346 of the battery cell 348 and the internal heat fin 112 relative to other embodiments without an integration of such features. This may be illustrated by pointing to other embodiments of the present disclosure that do not include the internal heat fin 112 integrated with certain other package components. For example, the embodiment of the battery cell assembly 114 illustrated in FIG. 12 (which includes the embodiment of the pouch battery cell 116 illustrated in FIG. 15) has at least three electrically insulating polymer layers (e.g., the electrically insulating polymer layers 120, 334, and 338) disposed between the electrochemical stack 346 and the internal heat fin 112. It may be appreciated that, in general, these electrically insulating polymer layers 120, 334, and 338 provide at least a portion of the thermal resistance of the thermal pathway 304 (e.g., contributes to the thermal resistance of the first interface represented by block 308 of FIG. 13). Accordingly, it may be appreciated that the battery cell 348 illustrated in FIG. 16 includes only a single insulating polymer layer 120 disposed between the electrochemical stack 346 and the internal heat fin 112. As such, the battery cell 348 illustrated in FIG. 16 enables a higher thermal conductivity pathway (e.g., thermal pathway 304 of FIG. 13 having a lower thermal resistance at block 308) between the electrochemical stack 346 and the internal heat fin 112.

Figure 17:
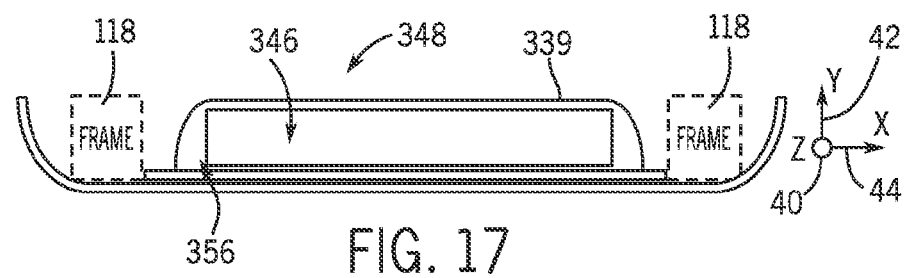
FIG. 17 is a cross-sectional schematic of a battery cell embodiment of FIG. 16 taken along line 17-17, wherein the components are assembled such that a frame is positioned outside of battery cell packaging that includes an integral internal heat fin, in accordance with an embodiment of the present approach.

FIG. 17 is a cross-sectional schematic of the assembled battery cell 348 taken along line 17-17 of FIG. 16. As set forth above, the battery cell 348 illustrated in FIG. 17 may be formed by stacking the electrochemical stack 346 on top of the electrically insulating polymer layer 120 and at least partially sealing the pouch material film 339 around a perimeter of the electrochemical stack 346. After at least partially sealing the pouch material film 339, the electrolyte 347 may be added to the electrochemical stack 346 and the pouch material film 339 may be completely (e.g., hermetically) sealed around the electrochemical stack 346. In certain embodiments, the pouch material film 339 may be coupled to the electrically insulating polymer layer 120, which is in turn coupled to the internal heat fin 112. Further, in certain embodiments, the frame 118 may then be disposed around the sealed electrochemical stack 346 of the battery cell 348 (e.g., during construction of a battery cell assembly 114). In other embodiments, the internal heat fin 112 may include a number of registration features (e.g., like the registration features 121 of the frame 118 illustrated in FIG. 12) and the frame 118 may be excluded altogether.

Figure 18:
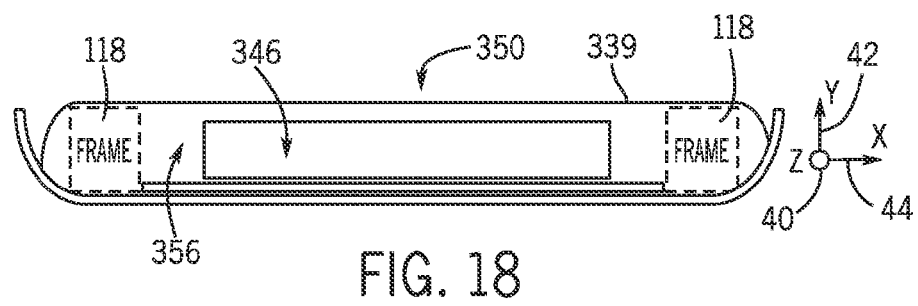
FIG. 18 is a cross-sectional schematic of a battery cell embodiment of FIG. 16 taken along line 17-17, wherein the components are assembled such that the frame is integrated with the battery cell packaging that includes the integral internal heat fin, in accordance with an embodiment of the present approach.

FIG. 18 is a cross-sectional schematic of an assembled battery cell 350 including an internal heat fin 112 as an integral component. Like the battery cell 348 illustrated in FIG. 17, the battery cell 350 illustrated in FIG. 18 includes the electrochemical stack 346 stacked on top of the electrically insulating polymer layer 120, which is stacked or layered on top of the heat fin 112. Additionally, the battery cell 350 illustrated in FIG. 18 includes the frame 118 disposed around the electrochemical stack 346. However, unlike the battery cell 348 illustrated in FIG. 17, the frame 118 of the battery cell 350 illustrated in FIG. 18 is disposed inside of the pouch material film 339. That is, during the manufacture of the battery cell 350, the pouch material film 339 may be disposed over the electrochemical stack 346 and the frame 118 and may be sealed around the perimeter of the frame 118. After at least partially sealing the pouch material film 339 around the frame 118, the electrolyte 347 may be added to the electrochemical stack 346. Further, the pouch material film 339 may cooperate with other layers including at least the internal heat fin 112 and the polymer layer 120 to provide a complete (e.g., hermetical) seal about both the electrochemical stack 346 and the frame 118. It may be appreciated that, for the illustrated embodiment of the battery cell 350, the frame 118 should be manufactured from a material that is robust to (e.g., substantially non-reactive with) the electrolyte 347 of the battery cell 350.

One or more of the disclosed embodiments, alone or on combination, may provide one or more technical effects useful in the manufacture of battery modules and battery systems. Presently disclosed are embodiments including battery cells that have an integrated internal heat fin, which enables a more efficient thermal pathway between the battery cell and the heat sink outer wall features (e.g., heat sink side plates that may include fans or liquid cooling blocks) that are also in thermal communication with the internal heat fin. Present embodiments may also provide for efficient manufacture of related battery modules by integrating certain functions into a single package. The disclosed battery cell embodiments include an electrochemical stack that is hermetically sealed to the surface of an internal heat fin using a pouch material film. In certain embodiments, the battery cell may include a frame disposed under the pouch material film along with the electrochemical stack. In certain embodiments, the frame may be disposed outside of the pouch material film, or may not be used at all. The technical effects and technical problems in the specification are exemplary and are not limiting. It should be noted that the embodiments described in the specification may have other technical effects and can solve other technical problems.

System and Method for Encasing a Battery Cell

Figure 19:
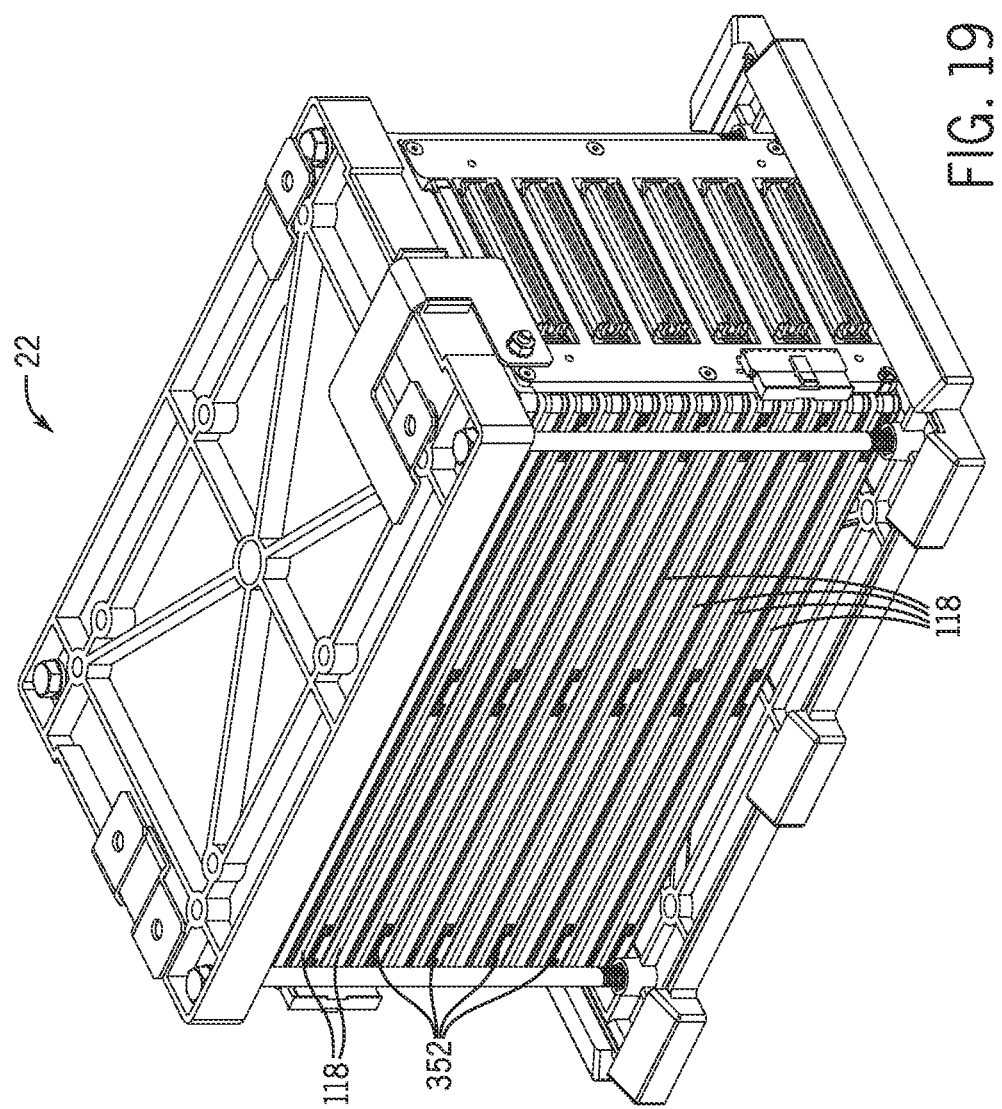
FIG. 19 is a perspective view of a battery module incorporating cell casings in a stacked arrangement or orientation, in accordance with an embodiment of the present approach.

Turning now to FIG. 19, an embodiment of the battery module 22 is illustrated having thermal interfaces 352 between the battery cells 116, which are arranged in a stacked orientation. The battery cells 116 are shown in a horizontally stacked orientation (e.g., "pancake stack"), but in other embodiments, they may be in a vertically stacked orientation (e.g., "book stack"). The thermal interfaces 352, which may include air gaps and/or heat transfer material, may facilitate passage of a fluid flow (e.g., air flow) between neighboring battery cells 116, which may help diffuse heat produced by the individual battery cells 116 of the battery module 22. In the embodiment shown, each battery cell 116 is disposed in a corresponding one of the polymer frames 118, and each polymer frame 118 is spaced apart a distance from the adjacent polymer frame 118 using cooperating features of the polymer frames 118 to allow the thermal interfaces 352. In certain embodiments, an external cooling feature, such as a fan (not shown), may be included in the battery system 20, such that fluid flow may be passed through the thermal interfaces 352 formed between the adjacent battery cells 116 in the battery module 22. Such an external cooling feature may improve the thermal management of the battery module 22, thereby increasing its life span and efficiency.

Figure 20:
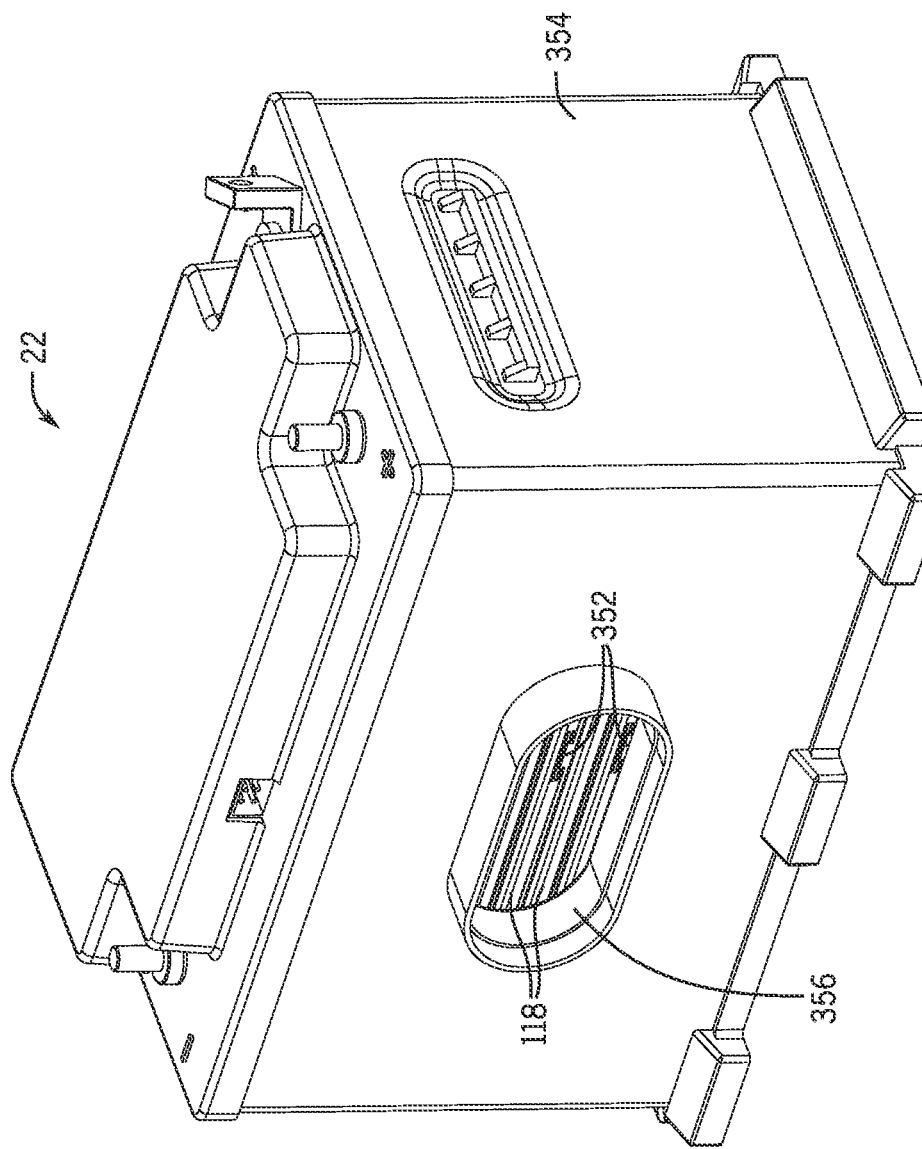
FIG. 20 is a perspective view of the battery module of FIG. 19 including a housing configured for active cooling, in accordance with an embodiment of the present approach.

In some embodiments, such as that shown in FIG. 20, a housing 354 of the battery module 22 may include one or more forced cooling vents 356. The forced cooling vents 356 may allow an external cooling feature (e.g., fan) to pass a flow of coolant, such as air, into the battery module 22 so that the coolant may flow through the thermal interfaces 352 between the battery cells 116. In the illustrated embodiment, the forced cooling vent 356 is obround with two parallel sides and two semicircular ends. Further, the forced cooling vent 356 extends out from the housing 354 to facilitate coupling with an external cooling feature and/or guidance of fluid flow. However, it should be understood that, in accordance with present embodiments, the forced cooling vents 356 may have any suitable shape, dimension, or location on the housing 354 of the battery module 22.

Figure 21:
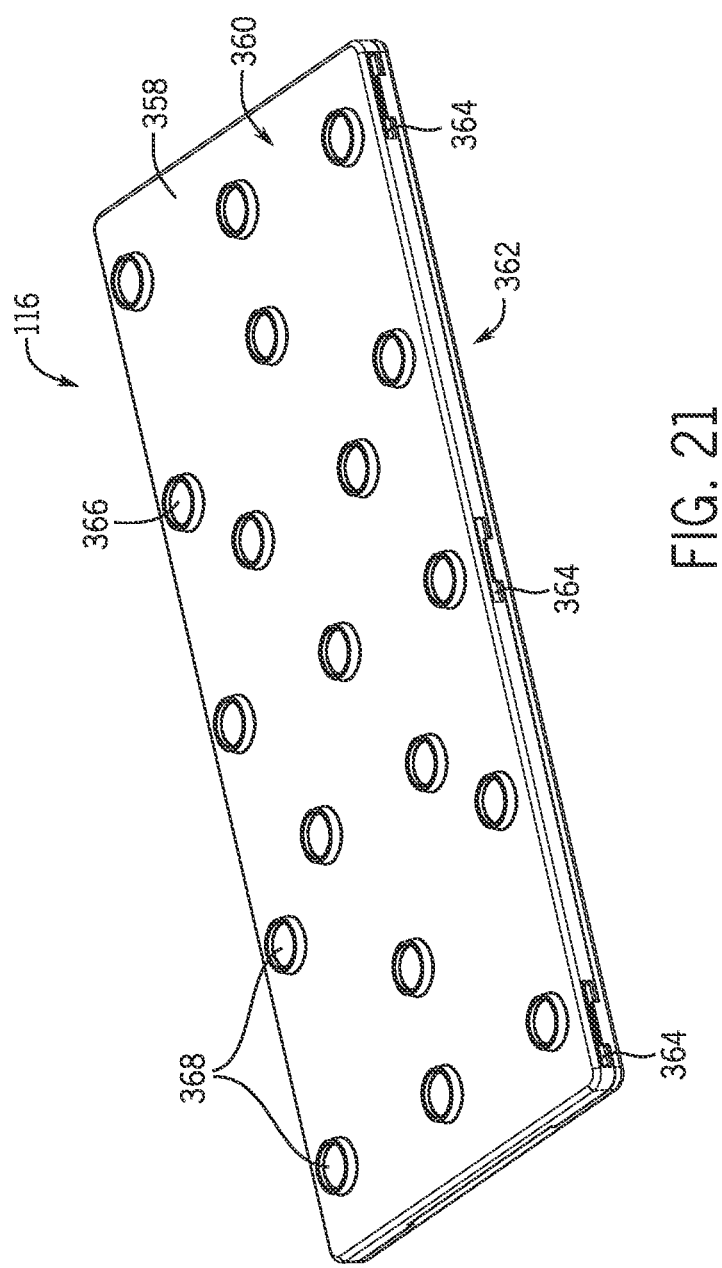
FIG. 21 is a perspective view of a closed cell casing including a plurality of integral standoffs disposed on an upper side of the cell casing, in accordance with an embodiment of the present approach.

To create the thermal interfaces 352 and to improve fluid flow between adjacent battery cells 116, each battery cell 116 may be disposed inside a cell casing or battery cell casing 358, as shown in FIG. 21. In certain embodiments, two or more battery cells 116 may be disposed in a single cell casing 358. The cell casings 358 may be separate from the polymer frames 118 or represent versions of the polymer frames 118. That is, the cell casings 358 may function as the polymer frames 118 or may cooperate with separate polymer frames 118 of the battery module 22.

A plurality of cell casings 358, such as that shown in FIG. 21, may be arranged in a stacked orientation within the battery module 22. Each cell casing 358 may include a first side 360 and a second side 362, which may be coupled to each other by one or more locking features 364 and/or via a hinge, as shown in FIG. 24. One or more thermal transfer features 366 may extend from the first side 360, the second side 362, or both the first side 360 and the second side 362. The one or more thermal transfer features 366 may be configured to facilitate transfer of heat out of the cell casing 358 and away from the corresponding battery cell 116 disposed within the cell casing 358. In some embodiments, highly conductive features may be included in one or more of the thermal transfer features 366. For example, while an outer surface of the cell casing 358 may be formed from a polymer, a highly conductive material, such as a metal, may be imbedded into one or more of the thermal transfer features 366 to increase the heat distribution capacity of the thermal transfer features 366. It should be understood that in some embodiments, some cell casings 358 may not include thermal transfer features 366, or may only include thermal transfer features 366 on one side of the cell casing 358. The plurality of cell casings 358 may be disposed within the housing 354 or the plurality of cell casings 358 may at least partially define the housing 354 of the battery module 22. The cell casings 358 may generally maintain their shape under pressure, which may buttress the structural integrity of the entire battery module 22 and/or facilitate distribution of pressure throughout the battery module 22 (including pressures associated with operation of the battery cells 116).

The first side 360 and the second side 362 of each of the plurality of cell casings 358 may include one or more of the thermal transfer features 366. The thermal transfer features 366 may be sized and shaped to facilitate efficient transfer of heat away from the cell casing 358 to a surrounding environment. Indeed, the thermal transfer features 366 may have geometries that expose a large amount of surface area for purposes of heat transfer. As an example, the thermal transfer features 366 of FIG. 21 may include generally circular walls extending from a surface of the cell casing 358. In some embodiments, different shapes (e.g., a ridge, or a circular wall with a passage through the wall) may be utilized to provide more surface area that is accessible to fluid flowing around the cell casing 358. In some embodiments, the thermal transfer features 366 may include recesses or concavities (e.g., dimples) into one or more surfaces of the cell casings 358. Further, the thermal transfer features 366 may be made of a material that differs from that of an associated cell casing 358 to increase or otherwise control heat transfer properties. Additionally, the thermal transfer features 366 may be arranged with respect to one another to encourage fluid flow in particular directions and/or distribute areas of high heat transfer to certain portions of the surface of the cell casings 358.

The one or more thermal transfer features 366 may include one or more standoffs 368 that function to distance the associated cell casing 358 from other portions of the battery module 22 (e.g., other cell casings 358). Specifically, one set of standoffs 368 may engage with another set of standoffs 368 to separate corresponding cell casings 358. The thermal transfer features 366 illustrated in FIG. 21 are also examples of standoffs 368. The standoffs 368 may cooperate with neighboring cell casings 358 to facilitate fluid flow between neighboring cell casings 358 of the plurality of cell casings 358 by providing a space (e.g., the thermal interface 352) between the cell casings 358. The thermal interface 352 may enable a fluid, such as air, to flow between the cell casings 358. The fluid flow may improve the thermal management of the battery module 22 by removing heat produced by the plurality of battery cells 116 and carrying it out of the battery module 22. The standoffs 368 may be generally circular (as shown in FIG. 21), or they may be square, rectangular, triangular, polygonal, or any other suitable shape. While 19 standoffs 368 are shown on the cell casing 358 in FIG. 21, any number of standoffs 368 may be included. For example, each cell casing 358 may include between about 1 and 200 standoffs 368, 1 and 100 standoffs 368, 1 and 50 standoffs 368, 1 and 25 standoffs 368, or any suitable number.

The thermal transfer features 366 or the standoffs 368 may be arranged in any manner, including one or more rows and/or columns, or the thermal transfer features 366 may be disposed only in the middle, edges, corners, etc. of the cell casing 358. It is understood that any suitable arrangement may be used. As briefly noted above, in certain embodiments, it may be desirable to arrange the thermal transfer features 366 such that a pathway formed between or by the thermal transfer features 366 for fluid flow facilitates the passage of consistent or controlled levels of fluid flow over the surface area of the cell casing 358. For example, in embodiments of the battery module 22 having a greater volume of available airflow, a relatively large number of thermal transfer features 366 may be used to guide the airflow in a circuitous route over the surface of the cell casing 358 and/or interact with (e.g., transfer heat to) the airflow. This may also be achieved by utilizing one or more complexly shaped thermal transfer features (e.g., a maze-like wall). In embodiments having less available airflow, relatively fewer thermal transfer features 366 may be used to facilitate passage of the limited airflow over the surface of the cell casing 358. The thermal transfer features 366 or standoffs 368 may be solid, or they may be generally hollow, as shown, to reduce the associated mass of the thermal transfer features 366. As noted above, certain geometric configurations of the thermal transfer features 36 may improve the thermal management of the battery cell 116 by enabling faster heat transfer between the battery cell 116, the cell casing 358, and the coolant flowing past the cell casing 358.

The standoffs 368 may also improve pressure distribution across each battery cell 116 and/or across an assembly of battery cells 116 as a whole. In some embodiments, such as when the battery cells 116 are arranged in a horizontally stacked orientation, a particular standoff 368 may improve the distribution of pressure exerted on a corresponding battery cell 116 by adjacent battery cells 116. Since the battery cells 116 are arranged in a stacked manner, each battery cell 116 may experience some amount of pressure, such as from battery cells 116 disposed above or on top of it. The standoffs 368 may help distribute this pressure by spreading the pressure across a large surface area on the cell casing 358, such as by using a large number of standoffs 368 on the first and/or second sides 360 and 362. In other embodiments, the standoffs 368 may be arranged to transfer the pressure to the strongest part of the cell casing 358, such as the edges of each side 360 and 362. As described in more detail in FIG. 23, the standoffs 368 on the first side 360 of a first cell casing 358 may generally align with the standoffs 368 on the second side 362 of an adjacent second cell casing 358.

Figure 22:
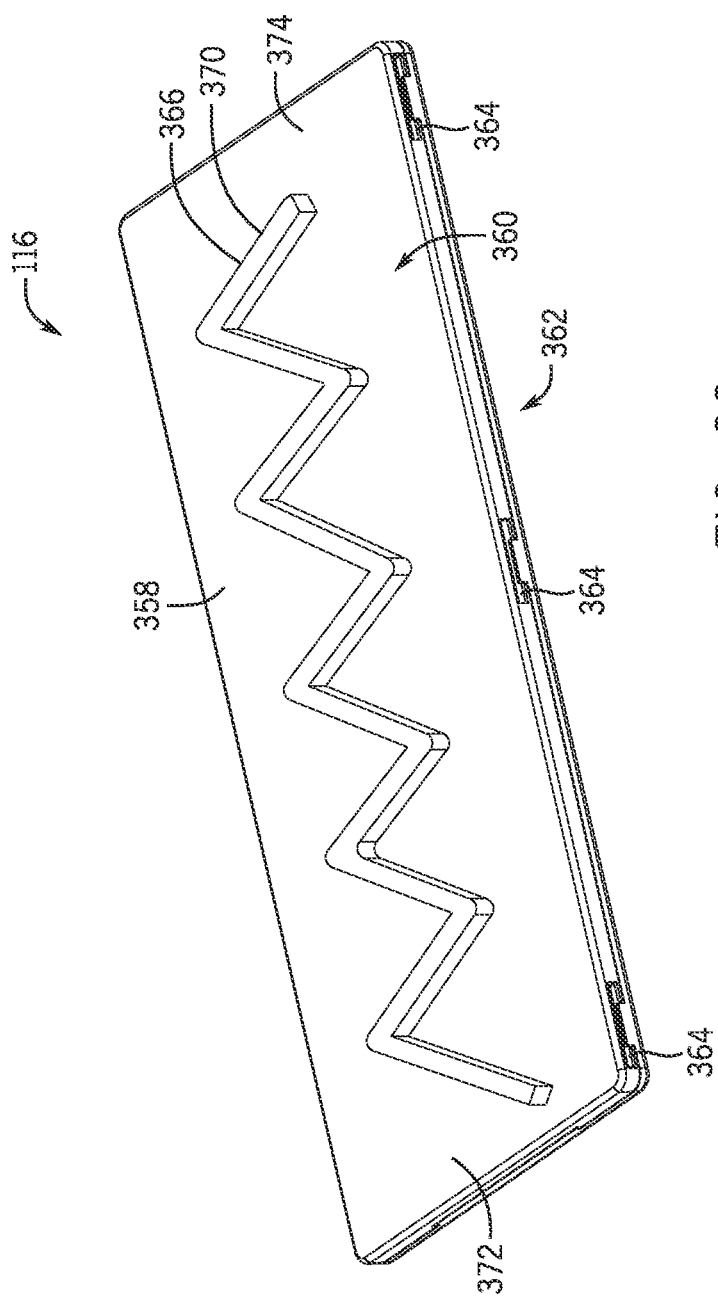
FIG. 22 is a perspective view of a closed cell casing including a groove disposed in an upper side of the cell casing and configured to guide fluid flow across the upper side, in accordance with an embodiment of the present approach.

In certain other embodiments, the thermal transfer feature 366 on the cell casing 358 may include one or more ridges 370, as shown in FIG. 22. The ridges 370 may extend out from the cell casing 358, and may be employed along with the standoffs 368 or other thermal transfer features 366. Each ridge 370 may extend (linearly or circuitously) along a length of the cell casing 358, and may enable fluid to flow in between adjacent call casings 358 by providing one or more fluid pathways. In addition, the ridge 370 on one cell casing 358 may be configured to align and/or interact (e.g., couple) with the ridge 370 on an adjacent cell casing 358. For example, adjacent ridges 370 may be configured to align and mate with each other to improve the alignment and orientation of the adjacent cell casings 358. Indeed, the ridge 370 may include a groove or recess along the outer surface or distal end that is configured to receive the outer end of another ridge 370.

The ridge 370, shown as defining a zigzag pattern across the first side 360 of the battery cell casing 358 in FIG. 22, may have any design and contour desired for distributing fluid flow and/or facilitating heat transfer. Any number of ridges 370 may be included on the first and/or second sides 360, 362 of the cell casing 358. Depending on system requirements and parameters (e.g., the volume of available airflow), the ridges 370 may be straight, curved, or may take any other desired form or shape, and they may take direct or indirect paths from a first end 372 to a second end 374 of the cell casing 358. For example, in embodiments having a large amount of available airflow, the ridge 370 may provide a more circuitous fluid pathway from the first end 372 to the second end 374. Alternately, in embodiments with a small amount of available airflow, the ridge 370 may provide a more direct fluid pathway to ensure that the air passes from the first end 372 to the second end 374.

As with the standoffs 368 described in FIG. 21, features or aspects of the ridge(s) 370 on the first side 360 of one cell casing 358 may generally align with features of aspects of the ridge(s) on the second side 362 of another cell casing 358. Aligning the features of the ridges 370 may facilitate alignment of cell casings 358 and/or allow more air to flow between the cell casings 358, thereby improving assembly efficiency and the thermal management of the battery module 22. In certain embodiments, such as embodiments with limited airflow availability in the battery module 22, the cell casing 358 may include a combination of standoffs 368 and ridges 370, such that more airflow may pass between neighboring (e.g., adjacent) cell casings 358.

FIG. 23 shows a cross-sectional view of a first standoff 376 on the first side 360, and a second standoff 378 on the second side 362 of adjacent cell casings 358, where the first and second standoffs 376 and 378 are configured to mate, or interlock, with each other. As noted above, some or all of the corresponding standoffs 368 on adjacent cell casings 358 may be configured to align and mate with one another. By mating together, the standoffs 368 may cooperate to facilitate registration and/or orientation of two or more of the plurality of cell casings 358 with respect to one another. Any interlocking method may be used to mate the first standoff 376 with the second standoff 378.

In the embodiment shown in FIG. 23, the first standoff 376 includes a protrusion 380 and an indentation 382. The second standoff 378 includes a corresponding protrusion 380 and indentation 382, which are configured to interlock with those on the first standoff 376. That is, the protrusions 380 and indentations 382 of the respective first standoff 376 and second standoff 378 are complementary. Each protrusion 380 may fit into the corresponding indentation 382, such that the first and second standoffs 376 and 378 are coupled together. Coupling the standoffs 368 in this way may prevent the two cell casings 358 from sliding across one another (e.g., decking). In this way, the standoffs 368 may reduce battery cell 116 installation time by making it easier for a technician to orient and align the battery cells 22, and may prevent decking of the battery cells 116.

The heights of the first and second standoffs 376 and 378 may determine the width of the thermal interface 352 between two adjacent casings 358. In the embodiment shown, a first height 384 of the first standoff and a second height 386 of the second standoff 378 are generally the same, but in other embodiments, the heights 384 and 386 may be different. The heights 384 and 386 of the standoffs 376 and 378 may be limited by the number of battery cells 116 and the size of the battery module 22 based on overall battery system size limitations. As noted above, different mating configurations may be utilized, including configurations that define holes through coupled standoffs 368 to facilitate additional fluid flow therethrough.

FIG. 24 shows the first and second sides 360 and 362 of the cell casing 358 coupled to each other with a hinge 388. The hinge 388 may allow the two sides 360 and 362 to be more easily closed about the battery cell 116. The battery cell 116 may be placed onto the second side 362 of the cell casing 358, and the first side 360 of the cell casing 358 may be folded over the battery cell 116 and into engagement with the second side 362. The first and second sides 360 and 362 may be contoured to receive the battery cell 116, and may include openings 390 for the tab electrodes 129. Locking features 364 may allow the first and second sides 360 and 362 to snap or otherwise lock together to secure the battery cell 116 inside the cell casing 358.

One or more of the disclosed embodiments, alone or on combination, may provide one or more technical effects useful in the manufacture of battery cells and battery cell casings. For example, certain embodiments of the present approach may enable improved thermal management of the battery cells 116, improve pressure distribution between the battery cells 116, and may reduce the time required for a technician to install or service the battery cells 116 of the battery module 22. By specific example, including thermal transfer features 366, such as standoffs 368 or ridges 370, on battery cell casings 358 may allow coolant to flow between adjacent cell casings 358, thereby cooling the battery cells 116. The technical effects and technical problems in the specification are exemplary and are not limiting. It should be noted that the embodiments described in the specification may have other technical effects and can solve other technical problems.

System and Method for Sealing a Battery Cell

Turning now to FIG. 25, an exploded view of the battery cell 116 is illustrated having a first layer 400 of pouch material, active material 402, the frame 118, and a second layer 404 of pouch material. The active material 402 may include two types of active material 402 disposed in alternating layers to form a generally planar electrochemical cell. The pouch material layers 400 and 404 may each be constructed of one or more sub-layers of material. These sub-layers may include films or foils made of conductive and non-conductive materials such as polypropylene, aluminum, and/or any other suitable materials. In certain embodiments, the conductive material (e.g., aluminum) may provide limited permeability characteristics to the pouch material layers 400 and/or 404 to prevent leakage therethrough, and the non-conductive material (e.g., polypropylene) may be used to electrically insulate the conductive material. Certain sub-layers of the pouch material layers 400 or 404 may be coextruded, bonded, or otherwise coupled together. As a specific example, an aluminum foil and a polypropylene layer may be ultrasonically bonded, or otherwise coupled to each other, to form at least portions of the upper and lower layers 400 and 404 of pouch material.

The frame 118 includes a plurality of edges that form an opening and surround side surfaces of the active material 402. The frame 118 may serve to protect the layers of active material 402 from being crushed or otherwise damaged during operation or handling (e.g., during installation or repair) of the battery cell 116 or related components of the battery system 20. For example, the frame 118 may help protect the active material 402 from external pressures or undesirable contact. In certain embodiments, the frame 118 may be thicker than the active material 402 residing in it, such that the active material 402 is recessed in the frame 118.

The battery cell 116 may include a number of openings 406 configured to enable bolts, screws, or other coupling mechanisms to secure the battery cell 116 to other battery cells 116 and/or other features of the battery module (e.g., the housing 354). The openings 406 may facilitate alignment of two or more battery cells 116 while also securing the battery cells 116. The openings 406 may extend through any portion(s) of the frame 118. For example, the openings 406 may extend through some or all of the corners of the frame 118. In other embodiments, the openings 406 may extend through a middle portion or body 408 of the battery cell 116. This may be achieved in part by including a hole through the active material 402 and sealing the first and second pouch material layers 402 and 404 together about the inner edges of the hole in the active material 402. Any number of openings 406 may be included in the frame 118 and/or through other areas of the battery cell 116, such as the middle portion 408. The openings 406 also represent any of various types of coupling features that may be utilized for coupling, registration, or orientation of the frame 118 with respect to other components.

The battery cell 116 may have electrodes extending from it, such as electrode tabs 129. The electrode tabs 129 are shown extending from opposite ends of the battery cell 116, but it should be understood that the electrode tabs 129 are not opposite each other in other embodiments. Indeed, in some embodiments the electrode tabs 129 may be angled relative to each other, the electrode tabs 129 may extend from adjacent sides of the battery cell 116, or the electrode tabs 129 may extend from a single side of the battery cell 116. Furthermore, it should be noted that the electrode tabs 129 are general examples of electrodes, which may include geometric characteristics other than flat tabs. Thus, present embodiments may include electrodes with various different geometric characteristics (including but not limited to flat tabs) in place of the electrode tabs 129.

In the illustrated embodiment, the electrode tabs 129 are configured to extend beyond the frame 118. This facilitates communicative or electrical coupling of other features (e.g., other battery cells 116) with the battery cell 116 via the electrode tabs 129. This also involves sealing about portions of the electrode tabs 129 to avoid leakage issues. This sealing with respect to the electrode tabs (or other types of electrodes) may be facilitated by lip areas 409, which may include extended portions of boundaries of the first and second layers 400 and 404 of pouch material. In the illustrated embodiment, the lip areas 409 of the second pouch material layer 404 are conformed toward the corresponding electrode tabs 129 to facilitate a sealable engagement with the electrode tabs 129. Further, the lip areas 409 extend beyond the corresponding electrode tabs 129 to facilitate sealed engagement with not only the electrode tabs 129 but also other features (e.g., the opposing lip areas 409 and/or the frame 118). In some embodiments, both sets of lip areas 409 are conformed for engagement. Further, in some embodiments, the lip areas 409 may be in different locations along the corresponding first and second pouch material layers 400 and 404.

The active material 402 includes an upper surface 410, a lower surface 412, and side surfaces 414. The active material 402 may be disposed in an opening of the frame 118. In other words, the frame 118 may be arranged around the active material 402 such that edges 416 of the frame 118 surround the side surfaces 414 of the active material 402. Thus, when the first layer 404 of pouch material and the second layer 400 of pouch material are positioned on either side of the opening formed by the frame 118 and sealed about the frame 118 (including embodiments wherein surfaces of the frame 118 and/or the electrode tabs 129 are directly sealed to the pouch material layers 400 and 404), the active material 402 is sealed in the battery cell 116. As discussed above, the electrode tabs 129 may extend outside of this sealed area and facilitate electrical access to the active material 402.

FIGS. 26-31 include partial cross-sectional views that schematically illustrate a number of different ways the layers 400 and 404 of pouch material may seal about the frame 118 and active material 402. It should be noted that FIGS. 26-31 generally represent cross-sectional views taken along a length of the battery cell 116 that does not include an electrode extending therethrough. For example, with reference to the battery cell 116 illustrated in FIG. 25, a partial cross-sectional view with similar characteristics would be taken lengthwise from the middle of the battery cell 116. Thus, electrodes such as the electrode tabs 129 are not visible in the cross-sectional views of FIGS. 26-31. It should be noted that different portions of the battery cell 116, such as different edges of the frame 118, may incorporate different structural features such as those illustrated in FIGS. 26-31. For example, a length of the battery cell 116 may incorporate one type of cross-section while a width may incorporate a different type of cross-section.

Turning first to FIG. 26, the second (or upper) layer 404 of pouch material is disposed over the upper surface 410 of the active material 402 and an upper surface 418 of the frame 118. Specifically, in the illustrated embodiment, the second layer 404 of pouch material is coupled or sealed against the upper surface 418 of the frame 118. Similarly, the first (or lower) layer 400 of pouch material is disposed under the lower surface 412 of the active material 402 and a lower surface 420 of the frame 118, and the first layer 400 of pouch material is sealed against the lower surface 412. The side surface 414 of the active material 402 wall may be generally flat, and may be essentially flush with a generally flat inner surface of the edge 416 of the frame 118, thereby reducing the amount space between the active material 402 and the frame 118 inside the battery cell 116. By arranging and coordinating the features of the battery cell 116 in the manner illustrated in FIG. 26, the first and second layers 400 and 404 of pouch material cooperate with the frame 118 to provide a seal with respect to the active material 402. In embodiments such as that illustrated in FIG. 26, the frame 118 is an active component for sealing in the active material 402. In other words, there is no pouch material layer between the frame 118 and the active material 402.

To create the seal in FIG. 26, the second layer 404 of pouch material is sealed to the upper surface 418 of the frame 118, and the first layer 400 of pouch material is sealed to the lower surface 420 of the frame 118. The first and second layers 400 and 404 of pouch material may be sealed to the surfaces 418 and 420 using a heat seal. Alternately, an adhesive, such as glue, high bond tape, dispensed adhesive, pumpable adhesive, an ultraviolet light curable bond, etc., may be used. In certain embodiments, an adhesive may be applied to an inner surface 421 of the layers 400 and 404, enabling the layers 400 and 404 to adhere to the portions of the battery cell 116 that the layers 400 and 406 extend across. In some embodiments, a sub-layer of the first and second layers 400 and 404 adjacent the frame 118 may include a composition similar to that of the frame 118 to facilitate a strong engagement with the frame 118 via melding of the sub-layers with the frame 118.

In some embodiments, the first and second layers 400 and 404 of pouch material may be trimmed or cut to fit the edges 416 of the frame 118, leading to one or more unsealed edges 422 that expose the inner layers of the first and/or second layers 400 and 404 of pouch material. As described above, the pouch material may include several sub-layers of material, including one or more layers, such as aluminum foil, that may be conductive. In certain embodiments, the unsealed edges 422 may be sealed or otherwise covered to reduce or eliminate the exposure of the conductive inner layers of the pouch material in the battery module 22. For example, the exposed edges 422 of pouch material may be covered with high bond tape, dispensed adhesive, etc., or the frame may include a lip to cover the exposed edge 422.

While FIG. 26 illustrates the first and second layers 400 and 404 coupled to the frame 118, the first and second layers 400 and 404 of pouch material may also be sealed to each other outside the frame, for example by a heat seal, as shown in FIG. 27. In certain embodiments, sealing the first and second layers 404 and 400 of the pouch material to each other outside of the frame 118 may cooperate with sealed engagement between the frame 118 and the layers 400 and 404 to provide a more robust seal around the active material 402. However, in some embodiments, the first and second layers 400 and 404 may be sealed together along the outer perimeter of the frame 118 without sealing directly to the frame 118. This may efficiently seal the active material 402 within the battery cell 116 and provide sufficient structural support from the frame 118 without requiring a sealed coupling between the frame 118 and the first and second layers 400 and 404.

FIGS. 28-30 illustrate embodiments of the battery cell 116 having what may be referred to as a grooved seal 424. As shown in FIG. 28, the first and second layers 400 and 404 of the pouch material may extend across the respective lower and upper surfaces 412 and 410 of the active material 402, as described in FIGS. 26-27. Further, the first and second layers 400 and 404 may also couple with the respective surfaces 420 and 418 of the frame 118. However, unlike the embodiments of FIGS. 26-27, the first and second layers 400 and 404 of the pouch material are also sealed to each other inside the frame 118. This combination of seals provides the grooved seal 424, which may enable a more comprehensive seal by providing larger inner surfaces 421 of the first and second pouch material layers 400 and 404 that may be sealed together or to the frame 118.

As illustrated in FIG. 28, when the frame 118 has a substantially square cross-section and is utilized with the grooved seal 424, a gap may be formed between an inner sidewall or inner edge 426 of the frame 118 and the grooved seal 424. Such a gap may trap air within the battery cell 116. To limit the potential amount of air sealed inside the battery cell 116, the frame 118 may be beveled along an inner edge 426 such that the inner edge 426 at least partially follows the contours of the grooved seal 424. For example, in FIG. 29, the inner edge 426 is partially angled to follow the contours of the first and second layers 400 and 404 of pouch material as they seal to each other inside the frame 118. While reducing the amount of air sealed inside the battery cell 116, angling the inner edge 426 of the frame 118 may also provide a larger surface area of the frame for sealing against the first and second layers 400 and 404 of pouch material. For example, a heat seal may be formed on, or an adhesive may be applied to the angled portion of the inner edge 426 as well as on the surfaces 418 and 420, allowing a more robust seal. It should be noted that different types of beveling of the inner edge 426 may be utilized in accordance with present embodiments. For example, in FIG. 30, the inner edge 426 is angled as in FIG. 29, but the inner edge 426 extends to a point 428, such that the amount of air sealed inside the battery cell 116 may be further reduced or eliminated. It should also be noted that the active material 402 may be similarly arranged to follow the contours of the grooved seal 424 and thus limit gap space between the grooved seal 424 and the active material 402.

In another embodiment, shown in FIG. 31, the first and second layers 400 and 404 of pouch material are sealed to each other, and also sealed to the frame 118. However, rather than sealing to outer sides 418 and 420 of the edge 416, the first and second layers 400 and 404 of pouch material are sealed inside the edge 416 of the frame 118. Sealing the first and second layers 400 and 404 of pouch material inside the edge 416 of the frame 118 may reduce or prevent exposure of unsealed edges 422 of the pouch material, as well as enabling a double seal, in which the sealed first and second layers 400 and 404 of pouch material are sealed to each other, and are further sealed inside the frame 118. With regard to covering exposed edges of the first and second layers 400 and 404 of pouch material, while not illustrated in FIGS. 26-30, it should be noted that coatings, layers, tapes, and the like may be utilized to cover the exposed edges to prevent potential communicative contact with any conductive sub-layers of the first and second layers 400 and 404 of pouch material.

In embodiments having a beveled or angled inner wall 426, as in FIGS. 29-30, a tool 430 such as that shown in FIG. 32 may be employed to press the first and second layers 400 and 404 of pouch material against the frame 118. The tool 430 may have an angled edge 432 that corresponds to the angle of the beveled inner edge 426 of the frame 118, allowing the contours of the tool 430 to match the contours of the grooved seal 424. The tool 430 may enable the pouch material to be pressed closely to the frame 118, thereby improving the quality of contact between the frame 118, the first and/or second layers 400 and 404, and the adhesive which may be applied between them. In some embodiments, two tools 430 may be used, such that one tool 430 may press on the first layer of pouch material 400 and another tool may press on the second layer 404 of pouch material, causing the first and second layers 400 and 406 of pouch material to seal to each other and to the respective portions of the frame 118. In embodiments wherein the active material 402 is also beveled, the tool 430 may include a pair of the angled edges 432.

As noted above, it should be understood that the views of the battery cell 116 shown in FIGS. 26-32 are along edges 416 of the battery cell 116 that do not include electrodes (e.g., electrode tabs 129); however, the techniques illustrated therein may be generally applied to edges 416 that do include the electrodes. FIG. 33 shows a partially exploded schematic of a cross sectional view of the battery cell 116, having the active material 402, the first and second layers 400 and 404 of pouch material, the frame 118, and the electrode tab 129. In this embodiment, the electrode tab 129 extends through an opening 433 in the frame 118 to protrude from the battery cell 116. As noted above, the electrodes may take any geometric form, and are not limited to the tab embodiment shown herein. To enable the electrode tabs 129 to extend beyond the frame 118, the frame may include one or more openings 433 (e.g., grooves or holes), as shown in FIGS. 34-35, to receive the electrode tabs 129.

FIG. 34 illustrates an embodiment of the frame 118 having grooves 434 along the upper surface 418, that are configured to receive the electrode tabs 129. It should be understood that the grooves 434 may be beveled, curved, etc., and they may be placed on any portion of the frame 118, including the upper surface 418, the lower surface 420, or any other suitable location. In certain embodiments, one groove may be placed in the upper surface 418, and another groove may be placed on the lower surface 420. The grooves 434 may enable the active material 402 to be disposed in the frame 118 such that the electrode tabs 129 align with and extend through the grooves 434. To seal around the electrode tab 129, a seal, such as a plastic seal, may be molded into the electrode tab 129 and/or the frame 118. In other embodiments, the electrode tab 129 may be vibration welded to the frame 118 or the electrode tab 129 may be imbedded in and/or integral with the frame 118. Any method or technique may be used to seal the electrode tab 129 to the frame 118. As discussed above, separately or in addition to being sealed with the frame 118, the electrode tabs 129 may be sealed with the first and second layers 400 and 404 of pouch material.

In other embodiments, such as that shown in FIG. 35, the frame includes holes 436 for the electrodes (e.g., the electrode tabs 129). The electrode tabs 129 may be fed through the holes 436, enabling the electrode tabs 129 to protrude from the battery cell 116. As in the embodiment having the grooves 434, the electrode tab 129 may be sealed to the frame 118 using a molded plastic seal, melting of the electrode tab 129 to the frame 118, vibration welding, molding the electrode tab 129 into the frame 118, etc. Furthermore, separately or in addition to being sealed with the frame 118, the electrode tabs 129 may be sealed with the first and second layers 400 and 404 of pouch material.

FIG. 36 illustrates an embodiment of the frame 118 having a support feature 438 across a middle portion 440 of the frame 118. The support feature 438 may buttress a middle portion of the active material 402, thereby preventing the active material 402 from sagging or otherwise extending beyond the contours of the frame 118. It should be understood that the support feature 438 may extend in any direction across the frame 118, and may include any of various geometries. For example, the support feature 438 may include a grid extending from one side of the frame 118 to another or cantilevered portions (e.g., semicircles that extend from the inner edges 426 of the frame 118 to support the active material 402). This may allow for active material 402 to be placed within an opening formed by the frame 118 without allowing the active material 402 to pass through the frame 118. As shown, the frame 118 may also comprise a pouch groove 442, which provides more surface area for coupling with the first and second layers 400 and 404 of pouch material. The pouch groove 442 may improve the seal between the frame 118 and the first and second layers 400 and 404 by providing more surface area for first and second layers 400 and 404 to adhere with, by recessing the seal, and by providing different directional components for the engagement between the first and second layers 400 and 404 and the frame 118. Thus, the pouch groove 442 may contribute to a more robust battery cell 116.

FIG. 37 is a schematic representation of a sheet of frame sections 443 arranged for assembly of multiple battery cells 116 via a method of manufacturing in accordance with an embodiment of the present approach. The sheet of frame sections 443 includes a ladder-like framework with a plurality of openings 444 in which the active material 402 may be disposed. The edges of the sheet of frame sections 443 may be geometrically configured in a fashion similar or identical to any of the previously disclosed embodiments. Indeed, the sheet of frame sections 443 may eventually be divided into separate frames 118 for use in providing a plurality of separate battery cells 116. However, to facilitate efficient manufacturing, the sheet of frame sections 443 may initially be processed as a unit to establish at least certain aspects of the battery cells 116 before being separated.

FIG. 38 is a block diagram of a method 500 of assembling one or more battery cells in accordance with an embodiment of the present approach. The method 500 begins with disposing (block 502) the frame 118 on the first layer 400 of pouch material. As described above, the frame 118 includes the edges 416 coupled (e.g., formed) together to form one or more openings 444 that may be configured to receive the active material 402. In one embodiment, the frame 118 may include the sheet of frame sections 443. Next, the active material 402 is disposed (block 504) on the first layer 400 of pouch material and in the opening(s) 444. This may include positioning the tab electrodes 129 such that they extend beyond the frame 118 or engage a conductive feature integral with the frame 118. The second layer 404 of pouch material is disposed (block 506) over the frame 118 and the active material 402. Alternatively, in other embodiments, the active material 402 may be placed on the first layer 400 of pouch material before the frame 118, and then the frame 118 may be placed about the active material 402. A seal is then established (block 508) involving the first and second layers 400 and 404 of pouch material about the active material 402 and the frame 118. The established seal may include any seal configuration described above (e.g., the groove seal 424). As described above, the first and second layers 400 and 404 of pouch material may be sealed to the frame 118, the tab electrodes 129, and/or each other (e.g., inside, around, or within the inner perimeter of the frame 118).

In embodiments employing the sheet of frame sections 443, once the first and second layers 400 and 404 of pouch material have been sealed around the active material 402 and about the frame 118, a plurality of separate frames 118 may be formed by cutting the framework between the openings 444 (e.g., along dashed lines 446). Thus, the separate frames 118 including the active material 402 sealed between the cut portions of the first and second layers 400 and 404 of pouch material may be provided for further processing into a plurality of separate battery cells 116. The battery cells 116 may include electrodes, such as the tab electrodes 129, which may be configured to extend from the active material 402 beyond the edges of the frame 118. As discussed above, the frame 118 and/or the tab electrodes 129 may include a molded sealing portion in certain areas, such as the edges 426 of the frame 118, to accommodate the tab electrodes 129 extending from the active material 402.

FIG. 39 illustrates a battery cell 116 including features configured to facilitate filling the frame 118 with electrolyte and/or degassing the battery cell 116 to activate the battery cell 116. To fill the battery cell 116, the first and second layers 400 and 404 of pouch material may be partially sealed around a perimeter of the active material 402. For example, in some embodiments, the first and second layers 400 and 404 are sealed to each other with a seal 509 along three sides of the battery cell 116, wherein the three sides are indicated by reference numeral 510 in FIG. 39. This seal 509 forms a bag with an open end along a fourth side 512.

The frame 118 may include a channel 514 (shown in FIG. 39A) to facilitate filling and degassing. Indeed, the battery cell 116 may be connected to a filling machine (not shown) via the channel 514 and the filling machine may generate a vacuum on the battery cell 116. Next, the filling machine may introduce a measured amount of electrolyte into the battery cell 116. Indeed, the electrolyte may fill the cell. While the illustrated channel 514 is generally rectangular, the channel 514 may take any shape or form, including a groove, an opening, a depression, a notch, a beveled edge, etc. Once the desired amount of electrolyte has been inserted into the battery cell 116, the open side (e.g., the fourth side 512) of the battery cell 116 is given a temporary seal 516, and the battery cell 116 moves to formation (e.g., initial electrical cycling).

After formation, degassing may be required to remove unwanted gas that may build up inside the battery cell 116. To remove this unwanted gas, the temporary seal 516 on the fourth side may be cut away, such as along dashed line 518. This effectively removes the temporary seal 516 and allows degassing via the resulting opening and the channel 514. Once the desired amount of gas has been removed, the fourth side 512 of the first and second pouch layers 400 and 404 are completely (e.g., hermetically) sealed around the active material 402 with what may be referred to as a permanent seal 520 that is formed inside the perimeter of the original temporary seal.

One or more of the disclosed embodiments, alone or on combination, may provide one or more technical effects useful in the sealing and manufacture of battery cells 116. For example, certain embodiments of the present approach enable integration of the frame 118 with pouch material. Thus, a structurally supported battery cell component can be provided more efficiently than separately providing a frame and a pouch cell. Present embodiments also include techniques for efficiently manufacturing a large number of battery components by utilizing a common framework during certain process steps and subsequently dividing the common framework into separate components. Furthermore, certain embodiments of the present approach may enable improved sealing in battery cells 116. By specific example, disposing the first and second layers 400 and 404 of pouch material about active material 402, and sealing them to or otherwise about the battery cell frame (e.g., the frame 118), as set forth above, may enable the manufacture of battery cells to include a more robust seal about the active material 402, compared to battery cells that are not sealed as described herein. As such, the sealing of the battery cell using the first and second layers 400 and 404 of pouch material, as presently disclosed, may generally enable the production of a more robust battery module 22. The technical effects and technical problems in the specification are exemplary and are not limiting. It should be noted that the embodiments described in the specification may have other technical effects and can solve other technical problems.

System and Method for Communicative Interconnect of Battery Cells

In addition to the elements discussed above, the battery module 22 includes the interconnect assemblies 128 for electrically connecting the battery cells 116 of the power assembly 84. As discussed above with respect to FIG. 7, the interconnect assemblies 128 may facilitate electrical coupling of the battery cells 116 within the power assembly 84. FIG. 40 is a schematic cross-sectional representation of the battery module 22, which illustrates two interconnect assemblies 128 with a number of interconnection devices 138 used to facilitate battery cell connections. The two interconnect assemblies 128 are disposed one on each side of the power assembly 84.

In order to provide the desired electrical output from the battery terminals 24, 26, and 30, the battery cells 116 are electrically connected in series or parallel via the interconnect assemblies 128. As described above, the power assembly 84 includes the multiple battery cells 116 arranged in a stacked orientation relative to each other. In addition, as discussed above, each battery cell 116 includes a pair of tab electrodes 129 extending from the battery cell 116. At any given time, one of the tab electrodes 129 acts as the anode, while the opposite facing tab electrode 129 acts as the cathode for the battery cell 116. The battery cells 116 may be connected in series or in parallel to neighboring battery cells 116 as desired. In the illustrated embodiment, the battery cells 116 are all connected in series. To facilitate this connection, the interconnection devices 138 may connect the anode of each battery cell 116 to the cathode of the neighboring battery cell 116, such that electricity flows through all of the battery cells 116 in series. To that end, the battery cells 116 may be disposed in a stacked orientation such that the direction of the flow of electricity through each battery cell 116 switches between alternating battery cells 116 within the power assembly 84, as indicated by arrows 522. Thus, on each interconnect assembly 128, the interconnection devices 138 may be placed between every other pair of neighboring battery cells 116. The term "neighboring battery cells" is used in the present disclosure to mean battery cells 116 that are stacked relative to each other without any other battery cells 116 disposed between. A first battery cell 116 of the power assembly 84 may be electrically coupled with a second neighboring battery cell 116 via an interconnection device 138 of the first interconnect assembly 128. The second battery cell 116 may be electrically coupled with a third neighboring battery cell 116 via an interconnection device 138 of the second interconnect assembly 128, and the third battery cell 116 may be electrically coupled with a fourth neighboring battery cell 116 via an interconnection device 138 of the first interconnect assembly 128, and so forth.

Although the illustrated embodiment specifically shows the battery cells 116 connected in series via the interconnect assemblies 128, other embodiments may be possible as well. For example, the battery cells 116 may be arranged in the stacked orientation such that anodes of two neighboring battery cells 116 are coupled via one of the interconnection devices, thereby facilitating a parallel connection of the battery cells 116. The battery cells 116 and interconnect assemblies 128 may be arranged to allow for any desired combination of parallel and/or series connections between the battery cells 116 of the power assembly 84. Further, it should be noted that the interconnect assemblies 128 and interconnection devices 138 disclosed herein may be used in applications for connecting any two terminals of an electrical device, such as for connecting terminals of a fuse with tab electrodes.

In present embodiments, the interconnect assemblies 128 use interconnection devices 138 configured to receive and facilitate electrical coupling of two tab electrodes 129 extending from neighboring battery cells 116. The interconnection devices 138 may be selectively removable from the tab electrodes 129, allowing any one of the battery cells 116 to be disconnected and removed from the power assembly 84 as desired. Different embodiments of the power module 22 may employ different types of interconnection devices 138. For example, in some embodiments described below, the interconnection device 138 may include a clamp configured to be disposed over a coupling structure of the interconnect assembly 128.

System and Method for Clamping Interconnection of Battery Cells

FIG. 41 is an exploded perspective view of one such embodiment of the interconnect assembly 128 that can connect neighboring battery cells 116 of the battery module 22. As discussed above with respect to FIG. 7, the illustrated interconnect assembly 128 includes the cell interconnect board 130 (e.g., ladder), which may provide structural support for the interconnection of the battery cells 116. The cell interconnect board 130 also may provide support for connecting the battery cells 116 with the various sensors 132 disposed on the cell interconnect board 130. As illustrated, the cell interconnect board 130 includes slots 134 through which the tab electrodes 129 of two neighboring battery cells 116 may be positioned for connecting the tab electrodes 129. In addition, the cell interconnect board 130 includes coupling structures 524 disposed across the slots 134 formed in the cell interconnect board 130.

The coupling structures 524 are substantially parallel structures disposed as rungs between frame pieces 526 (e.g., opposing edges) of the cell interconnect board 130. Each coupling structure 524 may have a substantially uniform cross section extending longitudinally between the frame pieces 526 along a longitudinal axis 528. The term "substantially parallel" used above refers to longitudinal axes 528 of the coupling structures 524 being parallel. For example, in the illustrated embodiment, the coupling structures 524 are aligned with respective longitudinal axes 528, and these longitudinal axes 528 are substantially parallel (e.g., within less than 1, 2, 3, 4, 5, or 6 degrees) of the X axis 44 of the battery module 22.

To connect two tab electrodes 129, the tab electrodes 129 may extend through the slots 134 and be at least partially conformed to an outer surface of the coupling structure 524 disposed across the slot 134. Each coupling structure 524 of the cell interconnect board 130 is positioned and designed to abut or receive the tab electrodes 129 from two battery cells 116 located near the coupling structure 524. In some embodiments, that is, the cell interconnect board 130 may be designed such that the coupling structures 524, when the battery module 22 is assembled, are disposed at a position between the tab electrodes 129 extending from two neighboring battery cells 116, with respect to the Y axis 42.

In addition to the cell interconnect board 130, the interconnect assembly 128 includes a number of interconnection devices 138, which are clamps 530 in the illustrated embodiment. The clamps 530 are configured to be disposed about the coupling structures 524 to facilitate electrically coupling the two tab electrodes 129 that are conformed to the coupling structure 524. More specifically, each clamp 530 may secure two neighboring tab electrodes 129 between a respective coupling structure 524 and the clamp 530. One or both of the coupling structure 524 and the clamp 530 may be electrically conductive, in order to facilitate the electrical connection between the two tab electrodes 129. In embodiments where the coupling structure 524 is conductive, the clamp 530 is used to secure the tab electrodes 129 in engagement with the coupling structure 524. In some embodiments, the coupling structure 524 and the clamp 530 may be nonconductive, but they may hold the tab electrodes 129 in direct contact with each other for establishing the desired electrical connection. The clamps 530 may extend along most or all of the length of the coupling structures 524 to provide a secure connection. As discussed in detail below, the clamps 530 and the coupling structures 524 may include specific mating features for aligning and securing the clamps 530 around the respective coupling structures 524. For example, the clamps 530 may include curved portions of a spring element that are complementary to substantially rounded outer portions of the coupling structures 524.

In some embodiments, the cell interconnect board 130 may include sensors 132 in electrical communication with the coupling structures 524. In such embodiments, the coupling structures 524 are conductive, and the cell interconnect board 130 may be part of a PCB that uses electrical sensor measurements to monitor operations of the individual battery cells 116, among other things. Specific embodiments of the sensors 132 and methods of connecting sensor electrical contacts with the tab electrodes 129 are discussed in further detail below.

It should be noted that the interconnect assembly 128 illustrated in FIG. 41 represents one of two interconnect assemblies 128 that may be used together to electrically connect the battery cells 116 in series. That is, one set of the cell interconnect board 130 and clamps 530 may be disposed at one end of the power assembly 84, and another set of the cell interconnect board 130 and clamps 530 may be disposed at an opposite end of the power assembly 84. As discussed with reference to FIG. 40, the tab electrodes 129 of alternating pairs of the battery cells 116 may be connected via the cell interconnect board 130 and clamps 530 at each end, respectively, until the battery cells 116 are all connected in series via the two interconnect assemblies 128. In other embodiments, parallel connections may be employed.

Although the illustrated embodiment shows the interconnect assembly 128 having the cell interconnect board 130 and a plurality of clamps 530, it should be noted that other types of interconnection devices 138 may be applied similarly to tab electrodes 129 conformed to structural rungs of the cell interconnect board 130. In other embodiments, that is, the cell interconnect board 130 may be equipped with different types of coupling structures 524, and the interconnection devices 138 may take a form that differs from those illustrated in FIG. 41. Examples of such other embodiments of the interconnect assembly 128 are discussed in detail below.

Having now discussed the general arrangement of components within an embodiment of the interconnect assembly 128, detailed descriptions of possible interconnection devices 138 will be provided. FIG. 42, for example, is a perspective view of the clamp 530 discussed above, which may facilitate the electrical connection of two tab electrodes 129. The clamp 530 may be a single-piece spring element. That is, the clamp 530 may be formed from a single piece of metal that is flexible enough to apply a desired clamping force to the tab electrodes 129 and the coupling structure 524. The clamp 530 may provide this clamping force without the application of a force from another component of the battery module 22. As described below, the clamp 530 may have a specific shape to facilitate application, alignment, and removal of the clamp 530 relative to the coupling structure 524.

As illustrated, the clamp 530 may be secured about the tab electrodes 129 and the coupling structure 524 without the use of additional fasteners. That is, no separate fastening elements (e.g., screws, pins, bolts, or other connectors) are used to couple and secure the clamp 530 against the coupling structure 524. The clamp 530 may be secured about the coupling structure without the use of a fastening element that is separate from the clamp and the coupling structure. The clamp 530 may provide all of the force for maintaining the tab electrodes 129 in position between the coupling structure 524 and the clamp 530 entirely from the clamping force provided by the spring element. This may facilitate relatively easy removal of the clamp 530 from the coupling structure 524 and the tab electrodes 129, compared to traditional couplings that use screws and similar fasteners.

In the illustrated embodiment, the clamp 530 has a uniform cross section that extends along an axis 532 of the clamp 530. The clamp 530 may extend in the direction of the axis 532 for a length that is approximately equal to (e.g., within 5 mm of) or slightly less than (e.g., within 20 mm of) a length of the coupling structure 524 about which the clamp 530 is positioned. In some embodiments, the clamp 530 extends beyond the coupling structure 524 to ensure full engagement. The clamp 530 may extend a distance along the axis 532 that is larger than a corresponding dimension of the tab electrodes 129 extending from the battery cells 116. This may help to ensure a proper electrical coupling of the tab electrodes 129 along the entire edge of each of the tab electrodes 129.

The shape of the cross section of the clamp 530 may include, among other things, a pair of curved portions 534, a detent 536 disposed between the curved portions 534, and wings 538 extending from ends 540 of the curved portions 534. This type of clamp 530 may be used with rounded coupling structures 524, such as a substantially cylindrical bar. Indeed, the curved portions 534 may function as components of a spring element to engage a substantially rounded outer portion of the coupling structure 524. That is, the curved portions 534 of the clamp 530 may partially trace a substantially rounded perimeter or partial perimeter of the coupling structure 524 with a geometric center. In the illustrated embodiment, for example, the curved portions 534 partially trace a circle, although in other embodiments, the curved portions 534 may trace an oval or other rounded geometric shape. The detent 536 may be disposed between the curved portions 534 at a position midway between the ends 540 of the clamp 530. The detent 536 extends toward a center of the circle (or other rounded shape) traced by the curved portions 534. The detent may be captured in an indentation of the coupling structure 524, thereby securing the clamp 530 about the coupling structure 524 in a relatively fixed orientation. The two wings 538 may extend from the curved portions 534 such that they are angled away from the center of the circle (or other rounded shape) traced by the curved portions 534.

The wings 538 may facilitate alignment with or removal of the clamp 530 from the coupling structure 524. Specifically, the wings 538 may be pulled apart, manually or via a tool, to remove the curved portions 534 of the clamp 530 from the coupling structure 524. In the illustrated embodiment, the wings 538 include apertures 542 that may receive extensions from a tool that can be actuated to flex the clamp 530 open for coupling or decoupling with the coupling structure 524. Specifically, the extensions from the tool may be inserted into the apertures 542 and a levering action initiated by squeezing plier-like handles of the tool together may cause the clamp 530 to flex open. When it is desirable to remove a battery cell 116 with a tab electrode 129 secured between the clamp 530 and the coupling structure 524, an operator may pull the wings 538 apart, and remove the clamp 530 from the coupling structure 524 and the tab electrode 129.

FIG. 43 is a schematic cross-sectional view of the interconnect assembly 128 having the coupling structure 524 and the clamp 530. In the illustrated embodiment, the interconnect assembly 128 is used to electrically couple a first tab electrode 129 extending from a first battery cell 116 with a second tab electrode 129 extending from a second battery cell 116. As discussed above, the battery cells 116 are disposed in a stacked orientation relative to one another. In the illustrated embodiment, the tab electrodes 129 are secured between the coupling structure 524, which may be electrically conductive, and the clamp 530.

To secure the tab electrodes 129 in the illustrated position, the clamp 530 is disposed about the coupling structure 524 and the first and second tab electrodes 129. More specifically, the clamp 530 may be positioned such that the curved portions 534 of the clamp 530 abut the tab electrodes 129 that are partially conformed around the coupling structure 524. From this position, the curved portions 534 of the clamp 530 may push against the rounded outer edge of the coupling structure 524, exerting a clamping force that maintains the tab electrodes 129 securely between the coupling structure 524 and the clamp 530.

It should be noted that the illustrated embodiments include curved clamps 530 (e.g., with the curved portions 534) configured to be received over rounded coupling structures 524. Using such rounded shapes for the electrical coupling of the tab electrodes 129 may facilitate a relatively enhanced connection, compared to maintaining tab electrodes against relatively flat structures. For example, a larger surface area of the tab electrodes 129 may be held between the rounded clamp 530 and coupling structure 524 than between a flat clamp/coupling structure that takes up a comparable amount of space in the battery module 22. This may facilitate a more secure connection between the tab electrodes 129, especially when the electrical connection requires direct contact of the tab electrodes 129 with one or both of the coupling structure 524 and the clamp 530. In addition, the rounded clamp 530 may apply the clamping force to the rounded coupling structure 524 such that the spring force in the clamp 530 is applied to the coupling structure 524 and the tab electrodes 129 from several different directions. Instead of two opposing friction force vectors directed to the coupling structure 524 and the tab electrodes 129, the disclosed clamp 530 provides radial clamping force vectors directed toward the center of the coupling structure 524. This may facilitate a relatively secure connection of the clamp 530 around the coupling structure 524, preventing the clamp 530 from sliding off or being unintentionally pulled out of connection with the coupling structure 524.

In some embodiments, the clamp 530 and the coupling structure 524 may be sized appropriately for holding the tab electrodes 129 via the clamping force. As noted above, the curved portions 534 of the clamp 530 may trace a circle. In the illustrated embodiment, the coupling structure includes a substantially cylindrical bar. In some embodiments, a diameter of the circled traced by the curved portions 534 of the clamp 530 may be approximately the same size, or slightly smaller than, an outer diameter of a rounded portion 544 of the cylindrical bar. Since the rounded portion 544 of the coupling structure 524 receives the curved portions 534 of the clamp 530, the clamp 530 may be elastically deformed when placed over the coupling structure 524 and the tab electrodes 129. As the clamp 530 exerts a spring force to bring the clamp 530 back into its equilibrium position, the clamp 530 transfers the force (as a clamping force) to the tab electrodes 129 and the coupling structure 524 via the curved portions 534.

As noted above, the coupling structure 524 and the clamp 530 may include complementary mating features for aligning and securing the clamp 530 about the coupling structure 524. Such mating features may include, for example, an indentation and detent. The illustrated coupling structure 524 is a substantially cylindrical bar, meaning that the bar is cylindrical except for an indentation 546 (e.g., a groove) formed along the outer diameter of the bar. This indentation 546 may extend along the length of the coupling structure 524. In other embodiments, the indentation 546 may be a recess, concavity, or multiple such features. The indentation 546 may be complementary with respect to the detent 536 of the clamp 530. That is, the indentation 546 may be sized to receive the detent 536 of the clamp 530 when the clamp 530 is disposed around the coupling structure 524 and the tab electrodes 129. By receiving and holding the detent 536 in the indentation 546, the coupling structure 524 may secure the clamp 530 in position about the coupling structure 524, so that the clamp 530 does not rotate with respect to or come off the coupling structure 524 on its own. In addition, the indentation 546 and the detent 536 may facilitate an appropriate rotational alignment of the clamp 530 relative to the coupling structure 524. Specifically, the placement of the indentation 546 and the complementary detent 536 may maintain the clamp 530 in position such that the curved portions 534 of the clamp 530, which transfer the clamping force, are situated directly over the tab electrodes 129 that are partially conformed to the coupling structure 524. Other arrangements of indentations 546 and complementary detents 536 may be employed in other embodiments of the interconnect assembly 128. For example, the indentation 546 is replaced with an extension (e.g., ridge or prong) in some embodiments, while the detent 536 is correspondingly replaced with a receptacle for the extension.

As noted above, the wings 538 of the clamp 530 may be used to remove the clamp 530 from the coupling structure 524. Specifically, an operator may manually, or with a tool, pull the wings 538 in the directions shown by arrows 548 in the illustrated embodiment. When pulled, the wings 538 may act as levers to force at least part of the curved portions 534 of the clamp 530 out of contact with the coupling structure 524 and the tab electrodes 129. Once the curved portions 534 are no longer secured around the coupling structure 524, the clamp 530 may be removed from the coupling structure 524 and the tab electrodes 129. The clamp 530 may be removed from the coupling structure 524 in a direction of the positive Z axis 40, as shown by an arrow 550.

The clamp 530 may be inserted onto the coupling structure 524 in an opposite direction (e.g., negative Z axis 40), as illustrated by arrow 552 in FIG. 44. However, prior to insertion of the clamp 530, the first and second tab electrodes 129 may be pre-shaped to conform at least partially to the coupling structure 524. More specifically, the tab electrodes 129 may be brought toward the coupling structure 524 and bent around the corresponding rounded portions 544 of the coupling structure 524, as shown by arrows 553. The coupling structure 524 receives the tab electrodes 129 in this conforming orientation with respect to the coupling structure 524 before the clamp 530 is disposed thereon. When the clamp 530 is added, the wings 538 are received over the coupling structure 524 and the pre-shaped tab electrodes 129, then the curved portions 534 are received over the coupling structure 524, and the detent 536 is positioned within the complementary indentation 546 of the coupling structure 524.

In the illustrated embodiment the tab electrodes 129 are pre-shaped such that they already conform to the coupling structure 524. That is, the pre-shaped tab electrodes 129 are in direct contact with the coupling structure 524 prior to the application of the clamp 530. However, in other embodiments, the tab electrodes 129 may be pre-shaped such that they are not directly in contact with the coupling structure 524 until the clamp 530 is disposed over the tab electrodes 129 and the coupling structure 524. In such instances, the clamp 530 pushes the tab electrodes 129 against the coupling structure 524 to establish the electrical connection.

Although in the illustrated embodiment, the tab electrodes 129 are wrapped only partially around the coupling structure 524, in other embodiments, the tab electrodes 129 may extend far enough from the battery cells 116 to wrap around the coupling structure 524 until the tab electrodes 129 are touching each other. In such instances, the coupling structure 524 and/or the clamp 530 may not be conductive at all for establishing an electrical connection between the tab electrodes 129. Instead, the tab electrodes 129 themselves may be pre-shaped around the coupling structure 524 until they are overlapping with respect to each other. Then, the clamp 530 may be positioned on the coupling structure 524 to secure the tab electrodes 129 in direct contact with each other for providing the electrical connection. In still other embodiments, the clamp 530 may be conductive, so that the electrical connection is established via the clamp 530.

Other variations of the coupling structure 524 may be possible as well. For example, as illustrated in FIG. 45, the coupling structure 524 may include a substantially cylindrical bar 554 that is hollow. This may reduce an overall weight of the battery module 22, as compared to a solid cylindrical bar. In other embodiments, the coupling structure 524 may include a clamp structure designed to receive the clamp 530. An example of one such clamp structure 555 is shown in FIG. 46. In the illustrated embodiment, the clamp structure 555 is complementary with respect to the clamp 530, meaning that the clamp structure 555 includes features designed to interact with and receive features of the clamp 530. The clamp structure 555 may be a single piece spring element, similar to the clamp 530, and may include similar features to the clamp 530. Specifically, the clamp structure 555 may include one or more of curved portions 556, wings 557 extending from the curved portions 556, and a detent 558 extending between the curved portions 556. The detent 558 may function as an indentation for receiving and holding the detent 536 of the clamp 530 against the clamp structure 555. One or both of the clamp structure 555 and the clamp 530 may be electrically conductive to provide an electrical connection between the two tab electrodes 129 secured between the clamp structure 555 and the clamp 530. Other embodiments of the interconnect assembly 128 may utilize different types of coupling structures 524 than those shown in the present disclosure.

One or more of the disclosed embodiments, alone or in combination, may provide one or more technical effects useful in the assembly and maintenance of battery modules with a number of battery cells arranged in a stacked orientation relative to each other. For example, certain embodiments of the present approach may enable improved interconnections between tab electrodes extending from the different battery cells. By specific example, conforming the tab electrodes around a coupling structure and securing the tab electrodes in electrical communication with each other via a clamp, as set forth above, may enable easier connections and disconnections of the battery cells, compared to battery interconnect assemblies that rely on relatively permanent connection methods, such as laser welding. The presently disclosed interconnect assembly provides a simple mechanical clamp that facilitates electrical coupling of the tab electrodes. Such clamps may be relatively easy to manufacture, as they can be formed from a single spring element. The clamp may includes features (e.g., wings) that facilitate removal of the clamp from the tab electrodes and the coupling structure, making the disclosed interconnect assembly more versatile than laser welding and other existing techniques for the disconnection, removal, or replacement of individual battery cells in the battery module. As such, the interconnection of battery cells via a clamp and coupling structure may generally enable a battery module with a more simple assembly and with individually replaceable battery cells. The technical effects and technical problems in the specification are exemplary and are not limiting. It should be noted that the embodiments described in the specification may have other technical effects and can solve other technical problems.

System and Method for Crimping Interconnection of Battery Cells

As noted above, other types of interconnection devices 138 may be employed in the interconnect assembly 128. For example, FIG. 47 illustrates an embodiment of the interconnect assembly 128 that uses a crimping element 560 to hold the tab electrodes 129 in direct contact, and thus in electrical communication, with each other. Specifically, the crimping element 560 is disposed over the tab electrodes 129, and the crimping element 560 is configured to apply a compressive force to the tab electrodes 129, as illustrated by arrows 562. The crimping element 560 may include a spring element that naturally biases aspects of the crimping element 560 in the direction of arrows 562 or the crimping element 560 may include a pliable material that essentially maintains its shape after being pressed together in the direction of arrows 562. In some embodiments, the crimping element 560 is electrically conductive to facilitate electrically coupling the tab electrodes 129 extending from the two battery cells 116. However, in other embodiments, the crimping element 560 may be nonconductive and may simply compress the two tab electrodes 129 against one another to maintain an electrical connection via direct contact. It should be noted that the tab electrodes 129 are representative of one embodiment and present embodiments may also be utilized with different types of electrodes.

The crimping element 560 may take on a variety of forms in different embodiments, each utilizing specific features to apply the compressive force to the tab electrodes 129. For example, in one embodiment, the crimping element 560 may include a single-piece spring element. As described in detail below, the single-piece spring element may be shaped to apply a desired compressive force for holding the tab electrodes 129 together. The shape of the spring element may also be designed to facilitate attachment and removal of the crimping element 560 from the tab electrodes 129 (e.g., via a tool). In another embodiment discussed below, the crimping element 560 may include a clip assembly with a biasing feature that facilitates opening and closing of the clip. This allows the clip to be selectively attached to or removed from the tab electrodes 129. In yet another embodiment, the crimping element 560 incorporates soft or pliable material (e.g., soft metal) and/or components with adhesive disposed thereon that can be pressed into engagement about the tab electrodes 129 such that the crimping element 560 maintains a compressed shape and thus a compressive coupling with the tab electrodes 129.

In the illustrated embodiment of FIG. 48, the crimping element 560 may include high voltage tape 564, which may include pliable metal. The high voltage tape 564 may be any adhesive tape that includes an adhesive layer 565 and, when disposed over the tab electrodes 129, permits the flow of electricity between the tab electrodes 129. The high voltage tape 564 may include, for example, electrical tape (e.g., insulating tape) or conductive tape. The adhesive (e.g., adhesive layer 565) of the high voltage tape 564 may maintain a compressive force on the tab electrodes 129, the compressive force being initially established during attachment of the high voltage tape 564. That is, the compressive force is first applied by an operator (or tool) that applies pressure to two sides 566 of the high voltage tape 564 disposed around the tab electrodes 129, and this pressure is maintained as the high voltage tape 564 sticks to itself via the adhesive 565. Although not illustrated, the high voltage tape 564 may extend past the tab electrodes 129 along the X axis 44 so that the two sides 566 can be secured together. The high voltage tape 564 may be removable. A user may pull the sides 566 of the high voltage tape 564 apart to disconnect the tab electrodes 129. In some embodiments, the high voltage tape 564 may be reusable, so that it can be attached and removed several times before being discarded. Thus, the high voltage tape 564 may be a relatively inexpensive and flexible element for removably crimping the tab electrodes 129 into electrical contact.

As noted above, the interconnect assembly 128 includes the crimping element 560, which may be a spring element, a clip, tape, or some other component for compressing the tab electrodes 129 together. In the illustrated embodiment of FIG. 47, the interconnect assembly 128 also includes the coupling structure 524, which is configured to receive the tab electrodes 129 in a partially conforming orientation with respect to the coupling structure 524. That is, respective portions of the tab electrodes 129 extend over a portion of the coupling structure 524 and flexibly engage the contacted portion of the coupling structure 524 such that the tab electrodes 129 assume geometries in partial conformance with the coupling structure 524. This type of conformity of the tab electrodes 129 with the coupling structure 524 occurs in accordance with various embodiments that employ the coupling structure 524. The two tab electrodes 129 are described as being partially conformed about the coupling structure 524 because they include sections that conform or substantially conform to certain surfaces of the coupling structure 524. That is, portions of the tab electrodes 129 that abut the coupling structure 524 flex and bend about the coupling structure 524 such that the tab electrodes 129 trace certain contours of the coupling structure 524. This conformed orientation of the tab electrodes 129 to the coupling structure 524 is illustrated in each of FIGS. 47, 49, 50, and 51. It should be noted that the tab electrodes 129 may be pre-shaped by a crimping mechanism prior to positioning the tab electrodes 129 adjacent the coupling structure 524 to encourage the conformed orientation. Once the tab electrodes 129 are arranged with respect to the coupling structure 524 (whether pre-shaped or partially conformed), the crimping element 560 may be disposed against the tab electrodes 129 to secure the tab electrodes 129 in electrical communication with each other.

The crimping element 560 may secure the tab electrodes 129 in the conforming orientation around the coupling structure 524. The crimping element 560 and the coupling structure 524 are separate components of the illustrated interconnect assembly 128. In some embodiments, the coupling structure 524 may be electrically conductive to facilitate the electrical connection of the tab electrodes 129 that are held in position against the coupling structure 524 via the crimping element 560. The coupling structure 524 may provide a substantial conductive surface for electrical interaction with the tab electrodes 129 and/or structural support for the tab electrodes 129 and the corresponding interconnection devices 138. However, it should be noted that, in some embodiments, the coupling structure 524 is not utilized and the crimping element 560 or other interconnection devices 138 function in a manner similar to that illustrated in FIG. 40.

FIG. 49 is a perspective sectional view of the interconnect assembly 128 that uses crimping elements 560 to secure pairs of the tab electrodes 129 around corresponding coupling structures 524. In the illustrated embodiment, the coupling structures 524 form part of the cell interconnect board 130 of the interconnect assembly 128, which was discussed in detail above with respect to FIG. 41. The cell interconnect board 130 may provide structural support for the interconnection of the tab electrodes 129 via the crimping elements 560. As noted above, the cell interconnect board 130 may also provide support for the interconnection of the battery cells 116 with the various sensors 132. Again, the cell interconnect board 130 includes the slots 134 through which the tab electrodes 129 of neighboring battery cells 116 may be positioned for connecting the tab electrodes 129. The coupling structures 524 are disposed across the slots 134 formed in the cell interconnect board 130. As discussed above with respect to FIG. 41, the coupling structures 524 may be substantially parallel structures disposed as rungs between the frame pieces 526 (e.g., opposing edges) of the cell interconnect board 130. Only one of the frame pieces 526 is shown in the illustrated embodiment.

To connect two tab electrodes 129, the tab electrodes 129 may extend through the slots 134 and be at least partially conformed to an outer surface of the coupling structure 524 disposed across the slot 134. Each coupling structure 524 of the cell interconnect board 130 is positioned and designed to abut or receive the tab electrodes 129 from two battery cells 116 located near the coupling structure 524. In some embodiments, that is, the cell interconnect board 130 may be designed such that the coupling structures 524, when the battery module 22 is assembled, are disposed proximate the respective pair of tab electrodes 129 that are to be received over the coupling structures 524. That is, the coupling structures 524 are disposed at a position between the tab electrodes 129 extending from two neighboring battery cells 116, with respect to the Y axis 42.

In some embodiments, the cell interconnect board 130 may include the sensors 132 (not shown) in electrical communication with the coupling structures 524. In such embodiments, the coupling structures 524 may be conductive, and the cell interconnect board 130 may be part of a PCB that uses electrical sensor measurements to monitor operations of the individual battery cells 116, among other things. Specific embodiments of the sensors 132 and methods of connecting sensor electrical contacts with the tab electrodes 129 are discussed in further detail below. In one embodiment, for example, the crimping element 560 may be disposed over the tab electrodes 129 and a tab electrical contact extending from the PCB and in communication with one or more of the sensors 132. The crimping element 560 may electrically couple the tab electrodes 129 from neighboring battery cells 116 with the tab electrical contact to facilitate collecting sensor measurements.

The crimping elements 560 may be attached to the pairs of tab electrodes 129 disposed around the respective coupling structures 524, holding the tab electrodes 129 in the partially conformed position around the coupling structures 524. The crimping elements 560 may extend along most or all of the length of the coupling structures 524 to provide a secure connection. In some embodiments, the crimping elements 560 may engage the coupling structures 524 and the tab electrodes 129. However, in other embodiments, the crimping elements 560 may facilitate coupling of the tab electrodes 129 in the partially conformed position around the coupling structures 524 without the crimping elements 560 being placed in contact with the coupling structures 524. In the illustrated embodiment, each crimping element 560 has a uniform cross section that extends along a lengthwise axis 568 of the crimping element 560. The crimping element 560 may extend in the direction of the axis 568 for a length that is approximately equal to (e.g., within 5 mm) or slightly less than (e.g., within 20 mm) a length of the coupling structure 524 about which the crimping element 560 is positioned. In some embodiments, the crimping element 560 extends beyond the coupling structure 524 to ensure full engagement. The crimping element 560 may extend a distance along the axis 568 that is larger than a corresponding dimension of the tab electrodes 129 extending from the battery cells 116. This may help to ensure a proper electrical coupling of the tab electrodes 129 along the entire edge of each of the tab electrodes 129.

It should be noted that the crimping element 560 may be secured about the tab electrodes 129 without the use of additional fasteners. That is, no separate fastening elements (e.g., screws, pins, bolts, or other connectors) are used to couple and secure the crimping element 560 about the tab electrodes 129. The crimping element 560 may secure the tab electrodes 129 together without the use of a fastening element that is separate from the crimping element 560. The crimping element 560 may provide all of the force for maintaining the tab electrodes 129 in position around the coupling structure 524 entirely from the compressive force provided by the crimping element 560. This may facilitate relatively easy removal of the crimping element 560 from the tab electrodes 129, compared to traditional couplings that use screws and similar fasteners.

In the illustrated embodiment, the crimping element 560 is a shaped spring element 570 with a substantially uniform cross section extending along the axis 568. FIG. 50 is a schematic cross-sectional view of the spring element 570, illustrating the specific shape of the spring element 570 that facilitates the compressive force for electrically coupling the tab electrodes 129. FIG. 50 also shows a detailed view of the shape of the coupling structure 524 around which the tab electrodes 129 are secured via the spring element 570.

The illustrated coupling structure 524 has a U-shaped cross section with two substantially parallel arms 572 extending from opposite ends of a base portion 574 of the coupling structure 524. In the illustrated embodiment, the arms 572 are substantially parallel to (e.g., within 1, 2, 3, 4, 5, or 6 degrees of) the Z axis 40. The base portion 574 is substantially parallel to the Y axis 42, and the arms 572 extend from the base portion 574 toward the battery cells 116 of the battery module 22. As noted above, the coupling structure 524 is configured to receive the pair of tab electrodes 129 in a conforming orientation. In the illustrated embodiment, each tab electrode 129 is conformed around one of the arms 572, and the crimping element 560 (e.g., spring element 570) secures the tab electrodes 129 along the base portion 574 of the coupling structure 524. It should be noted that although the illustrated crimping element 560 is a spring element 570, other types of crimping elements 560 may be used to secure the tab electrodes 129 against the base portion 574 of the U-shaped coupling structure 524.

As mentioned above, the illustrated spring element 570 is shaped to apply or provide the compressive force for securing the tab electrodes 129 in contact with each other. The spring element 570 may be a single-piece spring element, meaning that it is constructed (e.g., bent, forged, cast, or otherwise manufactured) from a single piece of flexible material. The shape of the cross section of the spring element 570 may include, among other things, a pair of arms 576 angled toward each other, a connecting portion 578 located between the arms 576, and a pair of curved portions 580 located one at each end of the respective arms 576. The arms 576 form opposing ends of the spring element 570, and the arms 576 are biased toward each other to provide the compressive force. Specifically, the connecting portion 578 biases the arms 576 toward each other to provide the compressive force to the tab electrodes 129 disposed between the arms 576. The curved portions 580 function as end separation features of the spring element 570. The curved portions 580 extend away from a point of application of the compressive force (e.g., where the arms 576 contact the tab electrodes 129). The curved portions 580 may be engaged and separated from each other to facilitate removal of the spring element 570 from the tab electrodes 129 via separation of the arms 576.

The spring element 570 may be initially constructed such that the arms 576 are in contact with each other before the spring element 570 is disposed over the tab electrodes 129. The arms 576 may be separated, either manually or with a tool, and the spring element 570 may be positioned over the tab electrodes 129 such that the tab electrodes 129 are disposed between the opened arms 576. The arms 576 may be released, and a spring force stored in the connecting portion 578 may urge the arms 576 back toward each other, thus capturing the tab electrodes 129 between the arms 576. It may be desirable to remove one or more of the battery cells 116 (for replacement or servicing) from the battery module 22 by disconnecting the tab electrodes 129 from each other. To disconnect the tab electrodes 129, an operator may lift, pull, or otherwise engage (manually or with a tool) the curved portions 580, in order to separate the arms 576 and remove the spring element 570 from the tab electrodes 129.

FIG. 51 illustrates a removal of the spring element 570 from the tab electrodes 129 using a tool. In the illustrated embodiment, the curved portions 580 of the spring element 570 may receive one or more tools that can be actuated to flex the spring element 570 open for coupling or decoupling with the tab electrodes 129. Specifically, tool features 582 may be inserted into the curved portions 580 and a levering action initiated by squeezing the tool features 582 together in a plier-like manner may cause the spring element 570 to flex open, as shown by arrows 584. The tool features 582 may engage the curved portions 580 located at the ends of the spring element 570 and urge the curved portions 580 apart to remove the compressive force from the tab electrodes 129. The spring element 570 and tab electrodes 129 may then be moved out of contact with each other so that the tab electrodes 129 are no longer connected. An operator may then remove one or both of the battery cells 116 from the battery module 22.

Other types of crimping elements 560 may be used for the interconnection devices 138 of the interconnect assembly 128. For example, FIG. 52 illustrates an embodiment of the crimping element 560 that includes a clip assembly 586 designed to secure the tab electrodes 129 in electrical contact with each other via a compressive force. The clip assembly 586 includes two rigid arms 588 coupled via a biasing feature, such as a spring 590. As illustrated, the two arms 588 are biased toward each other at a first end 592, and away from each other at a second end 594 opposite the first end 592. An operator may squeeze the arms 588 in a plier-like manner at the second end 594. This may compress the spring 590 or other biasing feature and separate the arms 588 at the first end 592, thereby releasing the tab electrodes 129 from contact with each other and the clip assembly 586. The arms 588 are also attached to a fulcrum 595 disposed between the spring 590 and the clamping end (i.e., first end 592) of the arms 588. In this position, the fulcrum 595 functions as a pivot point for the clip assembly 586. Specifically, the fulcrum 595 may transfer the separating force that the spring 590 exerts on the arms 588 at the second end 594 into a compressive force on the arms 588 at the first end 592. Likewise, the fulcrum 595 may transfer a force applied by the operator compressing the spring 590 at the second end 594 into a separating force at the first end 592.

Although not shown, the illustrated interconnect assembly 128 may include the coupling structure 524. That is, the clip assembly 586 may be used to secure the tab electrodes 129 against the coupling structure 524 to electrically connect the tab electrodes 129. In some embodiments, however, the crimping element 560 (e.g., high voltage tape 564, spring element 570, clip assembly 586, or some other crimping element) may be disposed over the tab electrodes 129 without the tab electrodes 129 being conformed to a structural component of the battery module 22. This may be possible depending on the length of the tab electrodes 129 extending from the battery cells 116 and the relative weight of the crimping element 560 to the tab electrodes 129. It may be desirable for the interconnect assembly 128 to include the tab electrodes 129 disposed in a conformed orientation with respect to the coupling structure 524 when the tab electrodes 129 are relatively long and/or when the crimping element 560 is relatively heavy in comparison with the tab electrodes 129. As noted above, the coupling structure 524 may provide structural support, surface area for electrical connection, and so forth. Other types, arrangements, and combinations of coupling structures 524 and crimping elements 560 may be used in other embodiments to facilitate battery cell interconnections in the battery module 22.

One or more of the disclosed embodiments, alone or in combination, may provide one or more technical effects useful in the assembly and maintenance of battery modules with a number of battery cells arranged in a stacked orientation relative to each other. For example, certain embodiments of the present approach may enable improved interconnections between tab electrodes extending from the different battery cells. By specific example, securing the tab electrodes in electrical communication with each other via a crimping element, as set forth above, may enable easier connections and disconnections of the battery cells, compared to battery interconnect assemblies that rely on relatively permanent connection methods, such as laser welding. The presently disclosed interconnect assembly provides a simple mechanical crimping element that facilitates electrical coupling of the tab electrodes. Such crimping elements may be relatively inexpensive and easy to manufacture. The crimping element may include high voltage tape, a clip assembly, or a single-piece spring element. The crimping element may utilize a spring or other biasing feature to provide a compressive force to hold the tab electrodes in electrical communication with each other. Other embodiments may employ an adhesive and/or pliable material (e.g., soft metal) that conforms when compressed and generally maintains the compressed shape. In addition, presently disclosed interconnect assemblies may also include a coupling structure to provide structural support for interconnecting the tab electrodes and/or providing sensor connections from each pair of battery cells to a PCB. Further, the crimping element may include arms that are separable, or other features that aid in removal of the crimping mechanism from the tab electrodes. This makes the disclosed interconnect assembly more versatile than laser welding and other existing techniques for the disconnection, removal, or replacement of individual battery cells in the battery module. As such, the interconnection of battery cells via a crimping element may generally enable a battery module with a more simple assembly and with individually replaceable battery cells. The technical effects and technical problems in the specification are exemplary and are not limiting. It should be noted that the embodiments described in the specification may have other technical effects and can solve other technical problems.

System and Method for Roller Interconnection of Battery Cells

Again, other types of interconnection devices 138 may be used in the interconnect assembly 128. For example, FIG. 53 illustrates an embodiment of the interconnect assembly 128 that uses a roller 596 disposed in a corresponding roller housing structure 598 to facilitate electrically coupling the tab electrodes 129. Specifically, two tab electrodes 129 are at least partially conformed about each roller housing structure 598 such that the tab electrodes 129 are positioned in an opening 600 defined by the roller housing structure 598. The two tab electrodes 129 are described as being partially conformed about the roller housing structure 598 because they include sections that conform or substantially conform to certain surfaces of the roller housing structure 598. That is, portions of the tab electrodes 129 that abut the roller housing structure 598 flex and bend about the roller housing structure 598 such that the tab electrodes 129 trace certain contours of the roller housing structure 598. This conformed orientation of the tab electrodes 129 to the roller housing structure 598 is illustrated in each of FIGS. 53, 54, 55, 56, and 57. It should be noted that the tab electrodes 129 may be pre-shaped by a crimping mechanism prior to positioning the tab electrodes 129 adjacent the roller housing structure 598 to encourage the conformed orientation. Once the tab electrodes 129 are arranged with respect to the roller housing structure 598 (whether pre-shaped or partially conformed), the roller 596 is disposed in the opening 600 to secure the tab electrodes 129 in electrical communication with each other. This insertion of the roller 596 may further conform the tab electrodes 129 to the contours of roller housing structure 598 and the roller 596. That is, the roller 596 may be positioned in the opening 600 to frictionally secure and press the tab electrodes 129 between the roller 596 and the roller housing structure 598.

In some embodiments, one or both of the roller housing structure 598 and the roller 596 may be electrically conductive, in order to facilitate the electrical connection between the two tab electrodes 129. In embodiments where the roller housing structure 598 is conductive, the roller 596 is used to secure the tab electrodes 129 in engagement with the roller housing structure 598. In some embodiments, the roller housing structure 598 and the roller 596 may be nonconductive, but they may hold the tab electrodes 129 in direct contact with each other for establishing the desired electrical connection. In such embodiments, the tab electrodes 129 overlap with one another within the roller housing structure 598, in contrast to the positioning of the tab electrodes 129 in the embodiment illustrated by FIG. 53.

In the illustrated embodiment, the roller housing structures 598 form part of the cell interconnect board 130 of the interconnect assembly 128, which was discussed in detail above with respect to FIG. 41. The cell interconnect board 130 may provide structural support for the interconnection of the tab electrodes 129 via the rollers 596. As noted above, the cell interconnect board 130 may also provide support for the interconnection of the battery cells 116 with the various sensors 132. Again, the cell interconnect board 130 includes the slots 134 through which the tab electrodes 129 of neighboring battery cells 116 may be positioned for connecting the tab electrodes 129. The roller housing structures 598 are disposed across the slots 134 formed in the cell interconnect board 130. Similar to the coupling structures 524 of FIG. 41, the roller housing structures 598 may be substantially parallel structures disposed as rungs between the frame pieces 526 (e.g., opposing edges) of the cell interconnect board 130. Only one of the frame pieces 526 is shown in the illustrated embodiment.

To connect two tab electrodes 129, the tab electrodes 129 may extend through the slots 134 and be at least partially conformed to surfaces of the roller housing structure 598 disposed across the slot 134. Each roller housing structure 598 of the cell interconnect board 130 is positioned and designed to receive the tab electrodes 129 from two battery cells 116 located near the roller housing structure 598. In some embodiments, that is, the cell interconnect board 130 may be designed such that the roller housing structures 598, when the battery module 22 is assembled, are disposed proximate the respective pair of tab electrodes 129 that are to be received over respective surfaces of the roller housing structures 598. That is, the roller housing structures 598 are disposed at a position between the tab electrodes 129 extending from two neighboring battery cells 116, with respect to the Y axis 42. It should be noted that, while the illustrated interconnect assembly 128 is used to connect battery cells 116 that are disposed in a horizontally stacked orientation relative to each other, the disclosed techniques may also be used to electrically couple battery cells 116 disposed in a vertically stacked orientation relative to each other. In such instances, for example, the roller housing structures 598 may be disposed at a position between the tab electrodes 129 extending from two neighboring battery cells 116, with respect to the X axis 44.

In some embodiments, the cell interconnect board 130 may include the sensors 132 (not shown) in electrical communication with the roller housing structures 598. In such embodiments, the roller housing structures 598 may be conductive, and the cell interconnect board 130 may be part of a PCB that uses electrical sensor measurements to monitor operations of the individual battery cells 116, among other things. Specific embodiments of the sensors 132 and methods of connecting sensor electrical contacts with the tab electrodes 129 are discussed in further detail below.

The rollers 596 may be disposed in the opening 600 defined by the roller housing structures 598, holding the tab electrodes 129 in the partially conformed position around the roller housing structures 598. The rollers 596 may extend along most or all of the length of the roller housing structures 598 to provide a secure connection. In some embodiments, the rollers 596 may extend beyond certain aspects of the respective roller housing structures 598. In operation, the rollers 596 may engage the roller housing structures 598 and the tab electrodes 129. In the illustrated embodiment, each roller 596 has a uniform cross section that extends along a lengthwise axis 602 of the roller 596. More specifically, the roller 596 may be a substantially cylindrical bar. The roller 596 may extend in the direction of the axis 602 for a length that is approximately equal to (e.g., within 5 mm) or slightly less than (e.g., within 20 mm) a length of the roller housing structure 598 into which the roller 596 is positioned. The roller 596 may extend a distance along the axis 602 that is larger than a corresponding dimension of the tab electrodes 129 extending from the battery cells 116. This may help to ensure a proper electrical coupling of the tab electrodes 129 along the entire edge of each of the tab electrodes 129.

The roller 596 may be configured to be removed manually from the opening 600 in the roller housing structure 598. Specifically, the length of the roller 596 extending along the axis 602 may allow for such manual removal. That is, in some embodiments, the roller 596 may extend a distance that is less than the length of the roller housing structure 598. This may provide space between the roller 596 and one or both of the frame pieces 526, so that the roller 596 is not positioned flush against both of the frame pieces 526 when disposed in the opening 600. Thus, one or both ends of the roller 596 may be accessible to an operator, so that the operator may grasp the exposed ends of the roller 596 and manually remove the roller 596 from the roller housing structure 598. In other embodiments, different techniques may be employed to remove the rollers 596 from their respective roller housing structures 598, such as via tools, a handle disposed on the roller 596, and other techniques. As noted above, the roller 596 may extend beyond certain features of the roller housing structure 598, such as beyond curved inner surfaces of the roller housing structure 598 that grip the roller 596, which may facilitate extraction of the roller 596 from the roller housing structure 598 by providing access to ends of the roller 596 for gripping purposes.

FIG. 54 is a cross-sectional schematic view of the interconnect assembly 128 having the roller 596 and the roller housing structure 598. Specifically, the illustrated embodiment shows the roller 596 being positioned in the roller housing structure 598 to secure the tab electrodes 129 in electrical communication. Prior to insertion of the roller 596, the first and second tab electrodes 129 may be pre-shaped to conform at least partially to the roller housing structure 598, as shown by arrows 604. More specifically, the tab electrodes 129 may be brought toward the roller housing structure 598 and bent around respective outer edges of the roller housing structure 598. The tab electrodes 129 may be pre-shaped around the roller housing structure 598 such that respective distal ends (e.g., free ends) of the tab electrodes 129 are disposed in the opening 600 defined by the roller housing structure 598. In other words, the tab electrodes 129 terminate in the opening 600 of the roller housing 598. In other embodiments, the tab electrodes 129 may be threaded into an interior portion of the roller housing structure 598 and conformed along interior surfaces until distal ends of the tab electrodes 129 terminate outside of the opening 600, as illustrated in FIG. 55. By positioning the tab electrodes as shown in FIG. 55, material used for the tab electrodes 129 may be conserved relative to other embodiments.

The roller housing structure 598 may be specifically shaped to receive the tab electrodes 129 in the conformed orientation about the roller housing structure 598 and disposed in the opening 600. For example, the roller housing structure 598 may be located near the battery cells 116 in a direction of the positive Z axis 40 relative to the battery cells 116. The tab electrodes 129 may extend from the battery cells 116 in the positive Z direction toward the roller housing structure 598, and may be conformed around the outer edges of the roller housing structure 598 and toward the opening 600. The opening 600 may be defined along the side of the roller housing structure 598 that faces the positive Z direction. The tab electrodes 129 may be wrapped about the roller housing structure such that the ends of the tab electrodes 129 extend into the opening 600, in the negative Z direction. The roller 596 may be inserted, as shown by an arrow 606, into the opening 600 to secure the tab electrodes 129 between the roller housing structure 598 and the roller 596 disposed in the opening 600. The roller 596 may include a substantially cylindrical bar aligned axially with the X axis 44, and the roller 596 may be inserted into the roller housing structure 598 in the negative Z direction. Since the roller 596 is inserted in the same direction (e.g., negative Z direction) as the tab electrodes 129 disposed in the opening 600, the tab electrodes 129 may be pushed further into the opening 600 and against the roller housing structure 598. This arrangement avoids displacement and wrinkling of the tab electrodes 129 during insertion of the roller 129. Further, this may increase the surface area of the tab electrodes 129 disposed between and in contact with the roller 596 and the roller housing structure 598, thereby enabling an increased electrical connection between the tab electrodes 129.

As discussed above, one or both of the roller 596 and the roller housing structure 598 may be conductive to facilitate electrically coupling the tab electrodes 129. In the illustrated embodiment, the tab electrodes 129 conform only partially along a surface of the roller housing structure 598 that defines the opening 600. However, in other embodiments, the tab electrodes 129 may extend far enough within the opening 600 to wrap around opposite sides of the roller 596 until the tab electrodes 129 are touching each other. In such instances, the roller housing structure 598 and/or the roller 596 may not be conductive at all and may essentially be used as a support for establishing an electrical connection between the tab electrodes 129. In such embodiments, the tab electrodes 129 themselves may be pre-shaped around the roller housing structure 598 until they are overlapping with respect to each other in the opening 600. Then, the roller 596 may be positioned in the opening 600 defined by the roller housing structure 598 to secure the tab electrodes 129 in direct contact with each other for providing the electrical connection. In still other embodiments, the tab electrodes 129 may be in contact with each other, and the roller 596 may be conductive, so that the electrical connection is established via the roller 596.

The opening 600 defined by the roller housing structure 598 may include a substantially semi-circular opening configured to receive the roller 596. That is, the roller housing structure 598 may include a substantially semi-circular cross section that defines the opening 600, and this cross section may partially trace a circle. The roller 596 may include a substantially cylindrical roller or bar configured to be received into the substantially semi-circular opening 600. In some embodiments, a diameter of the circle partially traced by the roller housing structure 598 (e.g., a diameter of the opening 600) may be approximately the same size, or slightly smaller than, an outer diameter of the roller 596 configured to be disposed therein. The roller housing structure 598 may be configured to elastically deform to receive and hold the roller 596 in the opening 600.

In the illustrated embodiment, the roller housing structure 598 includes two separate structures 608 (e.g., first and second structures 598 that are components of the roller housing structure 598), and these two structures 608 are separated by a space 610 to define the opening 600. The two structures 608 may be coupled together via the frame pieces 526 of the cell interconnect board 130. Each structure 608 may be configured to receive a respective tab electrode 129 in a conforming orientation with respect to the structure 608 such that the tab electrode 129 is disposed in the opening 600 defined by the roller housing structure 598.

In the illustrated embodiment, the structures 608 may be relatively rigid structures for providing structural support for the connection of the tab electrodes 129. The space 610 (e.g., separation) between the structures 608 may allow the structures 608 to be elastically deformed away from each other slightly to receive the roller 596 as the roller 596 is inserted into the opening 600. This deformation of the structures 608 away from each other may expand the opening 600 to receive and hold the roller 596 in the opening 600. As the roller 596 is pushed into the opening 600, the tab electrodes 129 may become more tightly conformed around the structures 608 as the roller 596 urges the ends of the tab electrodes 129 further into the opening 600.

In the illustrated embodiment, the structures 608 have a specific shape to facilitate conforming of the tab electrodes 129 about the roller housing structure 598 and securing of the tab electrodes 129 in the opening 600. More specifically, each structure 608 includes an interior prong 612 and an exterior prong 614 coupled together and extending toward the battery cells 116. Each structure 608 is configured to receive a respective tab electrode 129 in a conforming orientation about an outer edge of the respective exterior prong 614. A connecting portion 616 disposed between the interior and exterior prongs 612 and 614 may include rounded corners to provide a relatively smooth transition for the tab electrode 129 that is wrapped from the exterior prong 614 around the interior prong 612. The pair of tab electrodes 129 may be conformed around the exterior prongs 614 of the respective structures 608, and extend into the opening 600 defined by the interior prongs 612. The interior prongs 612 may be curved, as illustrated, to define the substantially semi-circular opening 600 for receiving the roller 596 into the roller housing structure 598. The interior prongs 612 may be configured to elastically deform away from each other to receive the roller 596 when the roller 596 is disposed in the opening 600.

It should be noted that other embodiments of the interconnect assembly 128 may utilize other shapes of roller housing structures 598 to receive the rollers 596 for securing the tab electrodes 129 in electrical connection. For example, in some embodiments, the roller housing structure 598 may include a single-piece structure. This may be similar to the illustrated embodiment, but with the interior prongs 612 combined to form a single piece that defines the substantially semi-circular opening 600 along the outward facing side of the roller housing structure 598. In such embodiments, since there is no space 610 to define the opening 600, the roller housing structure 598 may be made from relatively flexible materials. This may allow the roller housing structure 598 to deform slightly, expanding the opening 600 to receive and capture the inserted roller 596. Such embodiments may be particularly useful for connecting the tab electrodes 129 in direct contact with each other.

Other variations of the roller 596 may be possible as well. For example, as illustrated in FIG. 56, the roller 596 may include a substantially cylindrical bar 618 that is hollow. This may reduce an overall weight of the battery module 22, as compared to a solid cylindrical bar. In other embodiments, one or both of the roller 596 and the roller housing structure 598 may include teeth for gripping the tab electrodes 129 between the roller 596 and the roller housing structure 598. As illustrated in FIG. 57, for example, the roller 596 may be equipped with teeth 620 disposed along an outer surface of the substantially cylindrical roller 596. Similarly, the roller housing structure 598 may include teeth 620 disposed along an inner surface (e.g., circumference) of the roller housing structure 598 that defines the opening 600. In the illustrated embodiment, for example, the interior prongs 612 of the structures 608 that make up the roller housing structure 598 include teeth 620 along the inner facing sides of the interior prongs 612. The teeth 620 may be included on portions of the roller housing structure 598 configured to directly contact the tab electrodes 129 being held between the roller 596 and the roller housing structure 598. In other embodiments, the teeth 620 may be included on every surface of the roller housing structure 598 that is configured to receive the conformed tab electrodes 129. The teeth 620 may include ridges, bumps, detents, layers of relatively coarse material, or any other component that may increase the friction for maintaining the tab electrodes 129 in the electrically coupled position between the roller 596 and the roller housing structure 598. Other embodiments of the interconnect assembly 128 may utilize different types of rollers 596 and/or roller housing structures 598 than those shown in the present disclosure.

One or more of the disclosed embodiments, alone or in combination, may provide one or more technical effects useful in the assembly and maintenance of battery modules with a number of battery cells arranged in a stacked orientation relative to each other. For example, certain embodiments of the present approach may enable improved interconnections between tab electrodes extending from the different battery cells. By specific example, conforming the tab electrodes around a roller housing structure and securing the tab electrodes in electrical communication with each other via a roller disposed in the roller housing structure, as set forth above, may enable easier connections and disconnections of the battery cells, compared to battery interconnect assemblies that rely on relatively permanent connection methods, such as laser welding or fastening elements (e.g., screws). The presently disclosed interconnect assembly provides a simple mechanical roller and roller housing structure that facilitates electrical coupling of the tab electrodes. Such rollers and roller housing structures may be relatively easy to manufacture. The roller housing structure may includes features (e.g., prongs) that facilitate conforming of the tab electrodes around the roller housing structure such that, when the roller is inserted into an opening defined by the roller housing structure, the tab electrodes are forced into a more direct contact with the outer circumference of the roller. The roller may be manually inserted into and removed from the roller housing structure as desired, making the disclosed interconnect assembly more versatile than laser welding and other existing techniques for the disconnection, removal, or replacement of individual battery cells in the battery module. As such, the interconnection of battery cells via a roller and roller housing structure may generally enable a battery module with a more simple assembly and with individually replaceable battery cells. The technical effects and technical problems in the specification are exemplary and are not limiting. It should be noted that the embodiments described in the specification may have other technical effects and can solve other technical problems.

Printed Circuit Board Interconnect for Cells in a Battery System

As mentioned above, the cell interconnect board 130 provides structural support for the interconnection of the battery cells 116 and a number of sensors 132. The cell interconnect board 130 includes slots 134, one for each pair of battery cells 116. As illustrated in FIG. 58, positioned over each slot 134 is an interconnect 622 which allows for the physical connection of the battery cells 116 and the cell interconnect board 130. In the embodiment illustrated in FIG. 58, the interconnects 622 are electrically conductive bars coupled to the cell interconnect board 130 on the exterior-facing side facing away from the battery cells 116. However, the interconnects 622 may alternatively be placed on the interior side of cell interconnect board 130 facing the battery cells 116. The tab electrodes 129 of the battery cells 116 can be secured and electrically connected to an interconnect 622 using one or more interconnection devices 138, as discussed with respect to FIGS. 40-57.

Because the cell interconnect board 130 may be manufactured from a printed circuit board, each of the interconnects 622 may be electrically coupled via traces 624 to sensors 132, which are used to monitor various metrics associated with the state of the battery cells 116. For example, one or more voltage sensors 132a, which may be located on the exterior-facing side of the cell interconnect board 130, may be used to monitor the output voltage of a pair of battery cells 116. Alternatively, the voltage sensors 132a may be located on the interior-facing side of the cell interconnect board 130 or within the PCB if the PCB is a multilayer board. The sensors 132 may be connected to one or more terminal blocks 626, which connect to the BCM 72 to provide the associated data.

Other sensors 132, such as temperature sensors 132b or pressure sensors 132c, may be also located on the cell interconnect board 130, as shown in FIG. 59. Unlike voltage sensors 132a, which monitor a specific output of the battery cells 116, temperature sensors 132b and pressure sensors 132c monitor the environment of battery cells 116. As such, temperature sensors 132b and pressure sensors 132c may be placed on the interior-facing side of the cell interconnect board 130, closest to the battery cells 116. The temperature sensors 132b and pressure sensors 132c may not be electrically coupled to the interconnects 622, as shown in FIG. 59. According to other embodiments, the temperature sensors 132b and pressure sensors 132c may be electrically coupled to the interconnects 622. In such a case, the temperature sensors 132b may be electrically isolated. These sensors 132 may then be connected to one or more terminal blocks 626. The terminal block 626 connects to the BCM 72 to provide the associated data.

An alternative embodiment of battery cells 116 may include a cell interconnect board attachment 628 and an interconnect portion 630. A tab electrode 129 of a battery cell 116 may include a slit 632 that divides the tab electrode 129 into a cell interconnect board attachment 628 and an interconnect portion 630, as shown in FIG. 60. The interconnect portion 630 may be coupled to an interconnect 622 as described above. The cell interconnect board attachment 628 may be directly coupled to a sensor pad 634 on the cell interconnect board 130 by any appropriate technique, such as a weld, solder, or electrically conductive adhesive. In this embodiment, any sensors 132, such as voltage sensor 132a, that would be electrically connected to interconnects 622, are instead electrically connected to cell interconnect board attachments 628. Alternatively, the cell interconnect board 130 used in this embodiment may not be made of a PCB material, but instead may include a PCB coupled to the cell interconnect board 130 in order to access the data associated with the sensors 132.

In some embodiments, the battery cells 116 may all be connected in series to produce a first output voltage (e.g., 48 V), as shown in FIG. 61. The interconnects 622 at the top and bottom of the cell interconnect board 130 are connected via address voltage sense lines 640 to a terminal block 626. This connection allows terminal block 626 to provide the first output voltage associated with the series combination of all of the battery cells 116.

In some cases, the first output voltage provided by the series combination of all battery cells 116 may exceed the output voltage requirements of the battery module 22. In such cases, the battery cells 116 may be divided into battery cell groups 638, each of which provides a second output voltage (e.g., 12 V) that matches the lower output voltage requirement of the battery module 22, as shown by FIG. 62. Each battery cell group 638 includes one or more battery cells 116 connected in parallel via the cell interconnect board 130 and bus bars 636. Each battery cell group 638 is then connected via bus bars to the terminal block 626.

One or more of the disclosed embodiments, alone or in combination, may provide one or more technical effects useful for electrically connecting and securing stacked battery cells within a battery module. For example, certain embodiments may enable greater structural support for stacked battery cells. Certain embodiments may also allow for improved electrical connections between individual battery cells and battery cells and sensors. For example, the present cell interconnect board contains interconnects that provide a rigid structure to which battery cells may be directly coupled. Battery cells can be coupled to the interconnects with devices that are easy to attach and remove. Such a structure allows for the battery cells to be packaged in a manner similar to existing technology without the permanent assembly solutions, such as welding, which are commonly found in existing technology. Additionally, the present cell interconnect board also contains a printed circuit board which electrically connects the battery cells to various sensors. As such, the present cell interconnect board does not require a separate printed circuit board and connection elements coupled to the cell structure to provide the electrical connections between battery cells and sensor circuitry. The technical effects and technical problems in the specification are exemplary and are not limiting. It should be noted that the embodiments described in the specification may have other technical effects and can solve other technical problems.

DC-to-DC Converter for Batteries Having Multiple Positive Terminals

As mentioned above, the battery module 22 can be configured to provide two or more output voltages using three or more terminals. For example, the battery module 22 can provide a first output voltage (e.g., 48 V or 130 V) to high power components such as electric power steering, active suspension, BAS 29, and HVAC system 32. The battery module 22 can also provide a second output voltage (e.g., 12 V) to other components such as interior lights, entertainment systems, and door locks. By using a battery module 22 that provides two or more voltages, the various components of the mHEV 10 can be coupled to the battery module 22 such that they receive an efficient operating voltage given their requirements.

The battery module 22 may use one or more DC-to-DC converters 76 to provide the two output voltages from the power assembly 84. A DC-to-DC converter 76 may be a traditional buck, boost, or buck-boost converter, for example, that receives the output voltage across the series of battery cells 116 as an input and produces the second output voltage, as shown in the block diagram of FIG. 63. As such, the battery module 22 is configured to simultaneously provide two output voltages over three terminals.

A traditional DC-to-DC converter 76 may receive the output voltage across the series of battery cells 116, discharging all of the battery cells 116. Alternatively, the DC-to-DC converter 76 may be a switching network that selectively chooses one or more battery cell groups 638 to provide the second output voltage, as shown in the block diagram of FIG. 64. Each battery cell group 638 includes a subset of all of the battery cells 116. By selecting a subset of the battery cells 116, the switching network may reduce the overall rate of discharge for the battery cells 116. Although FIG. 56 depicts a configuration of 13 battery cells 116, wherein each battery cell 113 is also a battery cell group 638, it should be appreciated that a battery cell group 638 may include any number of battery cells 116, such as one, two, or four battery cells 116.

The switching network DC-to-DC converter 76 may include a voltage multiplexor 670 and a ground multiplexor 672, both of which receive an input from each battery cell group 638. The voltage multiplexor 670 and ground multiplexor 672 select the battery cell groups 638 which will provide the second output voltage.

However, the voltage multiplexor 670 and ground multiplexor 672 receive the same input from each battery cell group 638. As mentioned above, the voltage multiplexor 670 and ground multiplexor 672 only select which battery cell groups 638 are used to provide the second output voltage. As such, the voltage drop between the outputs of the voltage multiplexor 670 and ground multiplexor 672 may or may not equal the desired second output voltage.

To ensure that the second output voltage is produced, the voltage signals generated by the voltage multiplexor 670 and ground multiplexor 672 may then pass through an isolation DC-to-DC converter 674. The isolation DC-to-DC converter 674 may be a buck, boost, or buck-boost converter. The isolation DC-to-DC converter 674 accepts the output of the voltage multiplexor 670 and ground multiplexor 672 as inputs and produces a second output voltage signal and a ground signal. The switching network DC-to-DC converter 76 may also include at least one filter or clamping circuit (not shown) to reduce or eliminate interruptions in power or spikes in output voltage or current.

In such cases, the BCM 72 may control the DC-to-DC converter 76, as shown in FIG. 65. For example, U.S. Provisional Applications No. 61/746,818, filed on Dec. 28, 2012, and No. 61/800,103, filed on Mar. 15, 2013, both disclose a battery system containing a switching network that connects one or more groups of battery cells to a secondary voltage terminal, and both of these applications are incorporated by reference in their entireties for all purposes. The term "switching network" is intended to not be limiting but to include any devices that are capable of being selectively changed between an electrically conductive state to a nonconductive state, such as silicon controlled rectifiers, power transistors, relay switches or any other like devices. The BMMS controlling the switching network determines which groups of battery cells to connect, based on the measured state of charge for the groups of battery cells and the desired output of the DC-to-DC converter 76. The BMMS may have a predetermined order for connecting groups, and may disconnect a group when the charge has declined to a preselected minimum state of charge limit.

Both the traditional DC-to-DC converter 76 and the switching network DC-to-DC converter 76 may electrically connect via one or more terminal blocks 626 to the interconnects 622 located on the cell interconnect boards 130. Each of the pair of cell interconnect boards 130 may include a terminal block 626. In an embodiment employing a traditional DC-to-DC converter, the top interconnect 622 on one cell interconnect board 130 may be electrically coupled to the terminal block 626, as shown in FIG. 58. The bottom interconnect 622 on the other cell interconnect board 130 would be electrically coupled to the terminal block 626. The traditional DC-to-DC converter 76 may then be connected to the terminal block 626 located on both of the cell interconnect boards 130 such that it receives as an input the output voltage provided by a series combination of the battery cells 116.

In an embodiment employing a switching network DC-to-DC converter, the top and bottom interconnects 622 of each battery cell group 638 may be electrically coupled to the terminal block 626, as shown in FIG. 59. A terminal block 627, located on the top plate 100, may be electrically coupled to the terminal block 626 located on both of the cell interconnect boards 130 to consolidate the inputs from the battery cell groups 638. The switching network DC-to-DC converter 76 may then be connected to the terminal block 627 to receive the inputs from each of the battery cell groups 638.

Alternatively, a battery module 22 may contain four or more terminals, two of which may produce an equal amount of voltage, as shown in FIG. 68. For example, the battery module 22 may provide a first output voltage (e.g. 48 V or 130 V) using a first terminal, while the second and third terminals each produce a second output voltage (e.g., 12 V). One of the terminals producing the second output voltage may be capable of handling high loads such as cranking a cold engine. The other terminal producing the second output voltage may be adapted to handle low power loads. Components of the mHEV 10 can be coupled to either the second or third terminal based on their power requirements. Both DC-to-DC converters 76 may be coupled to the top of the battery module 22, as shown in FIG. 69, or one of the DC-to-DC converters 76 may be coupled to the top plate 100 and top portion 54 while another DC-to-DC converter 76 may be coupled to the exterior side of a cell interconnect board 130, as shown in FIG. 70. If one or more DC-to-DC converters 76 are used exclusively for high power loads, then those DC-to-DC converters 76 may also be coupled to a cooling system for heat dissipation.

In another embodiment, both a traditional DC-to-DC converter 76 and a switching network DC-to-DC converter 76 may be used in a four-terminal battery module 22, as shown in the block diagram of FIG. 71. The traditional DC-to-DC converter 76 may be used exclusively for high power loads, and the switching network DC-to-DC converter 76 may be used exclusively for low power loads. Using a switching network DC-to-DC converter 76 with only low power loads may mitigate effects of power switching, such as interruption of power, spikes in output current or voltage, and arcing. The switching network DC-to-DC converter 76 may also perform as a separate stable voltage network, providing an active charge balancing function during vehicle operation and/or for key-off load support.

One or more of the disclosed embodiments, alone or in combination, may provide one or more technical effects useful for providing multiple output voltages from a single battery module. Certain embodiments may enable improved placement of components to reduce the overall size of the battery modules. Certain embodiments may also provide multiple output voltages, each of which can be used exclusively for high or low power loads. For example, the present approach of placing a DC-to-DC converter on the lid or side of a battery module allows the battery module to retain the overall shape of the battery modules found in existing lead acid technology. Using one or more DC-to-DC converters or a DC-to-DC converter in conjunction with a switching network also allows various terminals to be configured for either high or low power loads. The technical effects and technical problems in the specification are exemplary and are not limiting. It should be noted that the embodiments described in the specification may have other technical effects and can solve other technical problems.

Pouch Frame with Integral Circuitry for Battery Module

As mentioned above, the battery module 22 may include two cell interconnect boards 130 with interconnects 622. Each battery cell assembly 114 may include a frame 118 and a battery cell 116, which has tab electrode 129. The tab electrodes 129 of a pair of battery cells 116 are secured to each interconnect 622 using one or more interconnection devices 138.

An alternative embodiment of battery cell assembly 114 includes a battery cell 116 that does not have tab electrodes 129. Instead, the frame 118 includes one or more female connectors 700 and one or more male connectors 702, as shown in FIG. 72. The female connectors 700 and male connectors 702 couple together to electrically connect battery cells 116 to one another, thus eliminating separate cell interconnect boards 130 and other associated circuitry.

The frame 118 may be split into a top frame portion 118a and a bottom frame portion 118b. The top frame portion 118a contains one or more female connectors 700 and the bottom frame 118 contains one or more male connectors 702. Both the top frame portion 118a and the bottom frame portion 118b also contain an electrically conductive tab 704 and 705, respectively, located on an interior side. The electrically conductive tabs 704 and 705 are connected to the female connectors 700 and male connectors 702, respectively, via traces 624 in the frame 118.

The battery cell 116 includes two electrically conductive contact plates 706 and 707, located on the battery cell 116 such that they align with the electrically conductive tabs 704 on the frame 118. The electrically conductive contact plates 706 and 707 may be coupled to the positive and negative terminals, respectively, of the battery cell 116, or vice versa. When assembled as in FIG. 73, the electrically conductive tabs 704 and 705 are inserted such that they contact and electrically connect to the electrically conductive contact plates 706 and 707. The battery cell 116 is then sealed so that the electrically conductive contact tabs 704 and 705 and the electrically conductive contact plates 706 and 707 are securely coupled together, creating an electrical connection between battery cell 116 and the connectors 700 and 702. The top frame portion 118a and bottom frame portion 118b may be coupled to one another using bolts 140, for example.

To vent any excessive amount of gas in the battery cells 116, the top frame portion 118a may also include pressure points 708, which are portions of the frame 118a that are structurally weaker than the rest of top frame portion 118a. When the pressure of the battery cell 116 exceeds a threshold, the pressure points 708 of frame 118 break open. This allows the battery cell assembly 114 to vent pressurized fluids or dissipate heat.

The top frame portion 118a contains one or more female connectors 700 and an electrically conductive tab 704, as shown in FIG. 74, and the bottom frame portion 118b contains one or more connectors 702 and an electrically conductive tab 705, as shown in FIG. 75. While the female connectors 700 and male connectors 702 may be placed in the center on one side of top frame portion 118a or bottom frame portion 118b, they may be located on any portion of frame 118. The female connectors 700 and male connectors 702 may also be used alone or in conjunction with any number of registration features 121 to couple the frames 118 to one another.

To form a power assembly 84, the battery cell assemblies 114 are stacked on top of one another using female connectors 700 and male connectors 702, as shown in FIG. 76. The positive electrodes of battery cells 116 are coupled to the electrically conductive contact tab 704 on top frame portion 118*a* and electrically connect to female connectors 700. The negative electrodes of battery cells 116 are coupled to the electrically conductive contact tab 705 on bottom frame portion 118*b* and electrically connect to male connectors 702. The female connectors 700 and male connectors 702 couple together to electrically connect the battery cells 116 in series. Stacking the battery cell assemblies 114 in the manner shown in FIG. 76 allows for simple assembly, maintenance, and repair of the power assembly 84. Also, as mentioned above, the cell interconnect boards 130 and circuitry that connect the battery cells 116 to one another may not be used.

The frame 118 may be located within the battery cell 116 rather than outside, as shown in FIG. 77. In this embodiment, frame 118 is a one piece structure that includes two electrically conductive contact tabs 704, one or more female connectors 700, and one or more male connectors 702. The frame 118 surrounds the active materials portion 710 of a battery cell 116, and the electrically conductive contact tabs 704 and 705 directly contact the electrically conductive contact plates 706 and 707, respectively. The upper pouch layer 710 and lower pouch layer 712 of battery cell 116 may then be welded together around frame 118. Upper pouch layer 710 and lower pouch layer 712 may include openings to allow for access to female connectors 700 and male connectors 702.

To monitor the output or state of battery cells 116, sensors 132 may be coupled to frame 118. The sensors 132 that monitor the environment surrounding the battery cells 116, such as temperature sensors 132*b*, may be coupled to the interior side of top frame portion 118*a*, as shown in FIG. 78A. So that they are close to the battery cells 116. Other sensors 132 that monitor the output of battery cells 116, such as voltage sensors 132*a*, may be coupled to the exterior side of bottom frame portion 118*b*, as shown in FIG. 78B. The sensors 132 that monitor the output of battery cells 116 may be coupled to either the exterior or interior side of frame 118 and are connected via traces 624 to an electrically conductive tab 704. The sensors 132 may be located on any side of either the top frame portion 118*a* or bottom frame portion 118*b*.

Certain sensors 132 may be located on a particular side of frame 118, such that when the battery cell assemblies 114 are stacked, the sensors 132 on a side alternate, as shown in FIG. 79. An alternative embodiment of cell interconnect board 130, as shown in FIG. 80, may contain a series of connectors that attach to the connectors associated with sensors 132 on frames 118. These connections allow data provided by sensors 132 to be sent to the BCM 72 via one or more terminal blocks 626 attached to cell interconnect board 130.

One or more of the disclosed embodiments, alone or on combination, may provide one or more technical effects useful for reducing the amount of packaging for a battery module. Specifically, certain embodiments may reduce the amount of components and connection used to electrically connect individual battery cells. Certain embodiments may also reduce the amount of components and connections used to electrically connect battery cells to various sensors. These frames can also include connectors that allow frames to electrically connect to one another, eliminating a separate printed circuit board to perform the same task. The connectors can be designed such that assembly and maintenance of a stack of battery cells is simpler than that of current solutions, which use permanent techniques such as welding. Additionally, the present frames can include various sensors, eliminating a separate printed circuit board to connect battery cells to various sensors. The technical effects and technical problems in the specification are exemplary and are not limiting. It should be noted that the embodiments described in the specification may have other technical effects and can solve other technical problems.

Remanufacturing Methods for Battery Module

Given the modular nature of the battery modules 22 discussed herein, as well as the different embodiments of various sections of the battery modules 22, which may be interchanged in any combination, present embodiments also relate to the remanufacturing of at least a portion of the battery modules 22. For example, any one or a combination of the battery modules 22 discussed above may be remanufactured to produce a remanufactured version of the battery module 22 including both new and used components, where the new components and the used components may be selected from any one or a combination of the embodiments described above. As defined herein, a "new" component is intended to denote a component that has not been used as a part of the particular battery module 22 being remanufactured, i.e., it is new with respect to the particular remanufactured battery module 22. In this way, a new component integrated into an embodiment of the battery module 22 (e.g., as a vehicular battery module) in accordance with present embodiments may previously have been used in another context, for example, a home battery, a computer battery, or another vehicular battery, or even an entirely different implementation (e.g., not a battery). Indeed, the new components may be remanufactured components themselves obtained from a different device. Furthermore, based on this definition, a new component may also denote a component that has never been used in any implementation, other than those implementations typically occurring as a part of a manufacturing process (e.g., as in testing for quality control). On the other hand, a "used" component, as defined herein, is intended to denote a component that has been used as a part of the particular battery module 22 being remanufactured. Therefore, a component that is removed from the battery module 22, and is subsequently re-fastened, re-attached, or otherwise re-positioned to or within the battery module 22 without incorporating a new component, would be referred to as a used component. In certain embodiments, the used components may be processed to restore their appearance or feel (i.e., properties that have no effect on the efficacy of the particular component). Such processing may be referred to as refurbishment.

The particular components of the remanufactured battery modules that are new or used are not particularly limited. However, an entity that performs the remanufacturing of the battery module 22 may have certain considerations (e.g., cost, availability of parts, time available for remanufacture) that may affect which components may be new components and which are used components, and the particular manner in which the battery module 22 is remanufactured. In certain embodiments of the present disclosure, for example, where the time available for remanufacturing an embodiment of the battery module 22 may be of concern, a rapid battery module remanufacturing process may include exposing, removing, and altogether replacing the power assembly 84 of the battery module 22 with a new power assembly 84.

On the other hand, in certain embodiments, such as where time is less of a concern, the remanufacturing process may include remanufacturing individual battery cell assemblies 114. Such remanufacturing may include, with respect to at least one battery cell assembly 114, replacing the battery cell 116, one or more of the gap pads 115,122, the frame 118, the heat fin 112, the phase change material layer 124, or any combination thereof, with a new battery cell 116 and/or other respective layer. The used portions of the battery cell assemblies 114, along with other used portions of the battery module 22, when retained, may, additionally or alternatively, be refurbished in a manner that enhances the appearance, but not the functionality, of the remanufactured battery module 22. As an example, one or more of the frames 118, one or more of the heat fins 112, or a combination thereof, may be polished.

In addition to or as an alternative to remanufacturing the power assembly 84, certain used electrical components of the battery module 22 may be replaced with new respective electrical components. For example, the terminals 24, 26, 30, DC-DC converter 76, and/or portions (or all) of the interconnect assemblies 128 may be replaced. Further, in certain embodiments, these and other electrical components may be repaired, such as by re-soldering electrical connections, re-plating conductive metals (e.g., electrical connectors), and/or reinforcing the structural supports for the electrical components (e.g., the cell interconnect board 130).

Furthermore, the present disclosure is not limited to remanufacturing the battery modules 22 described herein to re-produce the same type of battery module 22. Indeed, all or a portion of the battery modules 22 described herein may be remanufactured in a way that repurposes the battery module 22. For example, the battery modules 22 may be remanufactured to include different types of battery cells 116, to include different circuit arrangements such that the battery module 22 provides different types of power (e.g., 12 volts versus 48 volts), or any other arrangement that enables its use for the provision of power in a different manner. In some embodiments, such repurposing may be accomplished by replacing the used battery cells 116 with new battery cells 116 that have different voltages, by re-connecting certain of the battery cells 116 in parallel rather than only in series, and/or by changing the battery module's interfaces (e.g., the type and/or number of terminals 24, 26, 30).

The remanufacturing processes discussed herein may be performed by a number of different operators at varying locations, such as at a manufacturing plant, a service center, an automotive store, or at another facility, such as a vehicle servicing facility (e.g., a service garage). FIG. 81 is a process flow diagram of an embodiment of a high-level remanufacturing process 760 that may be performed at any one or a combination of the locations noted above. The process 760 may include, as depicted, obtaining (block 762) a used version of the battery module 22. For instance, the battery module 22 may have been used in a vehicle, or in another setting. The acts according to block 762 may include receiving the battery module 22, such as via shipment, removing the battery module 22 from a vehicle, home, or other location, or otherwise isolating the battery module 22 from other periphery to which the battery module 22 may have been connected. For example, referring to the embodiment depicted in FIG. 4, in one embodiment the acts according to block 762 may include disconnecting the battery module 22 from the starter motor 28, the HVAC 32, the VCM 36, or any combination thereof.

Before, during, or after obtaining the battery module 22 in accordance with block 762, the used battery module 22 may be inspected and/or tested (block 764). The particular manner in which the battery module 22 is inspected and/or tested may at least partially depend on the location where the battery module 22 is remanufactured and the extent to which the battery module 22 is remanufactured. For example, in certain settings, a technician or other operator performing the remanufacturing process may not have ready access to certain types of electrical testing equipment. In such a setting, the remanufacturing operator may rely more on a visual inspection of the used battery module 22 and its associated components, rather than on equipment having interfaces capable of obtaining accurate readings from the battery module 22. By way of example, the acts according to block 764 in such situations may include visually inspecting various components for wear resulting from vibration, thermal fluctuations, or the like (e.g., by observing breaks in electrical connections, wear or crazing of polymeric surfaces, bends or other deformities in metallic parts).

In other settings, more sophisticated testing may be performed in addition to or in lieu of visual inspections. For example, in some embodiments, such as when individual battery cells 116 will be replaced, an operator may perform electrical measurements on one or more of the individual battery cells 116 to determine whether, or to what extent, their performance has degraded. For example, the electrical measurements may determine that one or more of the battery cells 116 are not producing electrical energy at a desired voltage and/or current. Similar testing may be performed on the entire power assembly 84.

In certain embodiments, the phase change material layers 124 may be tested. For example, the phase change material layers 124 may be subjected to physical analyses so as to determine whether the phase change material disposed therein is operating within a desired set of parameters (e.g., within a desired temperature range). Additionally or alternatively, chemical analyses may be performed on the phase change material layers 124 to determine, for example, a concentration of the phase change material within the phase change material layers 124.

Additionally or alternatively, other portions of the battery module 22 may be tested and/or inspected in accordance with block 764. For example, the electrical components of the interconnect assemblies 128 may be inspected (e.g., for metal deterioration) and tested. Because the cell interconnect board 130 (e.g., a ladder structure including the frame pieces 526) of the interconnect assemblies 128 may, in some embodiments, at least partially structurally support the power assembly 84, the cell interconnect board 130 may be inspected for structural integrity (e.g., for cracks, crazing, and/or warping). The terminals 24, 26, 30 may also be inspected, for example for metal deterioration (e.g., abrasion, scraping, oxidation). Additionally or alternatively, the conductivity of the terminals 24, 26, 30 may be verified using suitable electrical tests. The DC-DC converter 76 may also be tested to determine whether it is capable of maintaining quality operation in the context of a remanufactured battery module.

After inspection and/or testing in accordance with block 764, the process 760 includes determining (query 766) whether it is appropriate to remanufacture the battery module 22. In embodiments where it is not appropriate to remanufacture the battery module 22, the battery module 22 may be discarded (block 768), such as by recycling the various parts of the battery module 22 for use in other implementations. By way of non-limiting example, the battery module 22 may not be remanufactured in embodiments where the battery module 22 does not include portions that may be retained in a remanufactured version of the battery module 22. For instance, the battery module 22 may have broken parts, or the parts may be so severely worn that they do not pass certain quality criteria. Indeed, in some embodiments, depending on how much of the battery module 22 may be retained, it may not be cost-effective to remanufacture the battery module 22 and the battery module 22 may be discarded.

On the other hand, in embodiments where the battery module 22 may be appropriately remanufactured, the battery module 22 may be processed according to a desired remanufacturing process (block 770). For example, as noted above and as discussed in further detail below, at least a portion of the power assembly 84, at least a portion of the interconnect assemblies 128, at least a portion of the side assemblies 106, at least a portion of the battery control assembly 70, or any combination thereof, may be remanufactured in accordance with present embodiments. Indeed, any one or a combination of the embodiments of various portions of the battery module 22 discussed above may be remanufactured to have the configuration of any one or a combination of the other embodiments discussed above. That is, the present disclosure is intended to encompass embodiments of the battery module 22 having any permutations and any combinations of the components described above with respect to present embodiments, whether in new or remanufactured contexts. Therefore, while described above as particular embodiments of the battery module 22, the present disclosure encompasses any and all combinations of these embodiments being used in a remanufactured version of the battery module 22.

After the appropriate remanufacturing process has been performed in accordance with block 770, the remanufactured version of the battery module 22 may be tested (block 772) to ensure compliance with various standards associated with the particular type of battery module 22 being remanufactured. For instance, in embodiments where the battery module 22 is to be used in a vehicle (e.g., the xEV 10 of FIG. 1), the testing may be used to ensure compliance with various vehicular standards.

After the battery module 22 is tested according to the acts represented by block 772, the battery module 22 may be packaged (block 774). For example, the cover 59 may be secured to the remainder of the battery module 22 (if not done at an earlier process stage). In certain embodiments, the remanufactured battery module 22 may be packaged in an appropriate container and shipped and/or provided to a desired location (e.g., a store and/or a servicing facility or consumer). In embodiments where the battery module 22 is remanufactured in a servicing facility (e.g., a vehicle garage, an auto shop), the battery module 22 may simply be re-installed back into service.

As noted above with respect to the acts represented by block 770, at least a portion of the power assembly 84, at least a portion of the interconnect assemblies 128, at least a portion of the side assemblies 106, at least a portion of the battery control assembly 70, or any combination thereof, may be remanufactured in accordance with present embodiments. FIGS. 82-90 each represent general methods by which sections of the battery module 22 may be remanufactured in accordance with the present disclosure. It should be noted that these methods are presented separately only to facilitate discussion. Indeed, any of the acts described hereinbelow may be used in any combination such that a remanufacturing process may incorporate some or all of the acts described with respect to FIGS. 82-90.

As noted above, the particular manner by which the battery modules 22 described herein are remanufactured may depend on a number of factors, including time considerations, cost considerations, the expertise of the individual performing the remanufacture, the configuration of the automated machinery performing the remanufacture, the desired configuration of the remanufactured battery module, or any combination thereof. Further, the automated machinery performing the remanufacture may include suitably configured storage and processing components for performing the methods described herein. For example, an automated remanufacturing system may include one or more tangible, machine-readable, non-transitory media collectively storing one or more sets of instructions that are executable by one or more processing devices, such as a processor of the automated machinery, to perform the tasks presented below. Furthermore, such automated machinery may perform some or all of the acts represented by FIG. 81, which may include acts illustrated in subsequent figures.

Discussed hereinbelow are various methods of remanufacturing certain portions of the battery module 22. Beginning with FIG. 82, the methods are first presented in a more general context, i.e., from the standpoint of remanufacturing entire sections (e.g., assemblies) of the battery module 22, and are followed by methods of remanufacturing particular portions of those sections. For instance, method 778 of FIG. 82 is described in the context of remanufacturing the combination formed by the top and bottom compression plates 100, 102, the power assembly 84, and the interconnect assemblies 128, and is followed by methods of remanufacturing each of these assemblies (e.g., separate from one another) in FIGS. 84 and 85.

Moving now to the more particular methods of remanufacturing the battery module 22, because the power assembly 84 and interconnect assemblies 128 include portions that will generally degrade over time, remanufacturing in accordance with one embodiment may include replacing at least one component of each with a new respective component. FIG. 82 represents an embodiment of such a method 778. In particular, the method 778 includes removing (block 780) the plastic or composite cover 59, the side assemblies 106, the end assemblies 80, and the battery control assembly 70 away from the remainder of the battery module 22. For example, the plastic or composite cover 59 and the battery control assembly 70 may be unfastened (e.g., by pulling away, by unscrewing, or a combination thereof) from the top compression plate 100, and may be displaced away from the power assembly 84, for example along the Y axis 42. Similarly, in some embodiments, the side assemblies 106 may be unfastened from the top and bottom compression plates 100, 102 (or other portion of the battery assembly 84), and displaced away from the power assembly 84, for example along the X axis 44. The end assemblies 80 may be unfastened from the interconnect assemblies 128, the power assembly 84, and/or the top and bottom compression plates 100, 102, and displaced away from the power assembly 84, for example along the Z axis 40. Each of the plastic or composite cover 59, the side assemblies 106, the end assemblies 80, and the battery control assembly 70 may independently be individually retained as entirely used components, be individually remanufactured so as to incorporate both new and used components, or be individually altogether replaced with a new respective assembly, in accordance with certain embodiments disclosed hereinbelow.

Once the assemblies noted above are removed, the remainder of the battery module 22 may be the power assembly 84 connected to the top and bottom compression plates 100, 102, and also to the interconnect assemblies 128. As noted above, such a structure may be referred to as a compressed and interconnected power assembly. In accordance with present embodiments, all or a portion of the compressed and interconnected power assembly may be replaced or remanufactured (block 782). For example, where time of remanufacture is a concern, once the compressed and interconnected power assembly is isolated, it may simply be replaced with a new compressed and interconnected power assembly. Example embodiments of the manner in which the compressed and interconnected power assembly may be remanufactured are discussed in detail below.

The method 778 also includes, after the acts represented by block 782, securing (block 784) the side assemblies 106, the end assemblies 80, and the battery control assembly 70, which may independently be entirely used, entirely new, or remanufactured, to the remanufactured or replaced compressed and interconnected power assembly 84. The plastic or composite cover 56 may then be secured (block 786) to produce the remanufactured battery module 22. In accordance with method 778, the remanufactured version of the battery module 22 may, as a result of these acts, include the side assemblies 106, the end assemblies 80, the battery control assembly 70, and a remanufactured or new version of the compressed and interconnected power assembly, where at least a portion of the power assembly 84, the interconnect assemblies 128, or a combination thereof, is new, and at least another portion of the side assemblies 106, the end assemblies 80, the battery control assembly 70, the power assembly 84, the interconnect assemblies 128, or any combination thereof, is used.

It should be noted that in certain embodiments, the compressed and interconnected power assembly may not necessarily be replaced or remanufactured. Indeed, in certain embodiments, the compressed and interconnected power assembly may be suitable for re-use in the remanufactured battery module 22. In such embodiments, other portions of the battery module 22 may be remanufactured. FIG. 83 is a process flow diagram of an embodiment of a method 790 to produce such a remanufactured version of the battery module 22. However, it should be noted that any of the acts described herein with respect to FIG. 83 may also be performed in any combination with any of the acts described above with respect to FIG. 82. That is, the acts described with respect to FIG. 83 may be performed such that the compressed and interconnected power assembly is used, new, or remanufactured.

As depicted, the method 790 includes removing the plastic or composite cover 59, the side assemblies 106, the end assemblies 80, and the battery control assembly 70 from the compressed and interconnected power assembly in accordance with the acts represented by block 780 described above. The method 790 also includes, upon appropriate disassembly in accordance with block 780, replacing or remanufacturing (block 792) all or a portion of the polymer or composite cover 59, the side assemblies 106, the end assemblies 80, the battery control assembly 70, or any combination thereof.

With respect to the polymer or composite cover 59, remanufacturing may include replacing various screws or other features used to secure the polymer or composite cover 59 to the battery module 22, replacing various removable portions (e.g., pads) where the polymer or composite cover 59 may interface with various other components (e.g., the terminals 24, 26, 30), or any other similar replacement. Alternatively, the polymer or composite cover 59 may simply be replaced with a new version.

With respect to the side assemblies 106, remanufacturing in accordance with block 792 may include replacing the thermal gap pads 108, the heat sink side plates 60, 62, the screws 110 (or other fastening features), or any combination thereof. The present embodiments are also intended to encompass situations where only one of the side assemblies 106 is remanufactured or replaced. Thus, the thermal gap pads 108 may, individually and independently, be new or used, the heat sink side plates 60, 62 may, individually and independently, be new or used, and the screws 110 (fastening features) may, independently and individually, be new or used.

With respect to the end assemblies 80, either or both may be remanufactured or replaced. For example, features of the end assemblies 80 that may experience deformations or other degradation as a result of thermal fluctuations may be replaced, including but not limited to the rectangular gaskets 86, the vent discs 96, the gap pads 82, the insulating polymer layer 90, or any combination thereof. The end plates 92 may, in addition to these features or as an alternative to these features, be replaced.

A variety of operations may be performed so as to generate a remanufactured version of the battery control assembly 70. Furthermore, in some embodiments, the entire battery control assembly 70 may be replaced with a new respective version (not necessarily having the exact same configuration). By way of non-limiting example, any one or a combination of the electrical features of the battery control assembly 70 may be replaced or re-plated (e.g., with a new or fresh metallic coat), including but not limited to the connections 58, the conductive portions of the cables 74 (and even the cables 74 themselves), interconnects between the cables 74 and the interconnect assemblies 128, or any combination thereof. In addition to replacing or re-plating these features, the DC-DC converter 76 may be removed and replaced (or not replaced, depending on a desired configuration of the remanufactured version of the battery module 22).

The battery control module 72 may undergo re-soldering of various electrical connections to new or used interfaces, may be re-programmed, or altogether replaced. In embodiments where the battery control module 72 is replaced or reprogrammed, the new or reprogrammed version of the battery control module 72 may not necessarily have the same programming as the used version. For example, the new or reprogrammed version of the battery control module 72 may have a programming more appropriately suited to the remanufactured version of the battery module 22, which may have different desired operating temperatures, operating voltages, or the like, compared to the used version of the battery module 22. Indeed, in certain embodiments, the new or reprogrammed version of the battery control module 72 may have a programming more appropriately suited to a different use or use within a different climate (e.g., use within a sport utility vehicle versus a compact car, or use in a cold climate versus a warm climate).

Once the plastic or composite cover 59, the side assemblies 106, the end assemblies 80, the battery control assembly 70, or any combination thereof, have been suitably remanufactured, the method 790 then progresses to securing (block 794) these components back to the compressed and interconnected power assembly. For example, while the side assemblies 106, the end assemblies 80, and the battery control assembly 70 may be secured to the compressed and interconnected power assembly in any order, in some embodiments, the side assemblies 106 may first be secured to the compressed and interconnected power assembly. Indeed, because, as noted above, the side assemblies 106 may function as heat sinks with respect to the compressed and interconnected power assembly, it may be desirable to ensure intimate contact therebetween. By way of non-limiting example, the battery control assembly 70 may be secured to the top compression plate 100 and to both side assemblies 106. The end assemblies 80 may each be connected to both side assemblies 106, the top and/or bottom compression plates 100, 102, one of the interconnect assemblies 128, or any combination thereof.

The plastic or composite cover 56 may then be secured (block 796) to produce a remanufactured version of the battery module 22. In accordance with method 790, the remanufactured version of the battery module 22 may, as a result of these acts, include new, used, or remanufactured versions, or any combination thereof, of the side assemblies 106, the end assemblies 80, the battery control assembly 70, and a remanufactured, new, or entirely used version of the compressed and interconnected power assembly.

The power assembly 84 may be compressed by the top and bottom compression plates 100, 102 to achieve, using the plurality of layers of each battery cell assembly 114, a certain amount of pressure on each battery cell 116, and the interconnect assemblies 128 may be used to interconnect two or more of the battery cells 116. In certain situations, the top and bottom compression plates 100, 102 and the interconnect assemblies 128 may be sufficiently re-usable such that they may be retained, and all or a portion of the power assembly 84 (e.g., at least one layer of the plurality of layers of at least one of the battery cell assemblies 114) may be replaced. FIG. 84 is a process flow diagram illustrating an embodiment of such a method 800. As may be appreciated, the method 800 may be performed in conjunction with any of the methods described above with respect to FIGS. 82 and 83. For instance, in some embodiments, the method 800 may constitute some or all of the acts represented by block 782 in FIG. 82.

As illustrated in FIG. 84, the method 800 includes removing (block 802) the interconnect assemblies 128 from the power assembly 84, such as by removing the screws 136 that secure the interconnect assemblies 128 to the top and bottom compression plates 100, 102 and, by extension, the power assembly 84. As discussed above, the interconnect assemblies 128 provide at least some structural support for the power assembly 84, such as by indirectly supporting the power assembly 84 through the top and bottom compression plates 100, 102. In one embodiment, upon removing the interconnect assemblies 128 from the power assembly 84, such as along the Z axis 40, the top and bottom compression plates 100, 102 may then be removed. For example, the compression bolts 140 may be loosened and removed, and the top and bottom compression plates 100, 102 may be separated from the remainder of the power assembly 84 (e.g., along the Y axis 42).

Once the power assembly 84 is isolated, the power assembly 84 may be replaced or remanufactured (block 804). For example, where time is a concern and in situations where it may be desirable to replace all of the battery cells 116 and/or other layers of the battery cell assemblies 114, the entire power assembly 84 may be replaced with a new respective power assembly 84. As noted above, the power assembly 84 may not necessarily have the same configuration as the used power assembly 84. For example, the new power assembly 84 may be rated to operate within a different temperature range, to provide electrical energy at a different current and/or voltage, or any combination of these and other configuration changes. This may be accomplished using different phase change materials within the phase change material layers 124, by using new gap pads 115 having a different thermal conductivity than the used gap pads 115, by using different battery cells 116, or any combination of these and other material/layer modifications. FIGS. 86 and 87, discussed in detail below, depict example methods by which individual portions of the power assembly 84 may be replaced to remanufacture the power assembly 84.

Once the power assembly 84 is appropriately replaced or remanufactured according to the acts represented by block 804, the interconnect assemblies 128 and the top and bottom compression plates 100, 102 may be secured (block 806) to the power assembly 84 to produce a remanufactured version of the battery module 22. In certain embodiments, one or more of the fastening mechanisms (e.g., screws, clamps, clips, snap-fits) used to secure the interconnect assemblies 128 and/or the top and bottom compression plates 100, 102 may be replaced at this stage.

As noted above, in addition to or in lieu of remanufacturing the power assembly 84, either or both of the interconnect assemblies 128 and/or the top and/or bottom compression plates 100, 102 may be remanufactured. FIG. 85 is a process flow diagram depicting an embodiment of such a method 810. In particular, the method 810 may be performed in conjunction with any of the methods introduced above, or may be performed as an entirely separate process.

As depicted, the method 810 includes some of the same acts as described above with respect to the method 800 in FIG. 84. Specifically, the acts represented by block 802, i.e., removing the interconnect assemblies 128 and the top and bottom compression plates 100, 102, may be performed so as to at least partially isolate each assembly from the other in a manner that facilitates remanufacture.

The method 810 further includes replacing or remanufacturing (block 812) either or both of the interconnect assemblies 128 and/or either or both of the top and bottom compression plates 100, 102. By way of example, either or both of the interconnect assemblies 128 and/or either or both of the top and bottom compression plates 100, 102 may simply be replaced with a new respective assembly or compression plate.

While more involved processes of remanufacturing the interconnect assemblies 128 are discussed in detail below with respect to FIGS. 88 and 89, in a general sense, the interconnect assemblies 128 may be remanufactured by replacing one or more of the sensors 132 with a new respective sensor, replacing one or more of the interconnect devices 138 with a new respective interconnect device (which may be the same or different as the used interconnect devices 138) replacing the cell interconnect board 130, re-plating the various metallic interconnects and/or conductors, or any combination thereof.

With respect to the top and bottom compression plates 100, 102, the locked nut features 142 may be replaced or otherwise repaired using new material. The compression bolts 140, while not integral with the top and bottom compression plates 100, 120, may also be replaced or otherwise re-plated or repaired to ensure that an appropriate amount of pressure is provided to the power assembly 84. Indeed, the compression bolts 140 (or other mechanism used to facilitate the pressurization of the power assembly 84) may be replaced at this stage or, as noted above with respect to FIG. 84, at a subsequent stage when the remanufactured version of the compressed and interconnected assembly is produced. As an example, the compression bolts 140 may be replaced with compression bolts 140 having different torque limits.

Once either or both of the interconnect assemblies 128 and/or either or both of the top and bottom compression plates 100, 102 are remanufactured or replaced according to the acts represented by block 812, the method 810 may include securing (block 814) the remanufactured or replaced assemblies 128 and/or top and/or bottom compression plates 100, 102 to the power assembly 84. The acts of block 814 may generally be the same as those described above with respect to block 806 in FIG. 84, although the manner in which the securing is performed may be different depending on whether the fastening mechanisms have been replaced with a different type of mechanism. By way of non-limiting example, a clamp may be replaced with a screw, or vice-versa.

As set forth above with respect to FIG. 84, FIGS. 86 and 87 each depict more specific methods for remanufacturing the power assembly 84, where the entire power assembly 84 is not replaced but rather, one or more portions of the power assembly 84 are replaced. In particular, FIG. 86 depicts a method 820 of remanufacturing the power assembly 84 by replacing or remanufacturing one or more of the battery cell assemblies 114. Thus, a remanufactured version of the battery module 22 produced in accordance with the method 820 will include at least a remanufactured power assembly 84 where at least a portion of at least one battery cell assembly 114 is new.

Specifically, the method 820 includes separating (block 822) the power assembly 84 into one or more individual battery cell assemblies 114. The acts represented by block 822 may include, by way of non-limiting example, de-registering each battery cell assembly 114 from every other battery cell assembly 114 by, for example, separating the frames 118 of the battery cell assemblies 114. In embodiments where the registration features 121 include various retention features, such as clamps or locks, the retention features may be removed, loosened, or even, in certain embodiments, broken.

Once the battery cell assemblies are appropriately separated in accordance with the acts represented by block 822, one or more of the battery cell assemblies 114 may be replaced with a new respective battery cell assembly 114, or may be remanufactured (block 824). By way of non-limiting example, the one or more battery cell assemblies 114 may be replaced with new respective battery cell assemblies 114 having generally the same configuration (e.g., the same number of layers, arrangement and order of layers, type of layers) or having a different configuration (e.g., a different number of layers, arrangement and order of layers, or type of layers). Indeed, in certain embodiments, such as when the battery cell assemblies 114 are replaced with new battery cell assemblies 114 having a different configuration, the different configuration may enable the remanufactured version of the battery module 22 to be used in a different type of climate (e.g., by having a different appropriate operating temperature range), to be used for providing electrical energy at different currents and/or voltages compared to the used version of the power assembly 84, to provide enhanced water resistance (e.g., as in a marine battery), to provide enhanced vibration dampening, or any combination thereof.

While replacing individual battery cell assemblies 114 may be desirable in some circumstances, in other situations, it may be desirable to remanufacture individual battery cell assemblies 114 by replacing a portion (e.g., a layer, a portion of a layer) of at least one battery cell assembly 114 with a new respective portion. Such embodiments are described in further detail below with respect to FIG. 87.

Once the one or more battery cell assemblies 114 are appropriately replaced in accordance with the acts represented by block 824, the battery cell assemblies 114 (including both used and new battery cell assemblies 114) may be re-registered (block 826) to one another to form the remanufactured version of the power assembly 84. For example, the registration features 121 of the battery cell assemblies 114 may be aligned and appropriately coupled (e.g., via male/female connection, clamps, screws, interference fit) so as to ensure proper alignment of the battery cell assemblies 114 and enable appropriate connection to the interconnect assemblies 128.

In addition to, or as an alternative to, replacing one or more battery cell assemblies 114, one or more individual layers of certain battery cell assemblies 114 may be replaced, as set forth in FIG. 87. In particular, FIG. 87 depicts a method 830 of remanufacturing individual battery cell assemblies 114 by replacing at least a portion of at least one layer of the plurality of layers forming the battery cell assembly 114. Thus, the method 830 may be performed as an alternative to, or in combination with, any of the methods set forth above with respect to FIGS. 81-86.

As depicted, the method 830 includes separating (block 832) at least one battery cell assembly 114 into its constituent layers, which may include any one or a combination of the layers discussed above in any embodiment. By way of example, referring to the embodiment of the battery module 22 depicted in FIG. 7, the constituent layers may include, but are not limited to, the gap pad 115, the internal heat fin 112, the phase change material layer 124, the frame 118, the battery cell 116, or any combination thereof. The separation may be performed, in some embodiments, simply by pulling layers away from one another (e.g., generally along the Y axis 42). In other embodiments, the layers may be secured to one another using, for example, chemical and/or mechanical fastening methods (e.g., an adhesive, clamp, clip, bolt, hook-and-loop connector). In such embodiments, the layers may be separated using appropriate processes associated with the particular fastening method. For instance, the adhesive coupling may be undone using a solvent, heat, a cutting tool (e.g., a razor), or any combination thereof.

Once separated, one or more layers of the battery cell assembly 114, or portions of one or more of the layers, may be replaced with a new respective layer or portion (block 834). The particular layers of the battery cell assemblies 114 that are replaced may depend on, by way of non-limiting example, the testing and inspection performed in accordance with the acts represented by block 764 of FIG. 81. For example, in embodiments where the power assembly 84 is not producing a desired current and/or voltage of electrical energy, one or more of the battery cells 116 may be replaced with a new respective battery cell 116. In yet other embodiments, the testing may indicate that the power assembly 84 is not producing the desired electrical energy, but may also indicate that the battery cells 116 are each producing a desired amount of electrical energy. In such embodiments, other layers that could potentially affect the operation of the power assembly 84 may be replaced, including but not limited to the gap pads 115 and/or other layers that affect the pressure exerted on each battery cell 116. Additionally or alternatively, the testing may indicate that the power assembly 84 or, one of the battery cell assemblies 114 in particular, is operating outside of a desired temperature range. In such situations, the phase change material layer 124 may be replaced, or may be infused with additional (new) phase change material. The gap pads 115 may, additionally or alternatively, be replaced for temperature reasons.

Additionally or alternatively, the battery cells 116 may be replaced to re-purpose the battery module 22. For example, the new battery cells 116 may have different voltage and/or current ratings compared to their used counterparts. That is, the used battery cells 116 may be rated, based on when they were originally manufactured, at a first voltage or current, and the new battery cells 116 may be rated at a second voltage or current, where the first voltage or current and the second voltage or current are different.

In still further embodiments, certain of the layers of the battery cell assemblies 114 may be replaced due to wear. For example, in embodiments where the battery module 22 is positioned within a vehicle, the battery module 22 may experience not only thermal fluctuations due to normal operation and climate, but may also be subjected to a variety of other environmental conditions that can degrade various components over time, such as humid air, salty air, road vibrations, debris, and the like. Accordingly, certain layers of the battery cell assemblies 114 may be crazed, broken, bent, oxidized, stained, or otherwise unsuitable for use within a remanufactured version of the battery module 22. In embodiments where worn layers are present in this manner, they may be replaced.

Once the one or more layers of the battery cell assemblies 114 are replaced, the layers of each battery cell assembly may be registered (block 836) to one another to produce at least one remanufactured version of the battery cell assembly 114. The acts represented by block 836 may include, by way of example, stacking the layers against one another in a particular order. As discussed above, it may be desirable to stack the layers of the battery cell assemblies 114 in a particular order (e.g., the order shown in FIG. 7) to obtain desired amounts of thermal conduction and to enable the provision of appropriate amounts of pressure on the battery cells 116. Indeed, either or both of these parameters may be important for ensuring homogenous operation between all of the battery cell assemblies 114 (e.g., substantially equal voltage and/or current output).

In other embodiments, the acts associated with block 836 may include securing the layers to one another, for example using an adhesive, hook-and-loop fastener, clamp, clip, soldering, crimping, bolting, screwing, friction fits, or any other features or methods suitable for securing one layer to another. Once the layers are secured to one another, the resulting battery cell assembly 114 may be a remanufactured battery cell assembly having at least one layer (of a plurality of layers) being new or having a new portion, and having at least one other layer (of the plurality of layers) being used. The resulting remanufactured battery cell assembly 114 may be incorporated into a remanufactured version of the power assembly 84, which may in turn be incorporated into a remanufactured version of the battery module 22. Thus, the remanufacturing processes associated with FIG. 87 may be used in conjunction with any one or a combination of the other methods set forth above.

As generally noted above with respect to FIGS. 81 and 85, one or more of the interconnect assemblies 128 may be remanufactured, either in combination with remanufacturing other portions of the battery module 22, or separate from other portions of the battery module 22. FIG. 88 depicts a method 840 for remanufacturing the interconnect assemblies 128 as a result of inspection and/or testing. The method 840 may be performed as a standalone method or in combination with any of the other methods set forth above.

As depicted, the method 840 includes inspecting and/or testing (block 842) the used interconnect assembly 128. The inspecting and/or testing may include a visual inspection of both structural support components of the interconnect assembly 128 (e.g., a dielectric material forming the cell interconnect board 130), as well as the electrical components of the interconnect assembly 128 (e.g., the sensors 132, coupling structures 524), which, in certain embodiments, may include one or more portions of at least one of the terminals 24, 26, 30. The inspection and/or testing may be performed in a similar manner as set forth above with respect to FIG. 81, such as by performing electrical measurements on the conductive portions of the interconnect assembly 128 and/or by visually inspecting the conductive portions for abrasion, pitting, scratching, metallic oxidation (i.e., corrosion), debris buildup, weld decay, and the like.

Assuming that the interconnect assembly 128 is eligible for remanufacturing, the interconnect assembly 128 may be remanufactured according to the results of the testing and/or inspection (block 844). By way of non-limiting example, the acts associated with block 844 may include reinforcing structural portions of the interconnect assembly 128 if the structural portions exhibit wear evidenced by cracking, crazing, chipping, or the like. In other embodiments, the structural portions (e.g., the dielectric of the cell interconnect board 130) may simply be replaced if the structural portions are not repairable or otherwise suitable for use in a remanufactured implementation of the battery module 22.

The acts associated with block 844 may, additionally or alternatively, include re-plating, re-coating, filing, re-soldering, or similarly processing the conductive portions of the interconnect assembly 128 (e.g., the coupling structures 524, the sensors 132). For example, a visual inspection of the interconnect assembly 128 may indicate that various electrical connections between conductive portions of the interconnect assembly 128 may be loose, worn, or broken. In such situations, a new or reinforced connection may be established by re-soldering. In still further embodiments, as another example, electrical tests may reveal that certain conductive portions of the interconnect assembly 128 no longer have a suitable conductivity. In such situations, those conductive portions may be re-coated, re-plated, or altogether replaced. Once the interconnect assembly 128 is remanufactured in accordance with block 844, the remanufactured version of the interconnect assembly 128 may be inspected and/or tested (block 846) to ensure compliance with an appropriate standard, and to ensure that any negative results of testing before the remanufacturing process have been appropriately corrected.

The methods set forth above relate to the general manner by which various portions of the battery module 22 may individually be remanufactured. Again, the methods discussed above may be performed as standalone methods, or in any combination. Indeed, the present disclosure is also intended to encompass certain remanufacturing methods that may involve remanufacturing combinations of assemblies to achieve a particular result. For instance, as discussed above with respect to FIG. 81, the electrical components of the battery module 22 may be remanufactured or replaced. As discussed in detail below with respect to FIG. 89, the battery module 22 may be remanufactured to achieve a different operating temperature range, or simply to replenish the capability of the battery module 22 to dissipate heat.

In particular, FIG. 89 illustrates an embodiment of a method 850 to remanufacture the battery module 22 by replacing all or a portion of the layers that have an effect on the thermal capabilities of the battery module 22. As depicted, the method 850 includes removing (block 852) the polymer or composite cover 59, the side assemblies 106, the end assemblies 80, the battery control assembly 70, the interconnect assemblies 128, and the top and bottom compression plates 100, 102 to isolate the power assembly 84. It should be noted that the acts represented by block 852 may be a combination of the acts described above with respect to block 780 of FIG. 82 and block 802 of FIG. 84.

The power assembly 84 may then be separated (block 822) into individual battery cell assemblies 114 in the manner set forth with respect to FIG. 86 above. Following the separation in accordance with block 822, the individual battery cell assemblies 114 may then be separated (block 832) into individual layers in the manner set forth with respect to FIG. 87 above.

Once the layers of the battery cell assemblies 114 have been separated, at least a portion of one or more of the thermal control layers of the battery cell assemblies 114 may be replaced (block 853). Generally, at least a portion of one or more of the gap pads 115, phase change material layers 124, and/or internal heat fins 112 of the power assembly 84 may be replaced. In still further embodiments, the phase change material layers 124 may be remanufactured by providing additional phase change material to the layers 124. The internal heat fins 112 may be re-shaped, re-plated, cut, or otherwise processed to enable enhanced heat transfer to the side assemblies 106 upon re-assembly of the battery module 22.

At least a portion of the side assemblies 106 may be replaced (block 854), as well. For example, the heat sink side plates 60, 62, the thermal gap pads 108, or a combination thereof, may be replaced.

It should be noted that the new respective layers (e.g., new phase change material layers 124, new gap pads 115, new thermal gap pads 108, new internal heat fins 112, or any combination thereof) may have the same configuration as their used counterparts, or may have different properties. For example, the new respective layers may enable operation of the battery module 22 at higher temperatures, or at lower temperatures when compared to the battery module 22 having the used respective layers. In certain embodiments, using new thermal layers (e.g., new phase change material layers 124, new gap pads 115, new thermal gap pads 108, new internal heat fins 112, or any combination thereof) may enable a wider temperature range than those employed in the used battery module 22. Indeed, the particular type of layer selected for each location may have an impact on the overall thermal management of the battery module 22. Furthermore, replacing the heat sink side plates 60, 62 with new respective plates 60, 62 may also have an effect on the thermal management of the battery module 22, for example depending on the size, shape, and extent of the external heat fins of the new heat sink side plates 60, 62 versus the used heat sink side plates 60, 62. Once the components that effect the thermal management of the battery module 22 have been suitably replaced or remanufactured, the components of the battery module 22 may then be re-assembled (block 856) to generate the remanufactured version of the battery module 22.

As set forth above, the remanufacturing processes described herein are not limited to producing the same battery module 22 obtained before remanufacture. In other words, in certain embodiments, the remanufacturing may result in re-purposing of the battery module 22. As an example of re-purposing the battery module 22, the battery module 22 may be re-purposed to provide electrical energy at different voltages and/or currents, which may enable its use in an entirely different implementation (e.g., a boat or house versus a vehicle). Among other approaches, including changing the voltage and/or current ratings of the individual battery cells 116 as discussed above, one approach is presented in FIG. 90, which depicts a method 860 for repurposing of the battery module 22 by re-arranging the manner in which the battery cells 116 are connected using the interconnect assembly 128. It should be noted that the method 860 may be used in conjunction with other methods described above.

The method 860 depicted in FIG. 90 provides various processes that may be used to remanufacture the interconnect assembly 128 to re-configure the battery module 22 to provide a different electrical output, such as a different voltage, a different current, or both. As illustrated, the method 860 includes removing (block 862) the interconnect assemblies 128 from the power assembly 84. It should be noted that the acts represented by block 862 may be substantially the same as set forth above with respect to block 802 of FIG. 84. In a general sense, the acts of block 862 may result in isolating the interconnect assemblies 128 from the battery cells 116.

The method 860 may also include, as illustrated, providing (block 864) a new conductor, or additional conductive materials, to electrically couple groupings of the coupling structures 524 (e.g., on the cell interconnect board 130) in parallel. For example, certain of the coupling structures 524 that would otherwise be electrically isolated may be connected to the negative terminal 24 (or interface for the negative terminal 24) or the second positive terminal 30 in a parallel arrangement.

Additionally, the method 860 may include remanufacturing, replacing, or reusing the power assembly 84 (block 866), depending on the particular end use of the remanufactured battery module 22 and the suitability of the power assembly 84 for that particular end use. In embodiments where the power assembly is remanufactured, the acts represented by block 866 may be the same as set forth above with respect to block 804 of FIG. 84 and may include at least some of the acts set forth above with respect to method 820 of FIG. 86 and/or method 830 of FIG. 87.

The method 860, as illustrated, also includes connecting (block 868) sets of serially-arranged battery cells 116 in parallel. For example, sets of battery cells 116 may be connected serially. However, rather than connecting all of the battery cells 116 in series, more than two battery cells 116 may not be connected at one end to another battery cell 116, but instead are connected to a terminal (e.g., the negative terminal 24 or one of the positive terminals 26, 30) in a parallel arrangement with at least one other set. The arrangement resulting from this connection scheme may be further appreciated with respect to FIG. 91, which is a side-view schematic illustration of sets 880 of the battery cells 116 being interconnected serially to form the sets 880, and the sets 880 being connected in parallel to a respective terminal. It should be noted that FIG. 91 is merely a schematic representation of an embodiment of one connection scheme to achieve different connectivity scheme than those embodiments described above.

As illustrated in FIG. 91, the repurposed battery module 22 includes the sets 880 of the battery cells 116, which may, in an actual implementation, be positioned within battery cell assemblies 114 and, thus, the power assembly 84. The sets 880 include a first set 882, a second set 884, and a third set 886, each set 880 having three battery cells 116 connected in series. However, as represented between the second and third sets 884, 886, any number of sets 880 may be used to achieve a desired output voltage.

With reference to the first set 882 as an example, each set 880, as illustrated, includes a first battery cell 888, with a negative tab electrode 890 being connected to one of the coupling structures 524 without being interconnected with another battery cell 116 at a negative end 892. Instead, the negative end 892 of the first battery cell 88 is connected, via the coupling structure 524 (or, in some embodiments, directly coupled) to the negative terminal 24. As shown, the respective first battery cells 888 of the second and third sets 884, 886 are also connected to the negative terminal 24 in this manner. While the first, second, and third sets 882, 884, 886 may be separately connected to the negative terminal 24 (or negative terminal interface), as illustrated, they are coupled in parallel via a negative bus 894 to the negative terminal 24.

A similar arrangement may be present with respect to the positive terminals 26, 30. For example, with reference to the first set 882, the first battery cell 888 is also connected, in a series arrangement, to second and third battery cells 896, 898. While the second battery cell 896 is serially connected at both ends to another battery cell (e.g., via the coupling structures 524 and tab electrodes 129), the third battery cell 898 is not. Rather, a positive end 900 of the third battery cell 898 is connected via a positive tab electrode 902 to the first and/or second positive terminals 26, 30 (e.g., via one of the coupling structures 524). This arrangement is similar for each set 880.

The respective third battery cells 898 of the second and third sets 884, 886 are also similarly connected to the first and/or second positive terminals 26, 30. Indeed, the third battery cells 898 may be separately connected to the first and/or second positive terminals 26, 30 or, as illustrated, may be connected in parallel via a positive bus 904 to the first and/or second positive terminals 26, 30. The negative and positive buses 894, 904 may be formed by extensions from an already-existing bus (e.g., the negative bus bar 104), or may be disposed on the cell interconnect board 130 of the interconnect assemblies 128 as new conductors. In particular, the buses 894, 904, and their connections to the first, second, and third sets 882, 884, 886 of battery cells 116, may be formed according to the acts represented by block 864 of FIG. 90.

It should be appreciated that the configuration depicted in FIG. 91 results in a lower output voltage than other embodiments described above, for example with respect to FIG. 40. However, the voltage output, while lower, may have a higher associated current due to the parallel connections of the sets 882, 884, 886. Accordingly, one implementation of the repurposed version of the battery module 22 set forth in FIG. 91 may be one in which the voltage desired is slightly lower (e.g., 12V, which may be obtained when each battery cell outputs 4V) but the current desired is higher. It should be noted that the reconfiguration represented by FIG. 77 is provided as an example. Different reconfigurations may be performed in accordance with present embodiments. For example, the battery cells 116 may be changed from being in series to being in parallel in any variation.

One or more of the disclosed embodiments, alone or on combination, may provide one or more technical effects useful in the remanufacture of battery modules, and portions of battery modules. For example, certain embodiments of the present approach may enable extended lifetimes of various portions of the battery module 22, including the battery cells 116, heat sink side plates 60, interconnect assemblies 128, battery control modules 72, and other materials that can be difficult to recycle. Indeed, the approaches described herein may improve the performance of battery modules 22 by enabling the selective replacement of individual components, and may ultimately reduce the time required for a technician to service a vehicle (or other location) having the battery module 22. By specific example, replacing a used component of the battery module 22 with a new respective component may enable the resulting remanufactured battery module 22 to approach its original performance standards. The technical effects and technical problems in the specification are exemplary and are not limiting. It should be noted that the embodiments described in the specification may have other technical effects and can solve other technical problems.

While only certain features and embodiments of the invention have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery module, comprising:
    a cell interconnect board comprising a printed circuit board (PCB) disposed proximate a power assembly having a plurality of pouch battery cells including at least a first pouch battery cell and a second pouch battery cell in a stacked orientation relative to each other;
    a coupling structure disposed in a slot of the interconnect board, wherein the coupling structure defines an opening;
    an interconnection device disposed in the opening of the coupling structure and configured to contact a first tab electrode extending from the first pouch battery cell and a second tab electrode extending from the second pouch battery cell, such that the first and second tab electrodes are disposed within the opening, are in electrical contact with each other, and are positioned between the coupling structure and the interconnection device; and
    a sensor configured to measure a parameter associated with the power assembly.

2. The battery module of claim 1, comprising a plurality of coupling structures defining a plurality of openings, and a plurality of substantially parallel interconnection devices spanning respective slots through the cell interconnect board, wherein each interconnection device of the plurality of substantially parallel interconnection devices is disposed within a corresponding opening of the plurality of openings and is configured to contact tab electrodes from two respective pouch battery cells of the plurality of pouch battery cells, such that the tab electrodes are disposed within the opening, are in electrical contact with each other, and are positioned between the interconnection device and a corresponding coupling structure of the plurality of coupling structures.

3. The battery module of claim 2, wherein the plurality of substantially parallel interconnection devices are electrically conductive, and wherein the cell interconnect board comprises a terminal block, address voltage sense lines, and bus bars configured to electrically couple two or more of the plurality of substantially parallel interconnection devices with the terminal block, such that the terminal block receives a voltage from the plurality of pouch battery cells.

4. The battery module of claim 3, wherein the address voltage sense lines are arranged such that the terminal block receives a voltage signal associated with a series combination of the plurality of pouch battery cells.

5. The battery module of claim 3, wherein the bus bars are arranged such that the terminal block receives a voltage signal associated with a parallel combination of groups of pouch battery cells, wherein each group of pouch battery cells comprises two or more pouch battery cells of the plurality of pouch battery cells.

6. The battery module of claim 1, wherein the interconnection device comprises an electrically conductive material.

7. The battery module of claim 1, wherein the sensor is disposed adjacent to the interconnection device on the cell interconnect board.

8. The battery module of claim 1, wherein the sensor is electrically coupled to the interconnection device.

9. The battery module of claim 1, wherein the sensor is disposed on a first side of the cell interconnect board and the interconnection device is attached to a second side of the cell interconnect board opposite the first side.

10. The battery module of claim 1, wherein the sensor is disposed on an interior-facing side of the cell interconnect board facing towards the power assembly.

11. The battery module of claim 1, wherein the cell interconnect board comprises a first sensor disposed on a first side facing towards the power assembly and a second sensor disposed on the opposite side.

12. The battery module of claim 1, wherein the cell interconnect board comprises a multilayer PCB, and the sensor is disposed within the multilayer PCB.

13. The battery module of claim 1, wherein the sensor comprises a voltage sensor.

14. The battery module of claim 13, wherein the cell interconnect board comprises a sensor pad configured to be electrically coupled with a portion of one of the first and second tab electrodes, wherein the voltage sensor is coupled to the sensor pad.

15. The battery module of claim 1, wherein the sensor comprises a temperature sensor configured to detect a temperature associated with the first and second pouch battery cells.

16. The battery module of claim 1, wherein the sensor comprises a pressure sensor.

17. The battery module of claim 1, wherein the cell interconnect board comprises a terminal block electrically coupled to the sensor.

18. A battery module, comprising:
a cell interconnect board comprising a printed circuit board (PCB) disposed proximate a power assembly having a plurality of pouch battery cells disposed in a stacked orientation relative to each other;
a plurality of coupling structures disposed in slots of the cell interconnect board;
a plurality of openings, each opening being defined by a corresponding coupling structure of the plurality of coupling structures; and
a plurality of interconnects, wherein each interconnect of the plurality of interconnects is disposed in a corresponding opening of the plurality of openings, and is configured to contact two tab electrodes that extend from a respective pair of adjacent pouch battery cells, that are disposed within the corresponding opening, and that are positioned between the coupling structure and the interconnect.

19. The battery module of claim 18, wherein the cell interconnect board electrically couples the plurality of pouch battery cells in series.

20. The battery module of claim 18, wherein the cell interconnect board comprises a plurality of bus bars configured to electrically couple two or more groups of pouch battery cells in series, wherein each of the groups of pouch battery cells comprises two or more pouch battery cells of the plurality of pouch battery cells electrically coupled in parallel via the cell interconnect board and the bus bars.

21. The battery module of claim 18, wherein the cell interconnect board comprises a terminal block configured to receive a voltage signal associated with a parallel combination of the groups of battery cells.

22. The battery module of claim 21, wherein the cell interconnect board comprises a voltage sensor coupled to the terminal block to measure voltage drops across the parallel combination of the groups of battery cells.

23. The battery module of claim 18, wherein the cell interconnect board comprises a sensor disposed adjacent to at least one interconnect of the plurality of interconnects.

24. The battery module of claim 23, wherein the sensor is electrically coupled to the at least one interconnect.

25. The battery module of claim 23, wherein the cell interconnect board comprises a multilayer PCB, and wherein the sensor is disposed within the multilayer PCB.

26. The battery module of claim 1, wherein the opening defined by the coupling structure comprises a semi-circular or circular cross-section.

27. The battery module of claim 26, wherein the interconnection device comprises a semi-circular or circular cross-section corresponding with the semi-circular or circular cross-section of the opening.

28. The battery module of claim 1, wherein the interconnection device is retained within the opening such that the interconnection device is selectively removable from the opening.

29. The battery module of claim 1, wherein the coupling structure is configured to elastically deform to retain the interconnection device.

* * * * *

UNITED STATES PATENT AND TRADEMARK OFFICE
CERTIFICATE OF CORRECTION

PATENT NO. : 9,553,343 B2  
APPLICATION NO. : 13/954765  
DATED : January 24, 2017  
INVENTOR(S) : Malcolm et al.

Page 1 of 3

It is certified that error appears in the above-identified patent and that said Letters Patent is hereby corrected as shown below:

On the Title Page

In item (56), under "U.S. PATENT DOCUMENTS", in Column 2, Line 5, please delete "Maggert" and insert -- Maggert et al. --.

On Page 2, in item (56), under "U.S. PATENT DOCUMENTS", in Column 1, Line 6, please delete "Wood" and insert -- Wood et al. --.

On Page 2, in item (56), under "U.S. PATENT DOCUMENTS", in Column 1, Line 8, please delete "Koetting" and insert -- Koetting et al. --.

In the Drawings

In Fig. 53, Sheet 35 of 65, please delete Tag "589" and insert Tag -- 598 --.

In the Specification

In Column 1, Line 32, please delete "full hybrid systems" and insert -- full hybrid electric vehicles --.

In Column 1, Line 35, please delete "mild hybrid systems" and insert -- mild hybrid electric vehicles --.

In Column 3, Line 33, please delete "FIG. 8 is" and insert -- FIG. 8 is a --.

In Column 3, Line 36, please delete "FIG. 9 is" and insert -- FIG. 9 is a --.

In Column 3, Line 39, please delete "FIG. 10 is" and insert -- FIG. 10 is a --.

In Column 3, Line 46, please delete "a exploded" and insert -- an exploded --.

Signed and Sealed this  
Thirteenth Day of June, 2017

Joseph Matal  
*Performing the Functions and Duties of the*  
*Under Secretary of Commerce for Intellectual Property and*  
*Director of the United States Patent and Trademark Office*

CERTIFICATE OF CORRECTION (continued)

U.S. Pat. No. 9,553,343 B2

In Column 3, Line 60, please delete "a exploded" and insert -- an exploded --.

In Column 4, Line 27, please delete "approach; and" and insert -- approach; --.

In Column 10, Line 33, please delete "xEV vehicle" and insert -- xEV --.

In Column 21, Line 58, please delete "battery control assembly 84" and insert -- battery control assembly 70 --.

In Column 24, Line 25, please delete "bottom compression plate 103." and insert -- bottom compression plate 102. --.

In Column 24, Line 37, please delete "may coupled" and insert -- may be coupled --.

In Column 25, Line 36, please delete "power assembly 114" and insert -- power assembly 84 --.

In Column 26, Line 3, please delete "fins 258" and insert -- fins 252 --.

In Column 27, Line 24, please delete "top compression plate 101," and insert -- top compression plate 100, --.

In Column 27, Lines 29-30, please delete "tap compression plate 39" and insert -- top compression plate 100 --.

In Column 28, Line 38, please delete "curved side portions 114" and insert -- curved side portions 280 --.

In Column 31, Line 8, please delete "thermal gap pad layer" and insert -- thermal gap pad --.

In Column 33, Line 15, please delete "end portions 46 and 56" and insert -- end portions 46 and 48 --.

In Column 34, Line 15, please delete "battery cell assembly 124)." and insert -- battery cell assembly 114). --.

In Column 34, Line 25, please delete "FG." and insert -- FIG. --.

In Column 34, Line 26, please delete "FG." and insert -- FIG. --.

In Column 34, Line 45, please delete "pouch battery cell 114" and insert -- pouch battery cell 116 --.

In Column 35, Lines 16-17, please delete "cobalt manganese oxide (NMC) (e.g., LiNiCoMnO2)," and insert -- manganese cobalt oxide (NMC) (e.g., LiNiMnCoO2), --.

In Column 36, Lines 27-28, please delete "a illustrated" and insert -- as illustrated --.

CERTIFICATE OF CORRECTION (continued)
U.S. Pat. No. 9,553,343 B2

In Column 41, Line 62, please delete "call casings" and insert -- cell casings --.

In Column 42, Line 60, please delete "battery cells 22," and insert -- battery cells 116, --.

In Column 44, Line 18, please delete "layers 402 and 404" and insert -- layers 400 and 404 --.

In Column 45, Line 2, please delete "first layer 404 of pouch material and the second layer 400" and insert -- first layer 400 of pouch material and the second layer 404 --.

In Column 45, Line 64, please delete "layers 400 and 406" and insert -- layers 400 and 404 --.

In Column 46, Line 22, please delete "layers 404 and 400" and insert -- layers 400 and 404 --.

In Column 47, Line 46, please delete "layers 400 and 406" and insert -- layers 400 and 404 --.

In Column 57, Line 66, please delete "may includes" and insert -- may include --.

In Column 67, Line 11, please delete "roller 129." and insert -- roller 596. --.

In Column 69, Line 35, please delete "may includes" and insert -- may include --.

In Column 74, Line 22, please delete "bottom frame 118" and insert -- bottom frame portion 118b --.

In Column 74, Line 47, please delete "frame 118a" and insert -- frame 118 --.

In Column 80, Line 44, please delete "batter assembly 84)," and insert -- power assembly 114), --.

In Column 81, Line 12, please delete "composite cover 56" and insert -- composite cover 59 --.

In Column 82, Line 11, please delete "discs" and insert -- disks --.

In Column 83, Line 4, please delete "composite cover 56" and insert -- composite cover 59 --.

In Column 84, Line 52, please delete "plates 100, 120," and insert -- plates 100, 102, --.

In Column 88, Line 22, please delete "filing," and insert -- filling, --.

In Column 90, Line 67, please delete "first battery cell 88" and insert -- first battery cell 888 --.